US012349478B2

(12) United States Patent
Hiramatsu et al.

(10) Patent No.: US 12,349,478 B2
(45) Date of Patent: Jul. 1, 2025

(54) IMAGING DEVICE

(71) Applicant: SONY SEMICONDUCTOR SOLUTIONS CORPORATION, Kanagawa (JP)

(72) Inventors: Katsunori Hiramatsu, Kanagawa (JP); Shintaro Okamoto, Kanagawa (JP); Yoshiaki Kitano, Kanagawa (JP); Yuya Maeda, Kanagawa (JP); Shinya Sato, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 568 days.

(21) Appl. No.: 17/619,347

(22) PCT Filed: Jun. 17, 2020

(86) PCT No.: PCT/JP2020/023702
§ 371 (c)(1),
(2) Date: Dec. 15, 2021

(87) PCT Pub. No.: WO2020/262131
PCT Pub. Date: Dec. 30, 2020

(65) Prior Publication Data
US 2022/0238590 A1   Jul. 28, 2022

(30) Foreign Application Priority Data

Jun. 26, 2019  (JP) ................. 2019-119127

(51) Int. Cl.
*H10F 39/18*  (2025.01)
*H10F 39/00*  (2025.01)

(52) U.S. Cl.
CPC ....... *H10F 39/18* (2025.01); *H10F 39/80373* (2025.01); *H10F 39/8057* (2025.01); *H10F 39/807* (2025.01)

(58) Field of Classification Search
CPC ......... H01L 27/14643; H01L 27/14614; H01L 27/14623; H01L 27/1463; H01L 21/3205;
(Continued)

(56) References Cited

U.S. PATENT DOCUMENTS 9,620,548 B1     4/2017  Wang et al.
10,103,190 B2 *  10/2018  Korobov ................. H10F 39/18
(Continued)

FOREIGN PATENT DOCUMENTS

CN     105009292 A    10/2015
JP    2003264281 A     9/2003
(Continued)

OTHER PUBLICATIONS

International Search Report prepared by the Japan Patent Office on Aug. 28, 2020, for International Application No. PCT/JP2020/023702, 5 pgs.

*Primary Examiner* — Yasser A Abdelaziez
(74) *Attorney, Agent, or Firm* — SHERIDAN ROSS P.C.

(57) ABSTRACT

An imaging device according to embodiments of the present disclosure includes: a first semiconductor substrate provided with a photoelectric conversion element, floating diffusion that temporarily holds a charge output from the photoelectric conversion element, and a transfer transistor that transfers the charge output from the photoelectric conversion element to the floating diffusion; and a second semiconductor substrate provided on the first semiconductor substrate via a first interlayer insulating film and provided with a readout circuit unit that reads out the charge held in the floating diffusion and outputs a pixel signal.

14 Claims, 78 Drawing Sheets

(58) Field of Classification Search
CPC . H01L 21/768; H01L 21/8234; H01L 23/522; H01L 27/00; H01L 27/088; H01L 27/146; H01L 27/14605; H01L 27/14607; H01L 27/14612; H01L 27/14634; H01L 27/14636; H01L 27/14603; H01L 27/14609; H01L 27/14665; H04N 25/70; H04N 25/79

See application file for complete search history.

(56) References Cited

U.S. PATENT DOCUMENTS

| | | | |
|---|---|---|---|
| 10,692,936 B2 * | 6/2020 | Zhang | H10F 39/80373 |
| 2011/0049336 A1 | 3/2011 | Matsunuma | |
| 2013/0032919 A1 | 2/2013 | Watanabe et al. | |
| 2013/0141617 A1 * | 6/2013 | Soda | H01L 27/14634 716/120 |
| 2015/0035029 A1 | 2/2015 | Ikeda | |
| 2016/0043130 A1 | 2/2016 | Ohguro | |
| 2017/0125473 A1 | 5/2017 | Wang et al. | |
| 2017/0200763 A1 | 7/2017 | Wang et al. | |
| 2017/0207259 A1 | 7/2017 | Yun | |
| 2018/0013961 A1 * | 1/2018 | Lee | H04N 25/76 |
| 2018/0076243 A1 | 3/2018 | Tashiro | |
| 2018/0090534 A1 | 3/2018 | Kim | |
| 2018/0190694 A1 | 7/2018 | Ihara | |
| 2018/0204874 A1 * | 7/2018 | Lee | H04N 25/11 |
| 2019/0006403 A1 | 1/2019 | Ikeda | |
| 2019/0386052 A1 | 12/2019 | Furuhashi | |
| 2020/0219920 A1 * | 7/2020 | Hur | H01L 27/14643 |
| 2021/0193703 A1 * | 6/2021 | Watanabe | H01L 27/1463 |

FOREIGN PATENT DOCUMENTS

| | | |
|---|---|---|
| JP | 2006-100620 | 4/2006 |
| JP | 2010-245506 | 10/2010 |
| JP | 2011-049445 | 3/2011 |
| JP | 2012-015417 | 1/2012 |
| JP | 2013-038118 | 2/2013 |
| JP | 2013-118345 | 6/2013 |
| JP | 2013-191639 | 9/2013 |
| JP | 2015-005690 | 1/2015 |
| JP | 2015-032687 | 2/2015 |
| JP | 2016-039315 | 3/2016 |
| JP | 2018-101699 | 6/2018 |
| JP | 2019-012905 | 1/2019 |
| TW | 201351629 A | 12/2013 |
| WO | WO 2016/147837 | 9/2016 |

* cited by examiner

IMAGING DEVICE

CROSS REFERENCE TO RELATED APPLICATIONS

This application is a national stage application under 35 U.S.C. 371 and claims the benefit of PCT Application No. PCT/JP2020/023702 having an international filing date of 17 Jun. 2020, which designated the United States, which PCT application claimed the benefit of Japanese Patent Application No. 2019-119127 filed 26 Jun. 2019, the entire disclosures of each of which are incorporated herein by reference.

FIELD

The present disclosure relates to an imaging device.

BACKGROUND

In conventional technologies, miniaturization, with regard to an area per pixel, in an imaging device having a two-dimensional structure has been realized by introduction of a microfabrication process and improvement of mounting density. In recent years, an imaging device having a three-dimensional structure has been developed in order to realize further miniaturization of the imaging device and densification of pixels. An imaging device having a three-dimensional structure has a configuration in which a semiconductor substrate including a plurality of sensor pixels and a semiconductor substrate including a signal processing circuit that process a signal obtained by each of the sensor pixels are stacked on each other.

CITATION LIST

Patent Literature

Patent Literature 1: JP 2010-245506 A

SUMMARY

Technical Problem

By the way, when stacking three layers of semiconductor chips in an imaging device having a three-dimensional structure, it is not practical to bond all the semiconductor substrates with their front surfaces. In three semiconductor substrates stacked with insufficient consideration, there is a possibility of an increased chip size or hindrance on miniaturization of an area per pixel due to a structure of electrically connecting the semiconductor substrates to each other. In view of this, it is desirable to provide an imaging device having a three-layer structure that has a chip size equivalent to the current chip size and would not hinder miniaturization of an area per pixel. In view of this, the present disclosure proposes an imaging device having a three-layer structure that has a chip size equivalent to the current chip size and would not hinder miniaturization of an area per pixel.

Solution to Problem

According to the present disclosure, an imaging device is provided. The imaging device includes: a first semiconductor substrate provided with a photoelectric conversion element, floating diffusion that temporarily holds a charge output from the photoelectric conversion element, and a transfer transistor that transfers the charge output from the photoelectric conversion element to the floating diffusion; a second semiconductor substrate provided on the first semiconductor substrate via a first interlayer insulating film and provided with a readout circuit unit that reads out the charge held in the floating diffusion and outputs a pixel signal; and a through-substrate electrode that penetrates the second semiconductor substrate and the first interlayer insulating film from a surface of the second semiconductor substrate opposite to a surface facing the first semiconductor substrate, the through-substrate electrode extending to the first semiconductor substrate so as to electrically connect the first semiconductor substrate and the second semiconductor substrate to each other. In the imaging device, a side surface of the through-substrate electrode is in contact with the second semiconductor substrate.

Also, according to the present disclosure, an imaging device is provided. The imaging device includes: a first semiconductor substrate provided with a photoelectric conversion element, floating diffusion that temporarily holds a charge output from the photoelectric conversion element, and a transfer transistor that transfers the charge output from the photoelectric conversion element to the floating diffusion; a second semiconductor substrate provided on the first semiconductor substrate via a first interlayer insulating film and provided with a readout circuit unit that reads out the charge held in the floating diffusion and outputs a pixel signal; and a through-substrate electrode that penetrates the first interlayer insulating film and electrically connects the first semiconductor substrate and the second semiconductor substrate to each other. In the imaging device, a distal end portion of the through-substrate electrode is embedded in the first semiconductor substrate.

Moreover, according to the present disclosure, an imaging device is provided. The imaging device includes: a first semiconductor substrate provided with a photoelectric conversion element, floating diffusion that temporarily holds a charge output from the photoelectric conversion element, and a transfer transistor that transfers the charge output from the photoelectric conversion element to the floating diffusion; a second semiconductor substrate provided on the first semiconductor substrate via a first interlayer insulating film and provided with a readout circuit unit that reads out the charge held in the floating diffusion and outputs a pixel signal; a first electrode electrically connected to a gate electrode of the transfer transistor; and a second electrode electrically connected to a semiconductor layer in the first semiconductor substrate. In the imaging device, at least one of the first or second electrodes is provided on a surface of the first semiconductor substrate opposite to a surface facing the second semiconductor substrate.

BRIEF DESCRIPTION OF DRAWINGS

FIG. 37 is a schematic plan view illustrating another example of a pixel isolation portion illustrated in FIG. 7A and the like.

DESCRIPTION OF EMBODIMENTS

Figure 1:
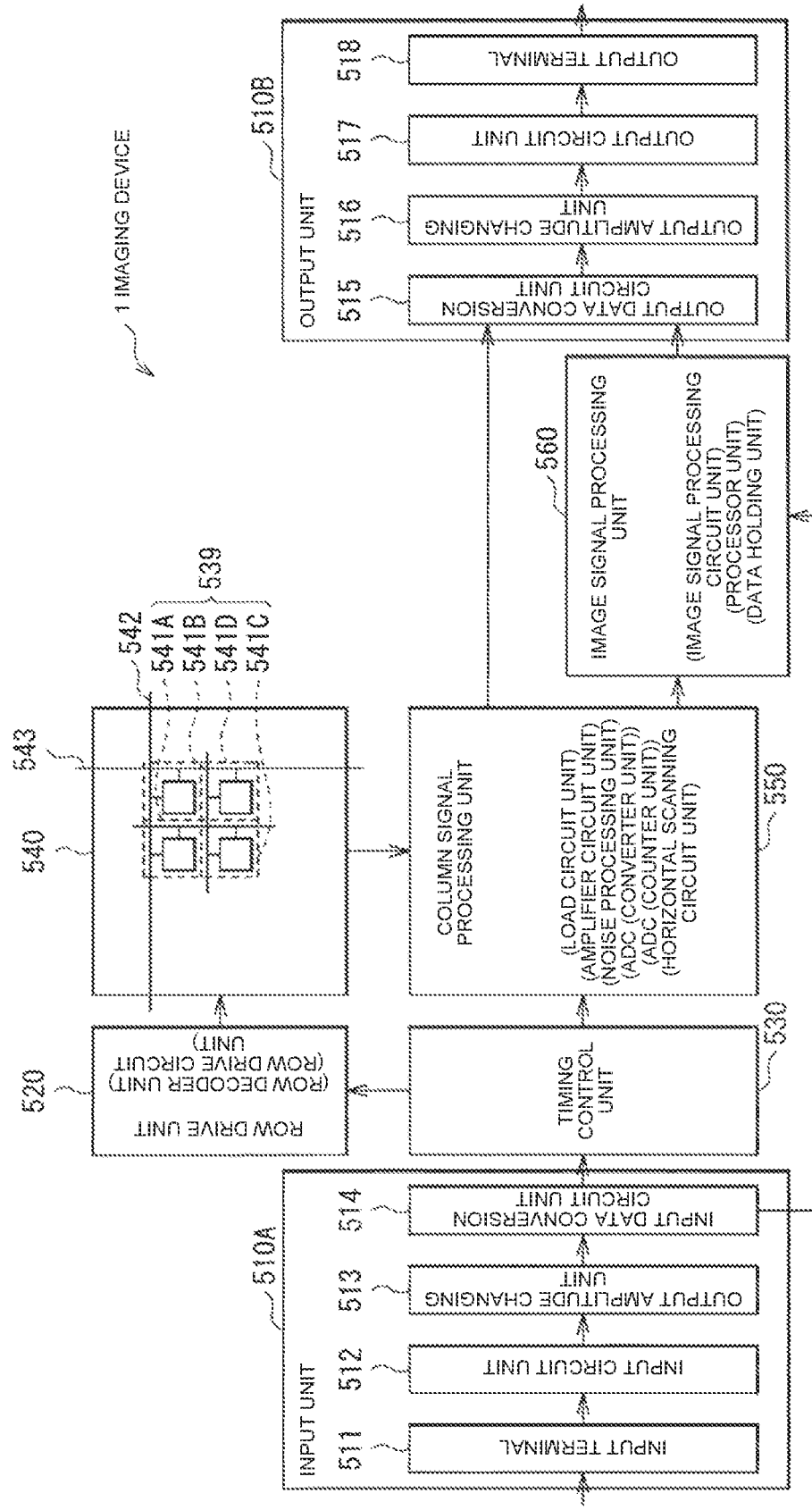
FIG. 1 is a block diagram illustrating an example of a functional configuration of an imaging device according to an embodiment of the present disclosure.

Embodiments of the present disclosure will be described below in detail with reference to the drawings. In each of the following embodiments, the same parts are denoted by the same reference symbols, and a repetitive description thereof will be omitted.

In addition, the drawings referred to in the following description are drawings for illustrating and facilitating further understanding of the embodiments of the present disclosure, and thus, shapes, dimensions, ratios, and the like illustrated in the drawings may be different from actual ones for the sake of clarity. Furthermore, the imaging device and the components and the like included in the imaging device illustrated in the drawings can be appropriately changed in design in consideration of the following description and known techniques. Furthermore, in the following description, the top-bottom direction of the stacked structure of the imaging device corresponds to a relative direction in a case where the imaging device is arranged such that light incident on the imaging device is directed from bottom to top, unless otherwise specified.

The description of specific lengths (numerical values) and shapes in the following description does not exclusively mean the same values as mathematically defined numerical values or geometrically defined shapes. Specifically, description of specific lengths (numerical values) and shapes in the following description includes dimensions in a case where there is a permissible difference (error/distortion) in the imaging device, a manufacturing process thereof, and use/operation thereof, and includes a shape similar to the shape illustrated herein. For example, in the following description, the expression "circular shape" means that the shape is not limited to a perfect circle but includes a shape similar to a perfect circle, such as an elliptical shape.

Furthermore, in the following description of circuits (electrical connections), unless otherwise specified, "electrically connected" means that a connection is made to allow electrical (signal) conduction through a plurality of elements. In addition, "electrically connected" in the following description includes not only a case of directly and electrically connecting a plurality of elements but also a case of indirectly and electrically connecting a plurality of elements via other elements.

In addition, in the following description, "provided in common" means that a plurality of one elements shares another element, in other words, the other element is shared by a predetermined number of each of the one elements, unless otherwise specified.

Furthermore, the following description is an exemplary case where the embodiments of the present disclosure are applied to a back-illuminated imaging device. Accordingly, light is incident from the back surface side in the imaging device to be described below.

Hereinafter, embodiments for carrying out the present disclosure will be described in detail with reference to the drawings. Note that the description will be given in the following order.

1. First embodiment (imaging device having stacked structure of three substrates)
2. First modification (planar configuration example 1)
3. Second modification (planar configuration example 2)
4. Third modification (planar configuration example 3)
5. Fourth modification (example in which contact portion between substrates is provided at central portion of pixel array unit)
6. Fifth modification (example of including planar transfer transistor)
7. Sixth modification (example in which one pixel is connected to one pixel circuit)
8. Seventh modification (configuration example of pixel isolation portion)
9. Eighth modification
10. Second Embodiment
11. Third Embodiment
12. Fourth Embodiment
13. Fifth Embodiment
14. Sixth Embodiment
15. Application example (imaging system)
16. Examples of applications to products
17. Summary
18. Supplementary notes 1. First Embodiment

[Functional Configuration of Imaging Device 1]

FIG. 1 is a block diagram illustrating an example of a functional configuration of an imaging device (imaging device 1) according to an embodiment of the present disclosure.

The imaging device 1 of FIG. 1 includes, for example, an input unit 510A, a row drive unit 520, a timing control unit 530, a pixel array unit 540, a column signal processing unit 550, an image signal processing unit 560, and an output unit 510B.

The pixel array unit 540 includes pixels 541 repeatedly arranged in an array. More specifically, a pixel sharing unit 539 including a plurality of pixels is a repeating unit, and is repeatedly arranged in an array formed in a row direction and a column direction. In the present specification, for convenience, the row direction is referred to as an H direction, and the column direction orthogonal to the row direction is referred to as a V direction in some cases. In the example of FIG. 1, one pixel sharing unit 539 includes four pixels (pixels 541A, 541B, 541C, and 541D). Each of the pixels 541A, 541B, 541C, and 541D includes a photodiode PD (illustrated in FIG. 6 and the like described below). The pixel sharing unit 539 is a unit of sharing one pixel circuit (a pixel circuit 210 in FIG. 3 described below). In other words, the four pixels (pixels 541A, 541B, 541C, and 541D) share one pixel circuit (the pixel circuit 210 to be described below). By causing the pixel circuit to operate in time division, a pixel signal of each of the pixels 541A, 541B, 541C, and 541D is sequentially read out. The pixels 541A, 541B, 541C, and 541D are each arranged in 2 rows×2 columns, for example. The pixel array unit 540 includes a plurality of row drive signal lines 542 and a plurality of vertical signal lines (column readout lines) 543 together with the pixels 541A, 541B, 541C, and 541D. The row drive signal line 542 drives the pixels 541 included in each of the plurality of pixel sharing units 539 arranged side by side in the row direction in the pixel array unit 540. Pixels to be driven are pixels arranged side by side in the row direction among the pixel sharing unit 539. As will be described in detail below with reference to FIG. 4, the pixel sharing unit 539 is provided with a plurality of transistors. In order to drive each of the plurality of transistors, a plurality of row drive signal lines 542 is connected to one pixel sharing unit 539. The pixel sharing unit 539 is connected to the vertical signal line (column readout line) 543. A pixel signal is read out from each of the pixels 541A, 541B, 541C, and 541D included in the pixel sharing unit 539 via the vertical signal line (column readout line) 543.

The row drive unit 520 includes, for example, a row address control unit that determines a position of a row for pixel drive, in other words, a row decoder unit, and includes a row drive circuit unit that generates a signal for driving the pixels 541A, 541B, 541C, and 541D.

The column signal processing unit 550 includes, for example, a load circuit unit that is connected to the vertical signal line 543 and forms a source follower circuit with the pixels 541A, 541B, 541C, and 541D (pixel sharing unit 539). The column signal processing unit 550 may include an amplifier circuit unit that amplifies a signal read out from the pixel sharing unit 539 via the vertical signal line 543. The column signal processing unit 550 may include a noise processing unit. The noise processing unit removes noise levels of a system from the signal read out from the pixel sharing unit 539 as a result of photoelectric conversion, for example.

The column signal processing unit 550 includes an analog-to-digital converter (ADC), for example. The analog-to-digital converter converts the signal read out from the pixel sharing unit 539 or the noise-processed analog signal into a digital signal. The ADC includes, for example, a comparator unit and a counter unit. The comparator unit compares an analog signal to be converted with a reference signal for comparison. The counter unit is supposed to count the time until the comparison result in the comparator unit is inverted. The column signal processing unit 550 may include a horizontal scanning circuit unit that performs control to scan the readout column.

The timing control unit 530 supplies a signal controlling timing to the row drive unit 520 and the column signal processing unit 550 based on the reference clock signal and the timing control signal input to the device.

The image signal processing unit 560 is a circuit that applies various types of signal processing on data obtained as a result of photoelectric conversion, in other words, data obtained as a result of an imaging operation in the imaging device 1. The image signal processing unit 560 includes, for example, an image signal processing circuit unit and a data holding unit. The image signal processing unit 560 may include a processor unit.

An example of signal processing executed in the image signal processing unit 560 is a tone curve correction process of increasing levels of gradations in a case where the AD converted imaging data is data obtained by imaging a dark subject, and reducing the levels of gradations in a case where the AD converted imaging data is data obtained by imaging a bright subject. In this case, it is desirable to preliminarily store, in the data holding unit of the image signal processing unit 560, the characteristic data of the tone curve, that is, which tone curve is to be used as a bases of the correction of gradation of the imaging data.

The input unit 510A is a unit for inputting the above-described reference clock signal, the timing control signal, the characteristic data, and the like from the outside of the device to the imaging device 1. The timing control signal is, for example, a vertical synchronization signal, a horizontal synchronization signal, or the like. The characteristic data is data to be stored in the data holding unit of the image signal processing unit 560, for example. The input unit 510A includes an input terminal 511, an input circuit unit 512, an input amplitude changing unit 513, an input data conversion circuit unit 514, and a power supply unit (not illustrated), for example.

The input terminal 511 is an external terminal for inputting data. The input circuit unit 512 is a unit for capturing a signal input to the input terminal 511 into the imaging device 1. The input amplitude changing unit 513 changes the amplitude of the signal captured by the input circuit unit 512 to an amplitude highly usable inside the imaging device 1. The input data conversion circuit unit 514 changes the arrangement of data strings of the input data. The input data conversion circuit unit 514 is constituted with a serial-to-parallel conversion circuit, for example. The serial-to-parallel conversion circuit converts a serial signal received as input data into a parallel signal. The input unit 510A can omit the input amplitude changing unit 513 and the input data conversion circuit unit 514. The power supply unit supplies power set to various voltages required inside the imaging device 1 based on power supplied from the outside to the imaging device 1.

When the imaging device 1 is connected to an external memory device, the input unit 510A may be provided with a memory interface circuit that receives data from the external memory device. Examples of the external memory device include a flash drive, SRAM, and DRAM.

The output unit 510B outputs image data to the outside of the device. Examples of the image data include image data captured by the imaging device 1, image data that has undergone signal processing performed by the image signal processing unit 560, and the like. The output unit 510B includes an output data conversion circuit unit 515, an output amplitude changing unit 516, an output circuit unit 517, and an output terminal 518, for example.

The output data conversion circuit unit 515 is constituted with a parallel-to-serial conversion circuit, and thus, the output data conversion circuit unit 515 converts a parallel signal used inside the imaging device 1 into a serial signal. The output amplitude changing unit 516 changes the amplitude of a signal used inside the imaging device 1. The signal having amplitude changed will have high usability in an external device connected to the outside of the imaging device 1. The output circuit unit 517 is a circuit that outputs data from the inside of the imaging device 1 to the outside of the device, and the output circuit unit 517 also drives wiring outside the imaging device 1 connected to the output terminal 518. Data output is performed from the imaging device 1 to the outside of the device via the output terminal 518. The output unit 510B can omit the output data conversion circuit unit 515 and the output amplitude changing unit 516.

When the imaging device 1 is connected to an external memory device, the output unit 510B may be provided with a memory interface circuit that outputs data to the external memory device. Examples of the external memory device include a flash drive, SRAM, and DRAM.

[Schematic Configuration of Imaging Device 1]

Figure 2:
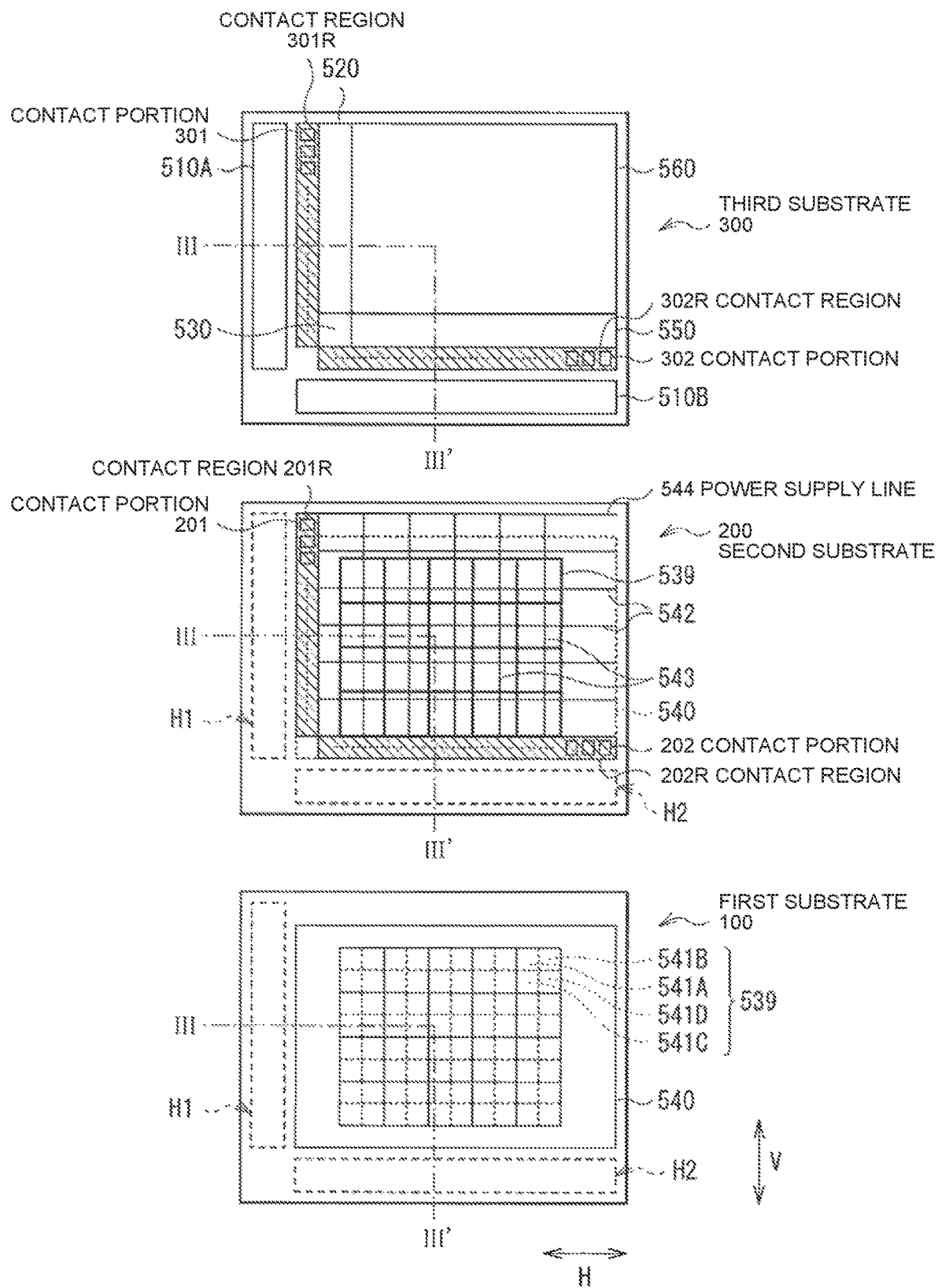
FIG. 2 is a schematic plan view illustrating a schematic configuration of the imaging device illustrated in FIG. 1.
Figure 3:
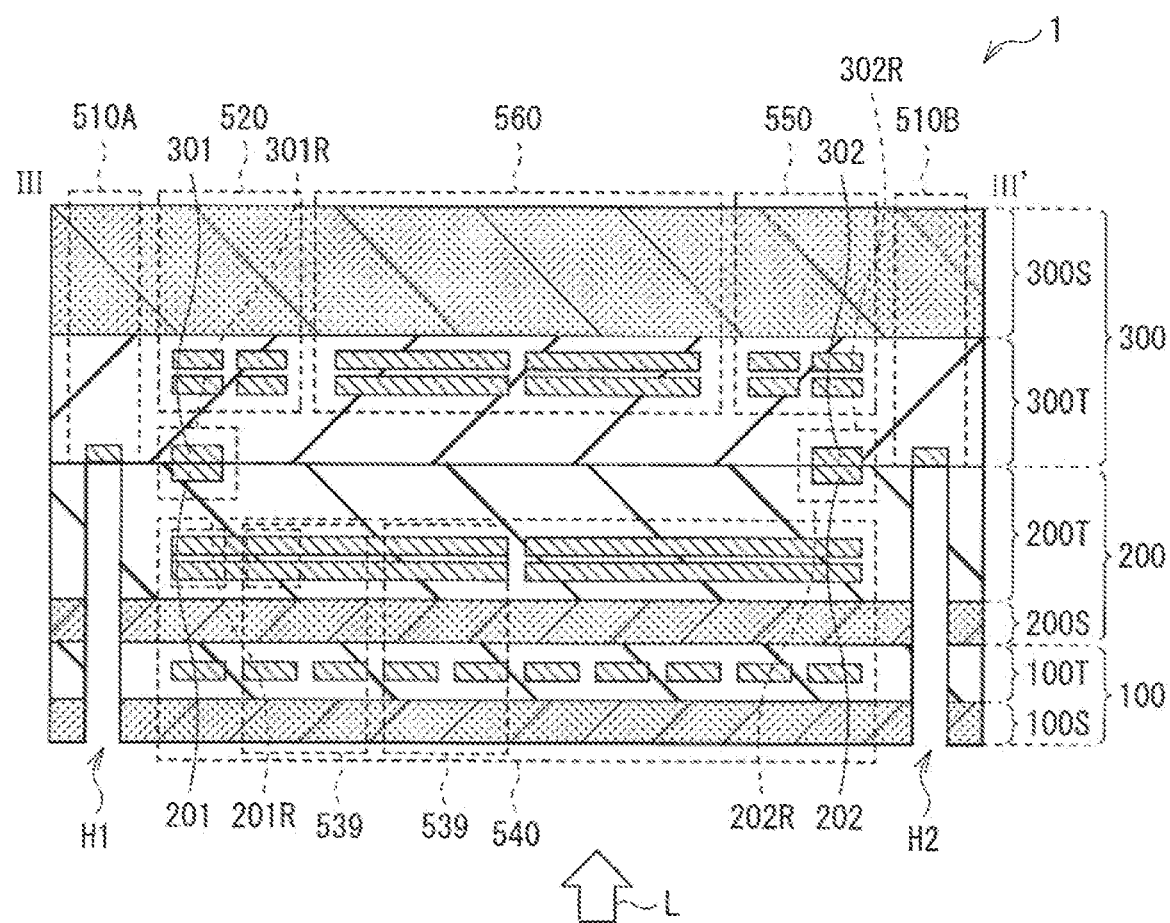
FIG. 3 is a schematic view illustrating a cross-sectional configuration taken along line III-III' illustrated in FIG. 2.

FIGS. 2 and 3 illustrate an example of a schematic configuration of the imaging device 1. The imaging device 1 includes three substrates (a first substrate 100, a second substrate 200, and a third substrate 300). FIG. 2 schematically illustrates a planar configuration of each of the first substrate 100, the second substrate 200, and the third substrate 300. FIG. 3 schematically illustrates a cross-sectional configuration of the first substrate 100, the second substrate 200, and the third substrate 300 stacked on each other. FIG. 3 corresponds to the cross-sectional configuration taken along line III-III' illustrated in FIG. 2. The imaging device 1 is an imaging device having a three-dimensional structure formed by bonding three substrates (the first substrate 100, the second substrate 200, and the third substrate 300). The first substrate 100 includes a semiconductor layer 100S and a wiring layer 100T. The second substrate 200 includes a semiconductor layer 200S and a wiring layer 200T. The third substrate 300 includes a semiconductor layer 300S and a wiring layer 300T. Here, a combination of the wiring included in each substrate of the first substrate 100, the second substrate 200, and the third substrate 300 together with an interlayer insulating film around the wiring is referred to as wiring layers (100T, 200T, and 300T) provided on each of the substrates (the first substrate 100, the second substrate 200, and the third substrate 300) for convenience. The first substrate 100, the second substrate 200, and the third substrate 300 are stacked in this order, and specifically, the layers are stacked in order of the semiconductor layer 100S, the wiring layer 100T, the semiconductor layer 200S, the wiring layer 200T, the wiring layer 300T, and the semiconductor layer 300S in a stacking direction. Specific configurations of the first substrate 100, the second substrate 200, and the third substrate 300 will be described below. An arrow illustrated in FIG. 3 indicates an incident direction of light L on the imaging device 1. In the following cross-sectional views in the present specification, the light incident side in the imaging device 1 may be referred to as "lower", "lower side", or "below", and the side opposite to the light incident side may be referred to as "upper", "upper side", or "above" for convenience. In addition, in the present specification, for convenience, in a substrate including a semiconductor layer and a wiring layer, a side of the wiring layer may be referred to as a front surface, while a side of the semiconductor layer may be referred to as a back surface. The description of the specification is not limited to the above terms. The imaging device 1 is, for example, a back-illuminated imaging device in which light is incident from the back surface side of the first substrate 100 having a photodiode.

Both the pixel array unit 540 and the pixel sharing unit 539 included in the pixel array unit 540 are constituted by using both the first substrate 100 and the second substrate 200. The first substrate 100 is provided with the plurality of pixels 541A, 541B, 541C, and 541D included in the pixel sharing unit 539. Each of these pixels 541 includes a photodiode (photodiode PD described below) and a transfer transistor (transfer transistor TR described below). The second substrate 200 is provided with a pixel circuit (a pixel circuit 210 to be described below) included in the pixel sharing unit 539. The pixel circuit reads out the pixel signal transferred from the photodiode of each of the pixels 541A, 541B, 541C, and 541D via the transfer transistor, or resets the photodiode. In addition to such a pixel circuit, the second substrate 200 includes a plurality of row drive signal lines 542 extending in the row direction and a plurality of vertical signal lines 543 extending in the column direction. The second substrate 200 further includes a power supply line 544 extending in the row direction. The third substrate 300 includes an input unit 510A, a row drive unit 520, a timing control unit 530, a column signal processing unit 550, an image signal processing unit 560, and an output unit 510B, for example. A region in which the row drive unit 520 is provided partially overlaps the pixel array unit 540 in the stacking direction of the first substrate 100, the second substrate 200, and the third substrate 300 (hereinafter, simply referred to as the stacking direction), for example. More specifically, the row drive unit 520 is provided in a region overlapping the vicinity of an end of the pixel array unit 540 in the H direction in the stacking direction (FIG. 2). The column signal processing unit 550 is provided, for example, in a region partially overlapping the pixel array unit 540 in the stacking direction. More specifically, the column signal processing unit 550 is provided in a region overlapping the vicinity of the end of the pixel array unit 540 in the V direction, in the stacking direction (FIG. 2). Although not illustrated, the input unit 510A and the output unit 510B may be disposed in a portion other than the third substrate 300, for example, may be disposed on the second substrate 200. Alternatively, the input unit 510A and the output unit 510B may be provided on the back surface (light incident surface) side of the first substrate 100. Incidentally the pixel circuit provided on the second substrate 200 may also be referred to as a pixel transistor circuit, a pixel transistor group, a pixel transistor, a pixel readout circuit, or a readout circuit as alternative terms. In the present specification, the term "pixel circuit" is used.

The first substrate 100 and the second substrate 200 are electrically connected by a through-substrate electrode (through-substrate electrodes 120E and 121E of FIG. 6 to be described below), for example. The second substrate 200 and the third substrate 300 are electrically connected via contact portions 201, 202, 301, and 302, for example. The contact portions 201 and 202 are provided on the second substrate 200, while the contact portions 301 and 302 are provided on the third substrate 300. The contact portion 201 of the second substrate 200 is in contact with the contact portion 301 of the third substrate 300, while the contact portion 202 of the second substrate 200 is in contact with the contact portion 302 of the third substrate 300. The second substrate 200 has a contact region 201R including a plurality of the contact portions 201 and a contact region 202R including a plurality of the contact portions 202. The third substrate 300 has a contact region 301R including a plurality of the contact portions 301 and a contact region 302R including a plurality of the contact portions 302. The contact regions 201R and 301R are provided between the pixel array unit 540 and the row drive unit 520 in the stacking direction (FIG. 3). In other words, the contact regions 201R and 301R are provided, for example, in a region where the row drive unit 520 (on the third substrate 300) and the pixel array unit 540 (on the second substrate 200) overlap each other in the stacking direction or in a region in the vicinity thereof. The contact regions 201R and 301R are disposed at ends in the H direction in such regions, for example (FIG. 2). In the third substrate 300, for example, the contact region 301R is provided at a position overlapping a part of the row drive unit 520, specifically, the end of the row drive unit 520 in the H direction (FIGS. 2 and 3). The contact portions 201 and 301 connect, for example, the row drive unit 520 provided on the third substrate 300 and the row drive signal line 542 provided on the second substrate 200 to each other. For example, the contact portions 201 and 301 may connect the input unit 510A provided on the third substrate 300, the power supply line 544, and a reference potential line (a reference potential line VSS described below) to each other. The contact regions 202R and 302R are provided between the pixel array unit 540 and the column signal processing unit 550 in the stacking direction (FIG. 3). In other words, the contact regions 202R and 302R are provided, for example, in a region where the column signal processing unit 550 (third substrate 300) and the pixel array unit 540 (second substrate 200) overlap each other in the stacking direction or in a vicinity region thereof. The contact regions 202R and 302R are disposed at ends in the V direction in such regions, for example (FIG. 2). In the third substrate 300, for example, the contact region 301R is provided at a position overlapping a part of the column signal processing unit 550, specifically, the end portion of the column signal processing unit 550 in the V direction (FIGS. 2 and 3). The contact portions 202 and 302 are provided for connecting a pixel signal (a signal corresponding to the amount of charge generated as a result of photoelectric conversion in a photodiode) output from each of the plurality of pixel sharing units 539 included in the pixel array unit 540 to the column signal processing unit 550 provided on the third substrate 300. The pixel signal is supposed to be transmitted from the second substrate 200 to the third substrate 300.

FIG. 3 is an example of a cross-sectional view of the imaging device 1 as described above. The first substrate 100, the second substrate 200, and the third substrate 300 are electrically connected to each other via the wiring layers 100T, 200T, and 300T. For example, the imaging device 1 includes an electrical connection portion adapted to electrically connect the second substrate 200 and the third substrate 300 to each other. Specifically, the contact portions 201, 202, 301, and 302 are formed with electrodes formed of a conductive material. The conductive material is formed of, for example, a metal material such as copper (Cu), aluminum (Al), or gold (Au). By directly bonding wiring portions formed as electrodes, for example, the contact regions 201R, 202R, 301R, and 302R electrically connect the second substrate and the third substrate to each other, enabling signal input and/or output between the second substrate 200 and the third substrate 300.

An electrical connection portion that electrically connects the second substrate 200 and the third substrate 300 to each other can be provided at a desired location. For example, as illustrated as the contact regions 201R, 202R, 301R, and 302R in FIG. 3, the contact regions may be provided in a region overlapping the pixel array unit 540 in the stacking direction. Alternatively, the electrical connection portion may be provided in a region not overlapping the pixel array unit 540 in the stacking direction. Specifically, it may be provided in a region overlapping a peripheral portion arranged outside the pixel array unit 540 in the stacking direction.

The first substrate 100 and the second substrate 200 are provided with connection holes H1 and H2, for example. The connection holes H1 and H2 penetrate both the first substrate 100 and the second substrate 200 (FIG. 3). The connection holes H1 and H2 are provided outside the pixel array unit 540 (or a portion overlapping the pixel array unit 540) (FIG. 2). For example, the connection hole H1 is arranged outside the pixel array unit 540 in the H direction, while the connection hole H2 is arranged outside the pixel array unit 540 in the V direction. For example, the connection hole H1 reaches the input unit 510A provided in the third substrate 300, while the connection hole H2 reaches the output unit 510B provided in the third substrate 300. The connection holes H1 and H2 may be hollow or at least partially contain a conductive material. For example, there is a configuration in which a bonding wire is connected to an electrode formed as the input unit 510A and/or the output unit 510B. Alternatively, there is a configuration in which the electrode formed as the input unit 510A and/or the output unit 510B is connected to the conductive material provided in the connection holes H1 and H2. The conductive material provided in the connection holes H1 and H2 may be embedded in a part or all of the connection holes H1 and H2, or alternatively, the conductive material may be formed on side walls of the connection holes H1 and H2.

FIG. 3 is a case of a structure in which the input unit 510A and the output unit 510B are provided on the third substrate 300, the present disclosure is not limited thereto. For example, by sending a signal of the third substrate 300 to the second substrate 200 via the wiring layers 200T and 300T, the input unit 510A and/or the output unit 510B can be provided on the second substrate 200. Similarly, by sending a signal of the second substrate 200 to the first substrate 1000 via the wiring layers 100T and 200T, the input unit 510A and/or the output unit 510B can be provided on the first substrate 100.

Figure 4:
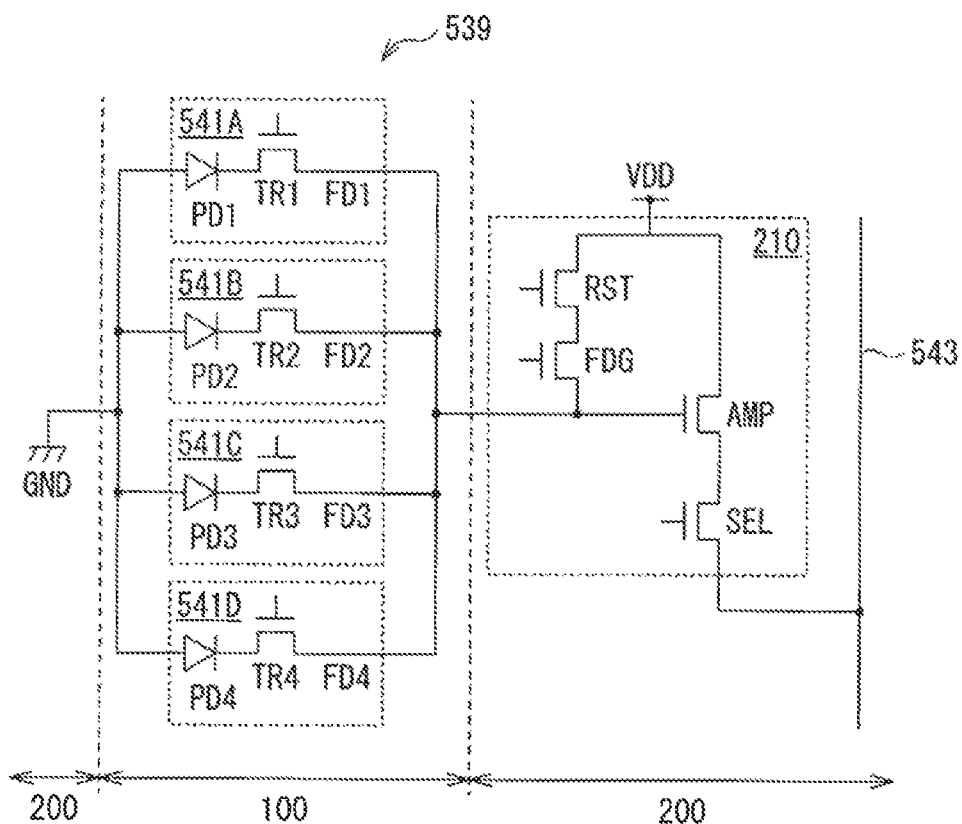
FIG. 4 is an equivalent circuit diagram of a pixel sharing unit illustrated in FIG. 1.

FIG. 4 is an equivalent circuit diagram illustrating an example of a configuration of the pixel sharing unit 539. The pixel sharing unit 539 includes the plurality of pixels 541 (FIG. 4 illustrates four pixels 541, namely, the pixels 541A, 541B, 541C, and 541D), one pixel circuit 210 connected to the plurality of pixels 541, and a vertical signal line 5433 connected to the pixel circuit 210. The pixel circuit 210 includes four transistors, specifically, an amplification transistor AMP, a selection transistor SEL, a reset transistor RST, and an FD conversion gain switching transistor FD, for example. As described above, by operating one pixel circuit 210 in time division, the pixel sharing unit 539 is configured to sequentially output the pixel signals of the four pixels 541 (pixels 541A, 541B, 541C, and 541D) included in the pixel sharing unit 539 to the vertical signal line 543. The mode in which one pixel circuit 210 is connected to the plurality of pixels 541 and pixel signals of the plurality of pixels 541 are output by the one pixel circuit 210 in time division is referred to as a mode in which "the plurality of pixels 541 shares one pixel circuit 210".

The pixels 541A, 541B, 541C, and 541D have components common to each other. Hereinafter, in order to distinguish the components of the pixels 541A, 541B, 541C, and 541D from each other, an identification number 1 is assigned to the end of the sign of the component of the pixel 541A, an identification number 2 is assigned to the end of the sign of the component of the pixel 541B, an identification number 3 is assigned to the end of the sign of the component of the pixel 541C, and an identification number 4 is assigned to the end of the sign of the component of the pixel 541D. When there is no need to distinguish the components of the pixels 541A, 541B, 541C, and 541D from each other, the identification numbers at the ends of the signs of the components of the pixels 541A, 541B, 541C, and 541D are omitted.

The pixels 541A, 541B, 541C, and 541D each include, for example, a photodiode PD, a transfer transistor TR electrically connected to the photodiode PD, and a node of floating diffusion FD electrically connected to the transfer transistor TR. The photodiode PD (PD1, PD2, PD3, PD4) has a cathode electrically connected to the source of the transfer transistor TR and has an anode electrically connected to a reference potential line (for example, ground). The photodiode PD photoelectrically converts incident light and generates a charge corresponding to the amount of received light. The transfer transistor TR (transfer transistors TR1, TR2, TR3, or TR4) is, for example, an n-type complementary metal oxide semiconductor (CMOS) transistor. The transfer transistor TR has the drain electrically connected to the floating diffusion FD and has the gate electrically connected to a drive signal line. This drive signal line is a part of the plurality of row drive signal lines 542 (refer to FIG. 1) connected to one pixel sharing unit 539. The transfer transistor TR transfers the charge generated in the photodiode PD to the floating diffusion FD. The floating diffusion FD (including nodes of floating diffusion FD1, FD2, FD3, or FD4) is an n-type diffusion layer region formed in the p-type semiconductor layer. The floating diffusion FD is a charge holding means of temporarily holding the charge transferred from the photodiode PD, and is a charge-voltage conversion means of generating a voltage corresponding to the charge amount.

The four nodes of floating diffusion FD (including nodes of floating diffusion FD1, FD2, FD3, and FD4) included in one pixel sharing unit 539 are electrically connected to each other, and are electrically connected to the gate of the amplification transistor AMP and the source of the FD conversion gain switching transistor FDG. The drain of the FD conversion gain switching transistor FDG is connected to the source of the reset transistor RST, and the gate of the FD conversion gain switching transistor FDG is connected to a drive signal line. This drive signal line is a part of the plurality of row drive signal lines 542 connected to one pixel sharing unit 539. The drain of the reset transistor RST is connected to the power supply line VDD, and the gate of the reset transistor RST is connected to the drive signal line. This drive signal line is a part of the plurality of row drive signal lines 542 connected to one pixel sharing unit 539. The gate of the amplification transistor AMP is connected to the floating diffusion FD, the drain of the amplification transistor AMP is connected to the power supply line VDD, and the source of the amplification transistor AMP is connected to the drain of the selection transistor SEL. The source of the selection transistor SEL is connected to the vertical signal line 543, while the gate of the selection transistor SEL is connected to the drive signal line. This drive signal line is a part of the plurality of row drive signal lines 542 connected to one pixel sharing unit 539.

Figure 6:
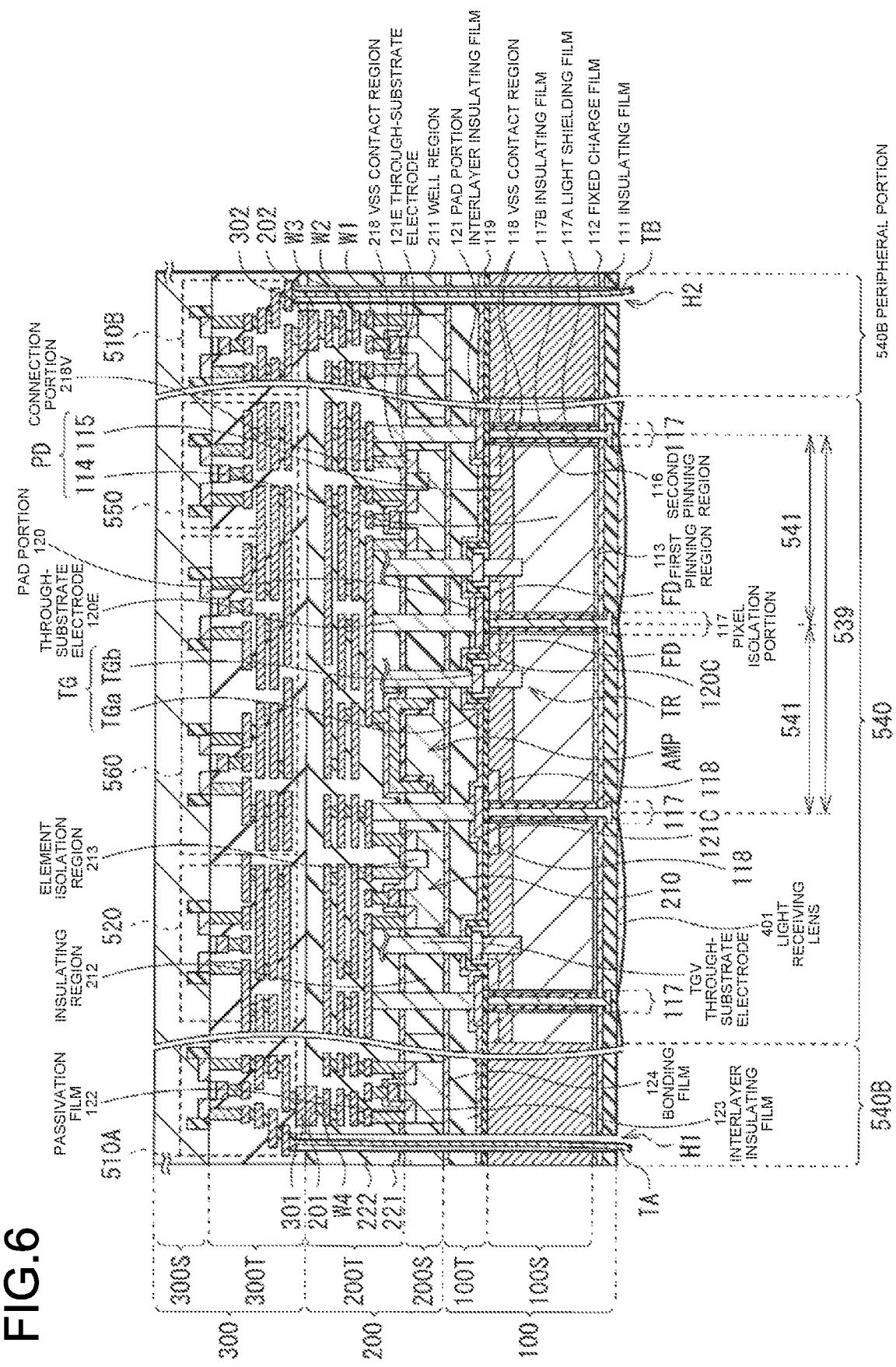
FIG. 6 is a schematic cross-sectional view illustrating an example of a specific configuration of the imaging device illustrated in FIG. 3.

When the transfer transistor TR is turned on, the transfer transistor TR transfers the charge of the photodiode PD to the floating diffusion FD. A gate (transfer gate TG) of the transfer transistor TR includes an electrode referred to as a vertical electrode, and is provided to extend from a front surface of a semiconductor layer (a semiconductor layer 100S in FIG. 6 to be described below) to a depth reaching the PD as illustrated in FIG. 6 to be described below. The reset transistor RST resets the potential of the floating diffusion FD to a predetermined potential. When the reset transistor RST is turned on, the potential of the floating diffusion FD is reset to the potential of the power supply line VDD. The selection transistor SEL controls an output timing of the pixel signal from the pixel circuit 210. The amplification transistor AMP generates a signal at a voltage corresponding to the level of the charge held in the floating diffusion FD as a pixel signal. The amplification transistor AMP is connected to the vertical signal line 543 via the selection transistor SEL. The amplification transistor AMP constitutes a source follower together with a load circuit unit (refer to FIG. 1) connected to the vertical signal line 543 in the column signal processing unit 550. When the selection transistor SEL is turned on, the amplification transistor AMP outputs the voltage of the floating diffusion FD to the column signal processing unit 550 via the vertical signal line 543. The reset transistor RST, the amplification transistor AMP, and the selection transistor SEL are N-type CMOS transistors, for example.

The FD conversion gain switching transistor FDG is used to change the gain of charge-voltage conversion in the floating diffusion FD. In general, a pixel signal is weak at the time of shooting in a dark place. Based on Q=CV, when capacitance (FD capacitance C) of the floating diffusion FD is large at the time of performing charge-voltage conversion, this will lead to a small V at the time of conversion into a voltage by the amplification transistor AMP. In contrast, the pixel signal has a great strength in a bright place, it would be difficult to hold the charge of the photodiode PD at the floating diffusion FD unless the FD capacitance C is large enough. Furthermore, the FD capacitance C needs to be large enough so that V when converted into a voltage by the amplification transistor AMP would not become too high (in other words, so as to be low). In view of these, when the FD conversion gain switching transistor FDG is turned on, the gate capacitance of the FD conversion gain switching transistor FDG increases, leading to an increase of the entire FD capacitance C. On the other hand, when the FD conversion gain switching transistor FDG is turned off, the entire FD capacitance C decreases. In this manner, switching on/off of the FD conversion gain switching transistor FDG can achieve variable FD capacitance C, making it possible to switch the conversion efficiency levels. The FD conversion gain switching transistor FDG is an N-type CMOS transistor, for example.

Incidentally, there may be a configuration without the FD conversion gain switching transistor FDG. At this time, for example, the pixel circuit 210 includes three transistors, for example, an amplification transistor AMP, a selection transistor SEL, and a reset transistor RST. The pixel circuit 210 includes, for example, at least one of pixel transistors such as an amplification transistor AMP, a selection transistor SEL, a reset transistor RST, and an FD conversion gain switching transistor FDG.

The selection transistor SEL may be provided between the power supply line VDD and the amplification transistor AMP. In this case, the drain of the reset transistor RST is electrically connected to the power supply line VDD and the drain of the selection transistor SEL. The source of the selection transistor SEL is electrically connected to the drain of the amplification transistor AMP, while the gate of the selection transistor SEL is electrically connected to the row drive signal line 542 (refer to FIG. 1). The source of the amplification transistor AMP (an output end of the pixel circuit 210) is electrically connected to the vertical signal line 543, while the gate of the amplification transistor AMP is electrically connected to the source of the reset transistor RST. Although not illustrated, the number of pixels 541 sharing one pixel circuit 210 may be other than four. For example, two or eight pixels 541 may share one pixel circuit 210.

Figure 5:
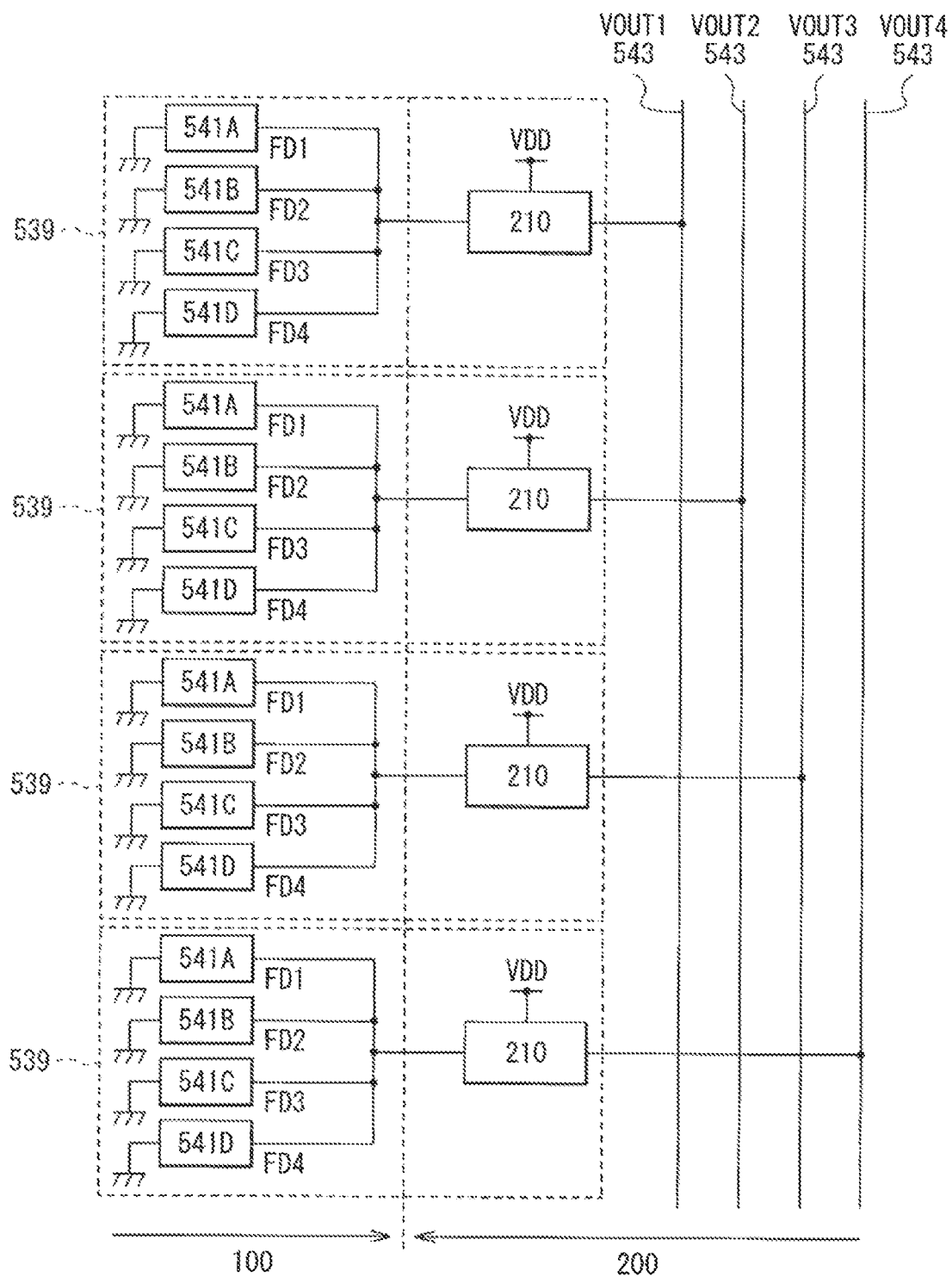
FIG. 5 is a diagram illustrating an example of a connection mode between a plurality of pixel sharing units and a plurality of vertical signal lines.

FIG. 5 illustrates an example of a connection mode between the plurality of pixel sharing units 539 and the vertical signal line 543. For example, the four pixel sharing units 539 arranged in the column direction are divided into four groups, and the vertical signal line 543 is connected to each of the four groups. For simplification, FIG. 5 illustrates an example in which each of the four groups has one pixel sharing unit 539, but the four groups may each include a plurality of pixel sharing units 539. In this manner, in the imaging device 1, the plurality of pixel sharing units 539 arranged in the column direction may be divided into groups including one or a plurality of pixel sharing units 539. For example, the vertical signal line 543 and the column signal processing unit 550 are connected to each of the groups, and pixel signals can be simultaneously read out from each of the groups. Alternatively, in the imaging device 1, one vertical signal line 543 may be connected to the plurality of pixel sharing units 539 arranged in the column direction. At this time, pixel signals are sequentially read out from the plurality of pixel sharing units 539 connected to the one vertical signal line 543 in time division.

[Specific Configuration of Imaging Device 1]

FIG. 6 illustrates an example of a cross-sectional configuration in a direction perpendicular to main surfaces of the first substrate 100, the second substrate 200, and the third substrate 300 of the imaging device 1. FIG. 6 schematically illustrates the positional relationship of the components to facilitate understanding, and may be different from the actual cross section. In the imaging device 1, the first substrate 100, the second substrate 200, and the third substrate 300 are stacked in this order. The imaging device 1 further includes a light receiving lens 401 on the back surface side (light incident surface side) of the first substrate 100. A color filter layer (not illustrated) may be provided between the light receiving lens 401 and the first substrate 100. The light receiving lens 401 is provided in each of the pixels 541A, 541B, 541C, and 541D, for example. The imaging device 1 is, for example, a back-illuminated imaging device. The imaging device 1 includes a pixel array unit 540 arranged in a central portion and a peripheral portion 540B arranged at an outer side of the pixel array unit 540.

The first substrate 100 includes an insulating film 111, a fixed charge film 112, a semiconductor layer 100S, and a wiring layer 100T in this order from the light receiving lens 401 side. The semiconductor layer 100S is formed of a silicon substrate, for example. The semiconductor layer 100S includes, for example, a p-well layer 115 in a part of the front surface (surface on the wiring layer 100T side) and in the vicinity thereof, and an n-type semiconductor region 114 in the other region (region deeper than the p-well layer 115). For example, the n-type semiconductor region 114 and the p-well layer 115 constitute a pn junction type photodiode PD. The p-well layer 115 is a p-type semiconductor region.

Figure 7A:
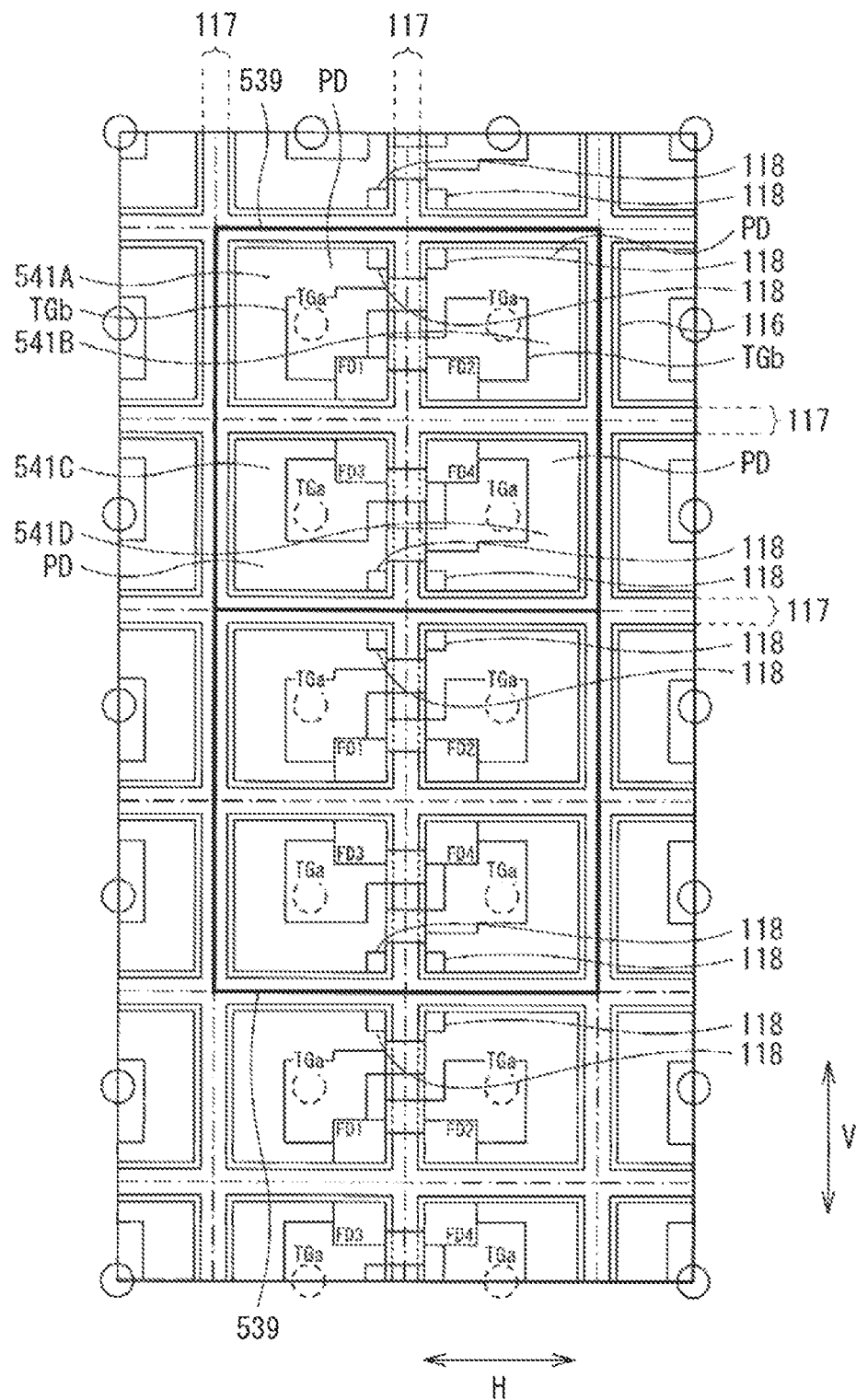
FIG. 7A is a schematic view illustrating an example of a planar configuration of a main part of a first substrate illustrated in FIG. 6.

FIG. 7A illustrates an example of a planar configuration of first substrate 100. FIG. 7A mainly illustrates a planar configuration of a pixel isolation portion 117, a photodiode PD, floating diffusion FD, a VSS contact region 118, and a transfer transistor TR of the first substrate 100. The configuration of first substrate 100 will be described with reference to FIG. 7A together with FIG. 6.

The floating diffusion FD and the VSS contact region 118 are provided in the vicinity of the front surface of the semiconductor layer 100S. The floating diffusion FD includes an n-type semiconductor region provided in the p-well layer 115. The nodes of floating diffusion FD (floating diffusion FD1, FD2, FD3, and FD4) of each of the pixels 541A, 541B, 541C, and 541D are provided close to each other in the central portion of the pixel sharing unit 539, for example (FIG. 7A). Although details will be described below, the four nodes of floating diffusion (floating diffusion FD1, FD2, FD3, and FD4) included in the pixel sharing unit 539 are electrically connected to each other via an electrical connection means (a pad portion 120 described below) in the first substrate 100 (more specifically, in the wiring layer 100T). Furthermore, the floating diffusion FD is connected from the first substrate 100 to the second substrate 200 (more specifically, from the wiring layer 100T to the wiring layer 200T) via an electrical means (a through-substrate electrode 120E described below). In the second substrate 200 (more specifically, inside the wiring layer 200T), the floating diffusion FD is electrically connected, via this electrical means, to the gate of the amplification transistor AMP and the source of the FD conversion gain switching transistor FDG.

The VSS contact region 118 is a region electrically connected to the reference potential line VSS, and is separated away from the floating diffusion FD. For example, in the pixels 541A, 541B, 541C, and 541D, the floating diffusion FD is arranged at one end and the VSS contact region 118 is arranged at the other end of each of pixels in the V direction (FIG. 7A). The VSS contact region 118 includes a p-type semiconductor region, for example. The VSS contact region 118 is connected to a ground potential (ground) or a fixed potential, for example. This configuration allows the reference potential to be supplied to the semiconductor layer 100S.

On the first substrate 100, the transfer transistor TR is provided together with the photodiode PD, the floating diffusion FD, and the VSS contact region 118. The photodiode PD, the floating diffusion FD, the VSS contact region 118, and the transfer transistor TR are provided in each of the pixels 541A, 541B, 541C, and 541D. The transfer transistor TR is provided on the front surface side (second substrate 200 side being the side opposite to the light incident surface side) of the semiconductor layer 100S. The transfer transistor TR has a transfer gate TG. The transfer gate TG includes, for example, a horizontal portion TGb facing the front surface of the semiconductor layer 100S and a vertical portion TGa provided in the semiconductor layer 100S. The vertical portion TGa extends in a thickness direction of the semiconductor layer 100S. The vertical portion TGa has one end being in contact with the horizontal portion TGb and the other end being provided in the n-type semiconductor region 114. With a configuration of the transfer transistor TR using such a vertical transistor, it is possible to suppress occurrence of transfer failure of the pixel signal and improve readout efficiency of the pixel signal.

The horizontal portion TGb of the transfer gate TG extends from a position facing the vertical portion TGa toward the central portion of the pixel sharing unit 539 in the H direction, for example (FIG. 7A). With this configuration, the position, in the H direction, of the through-substrate electrode (through-substrate electrode TGV to be described below) reaching the transfer gate TG can be brought close to the position, in the H direction, of the through-substrate electrode (through-substrate electrodes 120E and 121E to be described below) connected to the floating diffusion FD and the VSS contact region 118. For example, the plurality of pixel sharing units 539 provided on the first substrate 100 has the same configuration (FIG. 7A).

Figure 7B:
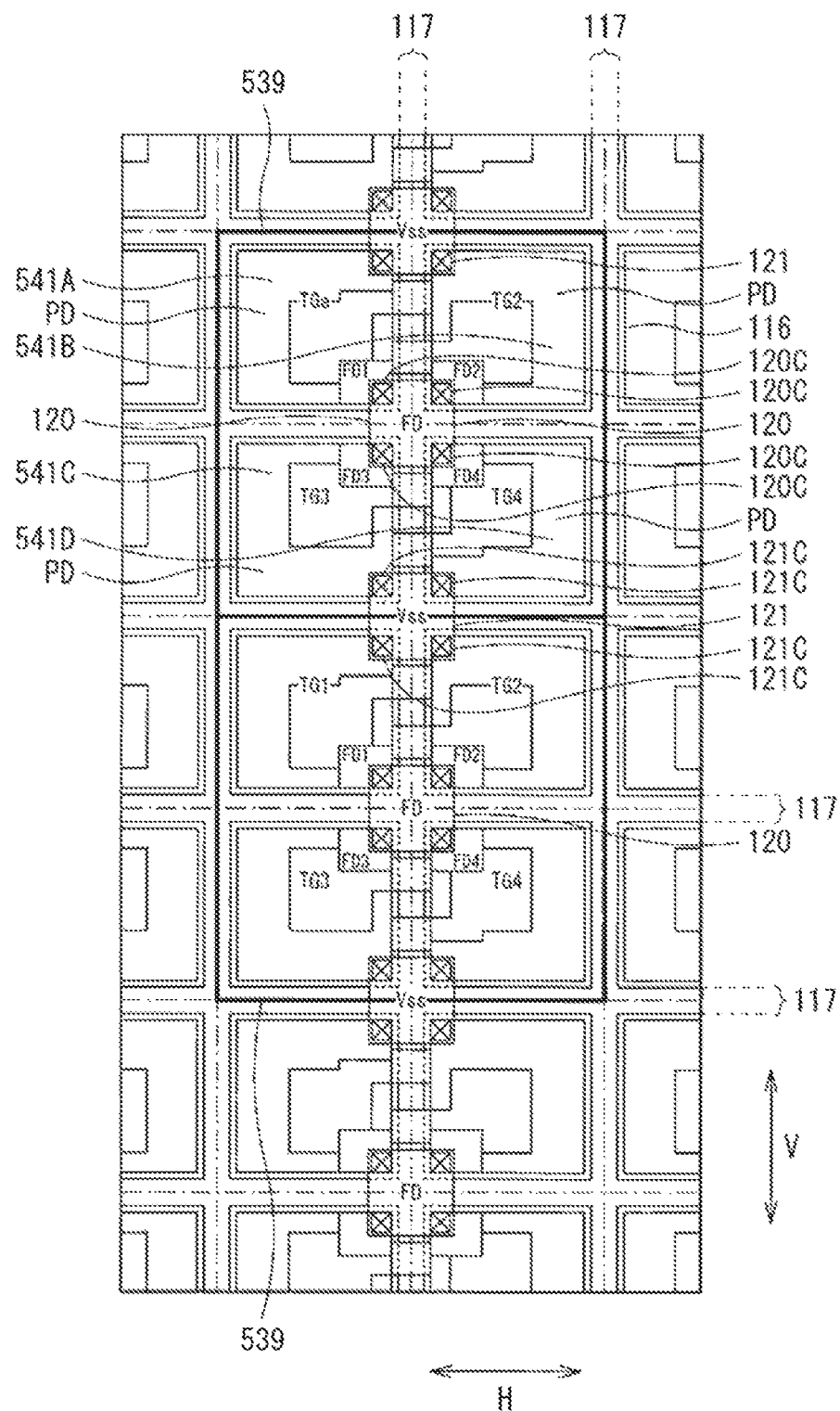
FIG. 7B is a schematic view illustrating a planar configuration of a pad portion together with the main part of the first substrate illustrated in FIG. 7A.

The semiconductor layer 100S has the pixel isolation portion 117 that isolates the pixels 541A, 541B, 541C, and 541D from each other. The pixel isolation portion 117 is formed to extend in the normal direction of the semiconductor layer 100S (direction perpendicular to the front surface of the semiconductor layer 100S). The pixel isolation portion 117 is provided so as to partition the pixels 541A, 541B, 541C, and 541D from each other, and has a grid-like planar shape, for example (FIGS. 7A and 7B). For example, the pixel isolation portion 117 electrically and optically isolates the pixels 541A, 541B, 541C, and 541D from each other. The pixel isolation portion 117 includes a light shielding film 117A and an insulating film 117B, for example. The light shielding film 117A is formed by using, for example, tungsten (W) or the like. The insulating film 117B is provided between the light shielding film 117A and the p-well layer 115 or the n-type semiconductor region 114. The insulating film 117B is formed of silicon oxide (SiO), for example. The pixel isolation portion 117 has a full trench isolation (FTI) structure, for example, and penetrates the semiconductor layer 100S. Although not illustrated, the pixel isolation portion 117 is not limited to the FTI structure penetrating the semiconductor layer 100S. For example, it is allowable to use a deep trench isolation (DTI) structure not penetrating the semiconductor layer 100S. The pixel isolation portion 117 extends in the normal direction of the semiconductor layer 100S and is formed in a partial region of the semiconductor layer 100S.

The semiconductor layer 100S includes a first pinning region 113 and a second pinning region 116, for example. The first pinning region 113 is provided in the vicinity of the back surface of the semiconductor layer 100S so as to be arranged between the n-type semiconductor region 114 and the fixed charge film 112. The second pinning region 116 is provided on a side surface of the pixel isolation portion 117, specifically, between the pixel isolation portion 117 and the p-well layer 115 or the n-type semiconductor region 114. The first pinning region 113 and the second pinning region 116 are formed with a p-type semiconductor region, for example.

There is provided a fixed charge film 112 having a negative fixed charge between the semiconductor layer 100S and the insulating film 111. By the electric field induced by the fixed charge film 112, the first pinning region 113 of a hole accumulation layer is formed at an interface on the light-receiving surface (back surface) side of the semiconductor layer 100S. This configuration suppresses the generation of dark current due to the interface state on the light receiving surface side of the semiconductor layer 100S. The fixed charge film 112 is formed of an insulating film having a negative fixed charge, for example. Examples of the material of the insulating film having a negative fixed charge include hafnium oxide, zircon oxide, aluminum oxide, titanium oxide, and tantalum oxide.

The light shielding film 117A is provided between the fixed charge film 112 and the insulating film 111. The light shielding film 117A may be provided continuously with the light shielding film 117A constituting the pixel isolation portion 117. The light shielding film 117A between the fixed charge film 112 and the insulating film 111 is selectively provided at a position facing the pixel isolation portion 117 in the semiconductor layer 100S, for example. The insulating film 111 is provided so as to cover the light shielding film 117A. The insulating film 111 is formed of silicon oxide, for example.

The wiring layer 100T, provided between the semiconductor layer 100S and the second substrate 200, includes an interlayer insulating film 119, pad portions 120 and 121, a passivation film 122, an interlayer insulating film (first interlayer insulating film) 123, and a bonding film 124 in this order from the semiconductor layer 100S side. The horizontal portion TGb of the transfer gate TG is provided in the wiring layer 100T, for example. The interlayer insulating film 119 is provided over the entire front surface of the semiconductor layer 100S and is in contact with the semiconductor layer 100S. The interlayer insulating film 119 is formed of a silicon oxide film, for example. Note that the configuration of the wiring layer 100T is not limited to the above, and any configuration including wiring and an insulating film is allowable.

FIG. 7B illustrates the configuration of the pad portion 120 and 121 together with the planar configuration illustrated in FIG. 7A. The pad portions 120 and 121 are provided in a selective region on the interlayer insulating film 119. The pad portion 120 is provided for connecting the nodes of the floating diffusion FD (floating diffusion FD1, FD2, FD3, and FD4) of the pixels 541A, 541B, 541C, and 541D to each other. For example, the pad portion 120 is arranged at the central portion of the pixel sharing unit 539 in plan view for each of the pixel sharing units 539 (FIG. 7B). The pad portion 120 is provided across the pixel isolation portion 117, and is arranged so as to overlap at least a part of each of nodes of the floating diffusion FD1, FD2, FD3, and FD4 (FIGS. 6 and 7B). Specifically, the pad portion 120 is formed in a region overlapping at least a part of each of the plurality of nodes of floating diffusion FD (floating diffusion FD1, FD2, FD3, and FD4) sharing the pixel circuit 210 and at least a part of the pixel isolation portion 117 formed between the plurality of photodiodes PD (photodiodes PD1, PD2, PD3, and PD4) sharing the pixel circuit 210, in a direction perpendicular to the front surface of the semiconductor layer 100S. The interlayer insulating film 119 is provided with a connection via 120C for electrically connecting the pad portion 120 and nodes of the floating diffusion FD1, FD2, FD3, and FD4. The connection via 120C is provided in each of the pixels 541A, 541B, 541C, and 541D. For example, by embedding a part of the pad portion 120 in the connection via 120C, the pad portion 120 is electrically connected to each of nodes of the floating diffusion FD1, FD2, FD3, and FD4.

The pad portion 121 is provided for connecting the plurality of VSS contact regions 118 to each other. For example, the VSS contact region 118 provided in the pixels 541C and 541D of one pixel sharing unit 539 adjacent in the V direction is electrically connected with the VSS contact region 118 provided in the pixels 541A and 541B of the other pixel sharing unit 539 by the pad portion 121. The pad portion 121 is provided across the pixel isolation portion 117, for example, and is arranged to overlap at least a part of each of the four VSS contact regions 118. Specifically, the pad portion 121 is formed in a region overlapping at least a part of each of the plurality of VSS contact regions 118 and at least a part of the pixel isolation portion 117 formed between the plurality of VSS contact regions 118 in a direction perpendicular to the front surface of the semiconductor layer 100S. The interlayer insulating film 119 is provided with a connection via 121C for electrically connecting the pad portion 121 and the VSS contact region 118 to each other. The connection via 121C is provided in each of the pixels 541A, 541B, 541C, and 541D. For example, by embedding a part of the pad portion 121 in the connection via 121C, the pad portion 121 and the VSS contact region 118 are electrically connected to each other. For example, the pad portion 120 and the pad portion 121 of each of the plurality of pixel sharing units 539 arranged in the V direction are arranged at substantially the same position in the H direction (FIG. 7B).

By providing the pad portion 120, it is possible to reduce the number of wiring lines for connecting from each floating diffusion FD to the pixel circuit 210 (for example, a gate electrode of the amplification transistor AMP) in the entire chip. Similarly, by providing the pad portion 121, it is possible to decrease the wiring lines supplying a potential to each VSS contact region 118 in the entire chip. This makes it possible to reduce the area of the entire chip, suppress the electrical interference between the wiring lines in the miniaturized pixel, and/or reduce the cost by decreased number of components.

The pad portions 120 and 121 can be provided at desired positions on the first substrate 100 and the second substrate 200. Specifically, the pad portions 120 and 121 can be provided in either the wiring layer 100T or an insulating region 212 of the semiconductor layer 200S. When provided in the wiring layer 100T, the pad portions 120 and 121 may be brought into direct contact with the semiconductor layer 100S. Specifically, the pad portions 120 and 121 may be directly connected to at least a part of each of the floating diffusion FD and/or the VSS contact region 118. Alternatively, it is allowable to use a configuration in which the connection vias 120C and 121C are provided from the floating diffusion FD and/or the VSS contact region 118 connected to the pad portions 120 and 121, respectively, and the pad portions 120 and 121 may be provided at desired positions of the wiring layer 100T and the insulating region 2112 of the semiconductor layer 200S.

In particular, in a case where the pad portions 120 and 121 are provided in the wiring layer 100T, it is possible to reduce the number of wiring lines connected to the floating diffusion FD and/or the VSS contact region 118 in the insulating region 212 of the semiconductor layer 200S. With this configuration, in the second substrate 200 forming the pixel circuit 210, it is possible to reduce the area of the insulating region 212 for forming the through-substrate wiring for connecting the floating diffusion FD to the pixel circuit 210. This makes it possible to ensure a large area of the second substrate 200 forming the pixel circuit 210. By ensuring the area of the pixel circuit 210, it is possible to form a large pixel transistor and contribute to image quality improvement by noise reduction and the like.

In particular, in a case where the FTI structure is used for the pixel isolation portion 117, it is preferable to provide the floating diffusion FD and/or the VSS contact region 118 in each of the pixels 541. Therefore, by using the configurations of the pad portions 120 and 121, it is possible to greatly decrease the wiring lines connecting the first substrate 100 and the second substrate 200 to each other.

Furthermore, as illustrated in FIG. 7B, for example, the pad portion 120 connected to the plurality of floating diffusions FD and the pad portion 121 connected to the plurality of VSS contact regions 118 are alternately arranged linearly in the V direction. Furthermore, the pad portions 120 and 121 are formed at positions surrounded by the plurality of photodiodes PD, the plurality of transfer gates TG, and the plurality of nodes of floating diffusion FD. This configuration enables flexible arrangement of elements other than the floating diffusion FD and the VSS contact region 118 on the first substrate 100 forming a plurality of elements, leading to higher efficiency of the layout of the entire chip. Furthermore, it is possible to achieve symmetry in the layout of the elements formed in each pixel sharing unit 539 and to suppress variations in characteristics of each pixel 541.

The pad portions 120 and 121 are each formed of polysilicon (Poly Si), for example, and more specifically, doped polysilicon doped with impurities. The pad portions 120 and 121 are preferably formed of a conductive material having high heat resistance, such as polysilicon, tungsten (W), titanium (Ti), or titanium nitride (TiN). With this configuration, the pixel circuit 210 can be formed after the semiconductor layer 200S of the second substrate 200 is bonded to the first substrate 100. Hereinafter, the reason for this will be described. Note that, in the following description, the method of forming the pixel circuit 210 after bonding the first substrate 100 and the semiconductor layer 200S of the second substrate 200 is referred to as a first manufacturing method.

Here, there is another conceivable method of forming the pixel circuit 210 on the second substrate 200 and thereafter bonding the second substrate 200 to the first substrate 100 (hereinafter referred to as a second manufacturing method). In the second manufacturing method, an electrode for electrical connection is formed in advance on the front surface of the first substrate 100 (front surface of the wiring layer 100T) and the front surface of the second substrate 200 (front surface of the wiring layer 200T) individually. At the same time as bonding the first substrate 100 and the second substrate 200 to each other, the electrical connection electrodes formed on the front surface of the first substrate 100 and the front surface of the second substrate 200 come into contact with each other. This forms an electrical connection between the wiring included in the first substrate 100 and the wiring included in the second substrate 200. Therefore, by adopting the configuration of the imaging device 1 using the second manufacturing method, for example, manufacturing can be performed using an appropriate process for the configuration of each of the first substrate 100 and the second substrate 200, leading to achievement of manufacture of a high-quality and high-performance imaging device.

When the first substrate 100 and the second substrate 200 are bonded to each other with such a second manufacturing method, an alignment error might occur due to a manufacturing device for bonding. In addition, when the first substrate 100 and the second substrate 200 are bonded to each other, with the first substrate 100 and the second substrate 200 each having the size about several tens of centimeters in diameter, for example, there is a possibility that expansion and contraction of the substrates occur in microscopic regions of the first substrate 100 and the second substrate 200. This expansion and contraction of the substrates is caused by a slight shift in the timing of contact between the substrates. Due to such expansion and contraction of the first substrate 100 and the second substrate 200, an error might occur in the positions of the electrical connection electrodes formed on the front surface of the first substrate 100 and the front surface of the second substrate 200. In the second manufacturing method, it is preferable to take measures so that the electrodes of the first substrate 100 and the second substrate 200 come into contact with each other even with occurrence of such an error. Specifically, at least one, preferably both, of the electrodes of the first substrate 100 and the second substrate 200 can be formed to have a large size in consideration of the above error. Therefore, with the use of the second manufacturing method, for example, the size of the electrode formed on the front surface of the first substrate 100 or the second substrate 200 (the size in the substrate planar direction) is larger than the size of an internal electrode extending from the inside of the first substrate 100 or the second substrate 200 to the front surface in the thickness direction.

On the other hand, by forming the pad portions 120 and 121 using a heat-resistant conductive material, the first manufacturing method can be applied. In the first manufacturing method, the first substrate 100 including the photodiode PD, the transfer transistor TR, and the like is formed, and thereafter the first substrate 100 and the second substrate 200 (semiconductor layer 200S) are bonded to each other. At this time, the second substrate 200 is in a state in which patterns such as active elements and wiring layers constituting the pixel circuit 210 are not formed yet. Since the second substrate 200 is in a state before pattern formation, even if an error occurs in the bonding position when the first substrate 100 and the second substrate 200 are bonded together, this bonding error would not cause an error in alignment between the pattern of the first substrate 100 and the pattern of the second substrate 200. This is because the pattern of the second substrate 200 is to be formed after bonding of the first substrate 100 and the second substrate 200 to each other. At pattern formation on the second substrate, the pattern is to be formed, for example, on an exposure device for pattern formation, by using pattern formed on the first substrate as an alignment target. For the above reason, the error in the bonding position between the first substrate 100 and the second substrate 200 does not cause a problem in manufacturing the imaging device 1 using the first manufacturing method. For similar reasons, an error caused by expansion and contraction of the substrate caused by the second manufacturing method would not cause a problem in manufacturing the imaging device 1 by the first manufacturing method.

In the first manufacturing method, after the first substrate 100 and the second substrate 200 (semiconductor layer 200S) are bonded together in this manner, active elements are formed on the second substrate 200. Thereafter, the through-substrate electrodes 120E and 121E and the through-substrate electrode TGV (FIG. 6) are formed. In the formation of the through-substrate electrodes 120E, 121E, and TGV, for example, patterns of the through-substrate electrodes are formed from above the second substrate 200 by reduction projection exposure using an exposure device. Since the reduction exposure projection is used, even if an error occurs in the alignment between the second substrate 200 and the exposure device, the magnitude of the error would be as small as a fraction of the error of the second manufacturing method (inverse of the reduction exposure projection magnification) in the second substrate 200. Therefore, by adopting the configuration of the imaging device 1 using the first manufacturing method, it is possible to facilitate alignment of elements formed on the first substrate 100 and the second substrate 200 with each other, leading to achievement of manufacturing a high-quality and high-performance imaging device.

The imaging device 1 manufactured using such a first manufacturing method has features different from the case of the imaging device manufactured by the second manufacturing method. Specifically, in the imaging device 1 manufactured by the first manufacturing method, the through-substrate electrodes 120E, 121E, and TGV have substantially constant thicknesses (sizes in the substrate planar direction) from the second substrate 200 to the first substrate 100, for example. Alternatively, when the through-substrate electrodes 120E, 121E, and TGV have tapered shapes, they have tapered shapes with a constant inclination. The imaging device 1 including such through-substrate electrodes 120E, 121E, and TGV has high applicability in miniaturization of the pixel 541.

Here, when the imaging device 1 is manufactured by the first manufacturing method, since the active element is formed on the second substrate 200 after the first substrate 100 and the second substrate 200 (semiconductor layer 200S) are bonded together, the first substrate 100 would be also affected by the heating treatment necessary for forming the active element. Therefore, as described above, it is preferable to use a conductive material having high heat resistance for the pad portions 120 and 121 provided on the first substrate 100. For example, the pad portions 120 and 121 is preferably formed of a material having a higher melting point (that is, higher heat resistance) than at least a part of the wiring member included in the wiring layer 200T of the second substrate 200. For example, the pad portions 120 and 121 are formed of a conductive material having high heat resistance, such as doped polysilicon, tungsten, titanium, and titanium nitride. With this configuration, the imaging device 1 can be manufactured using the first manufacturing method described above.

The passivation film 122 is provided over the entire front surface of the semiconductor layer 100S so as to cover the pad portions 120 and 121, for example (FIG. 6). The passivation film 122 is formed of a silicon nitride (SiN) film, for example. The interlayer insulating film 123 covers the pad portions 120 and 121 with the passivation film 122 interposed therebetween. The interlayer insulating film 123 is provided over the entire front surface of the semiconductor layer 100S, for example. The interlayer insulating film 123 is formed of a silicon oxide (SiO) film, for example. The bonding film 124 is provided on a bonding surface between the first substrate 100 (specifically, the wiring layer 100T) and the second substrate 200. That is, the bonding film 124 is in contact with the second substrate 200. The bonding film 124 is provided over the entire main surface of the first substrate 100. The bonding film 124 is formed of a silicon nitride film, for example.

The light receiving lens 401 faces the semiconductor layer 100S with the fixed charge film 112 and the insulating film 111 interposed therebetween, for example (FIG. 6). The light receiving lens 401 is provided at a position facing the photodiode PD of each of the pixels 541A, 541B, 541C, and 541D, for example.

The second substrate 200 includes the semiconductor layer 200S and the wiring layer 200T in this order from the first substrate 100 side. The semiconductor layer 200S is formed of a silicon substrate. In the semiconductor layer 200S, a well region 211 is provided across the thickness direction. The well region 211 is a p-type semiconductor region, for example. The second substrate 200 is provided with the pixel circuit 210 arranged for each of the pixel sharing units 539. The pixel circuit 210 is provided on the front surface side (wiring layer 200T side) of the semiconductor layer 200S, for example. In the imaging device 1, the second substrate 200 is bonded to the first substrate 100 such that the back surface side (semiconductor layer 200S side) of the second substrate 200 faces the front surface side (wiring layer 100T side) of the first substrate 100. That is, the second substrate 200 is bonded to the first substrate 100 in a face-to-back arrangement.

Figure 8:
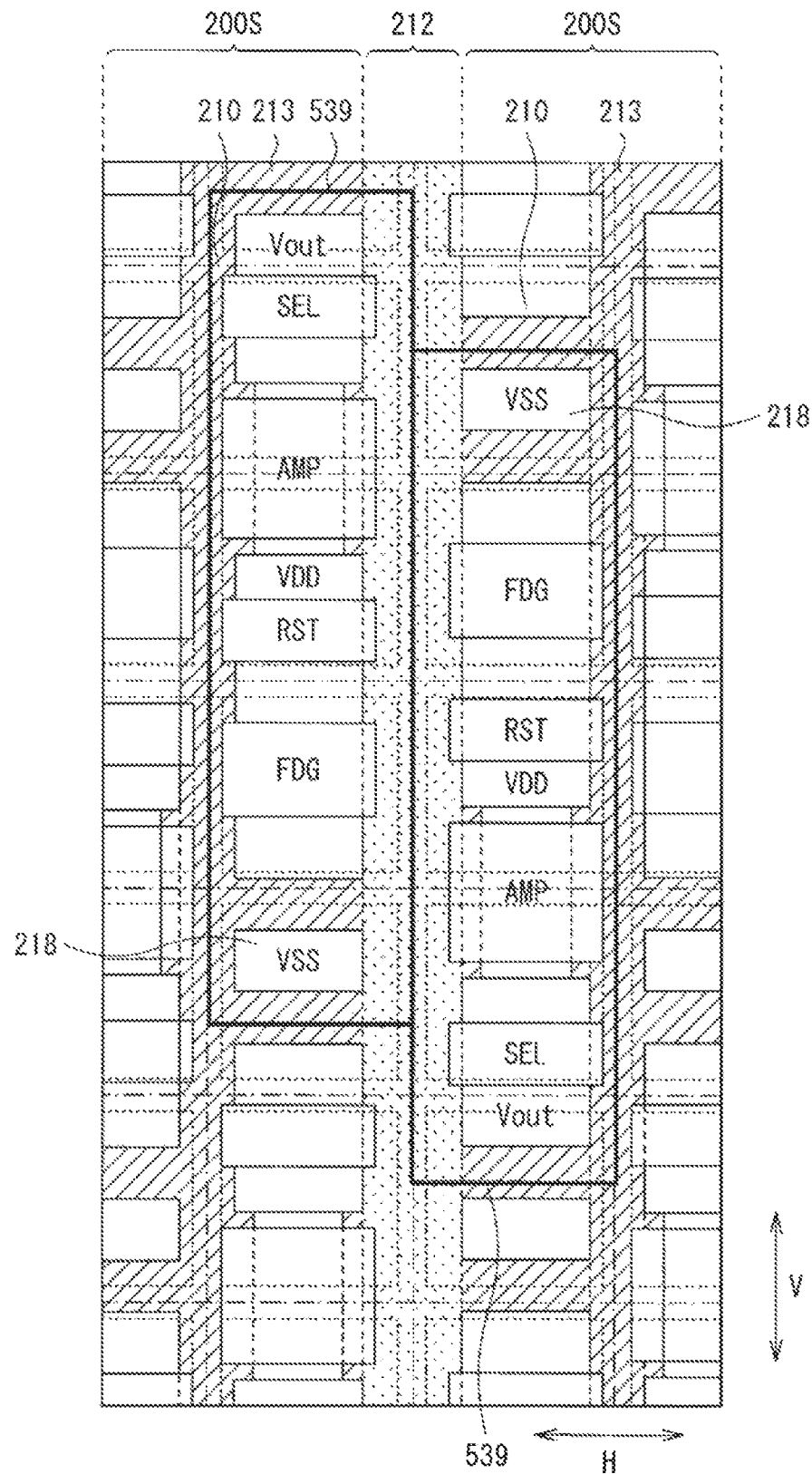
FIG. 8 is a schematic view illustrating an example of a planar configuration of a second substrate (semiconductor layer) illustrated in FIG. 6.
Figure 9:
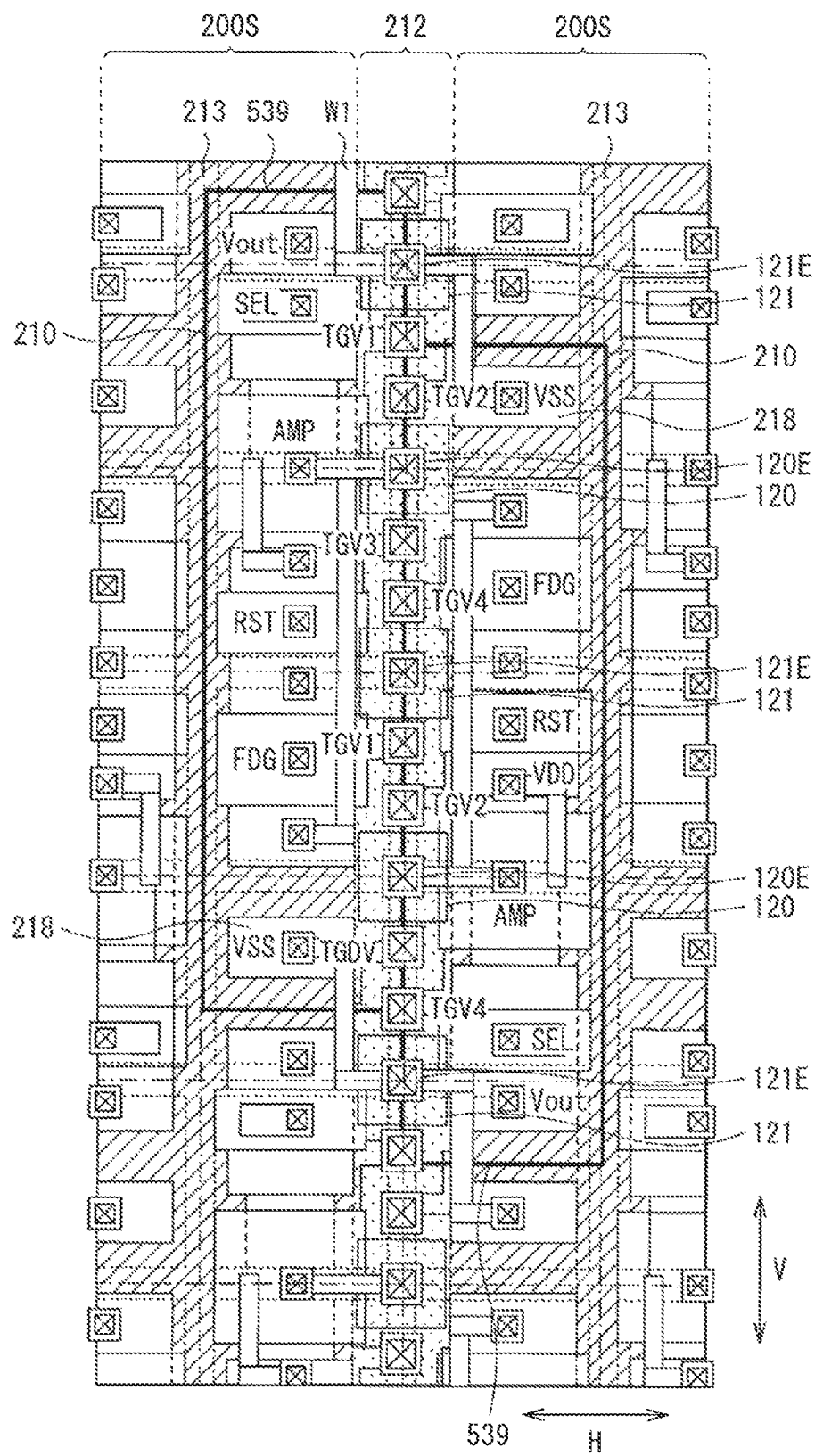
FIG. 9 is a schematic view illustrating an example of a planar configuration of a main part of a pixel circuit and the first substrate together with a first wiring layer illustrated in FIG. 6.
Figure 10:
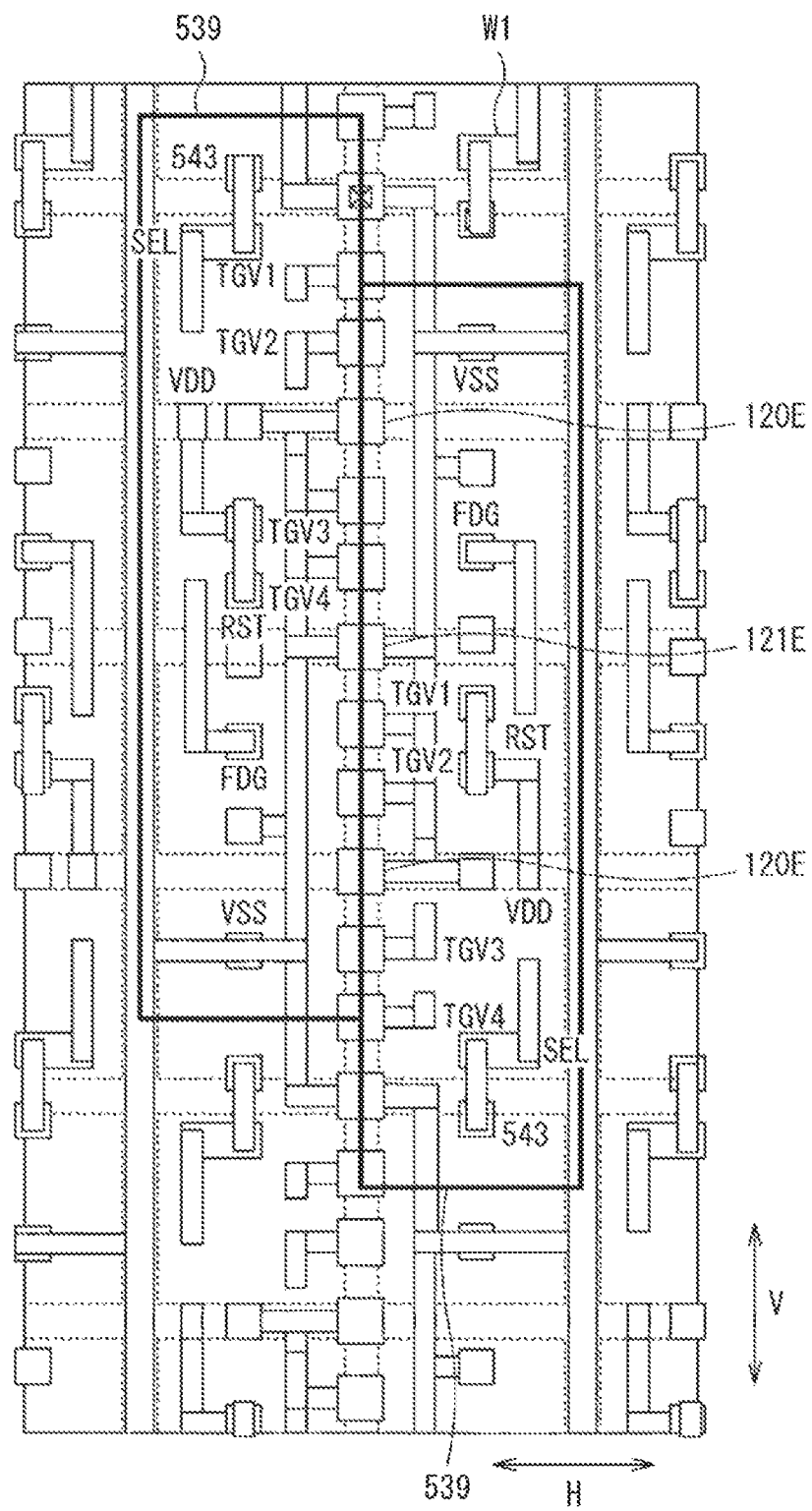
FIG. 10 is a schematic view illustrating an example of a planar configuration of the first wiring layer and a second wiring layer illustrated in FIG. 6.
Figure 11:
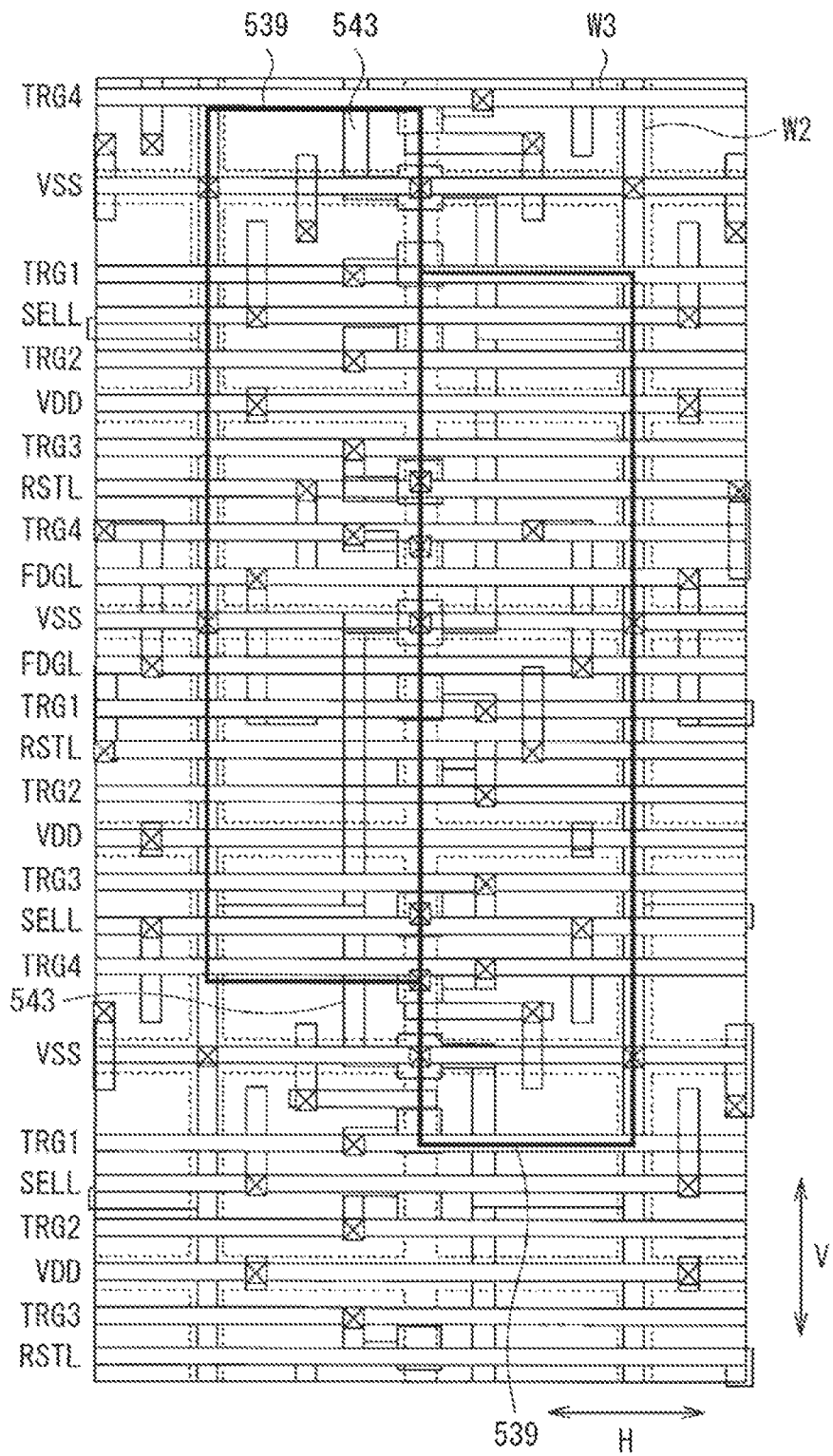
FIG. 11 is a schematic view illustrating an example of a planar configuration of the second wiring layer and a third wiring layer illustrated in FIG. 6.
Figure 12:
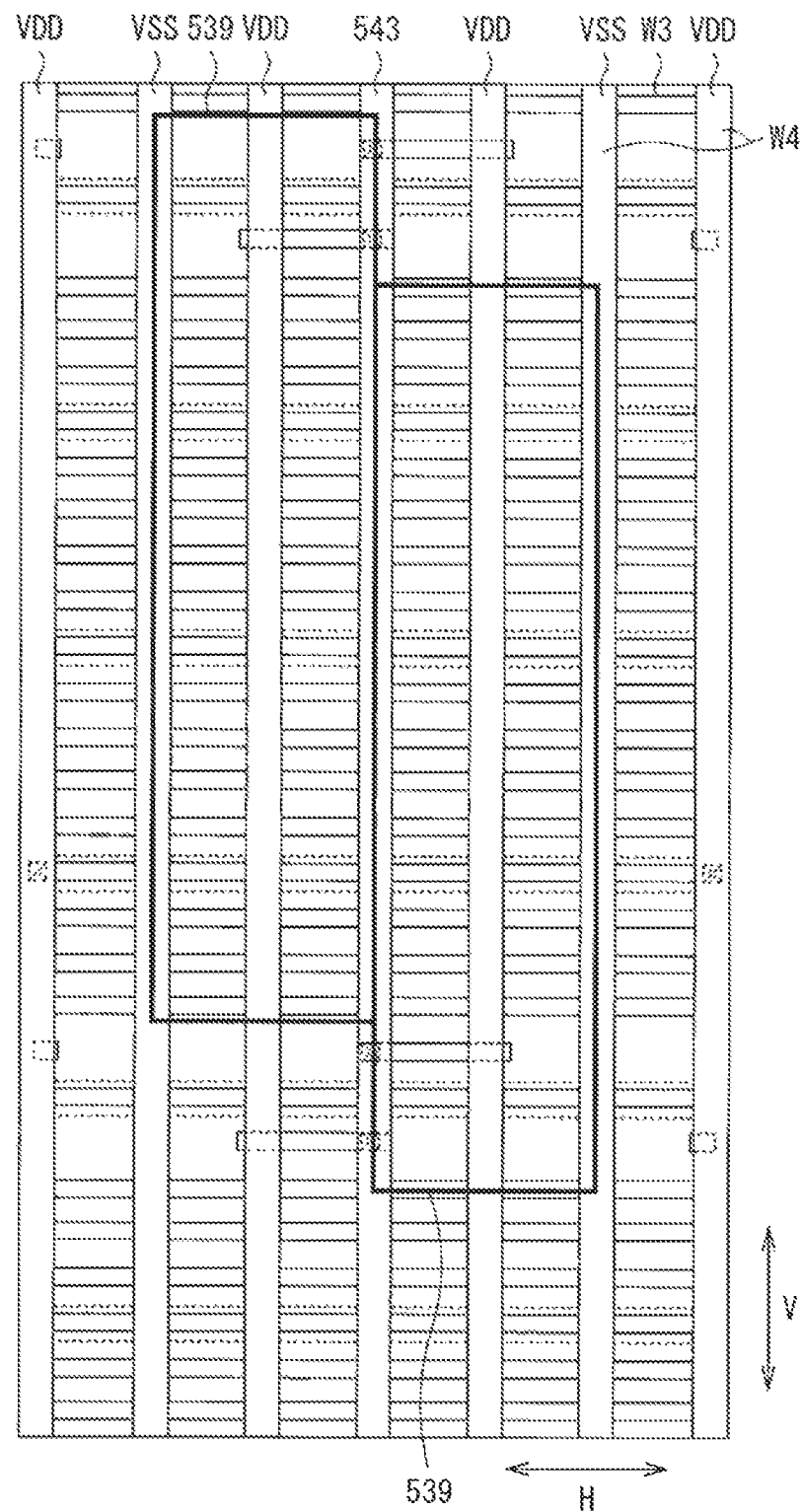
FIG. 12 is a schematic view illustrating an example of a planar configuration of the third wiring layer and a fourth wiring layer illustrated in FIG. 6.

FIGS. 8 to 12 schematically illustrate an example of a planar configuration of the second substrate 200. FIG. 8 illustrates a configuration of the pixel circuit 210 provided in the vicinity of the front surface of the semiconductor layer 200S. FIG. 9 schematically illustrates a configuration of each of portions of the wiring layer 200T (specifically, a first wiring layer W1 to be described below), the semiconductor layer 200S connected to the wiring layer 200T, and the first substrate 100. FIGS. 10 to 12 illustrate an example of a planar configuration of the wiring layer 200T. Hereinafter, the configuration of the second substrate 200 will be described with reference to FIGS. 8 to 12 together with FIG.

6. In FIGS. 8 and 9, the outer shape of the photodiode PD (boundary between the pixel isolation portion 117 and the photodiode PD) is indicated by a broken line, and a boundary between the semiconductor layer 200S and an element isolation region 213 or the insulating region 214 in a portion overlapping the gate electrode of each of transistors constituting the pixel circuit 210 is indicated by a dotted line. A portion overlapping the gate electrode of the amplification transistor AMP includes a boundary between the semiconductor layer 200S and the element isolation region 213 and a boundary between the element isolation region 213 and the insulating region 212 on one side in a channel width direction.

The second substrate 200 includes: the insulating region 212 that divides the semiconductor layer 200S; and the element isolation region 213 provided in a part of the semiconductor layer 200S in the thickness direction (FIG. 6). For example, the through-substrate electrodes 120E and 121E and the through-substrate electrodes TGV (through-substrate electrode TGV1, TGV2, TGV3, and TGV4) of the two pixel sharing units 539 connected to two pixel circuits 210 adjacent in the H direction are arranged in the insulating region 212 provided between the two pixel circuits 210 (FIG. 9).

The insulating region 212 has substantially the same thickness as the thickness of the semiconductor layer 200S (FIG. 6). The semiconductor layer 200S is divided by the insulating region 212. The through-substrate electrodes 120E and 121E and the through-substrate electrode TGV are disposed in the insulating region 212. The insulating region 212 is formed of silicon oxide, for example.

The through-substrate electrodes 120E and 121E are provided to penetrate the insulating region 212 in the thickness direction. The upper ends of the through-substrate electrodes 120E and 121E are connected to wiring (first wiring layer W1, second wiring layer W2, third wiring layer W3, and fourth wiring layer W4 to be described below) of the wiring layer 200T. The through-substrate electrodes 120E and 121E are provided to penetrate the insulating region 212, the bonding film 124, the interlayer insulating film 123, and the passivation film 122, and the lower ends of the electrodes are connected to the pad portions 120 and 121, respectively (FIG. 6). The through-substrate electrode 120E is provided for electrically connecting the pad portion 120 and the pixel circuit 210 to each other. That is, the floating diffusion FD of the first substrate 100 is electrically connected to the pixel circuit 210 of the second substrate 200 by the through-substrate electrode 120E. The through-substrate electrode 121E is provided for electrically connecting the pad portion 121 and the reference potential line VSS of the wiring layer 200T to each other. That is, the VSS contact region 118 of the first substrate 100 is electrically connected to the reference potential line VSS of the second substrate 200 by the through-substrate electrode 121E.

The through-substrate electrode TGV is provided to penetrate the insulating region 212 in the thickness direction. The upper end of the through-substrate electrode TGV is connected to the wiring of the wiring layer 200T. The through-substrate electrode TGV is provided to penetrate the insulating region 212, the bonding film 124, the interlayer insulating film 123, the passivation film 122, and the interlayer insulating film 119, and the lower end thereof is connected to the transfer gate TG (FIG. 6). Such a through-substrate electrode TGV is provided for electrically connecting the transfer gate TG (transfer gates TG1, TG2, TG3, and TG4) of each of the corresponding pixels 541A, 541B, 541C, and 541D to the wiring of the wiring layer 200T (part of the row drive signal line 542, specifically, wiring lines TRG1, TRG2, TRG3, and TRG4 in FIG. 11 to be described below). That is, by the through-substrate electrode TGV, the transfer gate TG of the first substrate 100 is electrically connected to the wiring TRG of the second substrate 200 and a drive signal is sent to each of the transfer transistors TR (transfer transistors TR1, TR2, TR3, and TR4).

The insulating region 212 is a region for insulating, from the semiconductor layer 200S, the through-substrate electrodes 120E and 121E and the through-substrate electrode TGV for electrically connecting the first substrate 100 and the second substrate 200 to each other. For example, the through-substrate electrodes 120E and 121E and the through-substrate electrode TGV (through-substrate electrode TGV1, TGV2, TGV3, and TGV4) connected to two pixel circuits 210 (pixel sharing unit 539) adjacent in the H direction are arranged in the insulating region 212 provided between the two pixel circuits 210. The insulating region 212 is provided to extend in the V direction, for example (FIGS. 8 and 9). Here, by appropriately arranging the horizontal portion TGb of the transfer gate TG, the through-substrate electrode TGV is disposed such that the position of the through-substrate electrode TGV in the H direction approaches the positions of the through-substrate electrodes 120E and 121E in the H direction as compared with the position of the vertical portion TGa (FIGS. 7A and 9). For example, the through-substrate electrode TGV is disposed at substantially the same position as the through-substrate electrodes 120E and 120E in the H direction. With this configuration, the through-substrate electrodes 120E and 121E and the through-substrate electrode TGV can be collectively disposed in the insulating region 212 extending in the V direction. As another arrangement example, it is also conceivable to provide the horizontal portion TGb only in a region overlapping the vertical portion TGa. In this case, the through-substrate electrode TGV would be formed substantially immediately above the vertical portion TGa, and for example, the through-substrate electrode TGV is disposed substantially at the central portion in the H direction and the V direction of each of the pixels 541. At this time, the position of the through-substrate electrode TGV in the H direction would greatly deviate from the positions of the through-substrate electrodes 120E and 121E in the H direction. For example, the insulating region 212 is provided around the through-substrate electrode TGV and the through-substrate electrodes 120E and 121E in order to electrically insulate these through-substrate electrodes from the adjacent semiconductor layer 200S. When the position of the through-substrate electrode TGV in the H direction and the positions of the through-substrate electrodes 120E and 121E in the H direction are greatly separated from each other, it would be necessary to provide the insulating region 212 independently around each of the through-substrate electrodes 120E, 121E, and TGV. This configuration would divide the semiconductor layer 200S into a large number of pieces. In comparison, the layout in which the through-substrate electrodes 120E and 121E and the through-substrate electrode TGV are collectively disposed in the insulating region 212 extending in the V direction can obtain a sufficiently large size of the semiconductor layer 200S in the H direction. This makes it possible to ensure a large area of the semiconductor element formation region in the semiconductor layer 200S. This configuration makes it possible, for example, to increase the size of the amplification transistor AMP and suppress noise.

As described with reference to FIG. 4, the pixel sharing unit 539 has a structure in which the floating diffusion FD provided in each of the plurality of pixels 541 is electrically connected, and the plurality of pixels 541 shares one pixel circuit 210. The floating diffusion FD is electrically connected to each other by the pad portion 120 provided on the first substrate 100 (FIGS. 6 and 7B). The electrical connection portion (pad portion 120) provided on the first substrate 100 and the pixel circuit 210 provided on the second substrate 200 are electrically connected via one through-substrate electrode 120E. In another conceivable structure example, an electrical connection portion between the floating diffusions FD can be provided on the second substrate 200. In this case, the pixel sharing unit 539 is provided with four through-substrate electrodes connected to the floating diffusions FD1, FD2, FD3, and FD4, respectively. This would result in, in the second substrate 200, the increased number of through-substrate electrodes penetrating the semiconductor layer 200S and enlargement of the insulating region 212 that insulates the surroundings of these through-substrate electrodes. In comparison, in the structure in which the pad portion 120 is provided on the first substrate 100 (FIGS. 6 and 7B), it is possible to achieve reduction in the number of through-substrate electrodes and downsizing of the insulating region 212. This makes it possible to ensure a large area of the semiconductor element formation region in the semiconductor layer 200S. This configuration makes it possible, for example, to increase the size of the amplification transistor AMP and suppress noise.

The element isolation region 213 is provided on the front surface side of the semiconductor layer 200S. The element isolation region 213 has a shallow trench isolation (STI) structure. In the element isolation region 213, the semiconductor layer 200S is engraved in the thickness direction (direction perpendicular to the main surface of the second substrate 200), and an insulating film is embedded in the engraved portion. This insulating film is formed of silicon oxide, for example. The element isolation region 213 isolates the plurality of elements, namely, transistors constituting the pixel circuit 210 from each other in accordance with the layout of the pixel circuit 210. The semiconductor layer 200S (specifically, the well region 211) extends below the element isolation region 213 (deep portion of the semiconductor layer 200S).

Here, with reference to FIGS. 7A, 7B, and 8, a difference between the outer shape (outer shape in the substrate planar direction) of the pixel sharing unit 539 on the first substrate 100 and the outer shape of the pixel sharing unit 539 on the second substrate 200 will be described.

In the imaging device 1, the pixel sharing unit 539 is provided in both the first substrate 100 and the second substrate 200. For example, the outer shape of the pixel sharing unit 539 provided on the first substrate 100 is different from the outer shape of the pixel sharing unit 539 provided on the second substrate 200.

In FIGS. 7A and 7B, the outline of the pixels 541A, 541B, 541C, and 541D is represented by a one-dot chain line, and the outer shape of the pixel sharing unit 539 is represented by a thick line. For example, the pixel sharing unit 539 of the first substrate 100 is formed with two pixels 541 (pixels 541A and 541B) arranged adjacent to each other in the H direction and two pixels 541 (pixels 541C and 541D) arranged adjacent to each other in the V direction. That is, the pixel sharing unit 539 of the first substrate 100 includes four pixels 541 in adjacent 2 rows×2 columns, giving the pixel sharing unit 539 of the first substrate 100 a substantially square outer shape. In the pixel array unit 540, such pixel sharing units 539 are arranged adjacent to each other at a two-pixel pitch (pitch corresponding to two pixels 541) in the H direction and a two-pixel pitch (pitch corresponding to two pixels 541) in the V direction.

In FIGS. 8 and 9, the outline of the pixels 541A, 541B, 541C, and 541D is represented by a one-dot chain line, and the outer shape of the pixel sharing unit 539 is represented by a thick line. For example, the outer shape of the pixel sharing unit 539 of the second substrate 200 is smaller than the pixel sharing unit 539 of the first substrate 100 in the H direction and larger than the pixel sharing unit 539 of the first substrate 100 in the V direction. For example, the pixel sharing unit 539 of the second substrate 200 is formed in a size (region) corresponding to one pixel in the H direction, and is formed in a size corresponding to four pixels in the V direction. That is, the pixel sharing unit 539 of the second substrate 200 is formed in a size corresponding to the pixels arranged in adjacent 1 row×4 columns, giving the pixel sharing unit 539 of the second substrate 200 a substantially rectangular outer shape.

For example, in each of the pixel circuits 210, the selection transistor SEL, the amplification transistor AMP, the reset transistor RST, and the FD conversion gain switching transistor FDG are arranged in this order in the V direction (FIG. 8). By providing the outer shape of each pixel circuit 210 in a substantially rectangular shape as described above, it is possible to arrange four transistors (selection transistor SEL, amplification transistor AMP, reset transistor RST, and FD conversion gain switching transistor FDG) side by side in one direction (V direction in FIG. 8). With this configuration, the drain of the amplification transistor AMP and the drain of the reset transistor RST can be shared by one diffusion region (diffusion region connected to the power supply line VDD). For example, the formation region of each of the pixel circuits 210 can be provided in a substantially square shape (refer to FIG. 21 described below). In this case, two transistors are arranged along one direction, making it difficult to share the drain of the amplification transistor AMP and the drain of the reset transistor RST in one diffusion region. Therefore, the formation region of the pixel circuit 210 provided in a substantially rectangular shape will facilitate arrangement of the four transistors so as to be close to each other, making it possible to downsize the formation region of the pixel circuit 210. This leads to miniaturization of the pixels. Furthermore, when there is no need to reduce the formation region of the pixel circuit 210, the formation region of the amplification transistor AMP can be increased to suppress noise.

For example, in the vicinity of the front surface of the semiconductor layer 200S, a VSS contact region 218 connected to the reference potential line VSS is provided in addition to the selection transistor SEL, the amplification transistor AMP, the reset transistor RST, and the FD conversion gain switching transistor FDG. The VSS contact region 218 is formed with a p-type semiconductor region, for example. The VSS contact region 218 is electrically connected to the VSS contact region 118 of the first substrate 100 (semiconductor layer 100S) via the wiring of the wiring layer 200T and the through-substrate electrode 121E. The VSS contact region 218 is provided at a position adjacent to the source of the FD conversion gain switching transistor FDG with the element isolation region 213 interposed therebetween, for example (FIG. 8).

Next, a positional relationship between the pixel sharing unit 539 provided on the first substrate 100 and the pixel sharing unit 539 provided on the second substrate 200 will be described with reference to FIGS. 7B and 8. For example, one pixel sharing unit 539 (for example, one on the upper side of FIG. 7B) out of the two pixel sharing units 539 arranged in the V direction on the first substrate 100 is connected to one pixel sharing unit 539 (for example, one on the left side of FIG. 8) out of the two pixel sharing units 539 arranged in the H direction on the second substrate 200. For example, the other pixel sharing unit 539 (for example, one on the lower side of FIG. 7B) out of the two pixel sharing units 539 arranged in the V direction on the first substrate 100 is connected to the other pixel sharing unit 539 (for example, one on the right side of FIG. 8) out of the two pixel sharing units 539 arranged in the H direction on the second substrate 200.

For example, in the two pixel sharing units 539 arranged in the H direction of the second substrate 200, the internal layout (arrangement of transistors and the like) of one pixel sharing unit 539 is substantially equal to the layout obtained by inverting the internal layout of the other pixel sharing unit 539 in the V direction and the H direction. Hereinafter, effects obtained by this layout will be described.

In the two pixel sharing units 539 arranged in the V direction of the first substrate 100, each of the pad portions 120 is arranged at the central portion of the outer shape of the pixel sharing unit 539, that is, at the central portion in the V direction and the H direction of the pixel sharing unit 539 (FIG. 7B). On the other hand, the pixel sharing unit 539 of the second substrate 200 has a substantially rectangular outer shape long in the V direction as described above, and thus, the amplification transistor AMP connected to the pad portion 120 is disposed at a position shifted upward in the drawing from the center of the pixel sharing unit 539 in the V direction, for example. For example, when the two pixel sharing units 539 arranged in the H direction of the second substrate 200 have the same internal layout, the distance between the amplification transistor AMP of one pixel sharing unit 539 and the pad portion 120 (for example, the pad portion 120 of the pixel sharing unit 539 on the upper side of FIG. 7) becomes relatively short. However, the distance between the amplification transistor AMP of the other pixel sharing unit 539 and the pad portion 120 (for example, the pad portion 120 of the pixel sharing unit 539 on the lower side of FIG. 7) becomes long. This increases the area of the wiring required for connecting the amplification transistor AMP and the pad portion 120, leading to a concern of complication of the wiring layout of the pixel sharing unit 539. This may affect miniaturization of the imaging device 1.

In contrast, by inverting the internal layout of the two pixel sharing units 539 arranged in the H direction of the second substrate 200 at least in the V direction, it is possible to shorten the distance between the amplification transistor AMP and the pad portion 120 of both of the two pixel sharing units 539. This makes it easy to miniaturize the imaging device 1 as compared with the configuration in which the two pixel sharing units 539 arranged in the H direction of the second substrate 200 have the same internal layout. Although the planar layout of each of the plurality of pixel sharing units 539 of the second substrate 200 is bilaterally symmetrical in the range illustrated in FIG. 8, the layout is bilaterally asymmetrical when including the layout of the first wiring layer W1 illustrated in FIG. 9 to be described below.

Furthermore, it is preferable that the internal layouts of the two pixel sharing units 539 arranged in the H direction of the second substrate 200 are also inverted in the H direction. Hereinafter, the reason for this will be described. As illustrated in FIG. 9, each of the two pixel sharing units 539 arranged in the H direction on the second substrate 200 is connected to each of the pad portions 120 and 121 of the first substrate 100. For example, the pad portions 120 and 121 are disposed at the central portion in the H direction (between the two pixel sharing units 539 arranged in the H direction) of the two pixel sharing units 539 arranged in the H direction on the second substrate 200. Therefore, by inverting the internal layouts of the two pixel sharing units 539 arranged in the H direction of the second substrate 200 also in the H direction, it is possible to reduce the distance between each of the plurality of pixel sharing units 539 of the second substrate 200 and each of the pad portions 120 and 121. This makes it further easier to miniaturize the imaging device 1.

Furthermore, the position of the outline of the pixel sharing unit 539 of the second substrate 200 does not have to be aligned with the position of any of the outlines of the pixel sharing units 539 of the first substrate 100. For example, in one pixel sharing unit 539 (for example, the one on the left side of FIG. 9) out of the two pixel sharing units 539 arranged in the H direction on the second substrate 200, one outline (for example, one on the upper side of FIG. 9) in the V direction is arranged outside the outline of one outline in the V direction of the pixel sharing unit 539 (for example, one on the upper side of FIG. 7B) of the corresponding first substrate 100. Furthermore, in the other pixel sharing unit 539 (for example, the one on the right side of FIG. 9) out of the two pixel sharing units 539 arranged in the H direction on the second substrate 200, the other outline (for example, one on the lower side of FIG. 9) in the V direction is arranged outside the outline of the other outline in the V direction of the pixel sharing unit 539 (for example, one on the lower side of FIG. 7B) of the corresponding first substrate 100. In this manner, by arranging the pixel sharing unit 539 of the second substrate 200 and the pixel sharing unit 539 of the first substrate 100 to correspond to each other, it is possible to shorten the distance between the amplification transistor AMP and the pad portion 120. This makes it easier to miniaturize the imaging device 1.

Furthermore, the positions of the outlines of the plurality of pixel sharing units 539 of the second substrate 200 do not need to be aligned. For example, the two pixel sharing units 539 arranged in the H direction of the second substrate 200 are arranged such that their outline positions in the V direction are shifted with each other. This configuration makes it possible to shorten the distance between the amplification transistor AMP and the pad portion 120. This makes it easier to miniaturize the imaging device 1.

The repeated arrangement of the pixel sharing units 539 in the pixel array unit 540 will be described with reference to FIGS. 7B and 9. The pixel sharing unit 539 of the first substrate 100 has the size of two pixels 541 in the H direction and the size of two pixels 541 in the V direction (FIG. 7B). For example, in the pixel array unit 540 of the first substrate 100, the pixel sharing unit 539 having the size corresponding to the four pixels 541 is repeatedly arranged adjacent to each other at a pitch of two pixels in the H direction (a pitch corresponding to two pixels 541) and at a pitch of two pixels in the V direction (a pitch corresponding to two pixels 541). Alternatively, the pixel array unit 540 of the first substrate 100 may include a pair of pixel sharing units 539 in which two pixel sharing units 539 are arranged adjacent to each other in the V direction. In the pixel array unit 540 of the first substrate 100, for example, the pair of pixel sharing units 539 adjacent to each other is repeatedly arranged at a pitch of two pixels in the H direction (a pitch corresponding to two pixels 541) and at a pitch of four pixels in the V direction (a pitch corresponding to four pixels 541). The pixel sharing unit 539 of the second substrate 200 has the size of one pixel 541 in the H direction and the size of four pixels 541 in the V direction (FIG. 9). For example, the pixel array unit 540 of the second substrate 200 includes a pair of pixel sharing units 539 including two pixel sharing units 539 having a size corresponding to the four pixels 541. The pixel sharing units 539 are arranged adjacent to each other in the H direction and are arranged to be shifted from each other in the V direction. In the pixel array unit 540 of the second substrate 200, for example, the pair of pixel sharing units 539 adjacent to each other is repeatedly arranged without a gap at a pitch of two pixels in the H direction (a pitch corresponding to two pixels 541) and at a pitch of four pixels in the V direction (a pitch corresponding to four pixels 541). Such repetitive arrangement of the pixel sharing units 539 enables the pixel sharing units 539 to be arranged without any gap. This makes it easier to miniaturize the imaging device 1.

The amplification transistor AMP preferably has a three-dimensional structure such as a Fin-shaped transistor, for example (FIG. 6). This increases the effective gate width, making it possible to suppress noise. The selection transistor SEL, the reset transistor RST, and the FD conversion gain switching transistor FDG have, for example, a planar structure. The amplification transistor AMP may have a planar structure. Alternatively, the selection transistor SEL, the reset transistor RST, or the FD conversion gain switching transistor FDG may have a three-dimensional structure.

The wiring layer 200T includes, for example, a passivation film 221, an interlayer insulating film 222, and a plurality of wiring layers (a first wiring layer W1, a second wiring layer W2, a third wiring layer W3, and a fourth wiring layer W4). For example, the passivation film 221 is in contact with the front surface of the semiconductor layer 200S and covers the entire front surface of the semiconductor layer 200S. The passivation film 221 covers the gate electrodes of the selection transistor SEL, the amplification transistor AMP, the reset transistor RST, and the FD conversion gain switching transistor FDG individually. The interlayer insulating film 222 is provided between the passivation film 221 and the third substrate 300. The interlayer insulating film 222 isolates the plurality of wiring layers (first wiring layer W1, second wiring layer W2, third wiring layer W3, and fourth wiring layer W4) from each other. The interlayer insulating film 222 is formed of silicon oxide, for example.

The wiring layer 200T includes, from the semiconductor layer 200S side, a first wiring layer W1, a second wiring layer W2, a third wiring layer W3, a fourth wiring layer W4, and the contact portions 201 and 202 in this order, and these portions are insulated from each other by the interlayer insulating film 222. The interlayer insulating film 222 includes a plurality of connection portions that connects the first wiring layer W1, the second wiring layer W2, the third wiring layer W3 or the fourth wiring layer W4 with their lower layers. The connection portion is a portion obtained by embedding a conductive material in a connection hole provided in the interlayer insulating film 222. For example, the interlayer insulating film 222 includes a connection portion 218V that connects the first wiring layer W1 and the VSS contact region 218 of the semiconductor layer 200S. For example, the hole diameter of the connection portion connecting the elements of the second substrate 200 is different from the hole diameters of the through-substrate electrodes 120E and 121E and the through-substrate electrode TGV. Specifically, the hole diameter of the connection hole connecting the elements of the second substrate 200 is preferably smaller than the hole diameters of the through-substrate electrodes 120E and 121E and the through-substrate electrode TGV. Hereinafter, the reason for this will be described. The depth of the connection portion provided in the wiring layer 200T (the connection portion 218V or the like) is smaller than the depths of the through-substrate electrodes 120E and 121E and the through-substrate electrode TGV. Therefore, the connection portion can easily fill the connection hole with the conductive material as compared with the through-substrate electrodes 120E and 121E and the through-substrate electrode TGV. By forming the hole diameter of the connection portion smaller than the hole diameters of the through-substrate electrodes 120E and 121E and the through-substrate electrode TGV, it is possible to facilitate miniaturization of the imaging device 1.

For example, the through-substrate electrode 120E is connected to the gate of the amplification transistor AMP and the source of the FD conversion gain switching transistor FDG (specifically, a connection hole reaching the source of the FD conversion gain switching transistor FDG) by the first wiring layer W1. The first wiring layer W1 connects the through-substrate electrode 121E and the connection portion 218V to each other, for example, enabling electrical connection between the VSS contact region 218 of the semiconductor layer 200S and the VSS contact region 118 of the semiconductor layer 100S.

Next, a planar configuration of the wiring layer 200T will be described with reference to FIGS. 10 to 12. FIG. 10 illustrates an example of a planar configuration of the first wiring layer W1 and the second wiring layer W2. FIG. 11 illustrates an example of a planar configuration of the second wiring layer W2 and the third wiring layer W3. FIG. 12 illustrates an example of a planar configuration of the third wiring layer W3 and the fourth wiring layer W4.

For example, the third wiring layer W3 includes wiring lines TRG1, TRG2, TRG3, TRG4, SELL, RSTL, and FDGL extending in the H direction (row direction) (FIG. 11). These wiring lines correspond to the plurality of row drive signal lines 542 described with reference to FIG. 4. The wiring lines TRG1, TRG2, TRG3, and TRG4 are provided for sending drive signals to the transfer gates TG1, TG2, TG3, and TG4, respectively. The wiring lines TRG1, TRG2, TRG3, and TRG4 are respectively connected to the transfer gates TG1, TG2, TG3, and TG4 via the second wiring layer W2, the first wiring layer W1, and the through-substrate electrode 120E. The wiring line SELL is provided for sending a drive signal to the gate of the selection transistor SEL, the wiring line RSTL is provided for sending a drive signal to the gate of the reset transistor RST, and the wiring line FDGL is provided for sending a drive signal to the gate of the FD conversion gain switching transistor FDG. The wiring lines SELL, RSTL, and FDGL are connected to the gates of the selection transistor SEL, the reset transistor RST, and the FD conversion gain switching transistor FDG via the second wiring layer W2, the first wiring layer W1, and the connection portion, respectively.

For example, the fourth wiring layer W4 includes a power supply line VDD, a reference potential line VSS, and a vertical signal line 543 extending in the V direction (column direction) (FIG. 12). The power supply line VDD is connected to the drain of the amplification transistor AMP and the drain of the reset transistor RST via the third wiring layer W3, the second wiring layer W2, the first wiring layer W1, and the connection portion. The reference potential line VSS is connected to the VSS contact region 218 via the third wiring layer W3, the second wiring layer W2, the first wiring layer W1, and the connection portion 218V. In addition, the reference potential line VSS is connected to the VSS contact region 118 of the first substrate 100 via the third wiring layer W3, the second wiring layer W2, the first wiring layer W1, the through-substrate electrode 121E, and the pad portion 121. The vertical signal line 543 is connected to the source (Vout) of the selection transistor SEL via the third wiring layer W3, the second wiring layer W2, the first wiring layer W1, and the connection portion.

The contact portions 201 and 202 may be provided at a position overlapping the pixel array unit 540 in plan view (for example, FIG. 3), or may be provided in the peripheral portion 540B outside the pixel array unit 540 (for example, FIG. 6). The contact portions 201 and 202 are provided on the front surface (surface on the wiring layer 200T side) of the second substrate 200. The contact portions 201 and 202 are formed of metal such as copper (Cu) and aluminum (Al), for example. The contact portions 201 and 202 are exposed on the front surface (surface on the third substrate 300 side) of the wiring layer 200T. The contact portions 201 and 202 are used for electrical connection between the second substrate 200 and the third substrate 300 and bonding between the second substrate 200 and the third substrate 300.

FIG. 6 illustrates an example in which a peripheral circuit is provided in the peripheral portion 540B of the second substrate 200. This peripheral circuit may include a part of the row drive unit 520, a part of the column signal processing unit 550, and the like. Furthermore, as illustrated in FIG. 3, the connection holes H1 and H2 may be arranged in the vicinity of the pixel array unit 540, instead of disposing the peripheral circuit in the peripheral portion 540B of the second substrate 200.

The third substrate 300 includes the wiring layer 300T and the semiconductor layer 300S in this order from the second substrate 200 side, for example. For example, the front surface of the semiconductor layer 300S is provided on the second substrate 200 side. The semiconductor layer 300S is formed with a silicon substrate. The semiconductor layer 300S includes a circuit provided at its portion on the front surface side. Specifically, for example, the portion on the front surface side of the semiconductor layer 300S includes at least a part of the input unit 510A, the row drive unit 520, the timing control unit 530, the column signal processing unit 550, the image signal processing unit 560, and the output unit 510B. The wiring layer 300T provided between the semiconductor layer 300S and the second substrate 200 includes an interlayer insulating film, a plurality of wiring layers isolated by the interlayer insulating film, and the contact portions 301 and 302. The contact portions 301 and 302 are exposed on the front surface (the surface on the second substrate 200 side) of the wiring layer 300T, with the contact portion 301 being in contact with the contact portion 201 of the second substrate 200, and with the contact portion 302 being in contact with the contact portion 202 of the second substrate 200, individually. The contact portions 301 and 302 are electrically connected to a circuit (for example, at least one of the input unit 510A, the row drive unit 520, the timing control unit 530, the column signal processing unit 550, the image signal processing unit 560, or the output unit 510B) formed in the semiconductor layer 300S. The contact portions 301 and 302 are formed of metal such as copper (Cu) and aluminum (Al), for example. For example, an external terminal TA is connected to the input unit 510A via the connection hole H1, while an external terminal TB is connected to the output unit 510B via the connection hole H2.

Here, features of the imaging device 1 will be described.

Typically, an imaging device includes a photodiode and a pixel circuit, as main components. Here, increasing the area of the photodiode will increase the charge generated as a result of photoelectric conversion. As a result, the signal/noise ratio (S/N ratio) of the pixel signal is improved, and the imaging device can output better image data (image information). In contrast, increasing the size of the transistor (particularly, the size of the amplification transistor) included in the pixel circuit will decrease the noise generated in the pixel circuit. As a result, the S/N ratio of the imaging signal is improved, enabling the imaging device to output better image data (image information).

However, in an imaging device in which a photodiode and a pixel circuit are provided on the same semiconductor substrate, increasing the area of the photodiode in a limited area of the semiconductor substrate might decrease the size of a transistor included in the pixel circuit. Furthermore, increasing the size of the transistor included in the pixel circuit might decrease the area of the photodiode.

In order to solve these problems, for example, the imaging device 1 of the present embodiment uses a structure in which a plurality of pixels 541 shares one pixel circuit 210 and the shared pixel circuit 210 is arranged to overlap the photodiode PD. This configuration makes it possible to realize maximization of the area of the photodiode PD and maximization of the size of the transistor included in the pixel circuit 210 within the limited area of the semiconductor substrate. This configuration makes it possible to improve the S/N ratio of the pixel signal, enabling the imaging device 1 to output better image data (image information).

In implementation of a structure in which the plurality of pixels 541 shares one pixel circuit 210 and the shared pixel circuit 210 is arranged to overlap the photodiode PD, a plurality of wiring lines connected to one pixel circuit 210 extends from the floating diffusion FD of each of the plurality of pixels 541. In order to ensure a large area of the semiconductor substrate 200 forming the plurality of pixel circuits 210, a plurality of extending wiring lines can be mutually connected to form integrated connected wiring. Similarly, for the plurality of wiring lines extending from the VSS contact region 118, it is possible to mutually connect the plurality of extending wiring lines to form the integrated connected wiring.

Forming a connected wiring that mutually connects a plurality of wiring lines extending from the floating diffusion FD of each of the plurality of pixels 541 in the semiconductor substrate 200 on which the pixel circuit 210 is to be formed, however, would lead to a conceivable concern of decreasing an area for forming transistors included in the pixel circuit 210. Similarly, forming an integrated connected wiring of mutually connecting a plurality of wiring lines extending from the VSS contact region 118 of each of the plurality of pixels 541 in the semiconductor substrate 200 on which the pixel circuit 210 is to be formed would lead to a conceivable concern of decreasing the area for forming the transistors included in the pixel circuit 210.

In order to solve these problems, for example, the imaging device 1 of the present embodiment can use a structure in which a plurality of pixels 541 shares one pixel circuit 210, and the shared pixel circuit 210 is arranged to overlap the photodiode PD, the structure being a structure in which an integrated connected wiring of mutually connecting the floating diffusions FD of each of the plurality of pixels 541, and an integrated connected wiring of mutually connecting the VSS contact regions 118 included in each of the plurality of pixels 541, are provided on the first substrate 100.

Here, by utilizing the second manufacturing method described above as the manufacturing method for providing, on the first substrate 100, the integrated connected wiring of mutually connecting the floating diffusion FD of each of the plurality of pixels 541 and the integrated connected wiring of mutually connecting the VSS contact region 118 of each of the plurality of pixels 541, it is possible to achieve manufacturing using an appropriate process according to the configuration of each of the first substrate 100 and the second substrate 200, leading to the manufacture of an imaging device with high quality and high performance. In addition, the connected wiring of the first substrate 100 and the second substrate 200 can be formed by a facilitated process. Specifically, in the case of using the second manufacturing method, an electrode connected to the floating diffusion FD and an electrode connected to the VSS contact region 118 are each provided on the front surface of the first substrate 100 and the front surface of the second substrate 200, which are the bonding boundary surfaces between the first substrate 100 and the second substrate 200. Furthermore, it is preferable to enlarge the electrodes formed on the front surfaces of the two substrates, namely, the first substrate 100 and the second substrate 200 so that the electrodes formed on the front surfaces of the two substrates come into contact with each other even when misalignment occurs between the electrodes provided on the front surfaces of the two substrates when the two substrates are bonded together. In this case, however, there is a conceivable concern of difficulty in disposing the electrodes in a limited area of individual pixels included in the imaging device 1.

In order to solve the problem of requirement for a large electrode at the bonding boundary surface between the first substrate 100 and the second substrate 200, the imaging device 1 of the present embodiment can use, for example, the first manufacturing method described above as the manufacturing method in which the plurality of pixels 541 shares one pixel circuit 210, and the shared pixel circuit 210 is arranged to overlap the photodiode PD. With this configuration, it is possible to facilitate alignment of elements formed on the first substrate 100 and the second substrate 200 with each other, leading to achievement of manufacturing a high-quality and high-performance imaging device. Furthermore, a unique structure generated by using this manufacturing method can be provided. That is, the imaging device includes a structure in which the semiconductor layer 100S, the wiring layer 100T of the first substrate 100, and the semiconductor layer 200S and the wiring layer 200T of the second substrate 200, are stacked in this order, in other words, a structure in which the first substrate 100 and the second substrate 200 are stacked in a face-to-back arrangement, and the device is provided with the through-substrate electrodes 120E and 121E penetrating from the front surface of the semiconductor layer 200S of the second substrate 200 through the semiconductor layer 200S and the wiring layer 100T of the first substrate 100 to reach the front surface of the semiconductor layer 100S of the first substrate 100.

Regarding this structure, however, having the integrated connected wiring of mutually connecting the floating diffusion FD of each of the plurality of pixels 541, and the integrated connected wiring of mutually connecting the VSS contact region 118 of each of the plurality of pixels 541, being provided on the first substrate 100, stacking this structure and the second substrate 200 using the first manufacturing method and then forming the pixel circuit 210 on the second substrate 200 would lead to a possibility that the heating process necessary at formation of the active elements included in the pixel circuit 210 might affect the connected wiring that has been formed on the first substrate 100.

Therefore, in order to solve the problem that the connected wiring is affected by the heating process at formation of active elements, it is desirable that the imaging device 1 of the present embodiment use a conductive material having high heat resistance for the integrated connected wiring of mutually connecting the floating diffusion FD of each of the plurality of pixels 541 and the integrated connected wiring of mutually connecting the VSS contact regions 118 of each of the plurality of pixels 541. Specifically, as the conductive material having high heat resistance, it is possible to use a material having a melting point higher than that of at least a part of the wiring material included in the wiring layer 200T of the second substrate 200.

In this manner, for example, the imaging device 1 of the present embodiment includes: (1) a structure in which the first substrate 100 and the second substrate 200 are stacked in a face-to-back arrangement (specifically, a structure in which the semiconductor layer 100S and the wiring layer 100T of the first substrate 100, and the semiconductor layer 200S and the wiring layer 200T of the second substrate 200 are stacked in this order); (2) a structure in which the through-substrate electrodes 120E and 121E are provided from the front surface of the semiconductor layer 200S of the second substrate 200, penetrating through the semiconductor layer 200S and the wiring layer 100T of the first substrate 100 to reach the front surface of the semiconductor layer 100S of the first substrate 100; and (3) a structure in which the integrated connected wiring of mutually connecting the floating diffusion FD included in each of the plurality of pixels 541, and the integrated connected wiring of mutually connecting the VSS contact regions 118 included in each of the plurality of pixels 541, are formed of a conductive material having high heat resistance. With this configuration, it is possible to provide the integrated connected wiring of mutually connecting the floating diffusion FD included in each of the plurality of pixels 541 and the integrated connected wiring of mutually connecting the VSS contact regions 118 included in each of the plurality of pixels 541, on the first substrate 100 without providing a large electrode at the boundary surface between the first substrate 100 and the second substrate 200.

[Operations of Imaging Device 1]

Figure 13:
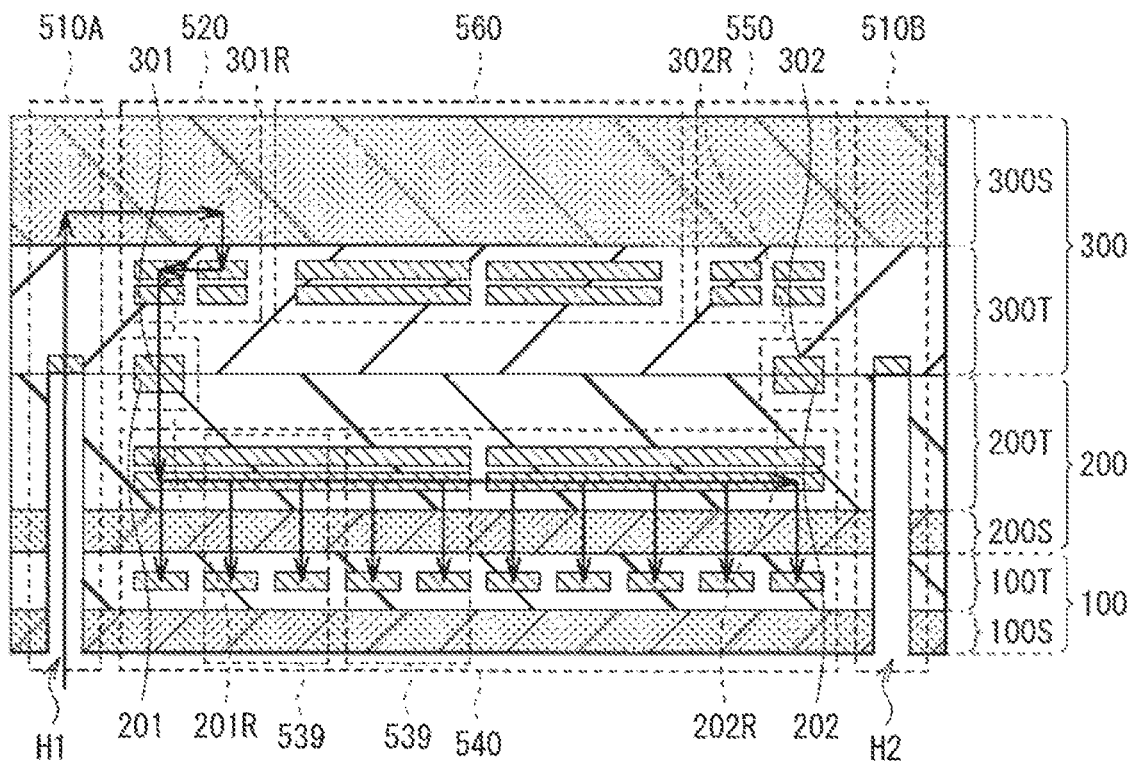
FIG. 13 is a schematic view illustrating a route of an input signal to the imaging device illustrated in FIG. 3.
Figure 14:
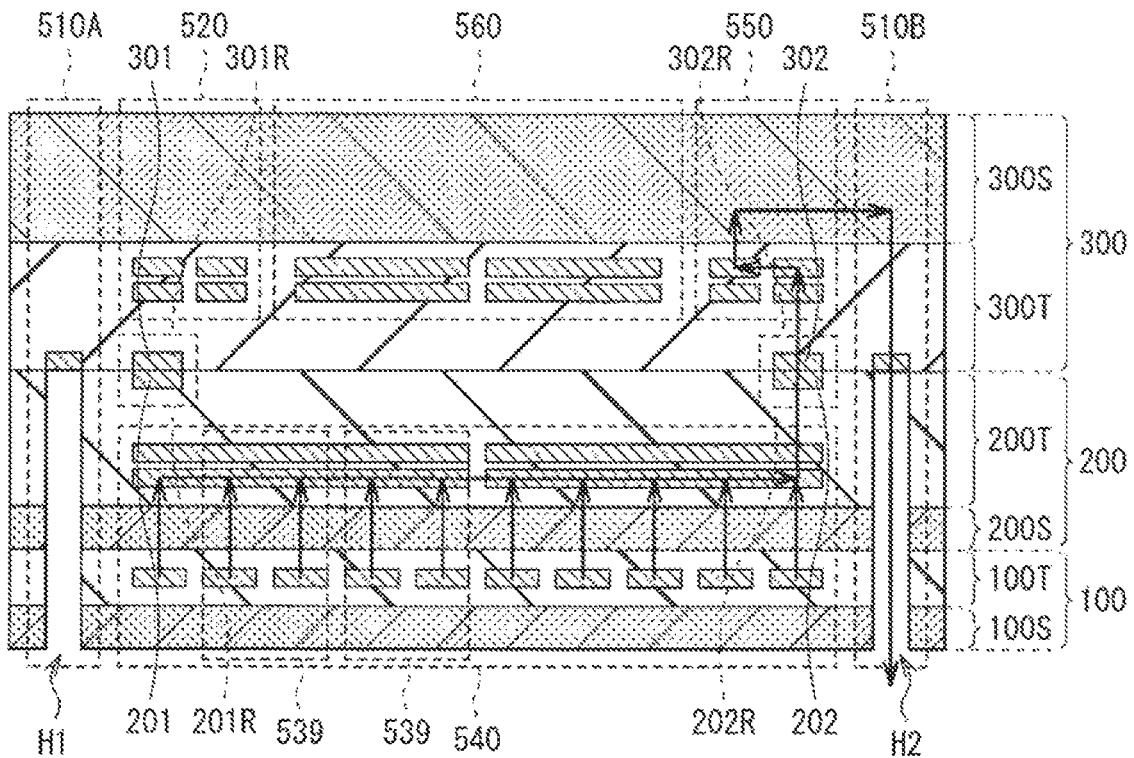
FIG. 14 is a schematic view illustrating a signal route of a pixel signal of the imaging device illustrated in FIG. 3.

Next, operations of the imaging device 1 will be described with reference to FIGS. 13 and 14. FIGS. 13 and 14 are diagrams having arrows representing routes of individual signals added to FIG. 3. In FIG. 13, routes of an input signal input to the imaging device 1 from the outside and routes of a power supply potential and a reference potential are indicated by arrows. In FIG. 14, a signal route regarding a pixel signal output from the imaging device 1 to the outside is indicated by arrows. For example, an input signal (for example, a pixel clock and a synchronization signal) input to the imaging device 1 via the input unit 510A is transmitted to the row drive unit 520 of the third substrate 300 to allow the row drive unit 520 to generate a row drive signal. The row drive signal is sent to the second substrate 200 via the contact portions 301 and 201. Furthermore, the row drive signal reaches each of the pixel sharing units 539 of the pixel array unit 540 via the row drive signal line 542 in the wiring layer 200T. Among the row drive signals reaching the pixel sharing unit 539 of the second substrate 200, drive signals other than those for the transfer gate TG are input to the pixel circuit 210 so as to drive each of transistors included in the pixel circuit 210. The drive signal for the transfer gate TG is input to the transfer gates TG1, TG2, TG3, and TG4 of the first substrate 100 via the through-substrate electrode TGV so as to drive the pixels 541A, 541B, 541C, and 541D (FIG.

13). Furthermore, the power supply potential and the reference potential supplied from the outside of the imaging device 1 to the input unit 510A (input terminal 511) of the third substrate 300 are sent to the second substrate 200 via the contact portions 301 and 201, and supplied to the pixel circuit 210 of each of the pixel sharing units 539 via the wiring in the wiring layer 200T. The reference potential is further supplied to the pixels 541A, 541B, 541C, and 541D of the first substrate 100 via the through-substrate electrode 121E. On the other hand, the pixel signal photoelectrically converted by the pixels 541A, 541B, 541C, and 541D of the first substrate 100 is sent to the pixel circuit 210 of the second substrate 200 for each of the pixel sharing units 539 via the through-substrate electrode 120E. The pixel signal based on this pixel signal is sent from the pixel circuit 210 to the third substrate 300 via the vertical signal line 543 and the contact portions 202 and 302. This pixel signal is processed by the column signal processing unit 550 and the image signal processing unit 560 of the third substrate 300, and then output to the outside via the output unit 510B.

[Effects]

In the present embodiment, the pixels 541A, 541B, 541C, and 541D (pixel sharing unit 539) and the pixel circuit 210 are provided on mutually different substrates (first substrate 100 and second substrate 200, respectively). With this configuration, the areas of the pixels 541A, 541B, 541C, and 541D and the pixel circuit 210 can be enlarged as compared with a case where the pixels 541A, 541B, 541C, and 541D and the pixel circuit 210 are formed on the same substrate. As a result, the amount of pixel signals obtained by photoelectric conversion can be increased, and transistor noise of the pixel circuit 210 can be reduced. This makes it possible to improve the signal/noise ratio of the pixel signal, enabling the imaging device 1 to output better pixel data (image information). In addition, it is possible to achieve miniaturization of the imaging device 1 (in other words, reduction of the pixel size and downsizing of the imaging device 1). By reducing the pixel size, the imaging device 1 can increase the number of pixels per unit area and can output a high-quality image.

Furthermore, in the imaging device 1, the first substrate 100 and the second substrate 200 are electrically connected to each other by the through-substrate electrodes 120E and 121E provided in the insulating region 212. For example, there is a conceivable method of connecting the first substrate 100 and the second substrate 200 by bonding pad electrodes to each other, or a method of connecting the first substrate 100 and the second substrate 200 by through-substrate wiring (for example, through Si via (TSV)) penetrating the semiconductor layer. As compared with such a method, by providing the through-substrate electrodes 120E and 121E in the insulating region 212, it is possible to decrease the area required for connecting the first substrate 100 and the second substrate 200 to each other. This configuration makes it possible to reduce the pixel size and further downsize the imaging device 1. Furthermore, further miniaturization of the area per pixel leads to achievement of higher resolution. When there is no need to reduce the chip size, the formation region of the pixels 541A, 541B, 541C, and 541D and the pixel circuit 210 can be enlarged. As a result, the amount of pixel signals obtained by photoelectric conversion can be increased, with reduction of the noise of the transistor included in the pixel circuit 210. This makes it possible to improve the signal/noise ratio of the pixel signal, enabling the imaging device 1 to output better pixel data (image information).

Furthermore, in the imaging device 1, the pixel circuit 210 is provided on a substrate (the second substrate 200) different from the substrate (the third substrate 300) on which the column signal processing unit 550 and the image signal processing unit 560 are provided. With this configuration, the area of the pixel circuit 210 and the areas of the column signal processing unit 550 and the image signal processing unit 560 can be enlarged as compared with the case where the pixel circuit 210 is formed on the same substrates as that for the column signal processing unit 550 and the image signal processing unit 560. This makes it possible to reduce the noise generated in the column signal processing unit 550, enabling a further advanced image processing circuit to be mounted by using the image signal processing unit 560. This leads to improvement of the signal/noise ratio of the pixel signal, enabling the imaging device 1 to output better pixel data (image information).

Furthermore, in the imaging device 1, the pixel array unit 540 is provided on the first substrate 100 and the second substrate 200, and the column signal processing unit 550 and the image signal processing unit 560 are provided on the third substrate 300. In addition, the contact portions 201, 202, 301, and 302 connecting the second substrate 200 and the third substrate 300 are formed above the pixel array unit 540. This enables flexible layout of the contact portions 201, 202, 301, and 302 without receiving layout interference from various wiring lines provided in the pixel array. Accordingly, the contact portions 201, 202, 301, and 302 can be applied to electrical connection between the second substrate 200 and the third substrate 300. With application of the contact portions 201, 202, 301, 302, for example, the column signal processing unit 550 and the image signal processing unit 560 have a higher degree of freedom in layout. This makes it possible to reduce the noise generated in the column signal processing unit 550, enabling a further advanced image processing circuit to be mounted by using the image signal processing unit 560. This leads to improvement of the signal/noise ratio of the pixel signal, enabling the imaging device 1 to output better pixel data (image information).

Furthermore, in the imaging device 1, the pixel isolation portion 117 penetrates the semiconductor layer 100S. With this configuration, even when the distance between adjacent pixels (pixels 541A, 541B, 541C, and 541D) is reduced due to miniaturization of the area per pixel, it is possible to suppress color mixing among the pixels 541A, 541B, 541C, and 541D. This makes it possible to improve the signal/noise ratio of the pixel signal, enabling the imaging device 1 to output better pixel data (image information).

Furthermore, the imaging device 1 includes the pixel circuit 210 for each of the pixel sharing units 539. With this configuration, as compared with a case where the pixel circuit 210 is provided in each of the pixels 541A, 541B, 541C, and 541D, it is possible to increase the formation region of the transistors (amplification transistor AMP, reset transistor RST, selection transistor SEL, FD conversion gain switching transistor FDG) constituting the pixel circuit 210. For example, increasing the formation region of the amplification transistor AMP can suppress noise. This makes it possible to improve the signal/noise ratio of the pixel signal, enabling the imaging device 1 to output better pixel data (image information).

Furthermore, in the imaging device 1, the pad portion 120 that electrically connects the floating diffusion FD (floating diffusion FD1, FD2, FD3, and FD4) of the four pixels (pixels 541A, 541B, 541C, and 541D) is provided on the first substrate 100. With this configuration, it is possible to decrease the number of through-substrate electrodes (through-substrate electrodes 120E) connecting the first substrate 100 and the second substrate 200 to each other as compared with the case where the pad portion 120 is provided on the second substrate 200. This makes it possible to reduce the size the insulating region 212 and ensure a sufficient size of the transistor formation region (semiconductor layer 200S) constituting the pixel circuit 210. This makes it possible reduce the noise of the transistor included in the pixel circuit 210, leading to improvement in the signal/noise ratio of the pixel signal, enabling the imaging device 1 to output better pixel data (image information).

Hereinafter, modifications of the imaging device 1 according to the above embodiment will be described. In the following modifications, the same reference numerals are given to the same configurations as those of the above embodiment.

2. First Modification

Figure 15:
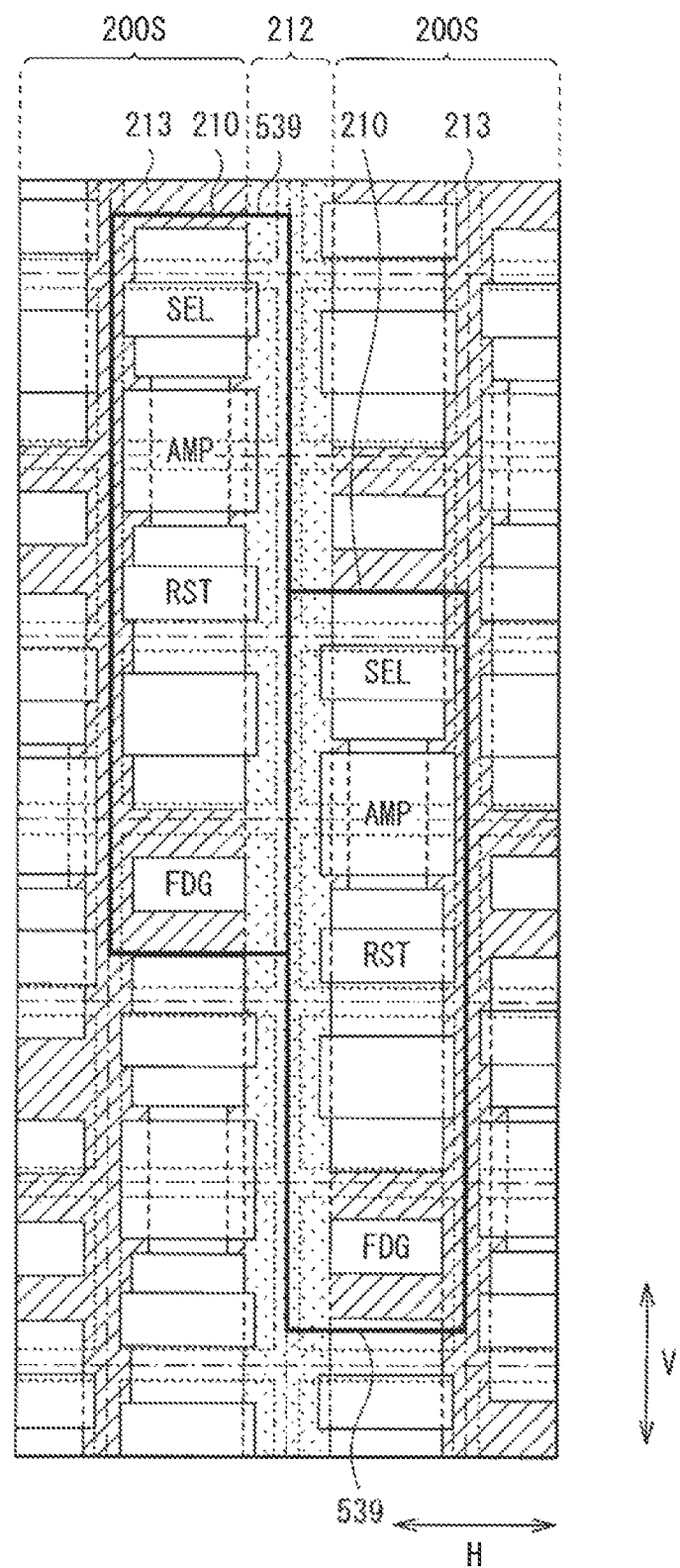
FIG. 15 is a schematic view illustrating a modification of the planar configuration of the second substrate (semiconductor layer) illustrated in FIG. 8.
Figure 16:
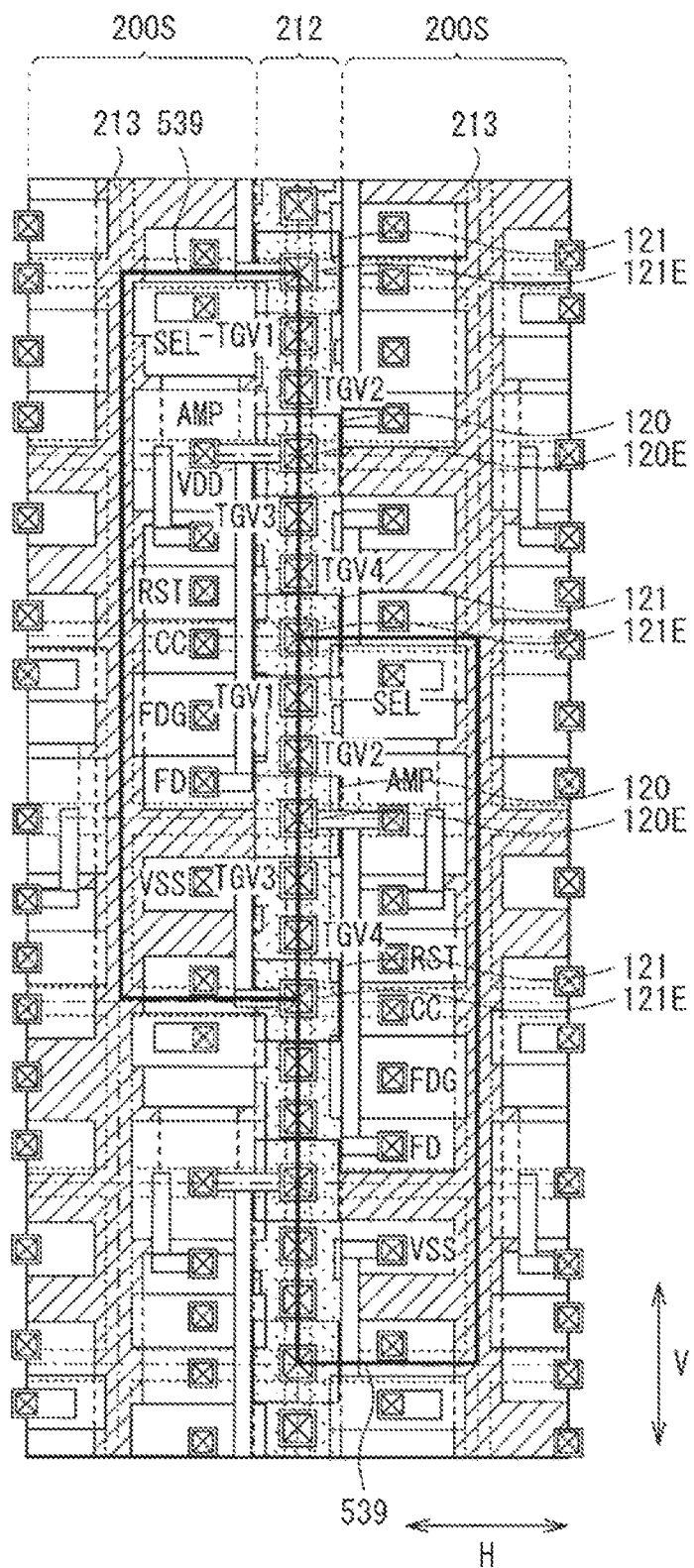
FIG. 16 is a schematic view illustrating a planar configuration of a main part of the first wiring layer and the first substrate together with a pixel circuit illustrated in FIG. 15.
Figure 17:
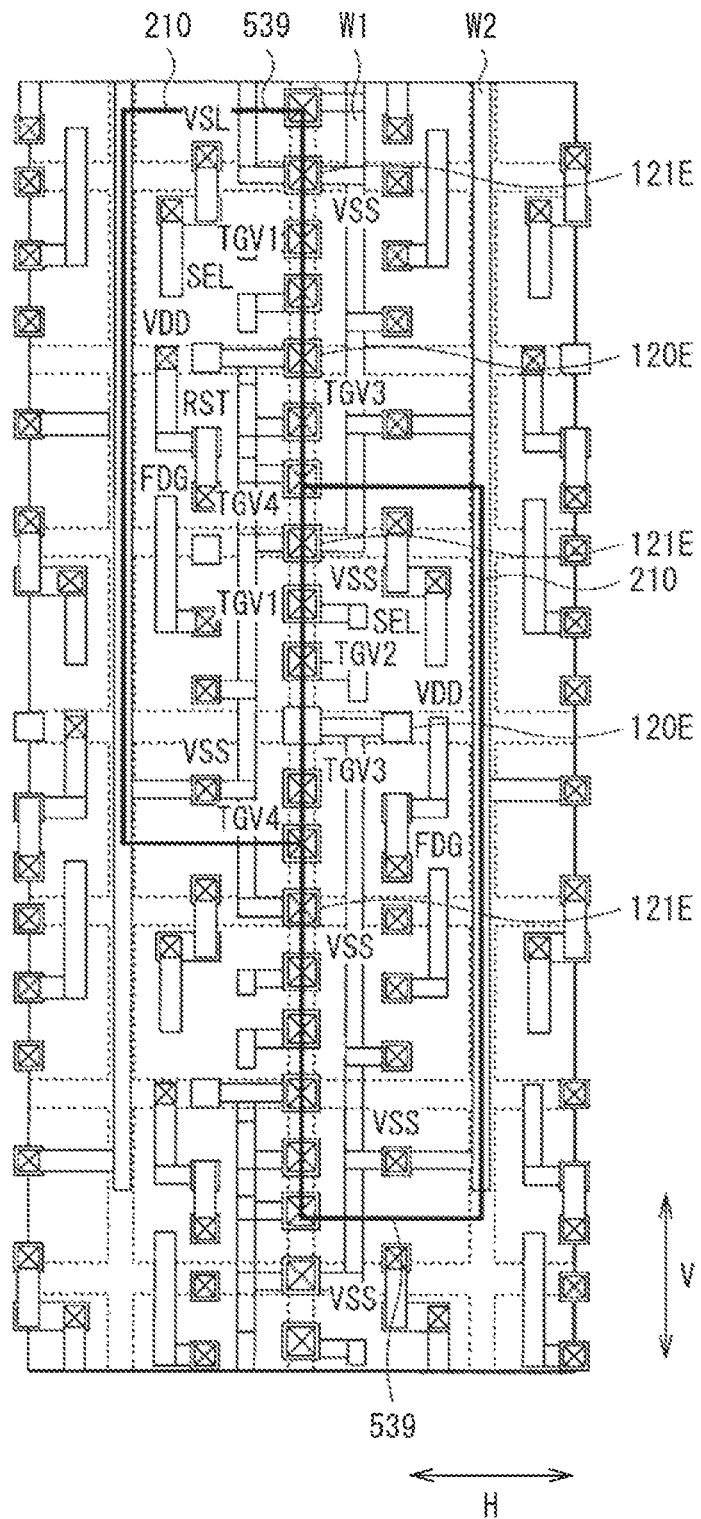
FIG. 17 is a schematic view illustrating an example of a planar configuration of the second wiring layer together with the first wiring layer illustrated in FIG. 16.
Figure 18:
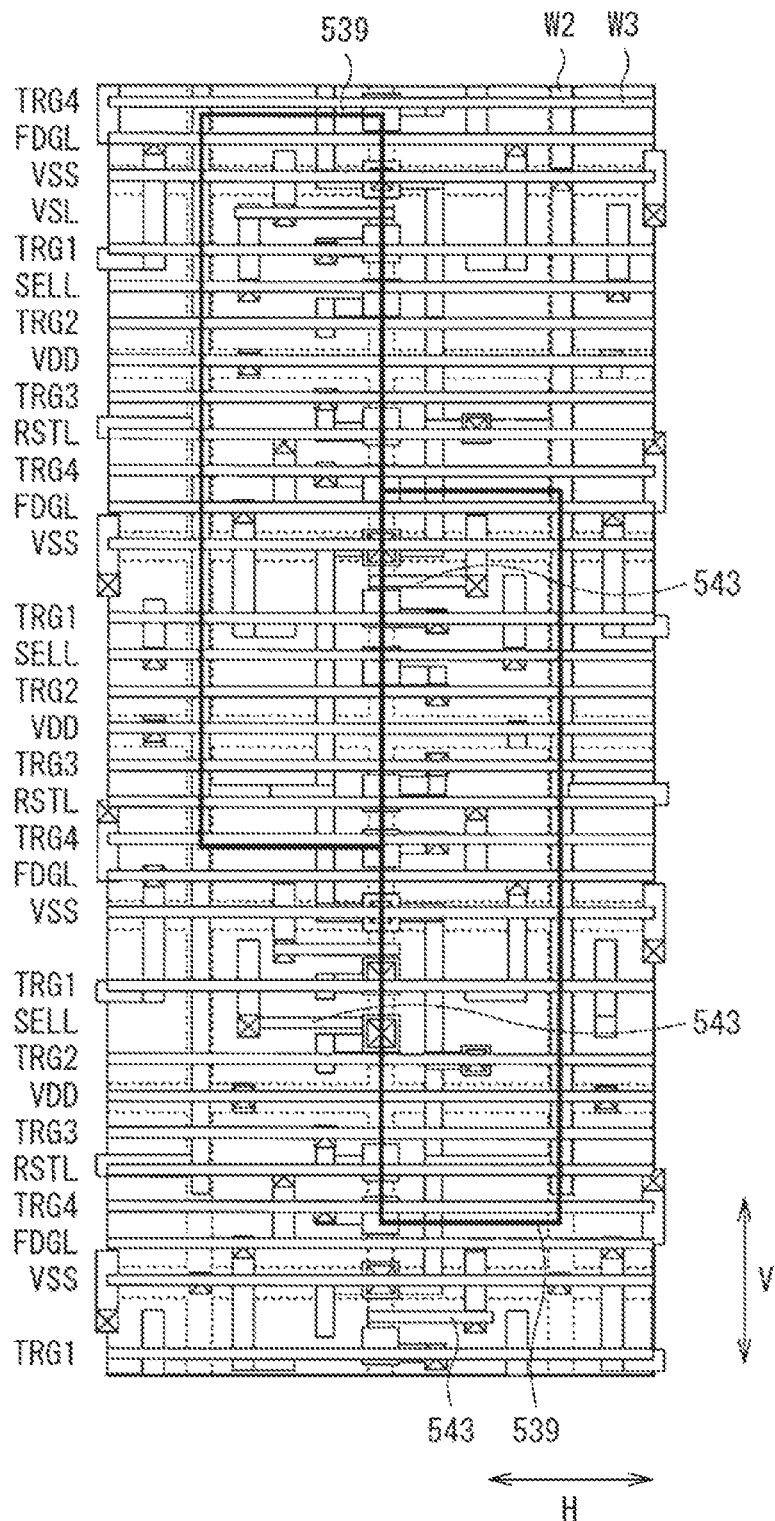
FIG. 18 is a schematic view illustrating an example of a planar configuration of the third wiring layer together with the second wiring layer illustrated in FIG. 17.
Figure 19:
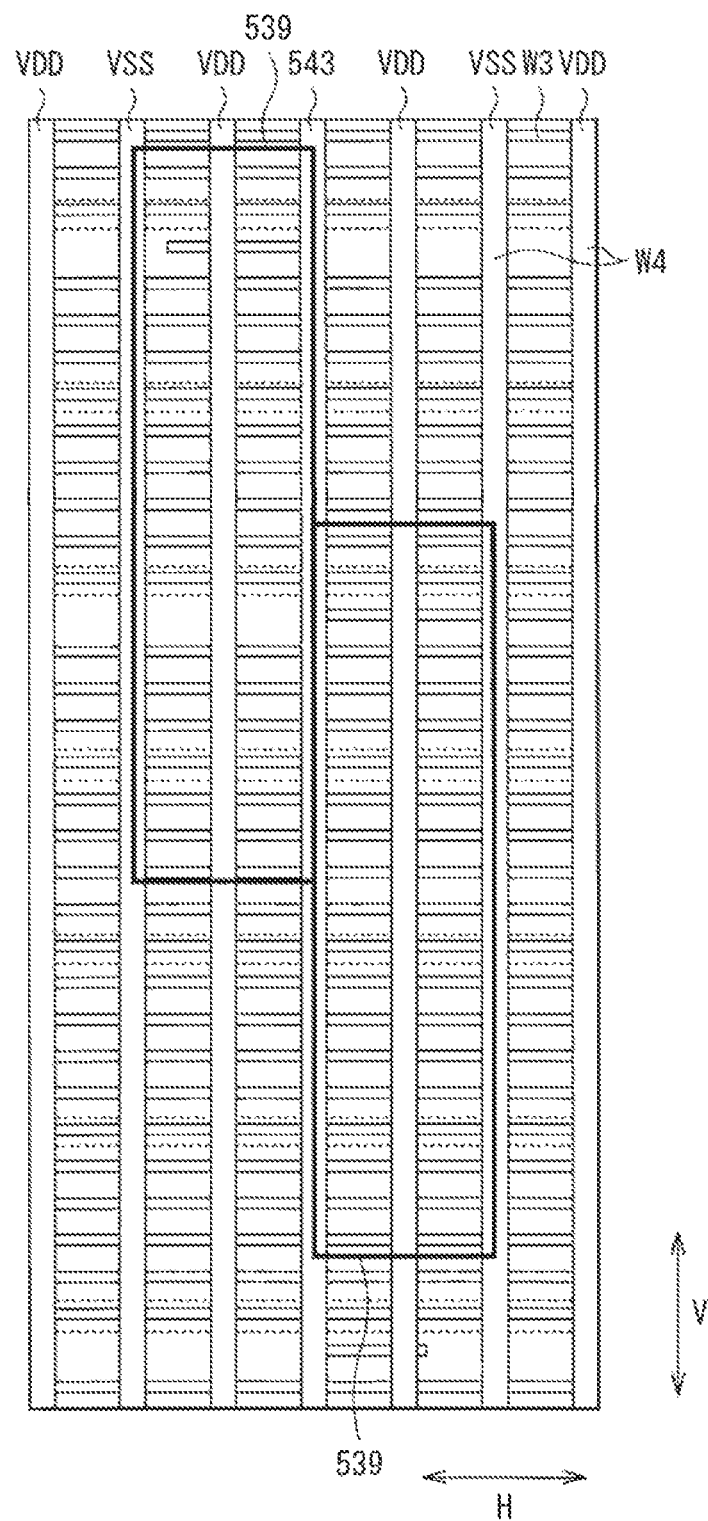
FIG. 19 is a schematic view illustrating an example of a planar configuration of the fourth wiring layer together with the third wiring layer illustrated in FIG. 18.

FIGS. 15 to 19 illustrate a modification of the planar configuration of the imaging device 1 according to the above embodiment. FIG. 15 schematically illustrates a planar configuration in the vicinity of the front surface of the semiconductor layer 200S of the second substrate 200, and corresponds to FIG. 8 described in the above embodiment. FIG. 16 schematically illustrates a configuration of each of portions of the first wiring layer W1, the semiconductor layer 200S connected to the first wiring layer W1, and the first substrate 100, and corresponds to FIG. 9 described in the above embodiment. FIG. 17 illustrates an example of a planar configuration of the first wiring layer W1 and the second wiring layer W2, and corresponds to FIG. 10 described in the above embodiment. FIG. 18 illustrates an example of a planar configuration of the second wiring layer W2 and the third wiring layer W3, and corresponds to FIG. 11 described in the above embodiment. FIG. 19 illustrates an example of a planar configuration of the third wiring layer W3 and the fourth wiring layer W4, and corresponds to FIG. 12 described in the above embodiment.

As illustrated in FIG. 16, the present modification has a configuration in which the internal layout of one pixel sharing unit 539 (for example, one on the right side in the drawing) among the two pixel sharing units 539 arranged in the H direction on the second substrate 200 is obtained by inverting the internal layout of the other pixel sharing unit 539 (for example, one on the left side in the drawing) only in the H direction. In addition, the shift in the V direction between the outline of one pixel sharing unit 539 and the outline of the other pixel sharing unit 539 is larger than the shift described in the above embodiment (FIG. 9). In this manner, with a larger shift in the V direction, it is possible to shorten the distance between the amplification transistor AMP of the other pixel sharing unit 539 and the connected pad portion 120 (the pad portion 120 of the other pixel sharing units 539 (one on lower side of the drawing) of the two pixel sharing units 539 arranged in the V direction illustrated in FIG. 7). With such a layout, the first modification of the imaging device 1 illustrated in FIGS. 15 to 19 can achieve the area of the planar layout of the two pixel sharing units 539 arranged in the H direction the same as the area of the pixel sharing unit 539 of the second substrate 200 described in the above embodiment without mutually inverting the planar layout of the two pixel sharing units 539 in the V direction. Note that the planar layout of the pixel sharing unit 539 of the first substrate 100 is the same as the planar layout described in the above embodiment (FIGS. 7A and 7B). Therefore, the imaging device 1 of the present modification can obtain the effects similar to those of the imaging device 1 described in the above embodiment. The arrangement of the pixel sharing unit 539 of the second substrate 200 is not limited to the arrangement described in the above embodiment and the present modification.

3. Second Modification

Figure 20:
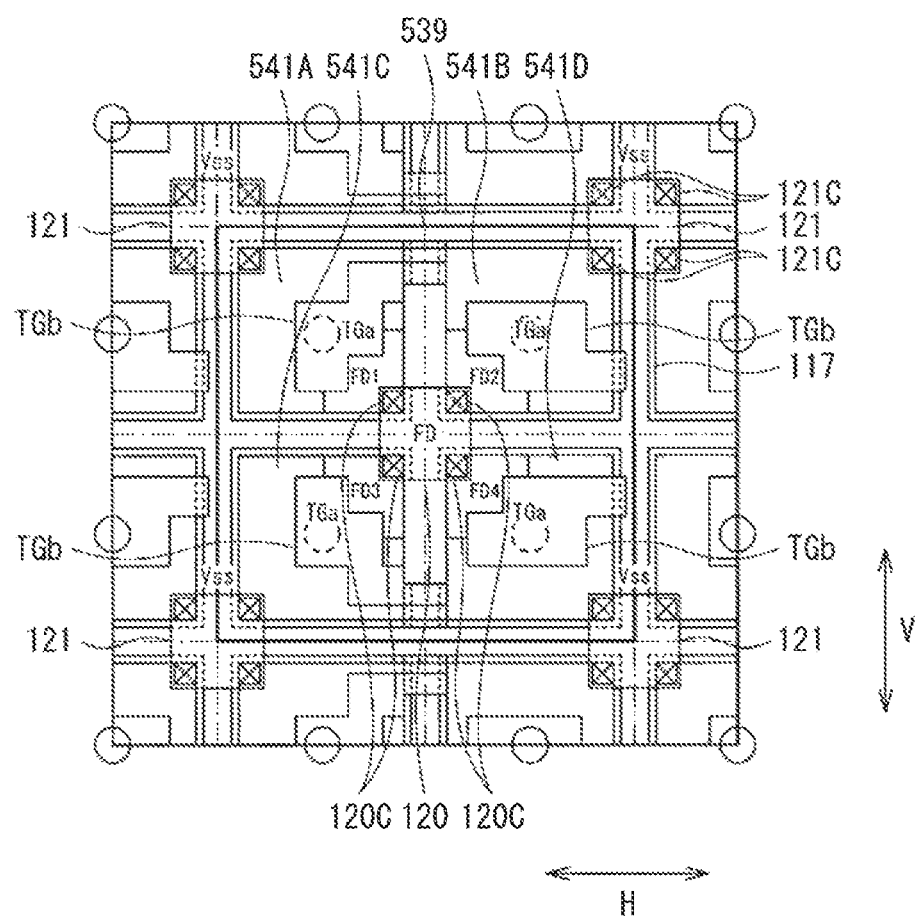
FIG. 20 is a schematic view illustrating a modification of the planar configuration of the first substrate illustrated in FIG. 7A.
Figure 21:
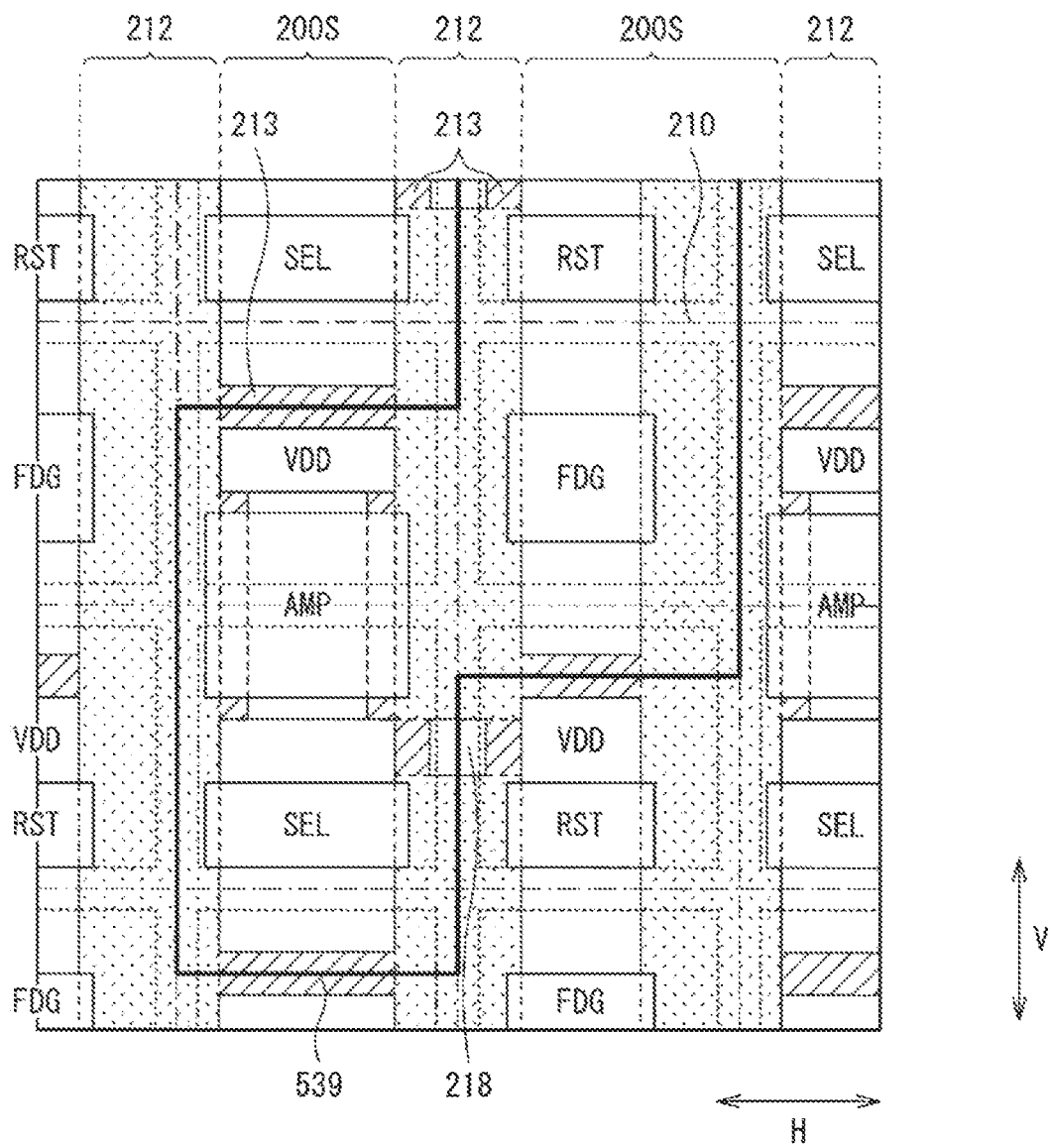
FIG. 21 is a schematic view illustrating an example of a planar configuration of the second substrate (semiconductor layer) stacked on the first substrate illustrated in FIG. 20.
Figure 22:
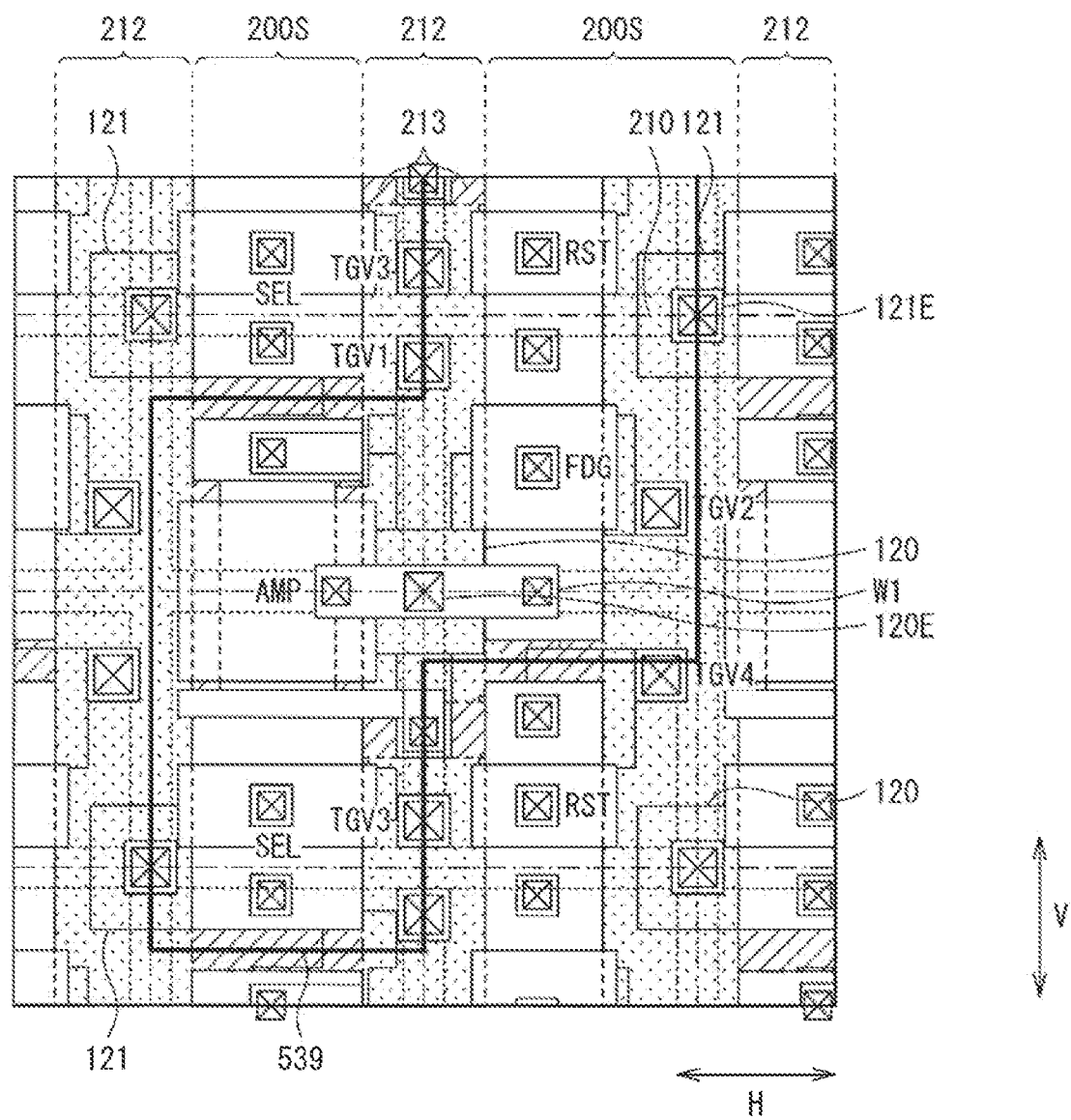
FIG. 22 is a schematic view illustrating an example of a planar configuration of the first wiring layer together with the pixel circuit illustrated in FIG. 21.
Figure 23:
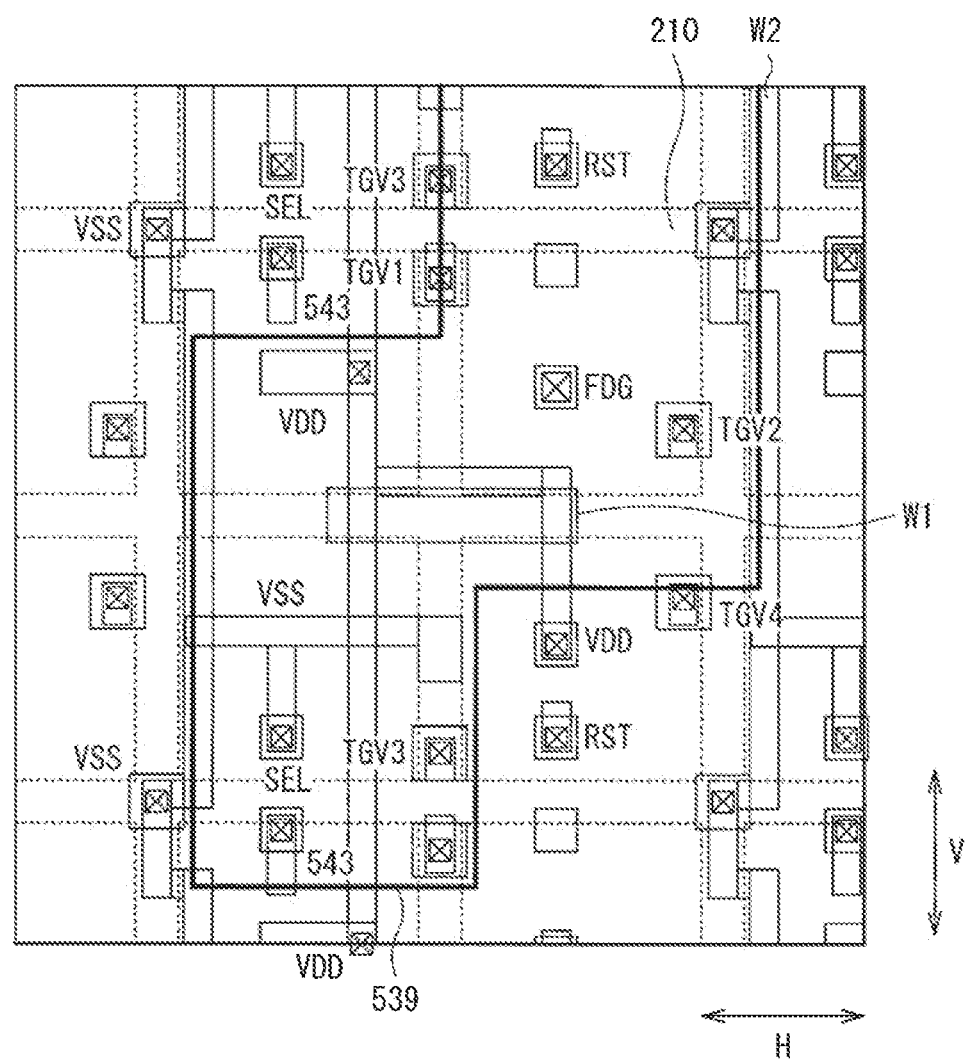
FIG. 23 is a schematic view illustrating an example of a planar configuration of the second wiring layer together with the first wiring layer illustrated in FIG. 22.
Figure 24:
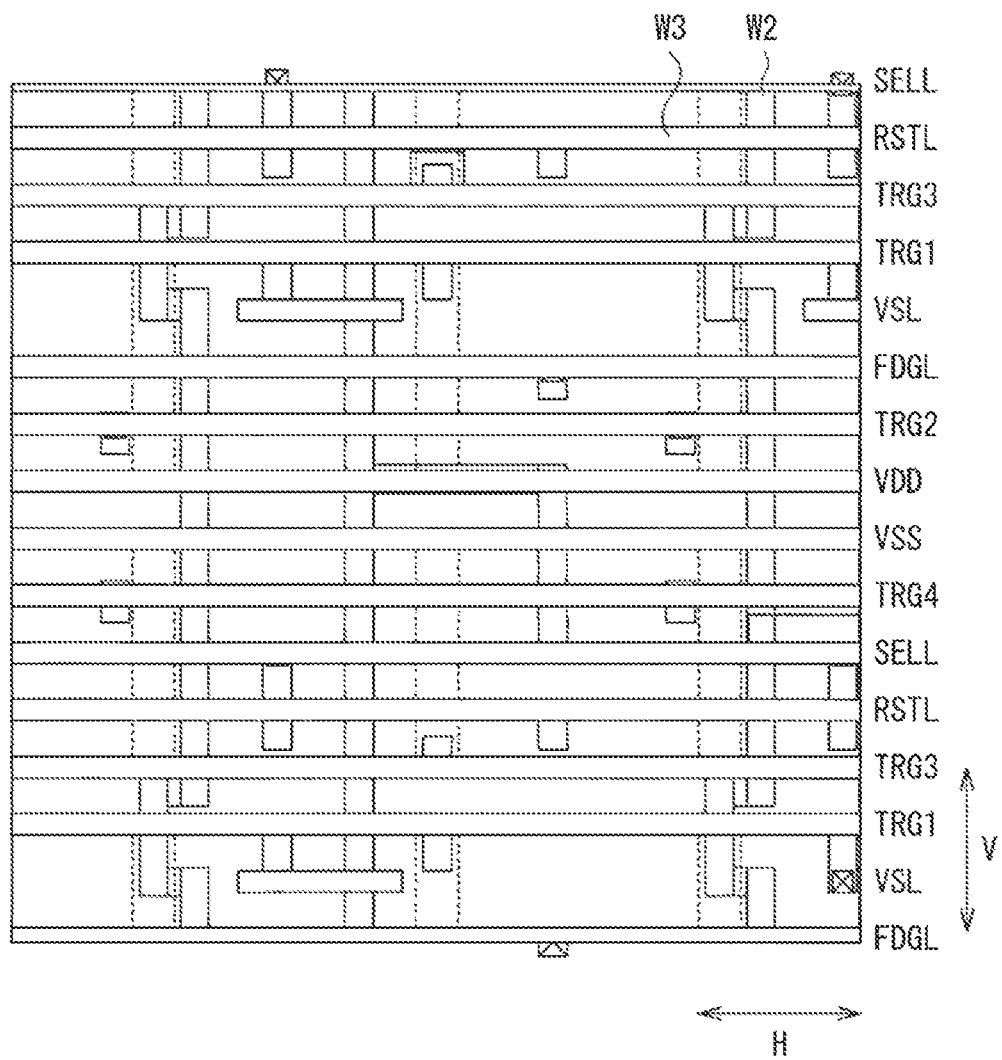
FIG. 24 is a schematic view illustrating an example of a planar configuration of the third wiring layer together with the second wiring layer illustrated in FIG. 23.
Figure 25:
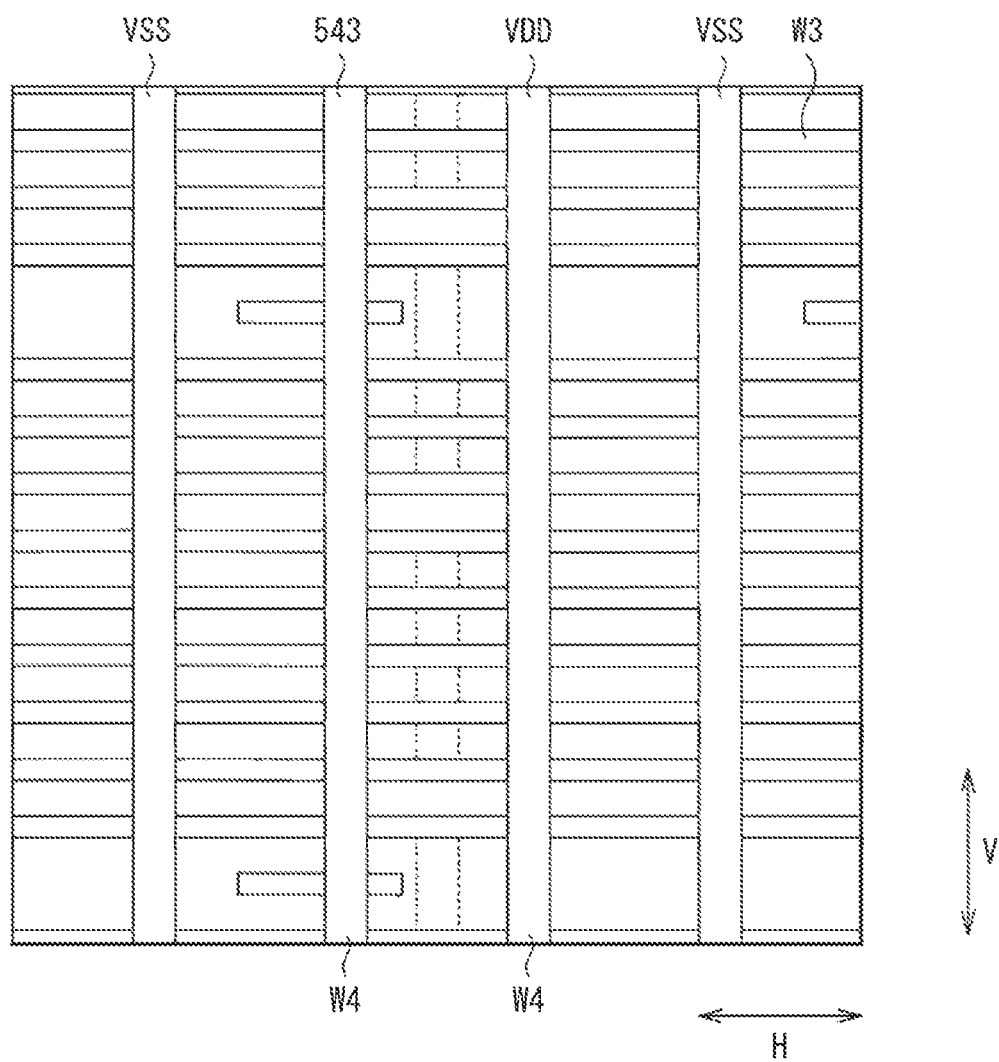
FIG. 25 is a schematic view illustrating an example of a planar configuration of the fourth wiring layer together with the third wiring layer illustrated in FIG. 24.

FIGS. 20 to 25 illustrate a modification of the planar configuration of the imaging device 1 according to the above embodiment. FIG. 20 schematically illustrates a planar configuration of the first substrate 100, and corresponds to FIG. 7A described in the above embodiment. FIG. 21 schematically illustrates a planar configuration in the vicinity of the front surface of the semiconductor layer 200S of the second substrate 200, and corresponds to FIG. 8 described in the above embodiment. FIG. 22 schematically illustrates a configuration of each of portions of the first wiring layer W1, the semiconductor layer 200S connected to the first wiring layer W1, and the first substrate 100, and corresponds to FIG. 9 described in the above embodiment. FIG. 23 illustrates an example of a planar configuration of the first wiring layer W1 and the second wiring layer W2, and corresponds to FIG. 10 described in the above embodiment. FIG. 24 illustrates an example of a planar configuration of the second wiring layer W2 and the third wiring layer W3, and corresponds to FIG. 11 described in the above embodiment. FIG. 25 illustrates an example of a planar configuration of the third wiring layer W3 and the fourth wiring layer W4, and corresponds to FIG. 12 described in the above embodiment.

In the present modification, the outer shape of each of the pixel circuits 210 has a substantially square planar shape (FIG. 21 and the like). In this respect, the planar configuration of the imaging device 1 of the present modification is different from the planar configuration of the imaging device 1 described in the above embodiment.

For example, the pixel sharing unit 539 of the first substrate 100 is formed over a pixel region of 2 rows×2 columns, and has a substantially square planar shape (FIG. 20), similarly to the description in the above embodiment. For example, in each of the pixel sharing units 539, the horizontal portions TGb of the transfer gates TG1 and TG3 of the respective pixel 541A and the pixel 541C of one pixel column extend in the direction from a position overlapping the vertical portion TGa toward the central portion of the pixel sharing unit 539 in the H direction (more specifically, a direction toward the outer edges of the pixels 541A and 541C and a direction toward the central portion of the pixel sharing unit 539), while the horizontal portions TGb of the transfer gates TG2 and TG4 of the respective pixel 541B and the pixel 541D of the other pixel column extend in the direction from a position overlapping the vertical portion TGa toward the outer side of the pixel sharing unit 539 in the H direction (more specifically, a direction toward the outer edges of the pixels 541B and 541D and a direction toward the outer side of the pixel sharing unit 539). The pad portion 120 connected to the floating diffusion FD is provided at a central portion of the pixel sharing unit 539 (a central portion of the pixel sharing unit 539 in the H direction and the V direction), while the pad portion 121 connected to the VSS contact region 118 is provided at an end of the pixel sharing unit 539 at least in the H direction (in the H direction and the V direction in FIG. 20).

As another arrangement example, it is also conceivable to provide the horizontal portions TGb of the transfer gates TG1, TG2, TG3, and TG4 only in a region facing the vertical portion TGa. At this time, the semiconductor layer 200S is likely to be divided into a large number of pieces similarly to the description in the above embodiment. This would make it difficult to enlarge the transistors of the pixel circuit 210. On the other hand, when the horizontal portions TGb of the transfer gates TG1, TG2, TG3, and TG4 are extended in the H direction from the position overlapping the vertical portion TGa as in the above modification, the width of the semiconductor layer 200S can be increased as described similarly to the description in the above embodiment. Specifically, the positions in the H direction of the through-substrate electrodes TGV1 and TGV3 respectively connected to the transfer gates TG1 and TG3 can be arranged close to the position in the H direction of the through-substrate electrode 120E, while the positions in the H direction of the through-substrate electrodes TGV2 and TGV4 respectively connected to the transfer gates TG2 and TG4 can be arranged close to the position in the H direction of the through-substrate electrode 121E (FIG. 22). This configuration can increase the width (size in the H direction) of the semiconductor layer 200S extending in the V direction similarly to the description in the above embodiment. This makes it possible to increase the size of the transistors of the pixel circuit 210, particularly, the size of the amplification transistor AMP. As a result, the signal/noise ratio of the pixel signal can be improved, enabling the imaging device 1 to output better pixel data (image information).

The pixel sharing unit 539 of the second substrate 200 has substantially the same size as that of the pixel sharing unit 539 of the first substrate 100 in the H direction and the V direction, for example, and is provided over a region corresponding to a pixel region of approximately 2 rows×2 columns, for example. For example, in each of the pixel circuits 210, the selection transistor SEL and the amplification transistor AMP are arranged side by side in the V direction in one semiconductor layer 200S extending in the V direction, while the FD conversion gain switching transistor FDG and the reset transistor RST are arranged side by side in the V direction in one semiconductor layer 200S extending in the V direction. The one semiconductor layer 200S including the selection transistor SEL and the amplification transistor AMP and the one semiconductor layer 200S including the FD conversion gain switching transistor FDG and the reset transistor RST are arranged in the H direction via the insulating region 212. The insulating region 212 extends in the V direction (FIG. 21).

Here, the outer shape of the pixel sharing unit 539 of the second substrate 200 will be described with reference to FIGS. 21 and 22. For example, the pixel sharing unit 539 of the first substrate 100 illustrated in FIG. 20 is connected to the amplification transistor AMP and the selection transistor SEL provided on one side of the pad portion 120 in the H direction (the left side of FIG. 22), and connected to the FD conversion gain switching transistor FDG and the reset transistor RST provided on the other side of the pad portion 120 in the H direction (the right side of FIG. 22). The outer shape of the pixel sharing unit 539 of the second substrate 200, including the amplification transistor AMP, the selection transistor SEL, the FD conversion gain switching transistor FDG, and the reset transistor RST, is determined by the following four outer edges.

A first outer edge is an outer edge of one end in the V direction of the semiconductor layer 200S including the selection transistor SEL and the amplification transistor AMP (end on the upper side of FIG. 22). The first outer edge is provided between the amplification transistor AMP included in the pixel sharing unit 539 and the selection transistor SEL included in the pixel sharing unit 539 adjacent to one side in the V direction of the pixel sharing unit 539 (the upper side of FIG. 22). More specifically, the first outer edge is provided at the central portion in the V direction of the element isolation region 213 between the amplification transistor AMP and the selection transistor SEL. A second outer edge is an outer edge of the other end in the V direction of the semiconductor layer 200S including the selection transistor SEL and the amplification transistor AMP (the lower end of FIG. 22). The second outer edge is provided between the selection transistor SEL included in the pixel sharing unit 539 and the amplification transistor AMP included in the pixel sharing unit 539 adjacent to the other side in the V direction of the pixel sharing unit 539 (the lower side of FIG. 22). More specifically, the second outer edge is provided at the central portion in the V direction of the element isolation region 213 between the selection transistor SEL and the amplification transistor AMP. A third outer edge is an outer edge of the other end in the V direction (the lower end of FIG. 22) of the semiconductor layer 200S including the reset transistor RST and the FD conversion gain switching transistor FDG. The third outer edge is provided between the FD conversion gain switching transistor FDG included in the pixel sharing unit 539 and the reset transistor RST included in the pixel sharing unit 539 adjacent to the other side in the V direction of the pixel sharing unit 539 (the lower side of FIG. 22). More specifically, the third outer edge is provided at the central portion in the V direction of the element isolation region 213 between the FD conversion gain switching transistor FDG and the reset transistor RST. A fourth outer edge is an outer edge of one end in the V direction of the semiconductor layer 200S including the reset transistor RST and the FD conversion gain switching transistor FDG (end on upper side of FIG. 22). The fourth outer edge is provided between the reset transistor RST included in the pixel sharing unit 539 and the FD conversion gain switching transistor FDG (not illustrated) included in the pixel sharing unit 539 adjacent to one side of the V direction the pixel sharing unit 539 (one on upper side of FIG. 22). More specifically, the fourth outer edge is provided at the central portion in the V direction of the element isolation region 213 (not illustrated) between the reset transistor RST and the FD conversion gain switching transistor FDG.

In the outer shape of the pixel sharing unit 539 of the second substrate 200 including such first, second, third, and fourth outer edges, the third and fourth outer edges are arranged to be shifted to one side in the V direction (in other words, offset to one side in the V direction) with respect to the first and second outer edges. By using such a layout, both the gate of the amplification transistor AMP and the source of the FD conversion gain switching transistor FDG can be disposed as close as possible to the pad portion 120. This makes it possible to reduce the area of the wiring connecting these, facilitating miniaturization of the imaging device 1. Note that the VSS contact region 218 is provided between the semiconductor layer 200S including the selection transistor SEL and the amplification transistor AMP and the semiconductor layer 200S including the reset transistor RST and the FD conversion gain switching transistor FDG. For example, the plurality of pixel circuits 210 has the same arrangement.

The imaging device 1 including such a second substrate 200 can also obtain the effects similar to those described in the above embodiment. The arrangement of the pixel sharing unit 539 of the second substrate 200 is not limited to the arrangement described in the above embodiment and the present modification.

4. Third Modification

Figure 26:
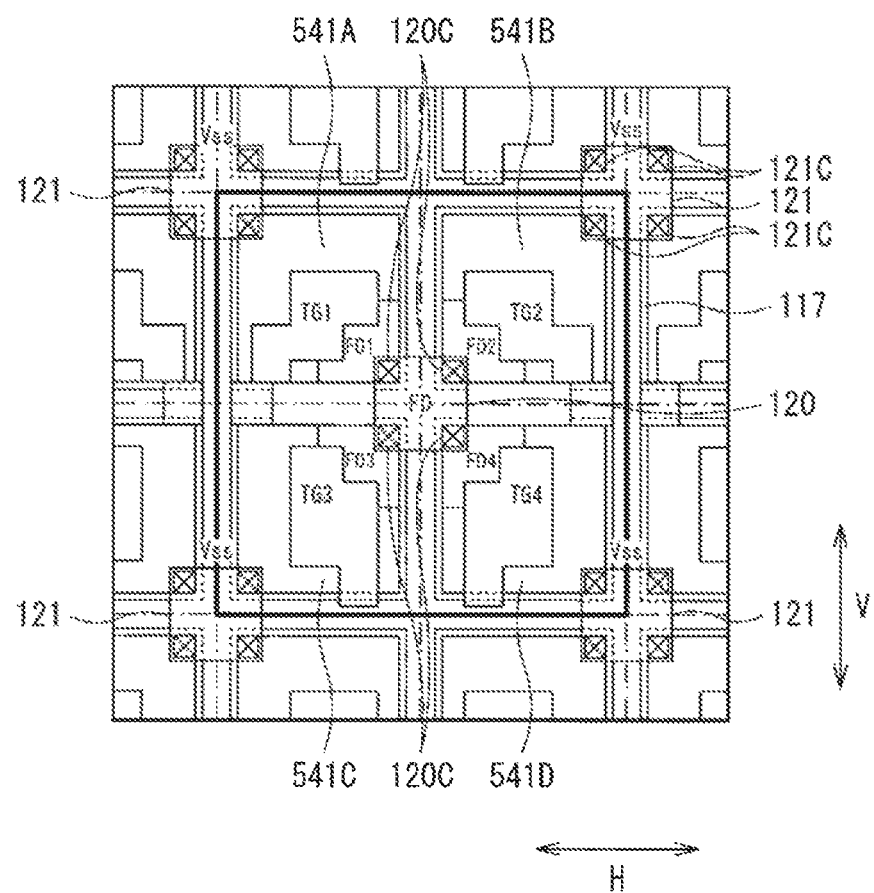
FIG. 26 is a schematic view illustrating another example of the planar configuration of the first substrate illustrated in FIG. 20.
Figure 27:
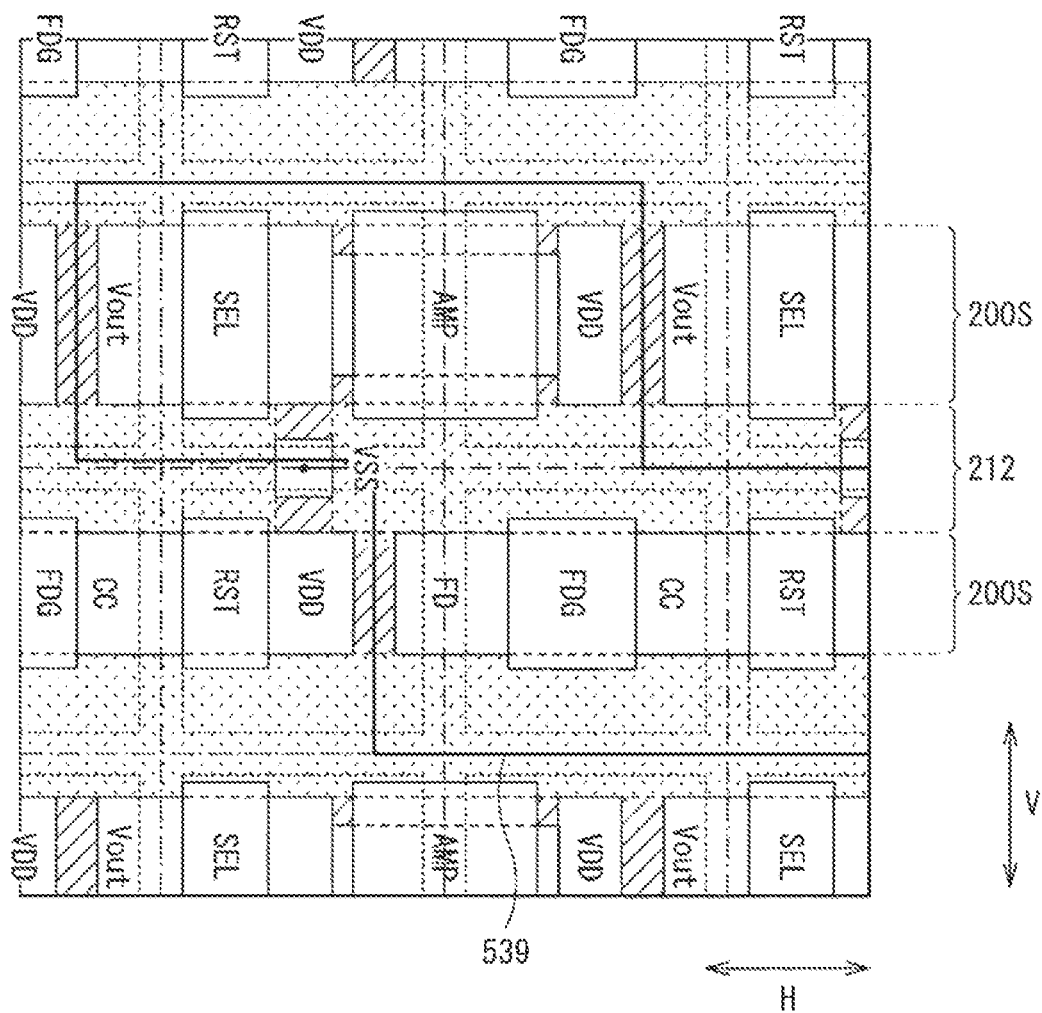
FIG. 27 is a schematic view illustrating an example of a planar configuration of the second substrate (semiconductor layer) stacked on the first substrate illustrated in FIG. 26.
Figure 28:
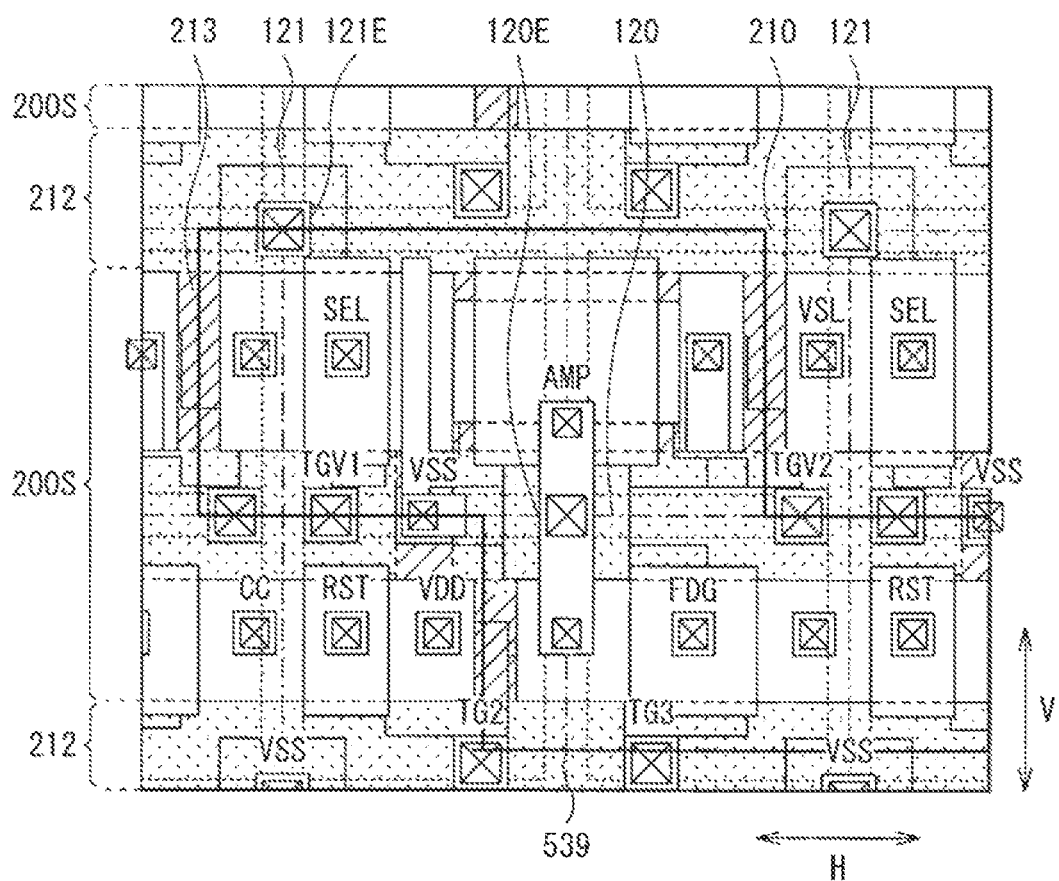
FIG. 28 is a schematic view illustrating an example of a planar configuration of the first wiring layer together with the pixel circuit illustrated in FIG. 27.
Figure 29:
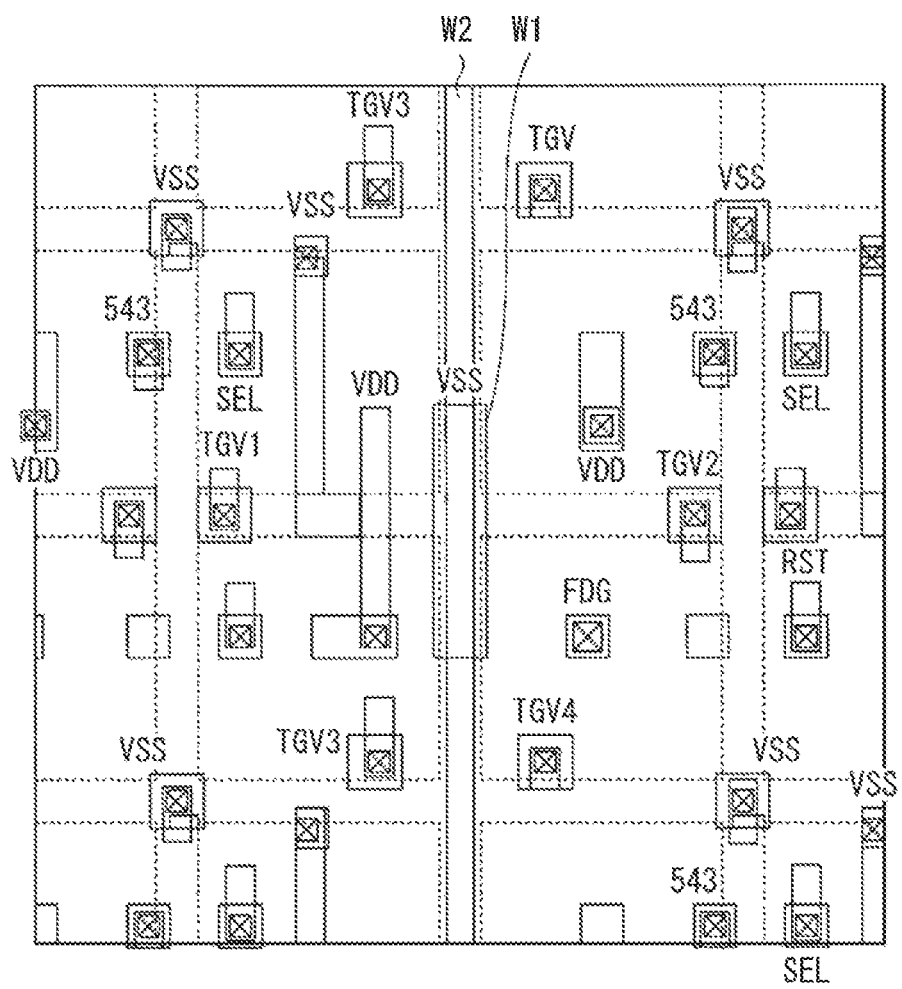
FIG. 29 is a schematic view illustrating an example of a planar configuration of the second wiring layer together with the first wiring layer illustrated in FIG. 28.
Figure 30:
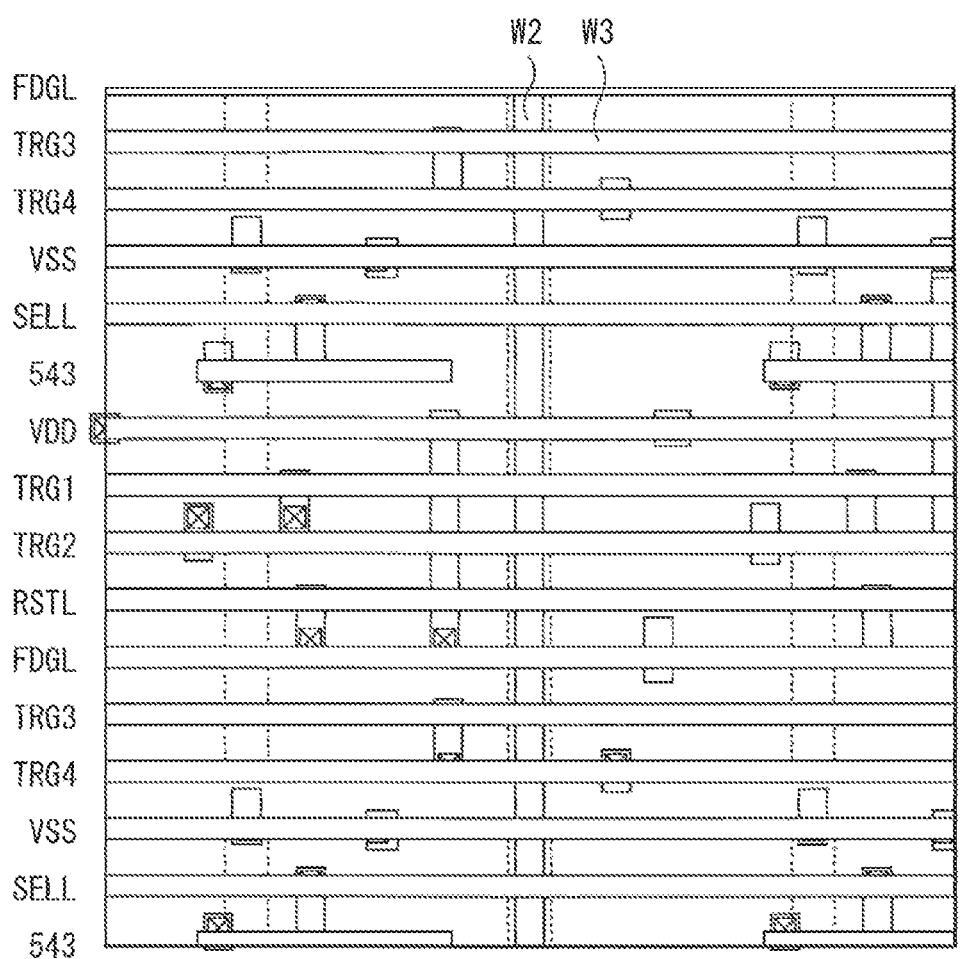
FIG. 30 is a schematic view illustrating an example of a planar configuration of the third wiring layer together with the second wiring layer illustrated in FIG. 29.
Figure 31:
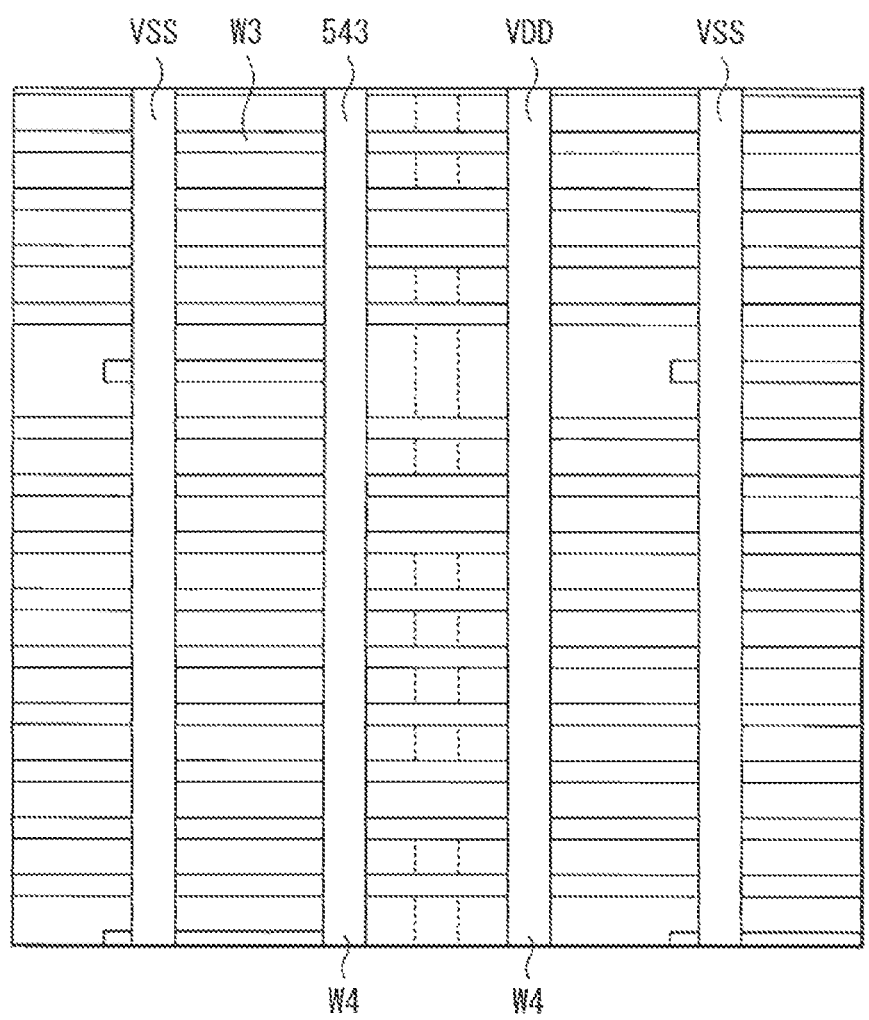
FIG. 31 is a schematic view illustrating an example of a planar configuration of the fourth wiring layer together with the third wiring layer illustrated in FIG. 30.

FIGS. 26 to 31 illustrate a modification of the planar configuration of the imaging device 1 according to the above embodiment. FIG. 26 schematically illustrates a planar configuration of first substrate 100, and corresponds to FIG. 7B described in the above embodiment. FIG. 27 schematically illustrates a planar configuration in the vicinity of the front surface of the semiconductor layer 200S of the second substrate 200, and corresponds to FIG. 8 described in the above embodiment. FIG. 28 schematically illustrates a configuration of each of portions of the first wiring layer W1, the semiconductor layer 200S connected to the first wiring layer W1, and the first substrate 100, and corresponds to FIG. 9 described in the above embodiment. FIG. 29 illustrates an example of a planar configuration of the first wiring layer W1 and the second wiring layer W2, and corresponds to FIG. 10 described in the above embodiment. FIG. 30 illustrates an example of a planar configuration of the second wiring layer W2 and the third wiring layer W3, and corresponds to FIG. 11 described in the above embodiment. FIG. 31 illustrates an example of a planar configuration of the third wiring layer W3 and the fourth wiring layer W4, and corresponds to FIG. 12 described in the above embodiment.

In the present modification, the semiconductor layer 200S of the second substrate 200 extends in the H direction (FIG. 28). That is, this configuration substantially corresponds to the configuration in which the planar configuration of the imaging device 1 illustrated in FIG. 21 and the like is rotated by 90 degrees.

For example, similarly to the description in the above embodiment, the pixel sharing unit 539 of the first substrate 100 is formed over a pixel region of 2 rows×2 columns, and has a substantially square planar shape (FIG. 26). For example, in each of the pixel sharing units 539, the transfer gates TG1 and TG2 of the respective pixel 541A and the pixel 541B of one pixel row extend toward the central portion of the pixel sharing unit 539 in the V direction, while the transfer gates TG3 and TG4 of the respective pixel 541C and the pixel 541D of the other pixel row extend in the outer direction of the pixel sharing unit 539 in the V direction. The pad portion 120 connected to the floating diffusion FD is provided at a central portion of the pixel sharing unit 539, while the pad portion 121 connected to the VSS contact region 118 is provided at an end of the pixel sharing unit 539 at least in the V direction (in the V direction and the H direction in FIG. 26). At this time, the positions in the V direction of the through-substrate electrodes TGV1 and TGV2 of the transfer gates TG1 and TG2 are closer to the positions in the V direction of the through-substrate electrode 120E, and the positions in the V direction of the through-substrate electrodes TGV3 and TGV4 of the transfer gates TG3 and TG4 are closer to the positions in the V direction of the through-substrate electrode 121E (FIG. 28). Therefore, the width (the size in the V direction) of the semiconductor layer 200S extending in the H direction can be increased for the reason similar to the description in the above embodiment. This makes it possible to increase the size of the amplification transistor AMP and suppress noise.

In each of the pixel circuits 210, the selection transistor SEL and the amplification transistor AMP are arranged side by side in the H direction, while the reset transistor RST is arranged at a position adjacent in the V direction with the selection transistor SEL and the insulating region 212 interposed therebetween (FIG. 27). The FD conversion gain switching transistor FDG is arranged side by side with the reset transistor RST in the H direction. The VSS contact region 218 is provided in an island shape in the insulating region 212. For example, the third wiring layer W3 extends in the H direction (FIG. 30), and the fourth wiring layer W4 extends in the V direction (FIG. 31).

The imaging device 1 including such a second substrate 200 can also obtain the effects similar to those described in the above embodiment. The arrangement of the pixel sharing unit 539 of the second substrate 200 is not limited to the arrangement described in the above embodiment and the present modification. For example, the semiconductor layer 200S described in the above embodiment and Modification 1 may extend in the H direction.

5. Fourth Modification

Figure 32:
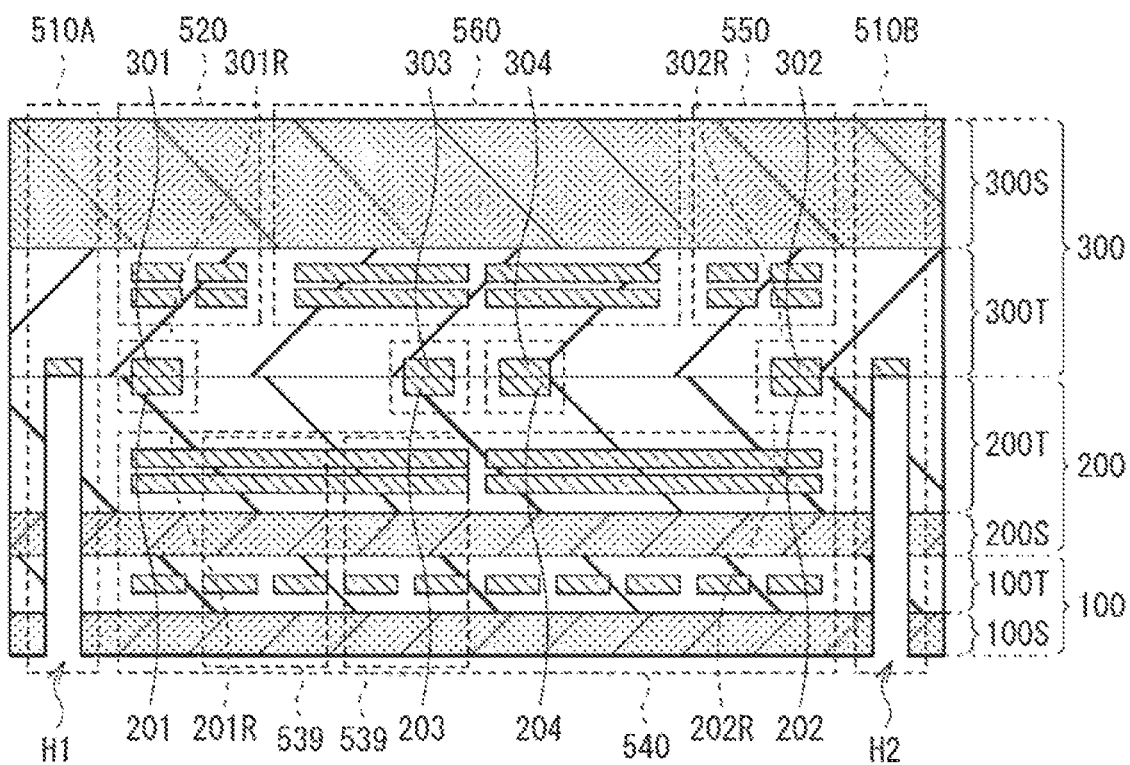
FIG. 32 is a schematic cross-sectional view illustrating another example of the imaging device illustrated in FIG. 3.

FIG. 32 schematically illustrates a modification of the cross-sectional configuration of imaging device 1 according to the exemplary embodiment. FIG. 32 corresponds to FIG. 3 described in the above embodiment. In the present modification, in addition to the contact portions 201, 202, 301, and 302, the imaging device 1 includes a contact portions 203, 204, 303, and 304 at facing positions at the central portion of the pixel array unit 540. In this respect, the imaging device 1 of the present modification is different from the imaging device 1 described in the above embodiment.

The contact portions 203 and 204 are provided on the second substrate 200, and are exposed on a bonding surface with the third substrate 300. The contact portions 303 and 304 are provided on the third substrate 300 and are exposed on a bonding surface with the second substrate 200. The contact portion 203 is in contact with the contact portion 303, while the contact portion 204 is in contact with the contact portion 304. That is, in the imaging device 1, the second substrate 200 and the third substrate 300 are connected by the contact portions 203, 204, 303, and 304 in addition to the contact portions 201, 202, 301, and 302.

Figure 33:
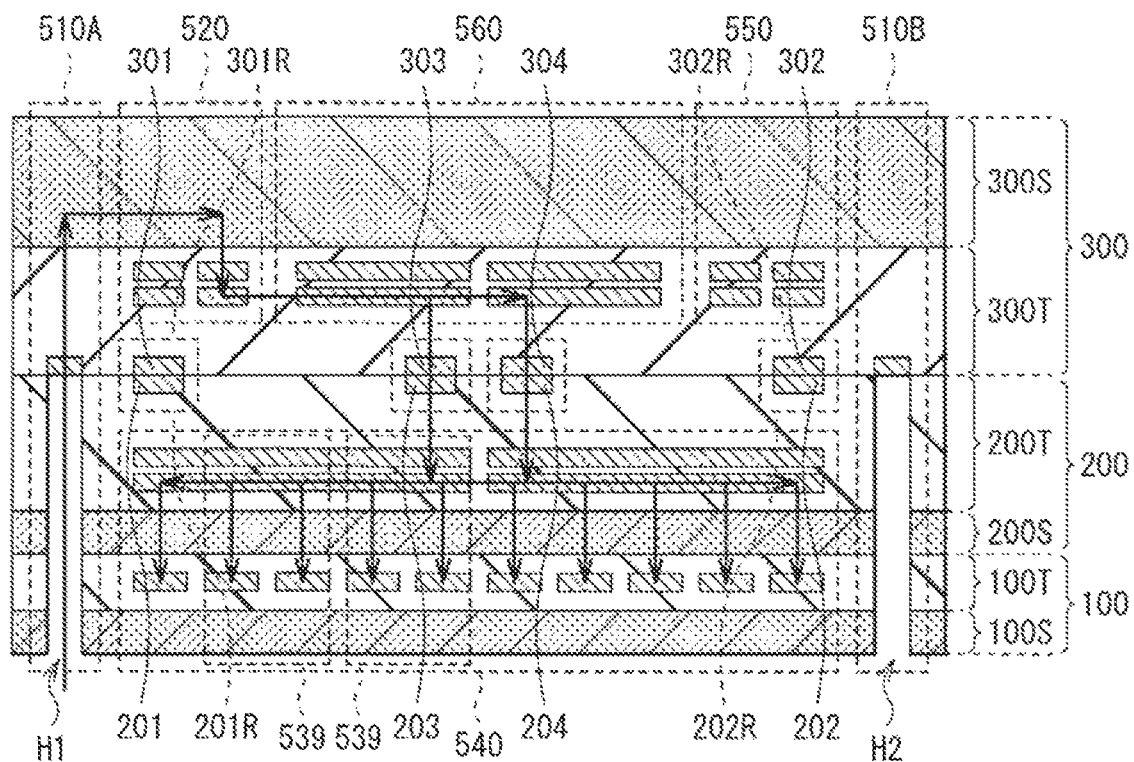
FIG. 33 is a schematic view illustrating a route of an input signal to the imaging device illustrated in FIG. 32.
Figure 34:
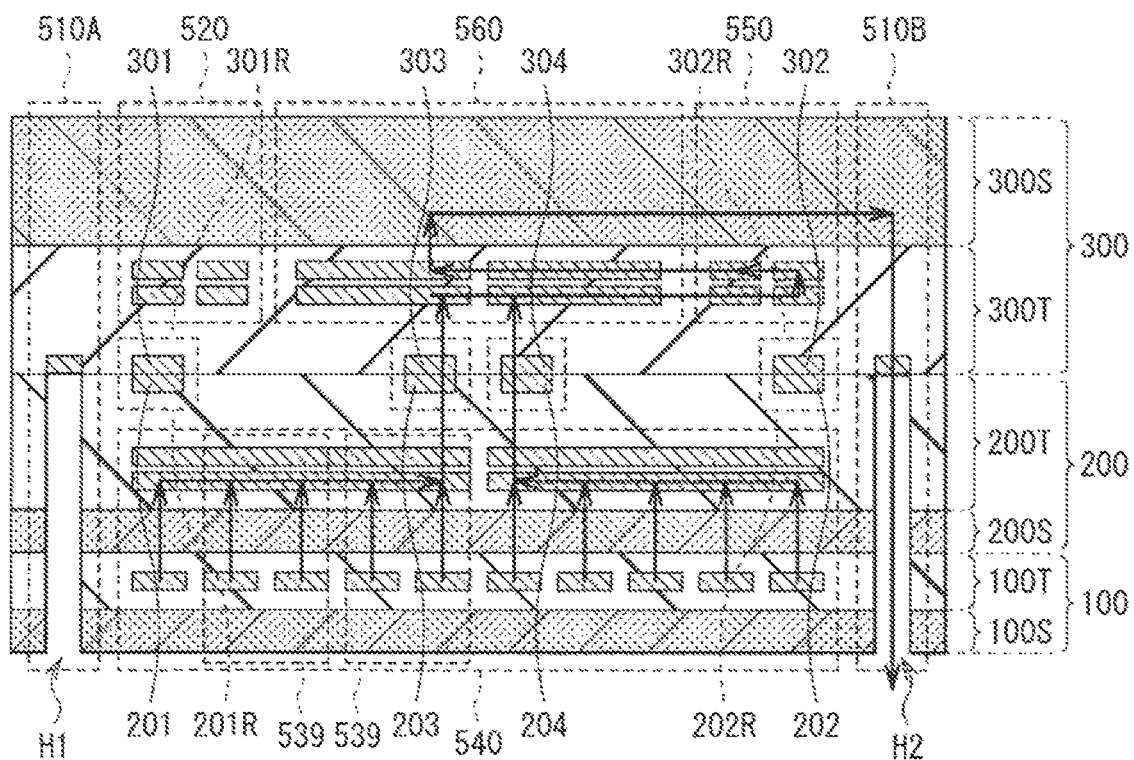
FIG. 34 is a schematic view illustrating a signal route of a pixel signal of the imaging device illustrated in FIG. 32.

Next, operations of the imaging device 1 will be described with reference to FIGS. 33 and 34. In FIG. 33, routes of an input signal input to the imaging device 1 from the outside and routes of a power supply potential and a reference potential are indicated by arrows. In FIG. 34, a signal route regarding a pixel signal output from the imaging device 1 to the outside is indicated by arrows. For example, an input signal input to the imaging device 1 via the input unit 510A is transmitted to the row drive unit 520 of the third substrate 300 to allow the row drive unit 520 to generate a row drive signal. The row drive signal is sent to the second substrate 200 via the contact portions 303 and 203. Furthermore, the row drive signal reaches each of the pixel sharing units 539 of the pixel array unit 540 via the row drive signal line 542 in the wiring layer 200T. Among the row drive signals reaching the pixel sharing unit 539 of the second substrate 200, drive signals other than those for the transfer gate TG are input to the pixel circuit 210 so as to drive each of transistors included in the pixel circuit 210. The drive signal for the transfer gate TG is input to the transfer gates TG1, TG2, TG3, and TG4 of the first substrate 100 via the through-substrate electrode TGV so as to drive the pixels 541A, 541B, 541C, and 541D. Furthermore, the power supply potential and the reference potential supplied from the outside of the imaging device 1 to the input unit 510A (input terminal 511) of the third substrate 300 are sent to the second substrate 200 via the contact portions 303 and 203, and supplied to the pixel circuit 210 of each of the pixel sharing units 539 via the wiring in the wiring layer 200T. The reference potential is further supplied to the pixels 541A, 541B, 541C, and 541D of the first substrate 100 via the through-substrate electrode 121E. On the other hand, the pixel signal photoelectrically converted by the pixels 541A, 541B, 541C, and 541D of the first substrate 100 is sent to the pixel circuit 210 of the second substrate 200 for each of the pixel sharing units 539. The pixel signal based on this pixel signal is sent from the pixel circuit 210 to the third substrate 300 via the vertical signal line 543 and the contact portions 204 and 304. This pixel signal is processed by the column signal processing unit 550 and the image signal processing unit 560 of the third substrate 300, and then output to the outside via the output unit 510B.

The imaging device 1 including such a contact portions 203, 204, 303, and 304 can also obtain effects similar to those described in the above embodiment. The position, the number, and the like of the contact portions can be changed according to the design of the circuit and the like of the third substrate 300 to which the wiring lines are to be connected via the contact portions 303 and 304.

6. Fifth Modification

Figure 35:
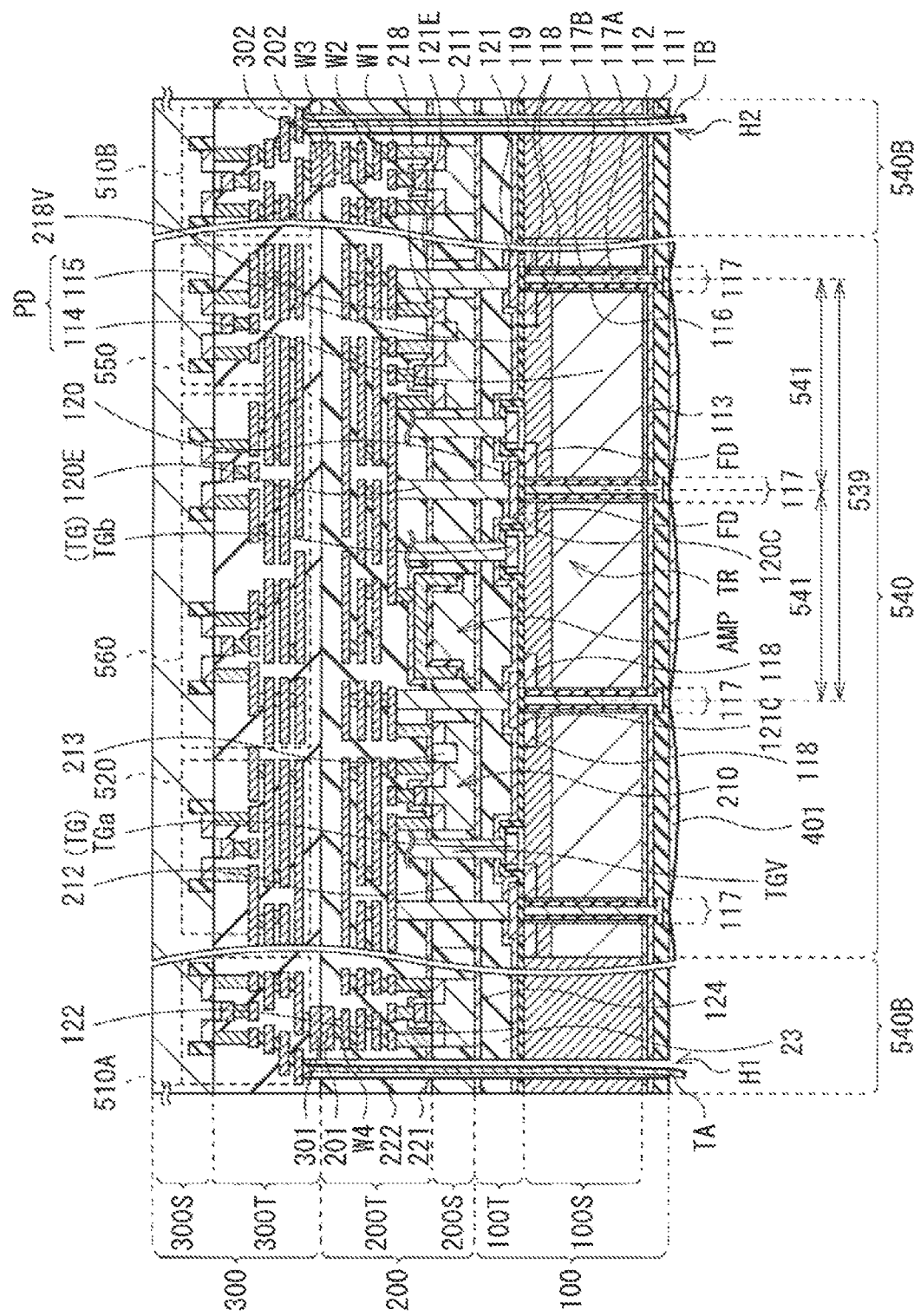
FIG. 35 is a schematic cross-sectional view illustrating another example of the imaging device illustrated in FIG. 6.

FIG. 35 illustrates a modification of the cross-sectional configuration of the imaging device 1 according to the embodiment. FIG. 35 corresponds to FIG. 6 described in the above embodiment. In the present modification, the transfer transistor TR having a planar structure is provided on the first substrate 100. In this respect, the imaging device 1 of the present modification is different from the imaging device 1 described in the above embodiment.

In the transfer transistor TR, the transfer gate TG is configured only by the horizontal portion TGb. In other words, the transfer gate TG has no vertical portion TGa, and is provided to face the semiconductor layer 100S.

The imaging device 1 including the transfer transistor TR having such a planar structure can also obtain the effects similar to those described in the above embodiment. Furthermore, it is also conceivable to form the photodiode PD closer to the front surface of the semiconductor layer 100S by providing the planar transfer gate TG on the first substrate 100 as compared with the case where the vertical transfer gate TG is provided on the first substrate 100, thereby increasing a saturation signal amount (Qs). In addition, the method of forming the planar transfer gate TG on the first substrate 100 can be considered to have a smaller number of manufacturing steps than the method of forming the vertical transfer gate TG on the first substrate 100, with less likelihood of occurrence of adverse effects due to the manufacturing steps on the photodiode PD.

7. Sixth Modification

Figure 36:
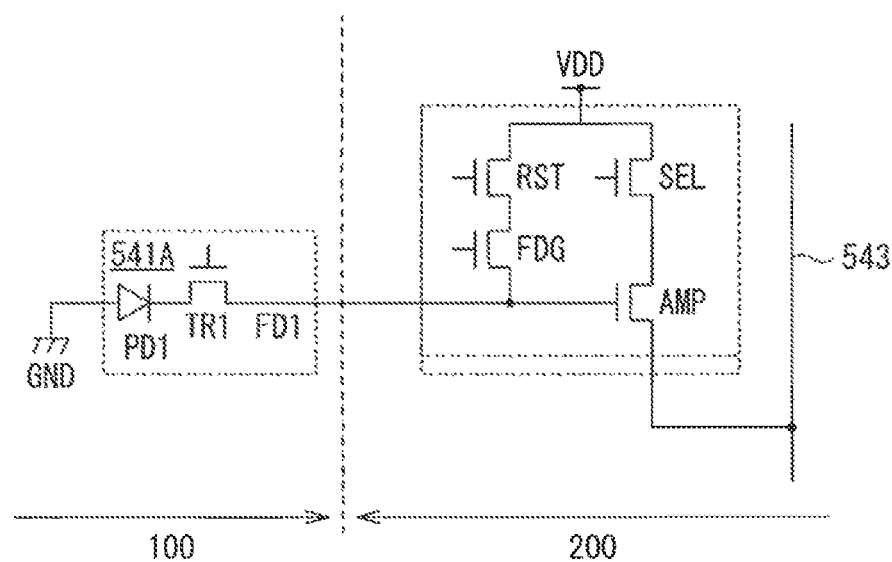
FIG. 36 is a diagram illustrating another example of the equivalent circuit illustrated in FIG. 4.

FIG. 36 illustrates a modification of the pixel circuit of imaging device 1 according to the embodiment. FIG. 36 corresponds to FIG. 4 described in the above embodiment. In the present modification, the pixel circuit 210 is provided for each pixel (pixel 541A). That is, the pixel circuit 210 is not shared by a plurality of pixels. In this respect, the imaging device 1 of the present modification is different from the imaging device 1 described in the above embodiment.

The imaging device 1 of the present modification is the same as the imaging device 1 described in the above embodiment in that the pixel 541A and the pixel circuit 210 are provided on different substrates (the first substrate 100 and the second substrate 200, respectively). Therefore, the imaging device 1 according to the present modification can also obtain effects similar to those described in the above embodiment.

8. Seventh Modification

Figure 37:
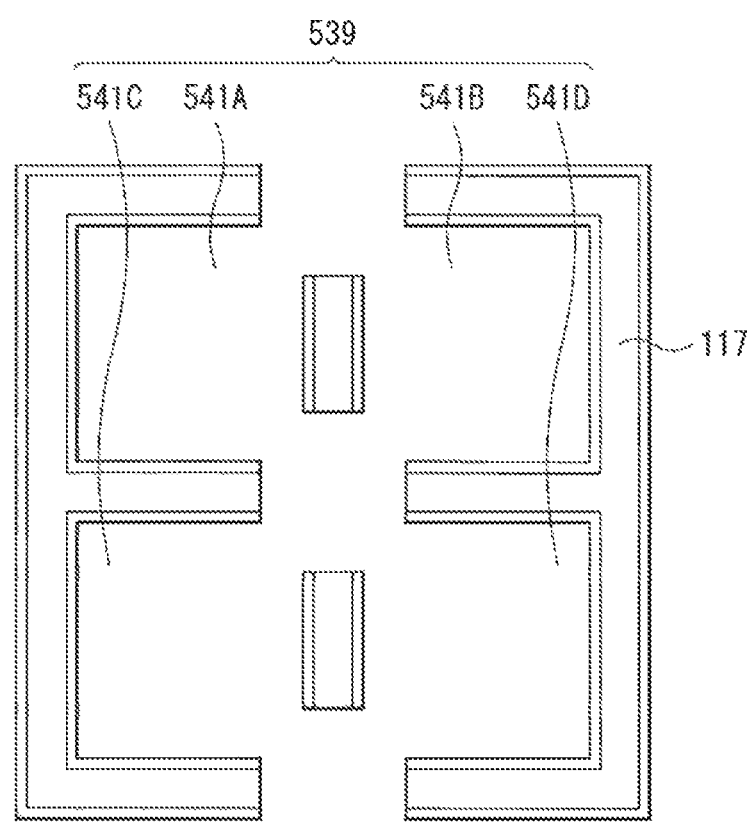

FIG. 37 illustrates a modification of the planar configuration of the pixel isolation portion 117 described in the above embodiment. The pixel isolation portion 117 surrounding each of the pixels 541A, 541B, 541C, and 541D may have gaps. That is, the entire circumference of the pixels 541A, 541B, 541C, and 541D does not have to be surrounded by the pixel isolation portion 117. For example, the gaps of the pixel isolation portion 117 are provided in the vicinity of the pad portions 120 and 121 (refer to FIG. 7B).

Although the above embodiment is an example in which the pixel isolation portion 117 has the FTI structure penetrating the semiconductor layer 100S (refer to FIG. 6), the pixel isolation portion 117 may have a configuration other than the FTI structure. For example, the pixel isolation portion 117 does not have to completely penetrate the semiconductor layer 100S, and may have a structure referred to as a deep trench isolation (DTI) structure.

9. Eighth Modification

Meanwhile, in the embodiments described above, the pixel circuit 210 including the amplification transistor AMP, the reset transistor RST, and the selection transistor SEL is supposed to be provided on the second substrate 200. In other words, in the embodiments described above, the amplification transistor AMP, the reset transistor RST, and the selection transistor SEL are formed on the same substrate 200. However, in the embodiment of the present disclosure, for example, it is allowable to use two stacked substrates instead of one second substrate 200. In this case, at least one transistor among the transistors included in the pixel circuit 210 may be provided on one substrate of the stacked substrates, while the remaining transistors may be provided on the other substrate. Specifically, it is allowable to use stacked substrates, namely, a lower substrate 2100 and an upper substrate 2200 (refer to FIG. 38) instead of the one second substrate 200, for example. In this case, formation of an interlayer insulating film 53 and wiring is performed on the lower substrate 2100, and then the upper substrate 2200 is further stacked on the lower substrate 2100. The upper substrate 2200 is stacked on the side of the lower substrate 2100 opposite to the surface facing the semiconductor substrate 11, enabling desired transistors to be provided. As an example, the amplification transistor AMP can be formed on the lower substrate 2100, while the reset transistor RST and/or the selection transistor SEL can be formed on the upper substrate 2200.

In the embodiment of the present disclosure, it is allowable to use three or more stacked substrates instead of one second substrate 200. In addition, a desired transistor among the plurality of transistors included in the pixel circuit 210 may be provided on each of the stacked substrates. In this case, the type of the transistors provided on the stacked substrates is not limited.

In this manner, by using a plurality of stacked substrates instead of one second substrate 200, the area used for the pixel circuit 210 can be reduced. Furthermore, by reducing the area of the pixel circuit 210 and miniaturizing individual transistors, the area of the chips constituting the imaging device 1 can also be reduced. In such a case, it is also allowable to increase the area of only a desired transistor among the amplification transistor AMP, the reset transistor RST, and the selection transistor SEL that can constitute the pixel circuit 210. For example, increasing the area of the amplification transistor AMP leads to reduction of noise.

Figure 42:
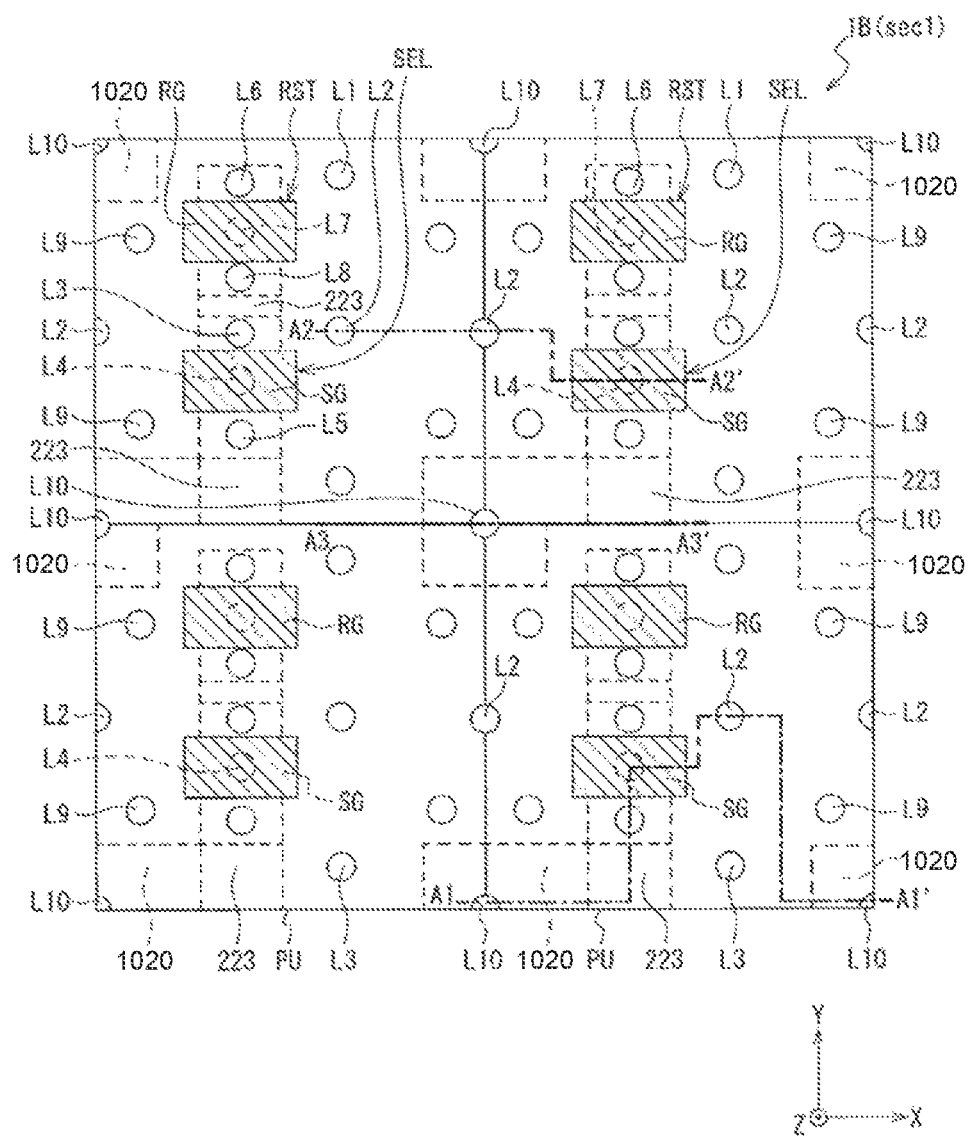
FIG. 42 is a cross-sectional view (part 1) in a horizontal direction illustrating a layout example of a plurality of pixel units according to the eighth modification of the first embodiment of the present disclosure.
Figure 43:
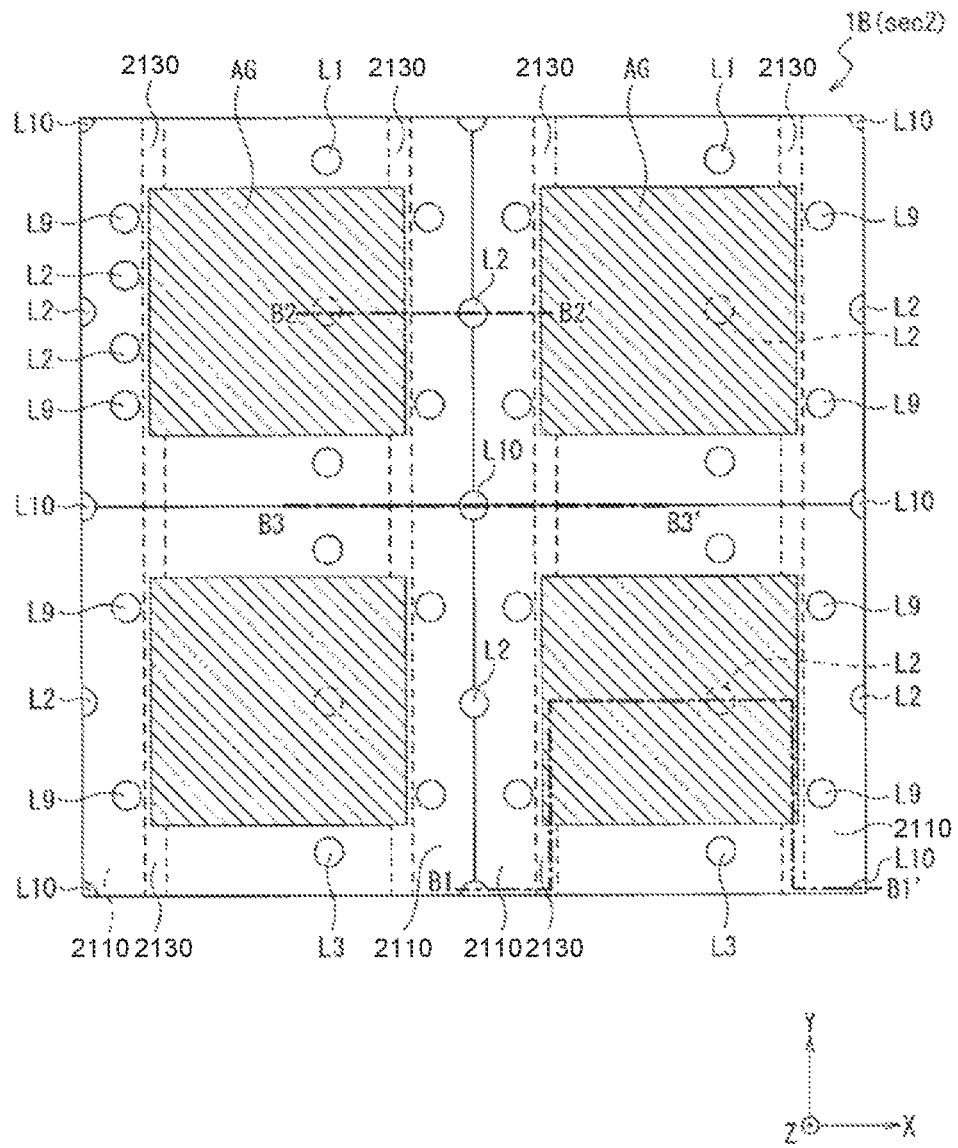
FIG. 43 is a cross-sectional view (part 2) in the horizontal direction illustrating a layout example of a plurality of pixel units according to the eighth modification of the first embodiment of the present disclosure.
Figure 44:
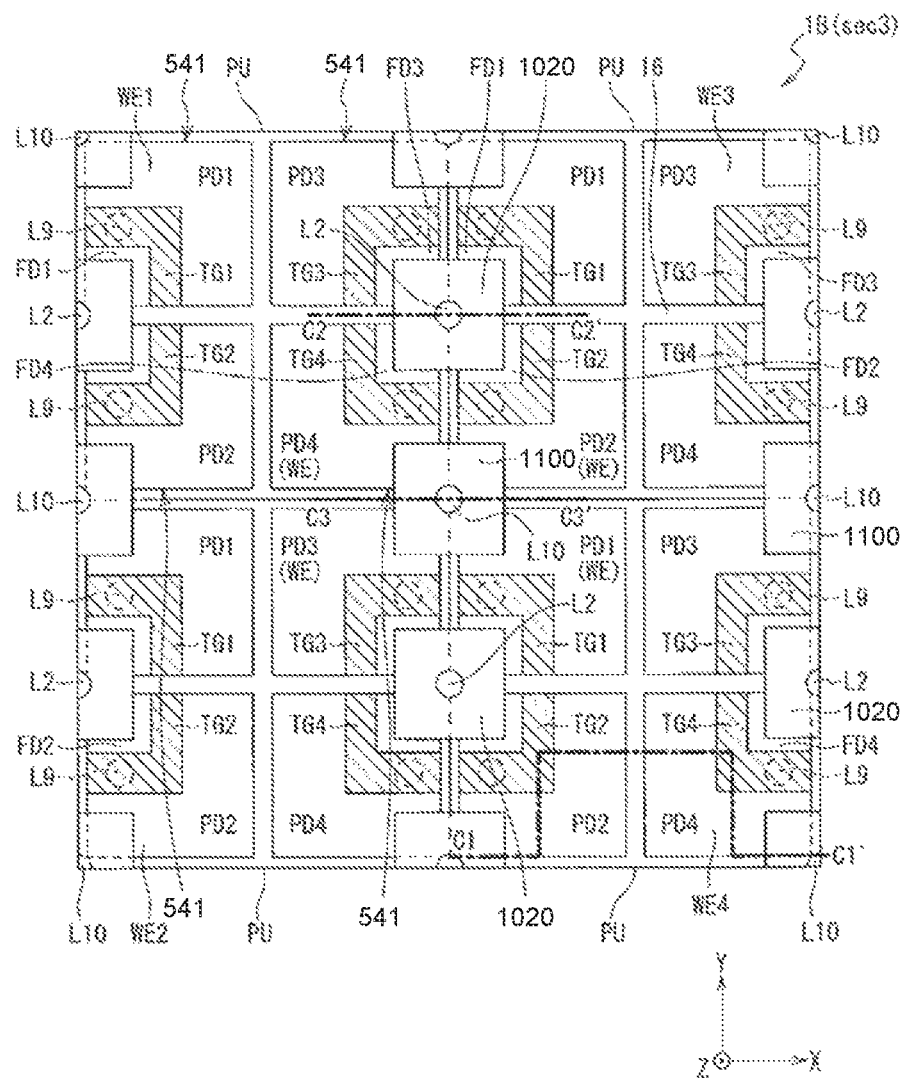
FIG. 44 is a cross-sectional view (part 3) in the horizontal direction illustrating a layout example of a plurality of pixel units according to the eighth modification of the first embodiment of the present disclosure.

An eighth modification in which two stacked substrates are used instead of one second substrate 200 will be described with reference to FIGS. 38 to 44. FIGS. 38 to 41 are cross-sectional views in the thickness direction illustrating a configuration example of an imaging device 1B according to the eighth modification of the present embodiment. FIGS. 42 to 44 are cross-sectional views in a horizontal direction illustrating exemplary layouts of a plurality of pixel units PU according to the eighth modification of the present embodiment. Note that the cross-sectional views illustrated in FIGS. 38 to 41 are merely schematic views, and are not views intended to illustrate an actual structure with strict correctness. In the cross-sectional views illustrated in FIGS. 38 to 41, positions of the transistors and impurity diffusion layers in the horizontal direction are intentionally changed in positions sec1 to sec3 to facilitate illustrating the configuration of the imaging device 1B in the drawings.

Figure 38:
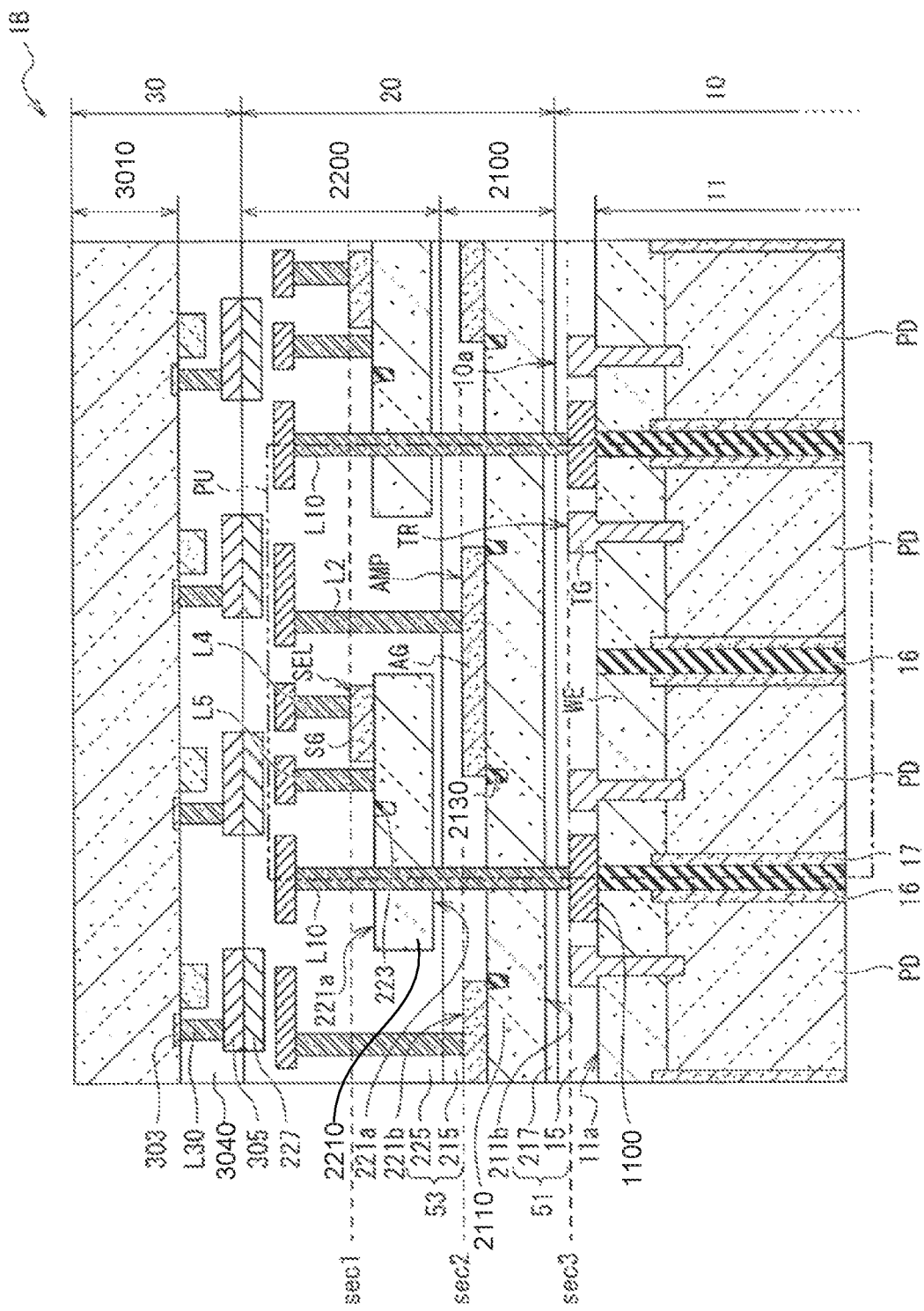
FIG. 38 is a cross-sectional view in a thickness direction illustrating a configuration example of an imaging device according to an eighth modification of the first embodiment of the present disclosure.

Specifically, in the pixel unit PU of the imaging device 1B illustrated in FIG. 38, the cross section at the position sec1 is a cross section of FIG. 42 cut along line A1-A1', the cross section at the position sec2 is a cross section of FIG. 43 cut along line B1-B1', and the cross section at the position sec3 is a cross section of FIG. 44 cut along line C1-C1'. Similarly, in the imaging device 1B illustrated in FIG. 39, the cross section at the position sec1 is a cross section of FIG. 42 cut along line A2-A2', the cross section at the position sec2 is a cross section of FIG. 43 cut along line B2-B2', and the cross section at the position sec3 is a cross section of FIG. 44 cut along line C2-C2'. In an imaging device 1B illustrated in FIG. 40, the cross section at the position sec1 is a cross section of FIG. 42 cut along line A3-A3', the cross section at the position sec2 is a cross section of FIG. 43 cut along line B3-B3', and the cross section at the position sec3 is a cross section of FIG. 44 cut along line C3-C3'.

Figure 39:
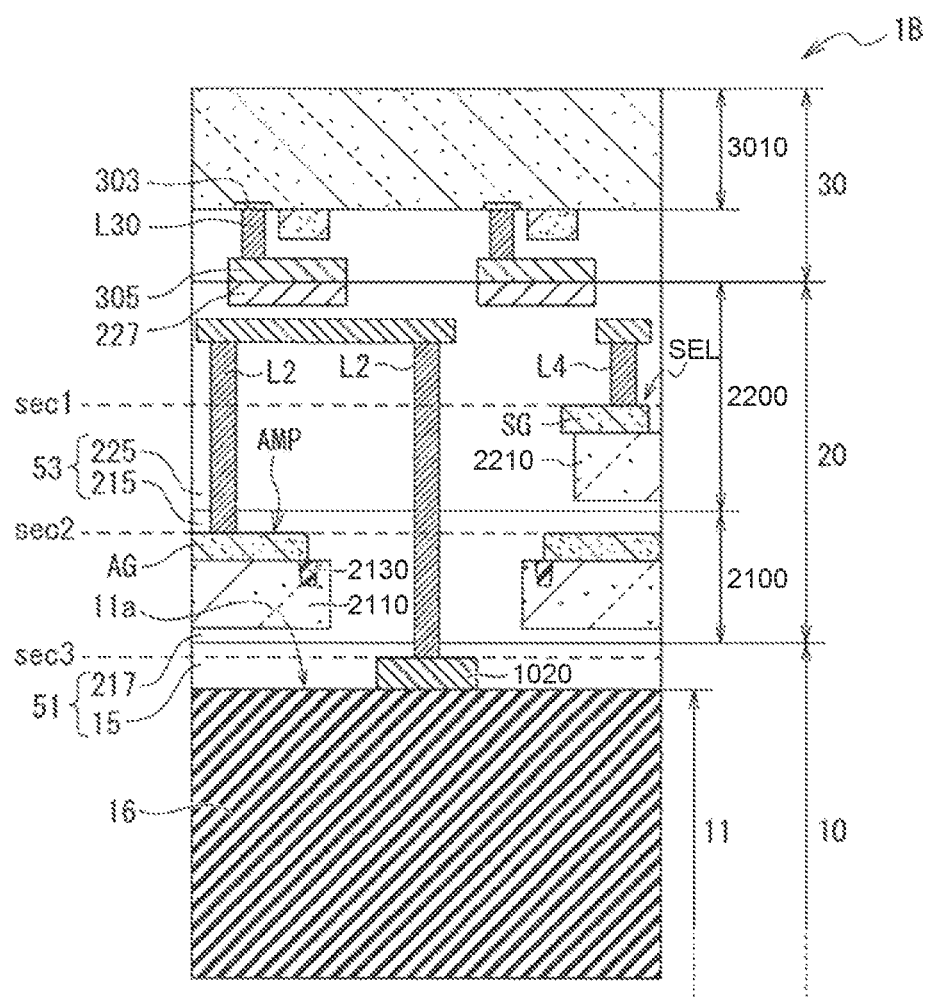
FIG. 39 is a cross-sectional view (part 1) in a thickness direction illustrating a configuration example of the imaging device according to the eighth modification of the first embodiment of the present disclosure.
Figure 40:
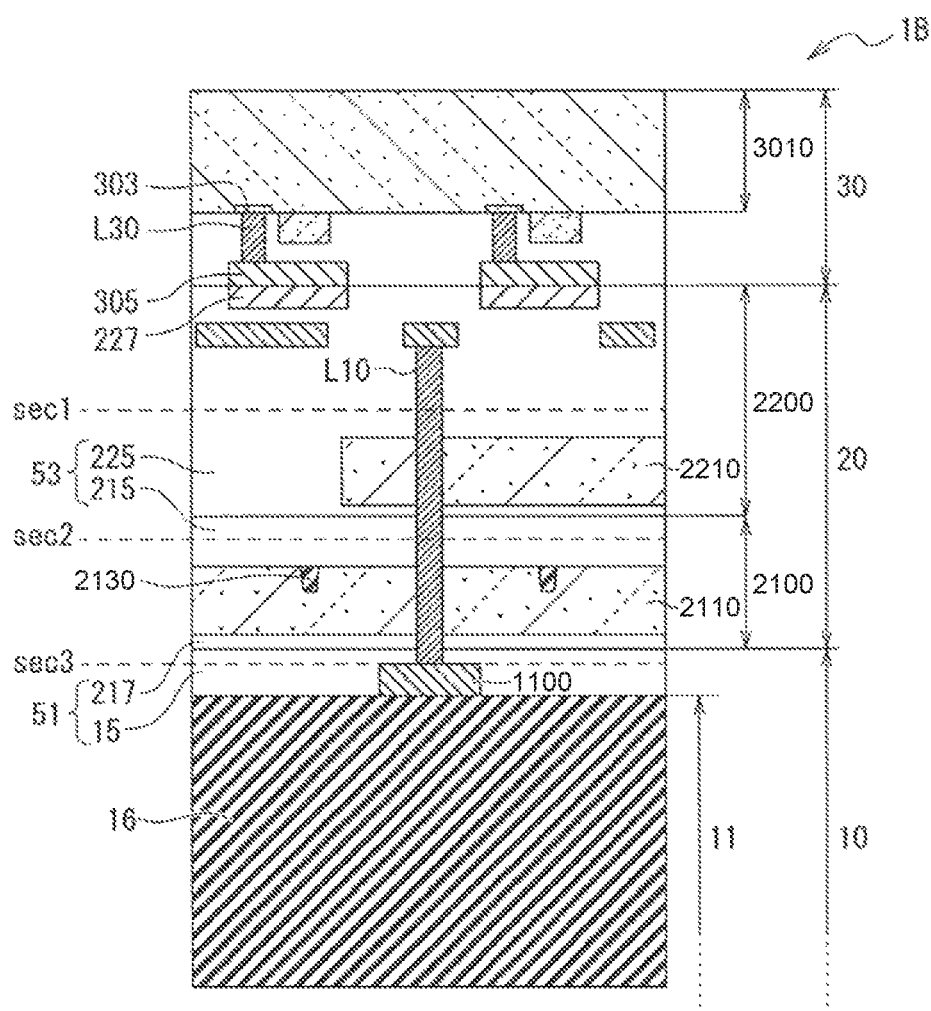
FIG. 40 is a cross-sectional view (part 2) in a thickness direction illustrating a configuration example of an imaging device according to the eighth modification of the first embodiment of the present disclosure.

As illustrated in FIGS. 39 and 44, the imaging device 1B includes a common pad electrode 1020 disposed across the plurality of pixels 541 and one wiring line L2 provided on the common pad electrode 1020, as shared portions. For example, the imaging device 1B includes a region in which nodes of floating diffusion FD1 to FD4 of the four pixels 541 are adjacent to each other via an element isolation layer 16 in plan view. The common pad electrode 1020 is provided in this region. The common pad electrode 1020 is disposed across the four nodes of floating diffusion FD1 to FD4, and is electrically connected to the four nodes of the floating diffusion FD1 to FD4, respectively. The common pad electrode 1020 is formed of a polysilicon film doped with an n-type impurity or a p-type impurity, for example.

On the central portion of the common pad electrode 1020, one wiring line L2 (that is, a floating diffusion contact) is provided. As illustrated in FIGS. 39 and 42 to 44, the wiring line L2 provided on the central portion of the common pad electrode 1020 extends from the first substrate portion 10 through the lower substrate 2100 of a second substrate portion 20 to reach the upper substrate 2200 of the second substrate portion 20, and is further connected to the gate electrode AG of the amplification transistor AMP via wiring and the like provided in the upper substrate 2200.

Furthermore, as illustrated in FIGS. 38 and 44, the imaging device 1B includes: a common pad electrode 1100 disposed across the plurality of pixels 541; and one wiring line L10 provided on the common pad electrode 1100, as shared portions. For example, the imaging device 1B includes a region in which well layers WE of the four pixels 541 are adjacent to each other, in plan view, with the element isolation layer 16 interposed therebetween. The common pad electrode 1100 is provided in this region. The common pad electrode 1100 is disposed across each of the well layers WE of the four pixels 541 and is electrically connected to each of the well layers WE of the four pixels 541. As an example, the common pad electrode 1100 is disposed between one common pad electrode 1020 and another common pad electrode 1020 disposed in line in a Y-axis direction. In the Y-axis direction, the common pad electrodes 1020 and 1100 are alternately arranged. The common pad electrode 1100 is formed of a polysilicon film doped with an n-type impurity or a p-type impurity, for example.

The one wiring line L10 (that is, well contact) is provided on the central portion of the common pad electrode 1100. As illustrated in FIGS. 38, 40, and 42 to 44, the wiring line L10 provided on the central portion of the common pad electrode 1100 extends from the first substrate portion 10 through the lower substrate 2100 of the second substrate portion 20 to reach the upper substrate 2200 of the second substrate portion 20, and is further connected to a reference potential line that supplies a reference potential (for example, ground potential: 0 V) through wiring or the like provided in the upper substrate 2200.

The wiring line L10 provided on the central portion of the common pad electrode 1100 is electrically connected to the upper surface of the common pad electrode 1100, the inner surface of a through hole provided in the lower substrate 2100, and the inner surface of a through hole provided in the upper substrate 2200, individually. With this configuration, the well layer WE of the semiconductor substrate 11 of the first substrate portion 10, the well layer of the lower substrate 2100 of the second substrate portion 20, and the well layer of the upper substrate 2200 are connected to the reference potential (for example, ground potential: 0 V).

The imaging device 1B according to the present modification has effects similar to the case of the imaging device 1 according to the embodiment of the present disclosure described above. Furthermore, the imaging device 1B further includes common pad electrodes 1020 and 1100 provided on the front surface 11a side of the semiconductor substrate 11 constituting the first substrate portion 10 so as to be disposed across a plurality of (for example, four) pixels 541 adjacent to each other. The common pad electrode 1020 is electrically connected to the nodes of the floating diffusion FD of the four pixels 541. The common pad electrode 1100 is electrically connected to the well layers WE of the four pixels 541. With this configuration, the wiring line L2 connected to the floating diffusion FD can be used in common by a unit of four pixels 541. This allows the wiring line L10 connected to the well layer WE to be used in common by the unit of four pixels 541. This enables reduction of the number of wiring lines L2 and L10, leading to the decrease in the area of the pixel 541 and miniaturization of the imaging device 1B.

Figure 41:
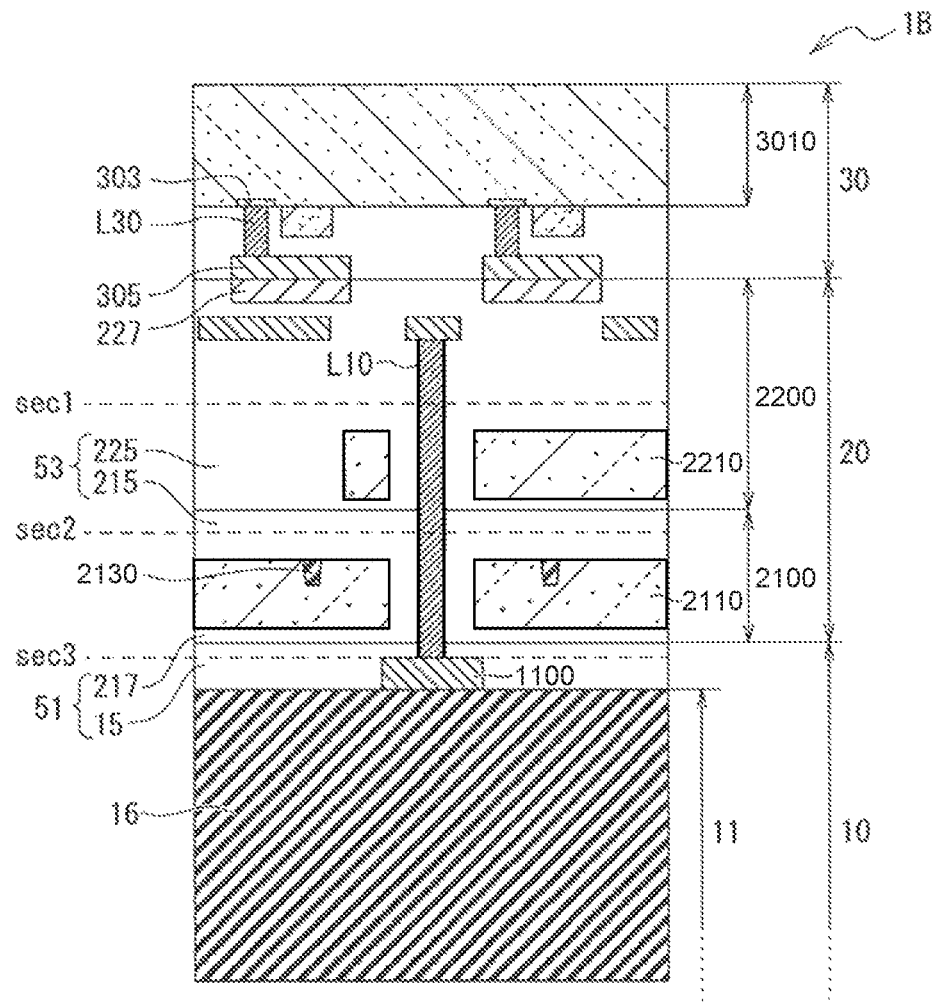
FIG. 41 is a cross-sectional view (part 3) in a thickness direction illustrating a configuration example of the imaging device according to the eighth modification of the first embodiment of the present disclosure.

Incidentally, the imaging device 1B according to the present modification can have a configuration as illustrated in FIG. 41. Specifically, the wiring line L10 may be provided so as to penetrate the insulating films 215 and 225.

10. Second Embodiment

Figure 45:
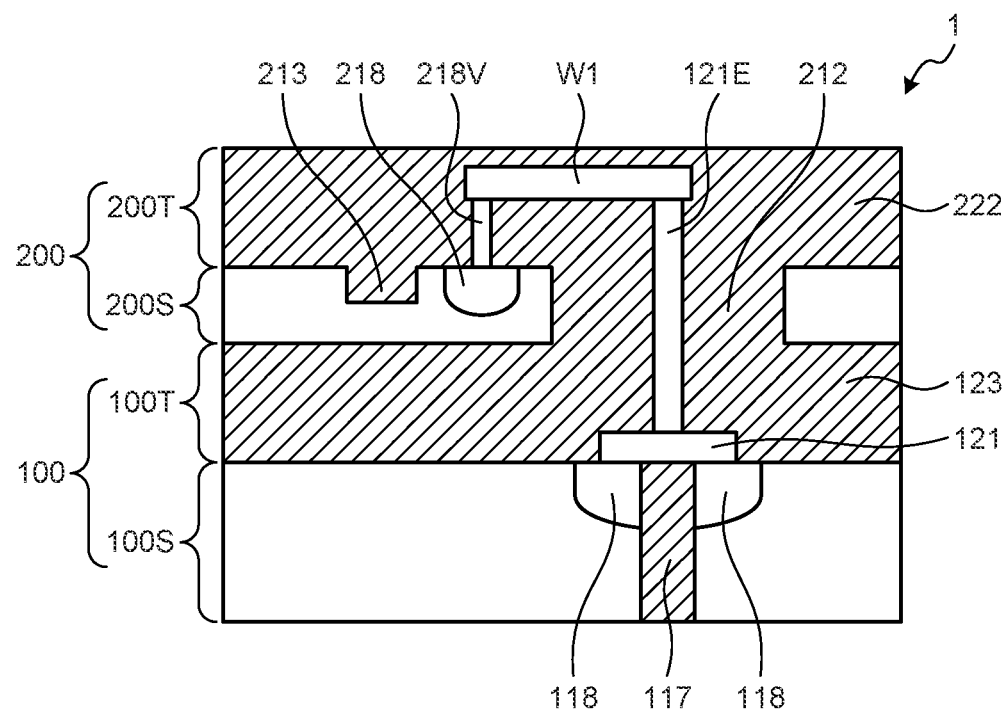
FIG. 45 is a schematic cross-sectional view (part 1) illustrating an example of a main part of the configuration of the imaging device illustrated in FIG. 3.
Figure 46:
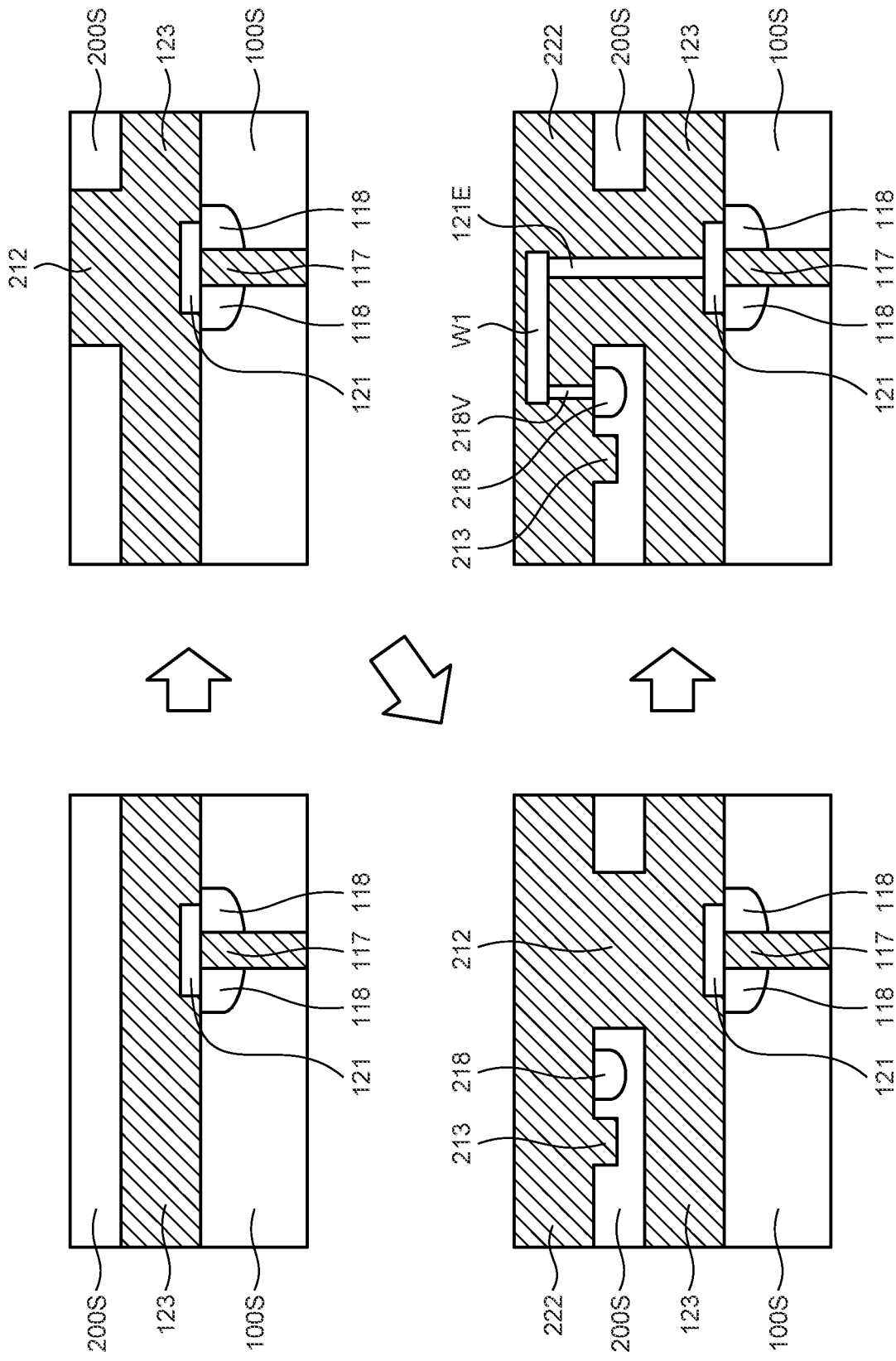
FIG. 46 is a process cross-sectional view illustrating a method of manufacturing the imaging device, corresponding to FIG. 45.
Figure 47:
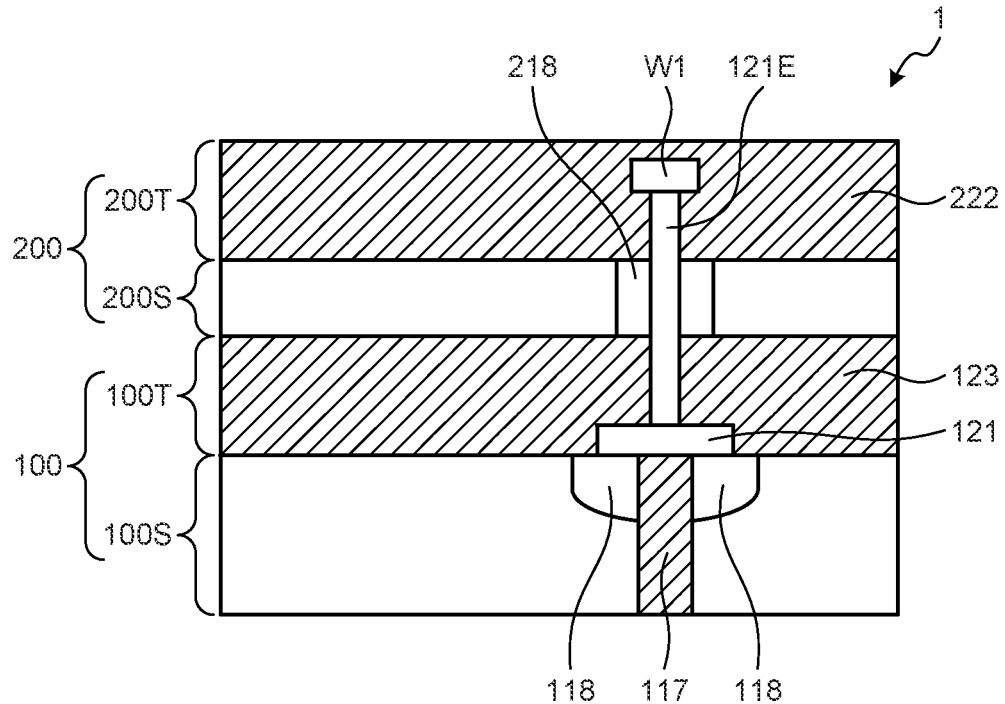
FIG. 47 is a schematic cross-sectional view (part 1) illustrating an example of a main part of a configuration of an imaging device according to a second embodiment of the present disclosure.

Next, details of a second embodiment of the present disclosure will be described. The present inventors continued intensive studies to achieve further miniaturization of the imaging device 1 according to the first embodiment as described above, and have devised an imaging device 1 according to the second embodiment of the present disclosure. Hereinafter, details of achievement of the techniques of the second embodiment of the present disclosure devised by the present inventors will be described with reference to FIGS. 45 to 47. FIG. 45 is a schematic cross-sectional view illustrating an example of a main part of the configuration of the imaging device 1 illustrated in FIG. 3. FIG. 46 is a process cross-sectional view illustrating a method of manufacturing the imaging device 1, corresponding to FIG. 45. Furthermore, FIG. 47 is a schematic cross-sectional view illustrating an example of a main part of the configuration of the imaging device 1 according to the present embodiment. For the sake of clarity, FIGS. 45 to 47 illustrate only the main part of the imaging device 1 related to the second embodiment, and omit illustrations of the other parts.

The imaging device 1 is required to electrically connect the VSS contact region 118 of the semiconductor layer 100S and the VSS contact region 218 of the semiconductor layer 200S to each other so as to have the same potential (for example, a power supply potential or the like). Specifically, as illustrated in FIG. 45, the imaging device 1 provides an electrical connection between the through-substrate electrode 121E electrically connected to the VSS contact region 118 and the connection portion 218V electrically connected to the VSS contact region 218 by the first wiring layer W1, thereby setting the VSS contact regions 118 and 218 to have the same potential.

Furthermore, the configuration as illustrated in FIG. 45 can be formed by the manufacturing method illustrated in FIG. 46. First, as illustrated in the upper left drawing of FIG. 46, the first substrate 100 on which the VSS contact region 118, the pixel isolation portion 117, the pad portion 121, and the like are formed is bonded with the second substrate 200 via the interlayer insulating film 123, and a process of thinning the second substrate 200 is further performed. Next, as illustrated in the upper right drawing of FIG. 46, the semiconductor layer 200S is partially removed by lithography and dry etching, and then an insulating film is embedded in the removed portion, thereby forming the insulating region 212 through which the through-substrate electrode 121E and the like are to penetrate.

Subsequently, as illustrated in the lower left drawing of FIG. 46, the VSS contact region 218 and the element isolation region 213 are formed in the semiconductor layer 200S, and then the interlayer insulating film 222 is formed on the semiconductor layer 200S. Furthermore, formation of a through hole (not illustrated) penetrating the interlayer insulating film 222, the insulating region 212, and the interlayer insulating film 123 is performed, and then a conductive material is embedded in the through hole to form the through-substrate electrode 121E. Subsequently, the first wiring layer W1 is formed to be electrically connected to the through-substrate electrode 121E, thereby obtaining a configuration as illustrated in the lower right drawing of FIG. 46.

As described above, in the manufacturing method illustrated in FIG. 46, the semiconductor layer 200S is partially removed in order to form the through-substrate electrode 121E and the insulating region 212 for insulating the through-substrate electrode 121E and the semiconductor layer 200S from each other. Therefore, on the imaging device 1 illustrated in FIG. 45, a region on the semiconductor layer 200S where elements such as transistors are to be formed is restricted by the amount of removal of the semiconductor layer 200S. As a result, the imaging device 1 illustrated in FIG. 45 has a restriction in the formation region of the element, leading to a lower degree of freedom in the layout of elements, making it difficult to achieve further miniaturization of the imaging device 1 in some cases. Furthermore, in the imaging device 1 illustrated in FIG. 45, the limitation regarding the region where the element is to be formed on the semiconductor layer 200S also leads to dimensional limitation of the elements, causing an occurrence of limitation in an attempt to further improve the characteristics of the elements. Although the above description is an example in which the VSS contact regions 118 and 218 electrically connected to the power supply line VSS, the above-described situation is not limited to the VSS contact regions 118 and 218. That is, the above-described situation is similarly applicable to other portions of the imaging device 1 connected to the same potential.

In view of the above-described situation, the present inventors have devised the second embodiment of the present disclosure. The imaging device 1 according to the present embodiment devised by the present inventors includes a through-substrate electrode 121E as illustrated in FIG. 47. The through-substrate electrode 121E penetrates from the surface of the semiconductor layer (second semiconductor substrate) 200S opposite to the surface facing the semiconductor layer (first semiconductor substrate) 100S through the semiconductor layer 200S and the interlayer insulating film (first interlayer insulating film) 123 to extend to the semiconductor layer 100S, so as to electrically connect the semiconductor layer 100S and the semiconductor layer 200S to each other. Furthermore, penetration of the through-substrate electrode 121E through the semiconductor layer 200S allows the side surface of the through-substrate electrode 121E to be partially in contact with the semiconductor layer 200S. By adopting such a configuration, the through-substrate electrode 121E and the semiconductor layer 200S are electrically connected to each other partially on the side surface.

In the present embodiment, by adopting the configuration of the through-substrate electrode 121E as described above, it is possible to manage without partially removing the semiconductor layer 200S in order to form the through-substrate electrode 121E and the insulating region 212 having the insulating film (not illustrated) to cover the side walls of the through-substrate electrode 121E. As a result, according to the present embodiment, it is possible to enlarge the region on the semiconductor layer 200S usable for formation of elements, leading to a higher degree of freedom of the layout of elements, facilitating further miniaturization of the imaging device 1. In addition, according to the present embodiment, enlargement of the region usable for formation of the elements on the semiconductor layer 200S makes it possible to enlarge each of the elements, facilitating improvement of the characteristics of the element. Hereinafter, details of the present embodiment like this will be sequentially described. In the following description, only points different from the above-described first embodiment will be described, and description of points common to the first embodiment will be omitted.

[Configuration]

Figure 48:
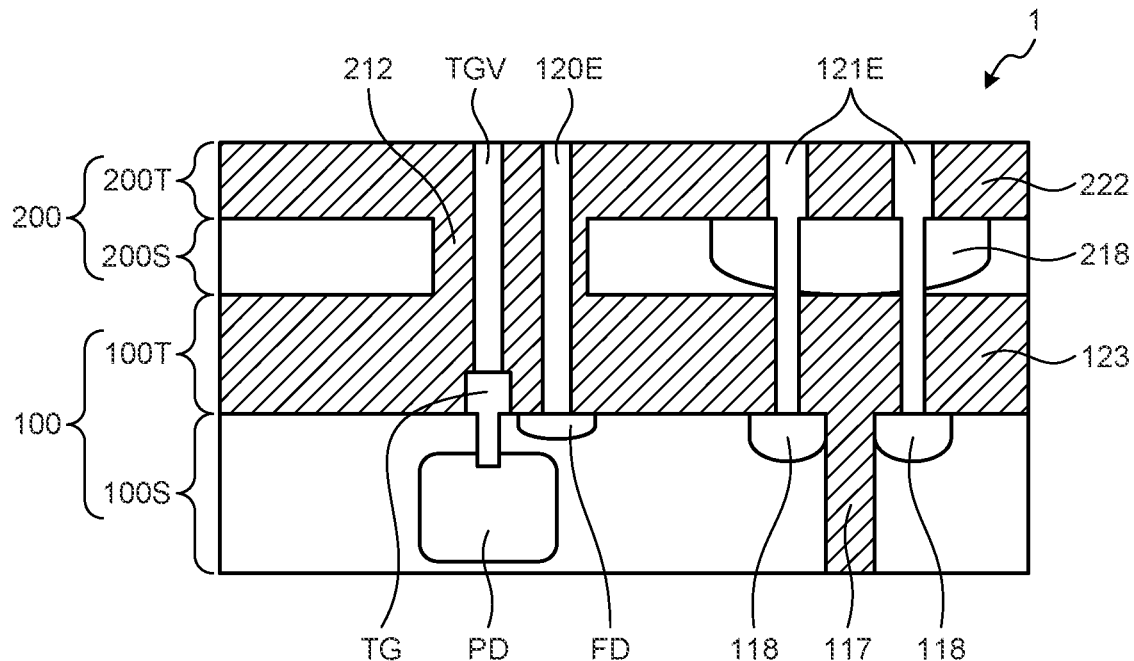
FIG. 48 is a schematic cross-sectional view (part 2) illustrating an example of a main part of a configuration of the imaging device according to the second embodiment of the present disclosure.

First, a detailed configuration of the imaging device 1 of the present embodiment will be described with reference to FIG. 48. FIG. 48 is a schematic cross-sectional view illustrating an example of a main part of the configuration of the imaging device 1 according to the present embodiment. For the sake of clarity, FIG. 48 illustrates only the main part of the imaging device 1 related to the present embodiment, and omit illustrations of the other parts.

Specifically, as illustrated in FIG. 48, the through-substrate electrode 121E penetrates from the surface of the semiconductor layer 200S opposite to the surface facing the semiconductor layer 100S through the semiconductor layer 200S and the interlayer insulating film 123 to extend to the semiconductor layer 100S, so as to electrically connect the semiconductor layers 100S and 200S to each other. Furthermore, penetration of the through-substrate electrode 121E through the semiconductor layer 200S allows the side surface of the through-substrate electrode 121E to be partially in contact with the semiconductor layer 200S, so that the through-substrate electrode 121E and the semiconductor layer 200S are electrically connected to each other partially on the side surface. More specifically, the through-substrate electrode 121E penetrates the VSS contact region (second region) 218 provided in the semiconductor layer 200S and extends to a surface of the VSS contact region (first region) 118 provided in the semiconductor layer 100S, facing the semiconductor layer 200S. Furthermore, penetration of the through-substrate electrode 121E through the VSS contact region 218 allows the side surface of the through-substrate electrode 121E to be partially in contact with the VSS contact region 218, allowing the through-substrate electrode 121E and the VSS contact region 218 to be electrically connected to each other. In addition, since the through-substrate electrode 121E extends to the surface of the VSS contact region 118 facing the semiconductor layer 200S, the through-substrate electrode 121E is electrically connected to the VSS contact region 118. Therefore, the through-substrate electrode 121E can electrically connect the VSS contact region 118 and the VSS contact region 218 to each other so as to have the same potential. In the present embodiment, the VSS contact region 218 is supposed to extend in the thickness direction of the semiconductor layer 200S as illustrated in FIG. 48.

In the present embodiment, the material of the through-substrate electrode 121E is not particularly limited, but it is preferable to use a material being a heat-resistant metal such as copper (Cu), tungsten (W), or aluminum (Al). Furthermore, in the present embodiment, it is allowable to provide a barrier metal film (not illustrated) between the through-substrate electrode 121E and an insulating film surrounding the outer periphery of the through-substrate electrode 121E. The barrier metal film can be formed of a material such as titanium nitride (TiN), tungsten nitride (WN), titanium (Ti), tantalum nitride (TaN), tantalum (Ta), zirconium (Zr), ruthenium (Ru), and cobalt (Co), alone or in layers. More specifically, in the present embodiment, the through-substrate electrode 121E can be formed by, for example, a combination of Ti/TiN/W or the like. Furthermore, in the present embodiment, the cross-sectional shape and size of the through-substrate electrode 121E in the horizontal direction are not particularly limited. For example, in the present embodiment, when having a circular cross-sectional shape, the diameter of the through-substrate electrode 121E is preferably smaller than the size of the pixel 541 or the pitch between the pixels 541, such as several 10 nm to hundreds and several 10 nm.

In the present embodiment, the VSS contact regions 118 and 218 are semiconductor regions of an identical conductivity type, and more specifically, can be formed as p-type semiconductor regions. However, in the present embodiment, the VSS contact regions 118 and 218 are not limited to the p-type semiconductor regions, and may be n-type semiconductor regions, and are not particularly limited.

Furthermore, in the present embodiment, the portions electrically connected by the through-substrate electrode 121E are not limited to the VSS contact regions 118 and 218, and is not particularly limited as long as the portions are required to have the same potential in the imaging device 1.

Furthermore, in the present embodiment, the second substrate 200 may include a plurality of stacked semiconductor substrates (not illustrated), similarly to the eighth modification described with reference to FIGS. 38 to 44. In such a case, the through-substrate electrodes 120E and 121E may be provided so as to penetrate, for example, a plurality of semiconductor substrates or element isolation regions (not illustrated) formed of insulating films provided on the plurality of semiconductor substrates.

[Manufacturing Method]

Figure 49:
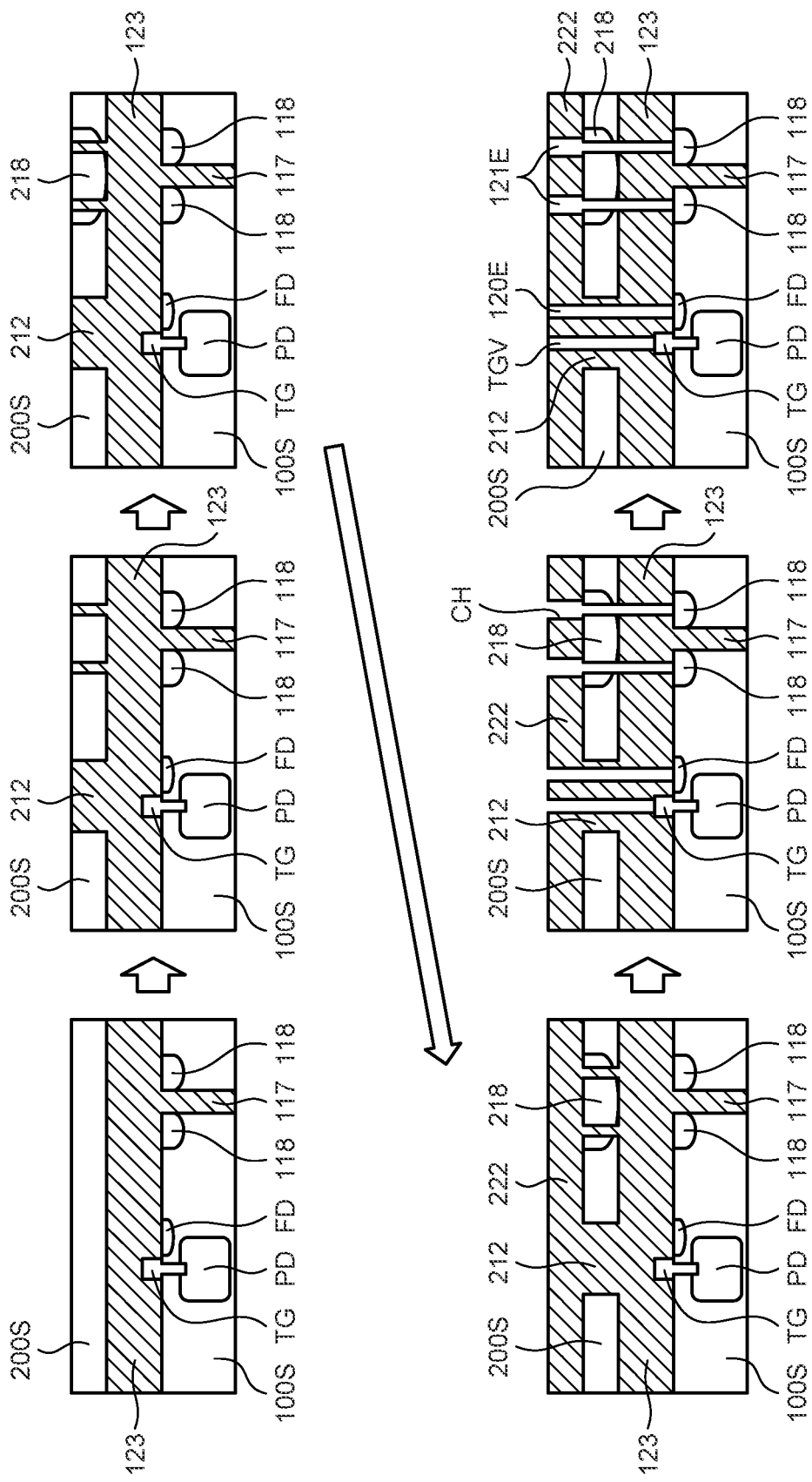
FIG. 49 is a process cross-sectional view illustrating a method of manufacturing an imaging device 1 according to the second embodiment of the present disclosure, corresponding to FIG. 48.

Next, a method of manufacturing the imaging device 1 according to the present embodiment will be described with reference to FIG. 49. FIG. 49 is a process cross-sectional view illustrating the method of manufacturing the imaging device 1 according to the present embodiment, corresponding to FIG. 48. For the sake of clarity, FIG. 49 illustrates only the main part of the imaging device 1 related to the present embodiment, and omit illustrations of the other parts.

First, as illustrated in the upper left drawing of FIG. 49, the second substrate 200 is bonded, via the interlayer insulating film 123, with the first substrate 100 on which the elements (for example, the photodiode PD, the floating diffusion FD, the transfer gate TG, the pixel isolation portion 117, the VSS contact region 118, and the like) are formed, and then, the second substrate 200 is thinned using a grinder, chemical mechanical polishing (CMP), or the like.

Next, as illustrated in an upper center of FIG. 49, the semiconductor layer 200S of the second substrate 200 is partially removed using lithography, dry etching, or the like. Furthermore, by embedding an insulating film (for example, SiO) in the portion from which the semiconductor layer 200S has been removed, formation of the insulating region 212 through which the through-substrate electrodes TGV, 120E, and 121E will penetrate is performed.

Subsequently, as illustrated in the upper right drawing of FIG. 49, the VSS contact region 218 is formed in the semiconductor layer 200S by using lithography, ion implantation, or the like.

Furthermore, as illustrated in the lower left drawing of FIG. 49, an insulating film (for example, SiO) is deposited on the semiconductor layer 200S by chemical vapor deposition (CVD) or the like to form the interlayer insulating film 222.

Next, as illustrated in the lower center drawing of FIG. 49, the interlayer insulating film 222, the semiconductor layer 200S, and the interlayer insulating film 123 are etched using lithography, dry etching, or the like, thereby forming a through hole CH penetrating therethrough.

Subsequently, a barrier metal is applied by a physical vapor deposition (PVD) method, a chemical vapor deposition (CVD) method, or an atomic layer deposition (ALD) method or the like so as to cover, by deposition, the inner wall of the through hole CH. Furthermore, for example, after the barrier metal is etched, a metal film or the like is formed by a plating method, a CVD method, a PVD method, or an ALD method so as to fill the through hole CH. Furthermore, an excessive metal film or the like protruding from the through hole CH is removed by using CMP, dry etching, or the like. With this procedure, it is possible, in the present embodiment, to obtain a configuration as illustrated on the lower right drawing of FIG. 49.

[Effects]

In the present embodiment, the through-substrate electrode 121E electrically connecting the semiconductor layers 100S and 200S to each other has a configuration as described above, that is, configuration in which both of the VSS contact regions 118 and 218 share one through-substrate electrode 121E. In other words, in the present embodiment, by penetrating the VSS contact region 218 while being electrically connected to the VSS contact region 118, the through-substrate electrode 121E is electrically connected to the VSS contact region 218 partially on the side surface of the through-substrate electrode 121E. With such a configuration, the VSS contact regions 118 and 218 can be electrically connected to each other so as to have the same potential by the through-substrate electrode 121E. Furthermore, in the present embodiment, by adopting such a configuration, there is no need to form, around the through-substrate electrode 121E, the insulating region 212 that electrically insulates the through-substrate electrode 121E and the semiconductor layer 200S from each other. Accordingly, in the present embodiment, it is possible to manage without performing partial removal of the semiconductor layer 200S in order to form the insulating region 212 to cover the through-substrate electrode 121E and the side walls of the through-substrate electrode 121E. As a result, according to the present embodiment, not performing partial removal of the semiconductor layer 200S will enlarge the region usable for formation of elements on the semiconductor layer 200S, leading to an increased degree of freedom in the layout of the elements, facilitating further miniaturization of the imaging device 1.

In addition, according to the present embodiment, enlargement of the region usable for formation of elements on the semiconductor layer 200S makes it possible to enlarge the element itself, enabling further improvement of the characteristics of the element. For example, according to the present embodiment, it is possible to ensure, on the semiconductor layer 200S, sufficient-sized formation regions for various types of transistors constituting the pixel circuit 210. Accordingly, ensuring sufficiently large area for forming the transistors makes it possible to reduce the noise of the transistor included in the pixel circuit 210, leading to improvement in the signal/noise ratio of the pixel signal, enabling the imaging device 1 to output better pixel data (image information).

[First Modification]

Figure 50:
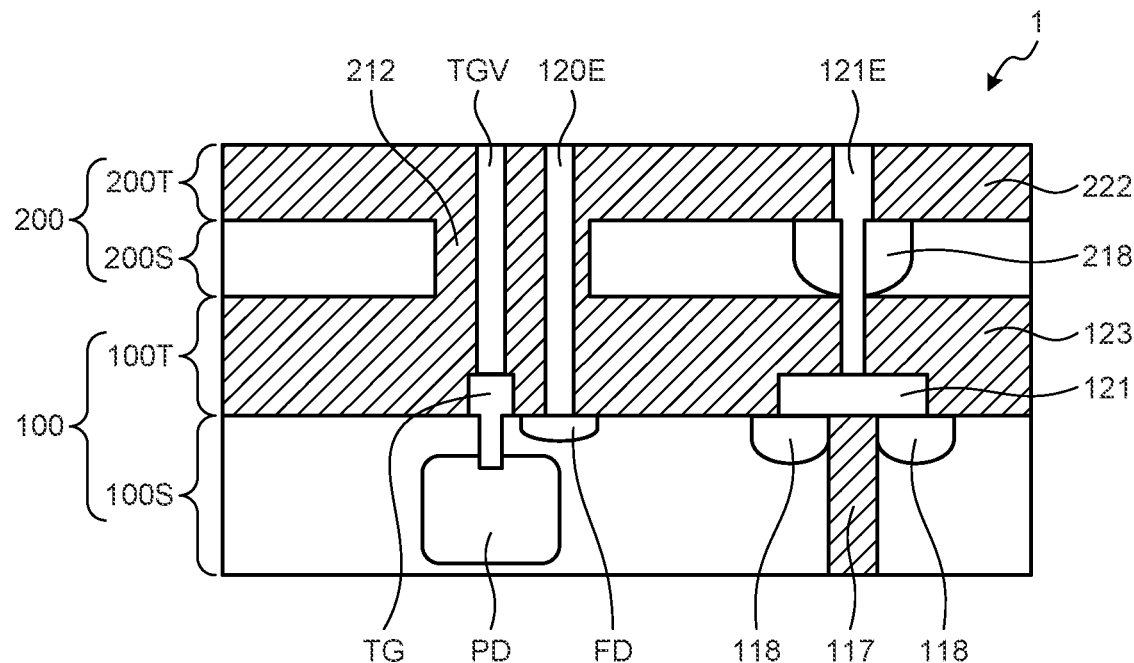
FIG. 50 is a schematic cross-sectional view (part 1) illustrating an example of a main part of a configuration of an imaging device according to a first modification of the second embodiment of the present disclosure.
Figure 52:
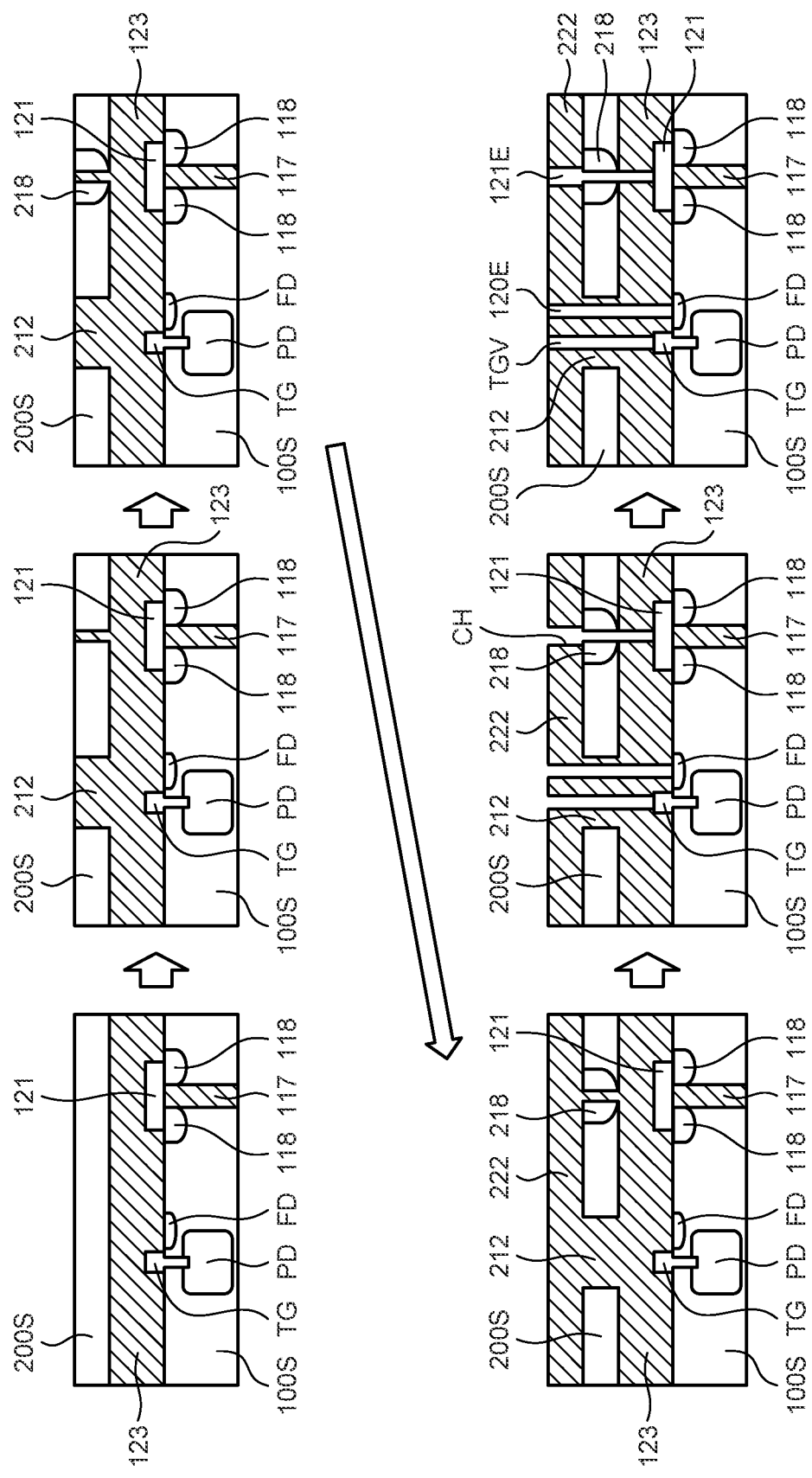
FIG. 52 is a process cross-sectional view illustrating the method of manufacturing the imaging device 1 according to the first modification of the second embodiment of the present disclosure, corresponding to FIG. 50.
Figure 53:
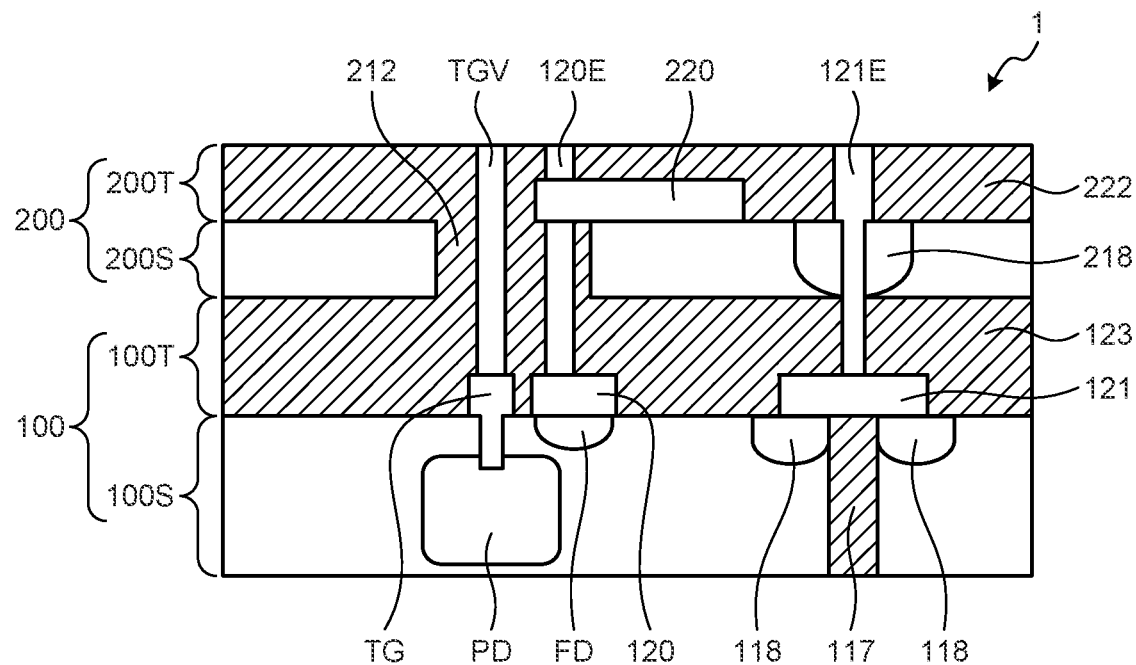
FIG. 53 is a schematic cross-sectional view illustrating an example of a main part of a configuration of an imaging device according to a second modification of the second embodiment of the present disclosure.

In the imaging device 1, there is a case where a plurality of VSS contact regions 118 is provided in the semiconductor layer 100S and where it is required that the plurality of VSS contact regions 118 and the VSS contact region 218 in the semiconductor layer 200S are electrically connected so as to have the same potential. In such a case, by providing a pad portion 121 as described below, it is possible to suppress an increase in the number of the through-substrate electrodes 121E formed in the imaging device 1, making it possible to facilitate further miniaturization of the imaging device 1. Such a first modification of the present embodiment will be described with reference to FIGS. 50 to 53. FIGS. 50 and 52 are schematic cross-sectional views illustrating an example of a main part of a configuration of an imaging device 1 according to the first modification of the present embodiment. FIG. 53 is a process cross-sectional view illustrating the method of manufacturing the imaging device 1 according to the first modification of the present embodiment, corresponding to FIG. 50. For the sake of clarity, FIGS. 50 to 53 illustrate only the main part of the imaging device 1 related to the present modification, and omit illustrations of the other parts. Here, only points different from the above-described second embodiment will be described, and description of points common to the second embodiment will be omitted.

In the present modification, as illustrated in FIG. 50, a plurality of VSS contact regions 118 is provided in the semiconductor layer 100S. Furthermore, in the present modification, a pad portion (first contact portion) 121 is provided on a surface of the VSS contact region 118 of the semiconductor layer 100S facing the semiconductor layer 200S. More specifically, the pad portion 121 is provided across the plurality of VSS contact regions 118 described above so as to electrically connect the plurality of VSS contact regions 118 to each other. In addition, in the present modification, the through-substrate electrode 121E penetrates the VSS contact region 218 provided in the semiconductor layer 200S and extends to the upper surface of the pad portion 121 provided across the plurality of VSS contact regions 118. In this manner, the through-substrate electrode 121E is electrically connected to the pad portion 121 on the upper surface of the pad portion 121. Therefore, in the present modification, the through-substrate electrode 121E can electrically connect the VSS contact region 218 and the plurality of VSS contact regions 118 to each other such that the VSS contact region 218 and the plurality of VSS contact regions 118 have the same potential. The pad portion 121 can be formed of a conductive material such as metal or doped polysilicon doped with impurities, for example.

Furthermore, in the present embodiment and the present modification, the second substrate 200 may include a plurality of stacked semiconductor substrates (not illustrated), similarly to the eighth modification described with reference to FIGS. 38 to 44. In such a case, the side surface of the through-substrate electrode 121E may be partially in contact with the plurality of semiconductor substrates.

Figure 51:
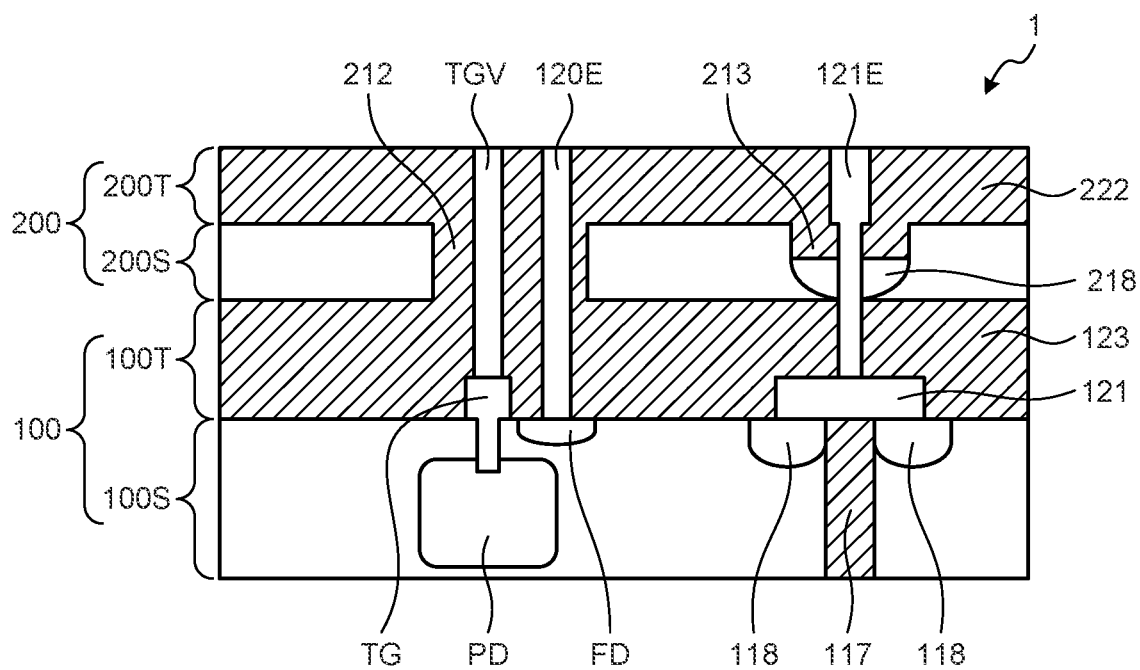
FIG. 51 is a schematic cross-sectional view (part 2) illustrating an example of a main part of a configuration of the imaging device according to the first modification of the second embodiment of the present disclosure.

Furthermore, a configuration as illustrated in FIG. 51 is applicable in the present embodiment and the present modification. Specifically, as illustrated in FIG. 51, the element isolation region 213 having an STI structure is provided on the VSS contact region 218 of the semiconductor layer 200S. The through-substrate electrode 121E is provided to penetrate the element isolation region 213 so as to be in contact with the VSS contact region 218. In this manner, in the present embodiment and the present modification, the through-substrate electrode 121E can be provided so as to penetrate the element isolation region 213, making it possible to increase the region usable to arrange the through-substrate electrode 121E and the element isolation region 213, enabling achievement of higher degree of freedom of the layout of elements in the semiconductor layer 200S. This results in achievement of further miniaturization of the imaging device 1. In such a configuration as illustrated in FIG. 51, similarly to the eighth modification described with reference to FIGS. 38 to 44, the second substrate 200 can be constituted with a plurality of stacked semiconductor substrates (not illustrated).

Next, a method of manufacturing the imaging device 1 according to the present modification will be described with reference to FIG. 52. First, in the present modification, as illustrated in the upper left drawing of FIG. 52, the pad portion 121 extending across the plurality of VSS contact regions 118 is formed on the semiconductor layer 100S of the first substrate 100. Furthermore, the above-described first substrate 100 and the second substrate 200 are bonded with each other via the interlayer insulating film 123 and then, a thinning process is applied to the second substrate 200. The subsequent steps are similar to those of the second embodiment, and thus the description thereof is omitted here.

According to the present modification, by providing the pad portion 121 that electrically connects the plurality of VSS contact regions 118 in the semiconductor layer 100S, it is possible to suppress an increase in the number of through-substrate electrodes 121E formed in the imaging device 1, facilitating further miniaturization of the imaging device 1.

[Second Modification]

In the imaging device 1, it is required to electrically connect a plurality of elements (for example, the amplification transistor AMP and the FD conversion gain switching transistor FDG) formed on the semiconductor layer 200S and the floating diffusion FD provided in the semiconductor layer 100S to each other so as to have the same potential. In such a case, a pad portion 220 as described below is provided on the semiconductor layer 200S, and the plurality of elements is electrically connected to each other by the pad portion 220. Furthermore, in such a case, by electrically connecting the through-substrate electrode 121E and the pad portion 220 to each other, the plurality of elements and the floating diffusion FD can be electrically connected to each other so as to have the same potential. As a result, it is possible to suppress an increase in the number of through-substrate electrodes 120E, wiring lines (not illustrated), and the like formed in the imaging device 1, facilitating further miniaturization of the imaging device 1.

Figure 54:
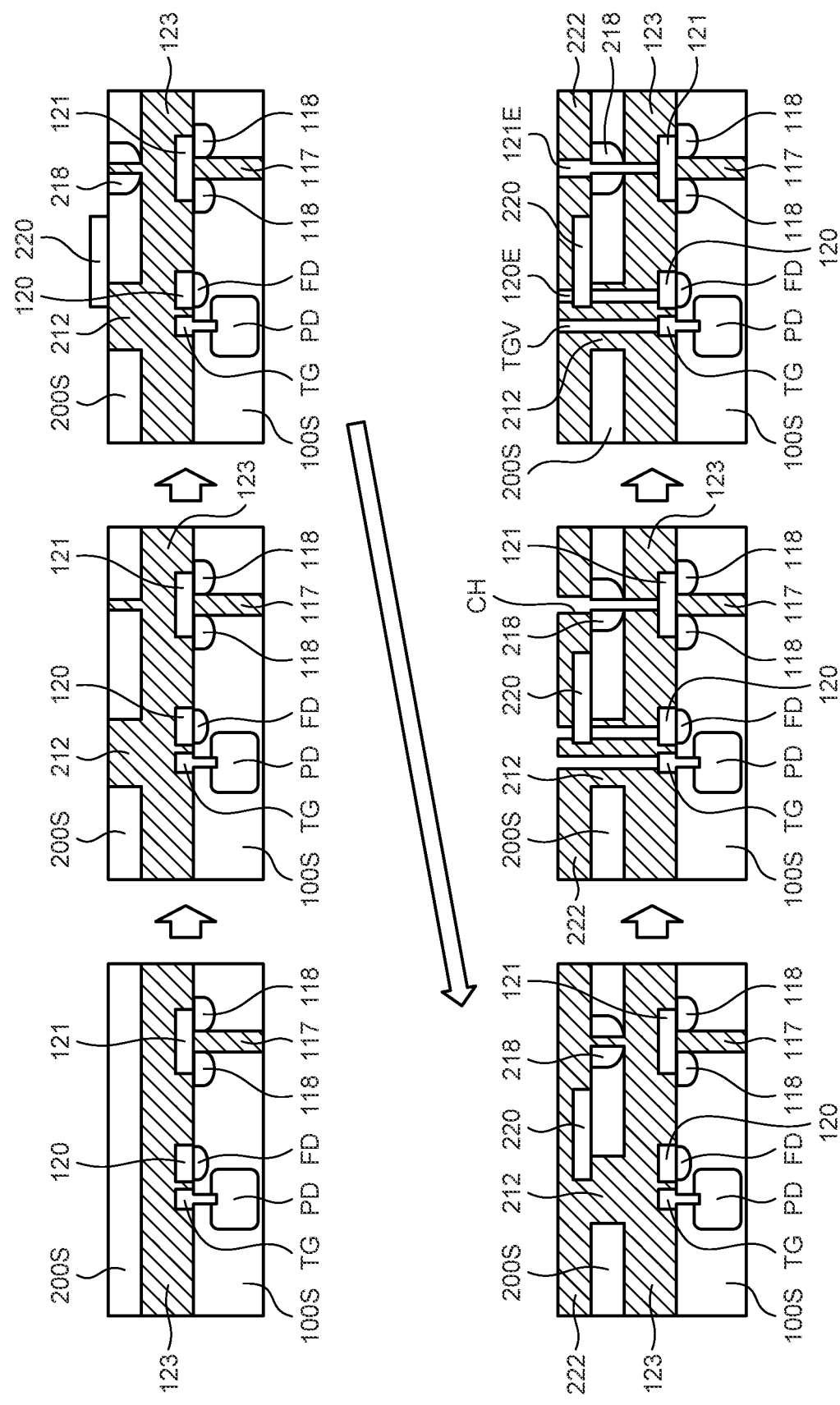
FIG. 54 is a process cross-sectional view illustrating the method of manufacturing the imaging device 1 according to the second modification of the second embodiment of the present disclosure, corresponding to FIG. 53.

Such a second modification of the present embodiment will be described with reference to FIGS. 53 and 54. FIG. 53 is a schematic cross-sectional view illustrating an example of a main part of a configuration of an imaging device 1 according to the second modification of the present embodiment. Furthermore, FIG. 54 is a process cross-sectional view illustrating the method of manufacturing the imaging device 1 according to the second modification of the present embodiment, corresponding to FIG. 53. For the sake of clarity, FIGS. 53 and 54 illustrate only the main part of the imaging device 1 related to the present modification, and omit illustrations of the other parts. Here, only points different from the above-described second embodiment will be described, and description of points common to the second embodiment will be omitted.

Specifically, in the present modification, as illustrated in FIG. 53, a pad portion 220 formed of a conductive material is provided on the semiconductor layer 200S. The pad portion 220 can electrically connect elements formed on the semiconductor layer 200S, for example, a gate (not illustrated) of the amplification transistor AMP and a source (specifically, provided in the semiconductor layer 200S) of the FD conversion gain switching transistor FDG to each other. In the present modification, the through-substrate electrode 120E is electrically connected to the pad portion 220, and further extends to the upper surface of the pad portion 120 provided on the floating diffusion FD. Accordingly, due to the electrical connection between the through-substrate electrode 120E and the pad portion 120 electrically connected to the floating diffusion FD, the elements formed on the semiconductor layer 200S and the floating diffusion FD can be electrically connected to each other. Similarly to the pad portion 121 described above, the pad portion 220 can be formed of a conductive material such as metal or doped polysilicon doped with impurities, for example.

Next, a method of manufacturing the imaging device 1 according to the present modification will be described with reference to FIG. 54. First, as illustrated in the upper left drawing of FIG. 54, the second substrate 200 is bonded with the first substrate 100 on which the elements are formed via the interlayer insulating film 123, and then, a thinning process is applied to the second substrate 200.

Next, as illustrated in the upper center drawing of FIG. 54, the semiconductor layer 200S of the second substrate 200 is partially removed, and an insulating film is embedded in a portion where the semiconductor layer 200S has been removed, thereby forming an insulating region 212 through which the through-substrate electrodes TGV, 120E, and 121E penetrate.

Subsequently, the VSS contact region 218 and the pad portion 220 are formed on the semiconductor layer 200S, leading to acquisition of a configuration as illustrated in the upper right drawing of FIG. 54. The subsequent steps are similar to those of the second embodiment, and thus the description thereof is omitted here.

In the present modification, the pad portion 220 for electrically connecting various elements formed on the semiconductor layer 200S is provided on the semiconductor layer 200S, and then, the pad portion 220 and the through-substrate electrode 120E are electrically connected to each other. Therefore, according to the present modification, the presence of the pad portion 220 makes it possible to electrically connect various elements while managing without providing a through-substrate electrode individually for each of the elements. As a result, according to the present modification, it is possible to suppress an increase in the number of the through-substrate electrodes 120E, wiring lines (not illustrated), and the like to be formed in the imaging device 1, facilitating further miniaturization of the imaging device 1.

11. Third Embodiment

Figure 55:
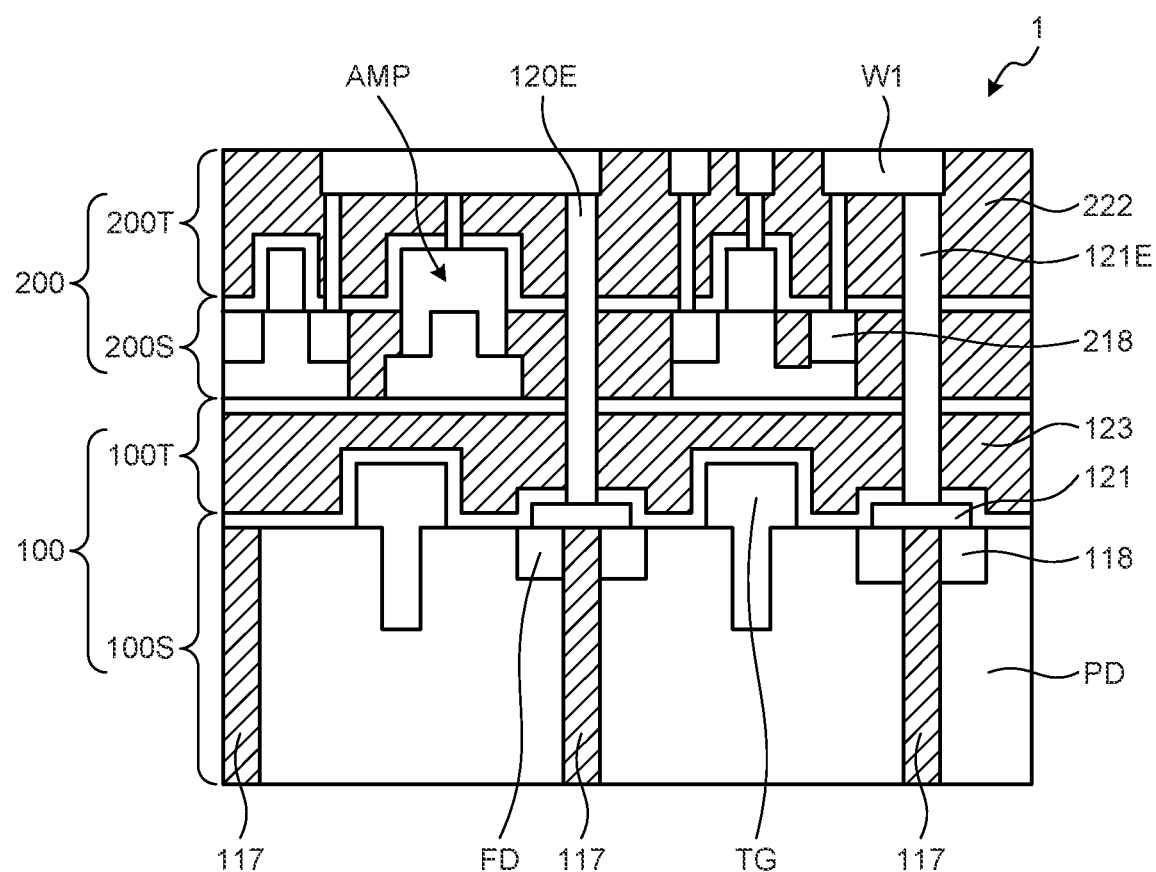
FIG. 55 is a schematic cross-sectional view (part 2) illustrating an example of a main part of the configuration of the imaging device illustrated in FIG. 3.

Next, details of a third embodiment of the present disclosure will be described. The present inventors continued to earnestly study the ways to achieve further miniaturization of the imaging device 1 according to the first embodiment as described above, and have devised an imaging device 1 according to the third embodiment of the present disclosure. Hereinafter, details of achievement of the techniques of the third embodiment of the present disclosure devised by the present inventors will be described with reference to FIG. 55. FIG. 55 is a schematic cross-sectional view illustrating an example of a main part of the configuration of the imaging device 1 illustrated in FIG. 3. For the sake of clarity, FIG. 55 illustrates only the main part of the imaging device 1 related to the third embodiment, and omit illustrations of the other parts.

In the imaging device 1 illustrated in FIG. 55, the through-substrate electrode 121E is electrically connected, via the pad portion 121, to the plurality of VSS contact regions 118 provided in the semiconductor layer 100S. Specifically, the through-substrate electrode 121E is electrically connected, via the pad portion 121, to the surfaces of the plurality of VSS contact regions 118 in the semiconductor layer 100S. Therefore, in the imaging device 1 illustrated in FIG. 55, in order to achieve mutual electrical connection between the plurality of VSS contact regions 118 provided adjacent to each other with the pixel isolation portion 117 interposed therebetween in the semiconductor layer 100S, it might be required to increase the area of the pad portion 121. Therefore, because of the large area of the pad portion 121 occupied in the imaging device 1 illustrated in FIG. 55, there has been a case having difficulty in achieving further miniaturization of the imaging device 1.

In view of the above-described situation, the present inventors have devised the third embodiment of the present disclosure. The imaging device 1 according to the present embodiment devised by the present inventors has a configuration in which a distal end portion 121F of the through-substrate electrode 121E is embedded in the semiconductor layer (first semiconductor substrate) 100S (refer to FIG. 56). With such a through-substrate electrode 121E, it is possible to have an electrical connection on the side wall of the distal end portion 121F of the through-substrate electrode 121E to the semiconductor layer 100S (specifically, the plurality of VSS contact regions 118 provided in the semiconductor layer 100S), making it possible to manage without providing the pad portion 121 having a large area for electrically connecting to the semiconductor layer 100S. As a result, it is possible manage without providing the pad portion 121 having a large area, facilitating further miniaturization of the imaging device 1. For example, in the present embodiment, since it is possible to manage without providing the pad portion 121 having a wide area, the photodiode PD and the like can be enlarged in dimensions, leading to an achievement of an increase in the charge generated in the photodiode PD and improvement of the sensitivity of the imaging device 1. In addition, it is possible to manage without forming a structure having a corner such as the pad portion 121, leading to a suppression of electric field concentration in the through-substrate electrode 121E. As a result, it is possible to suppress failure of the imaging device 1 due to electric field concentration in the through-substrate electrode 121E. Details of the present embodiment will be sequentially described below. In the following description, only points different from the above-described first embodiment will be described, and description of points common to the first embodiment will be omitted.

[Configuration]

Figure 56:
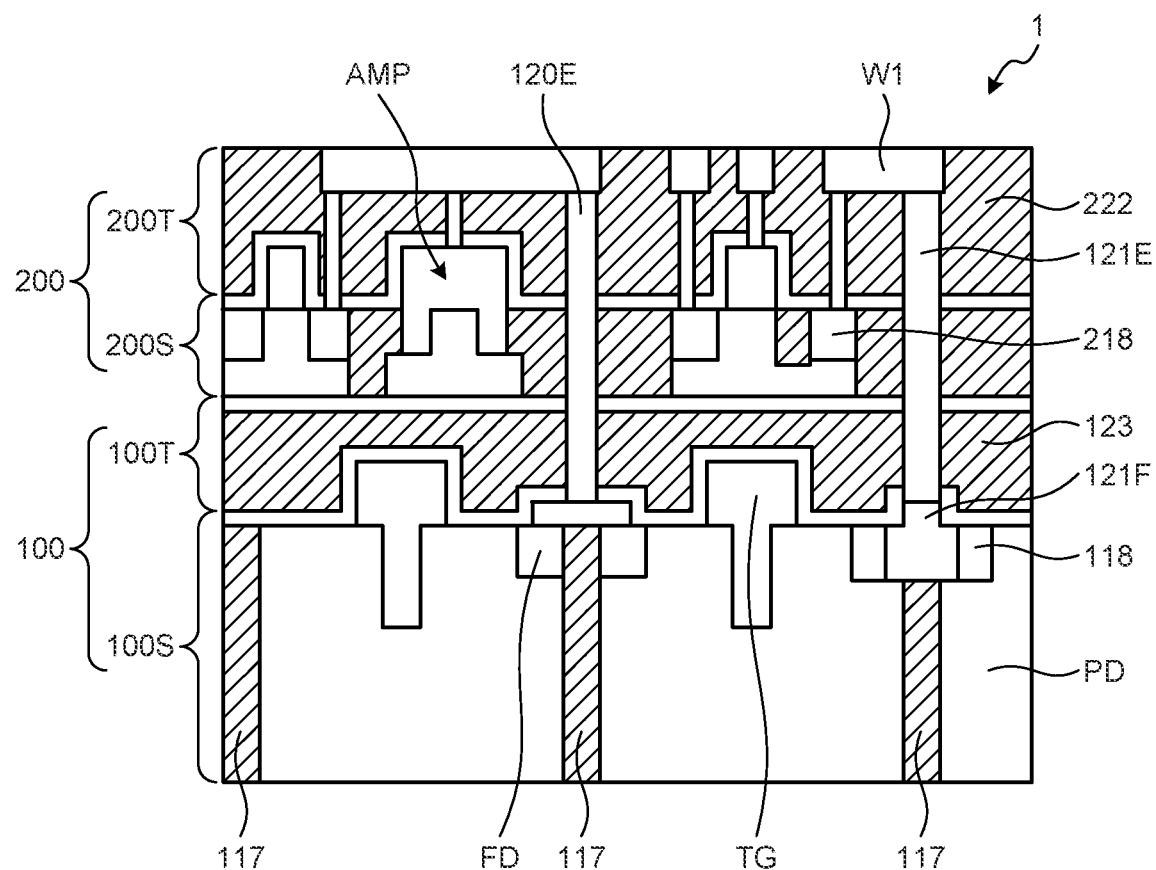
FIG. 56 is a schematic cross-sectional view (part 1) illustrating an example of a main part of a configuration of an imaging device according to a third embodiment of the present disclosure.
Figure 57:
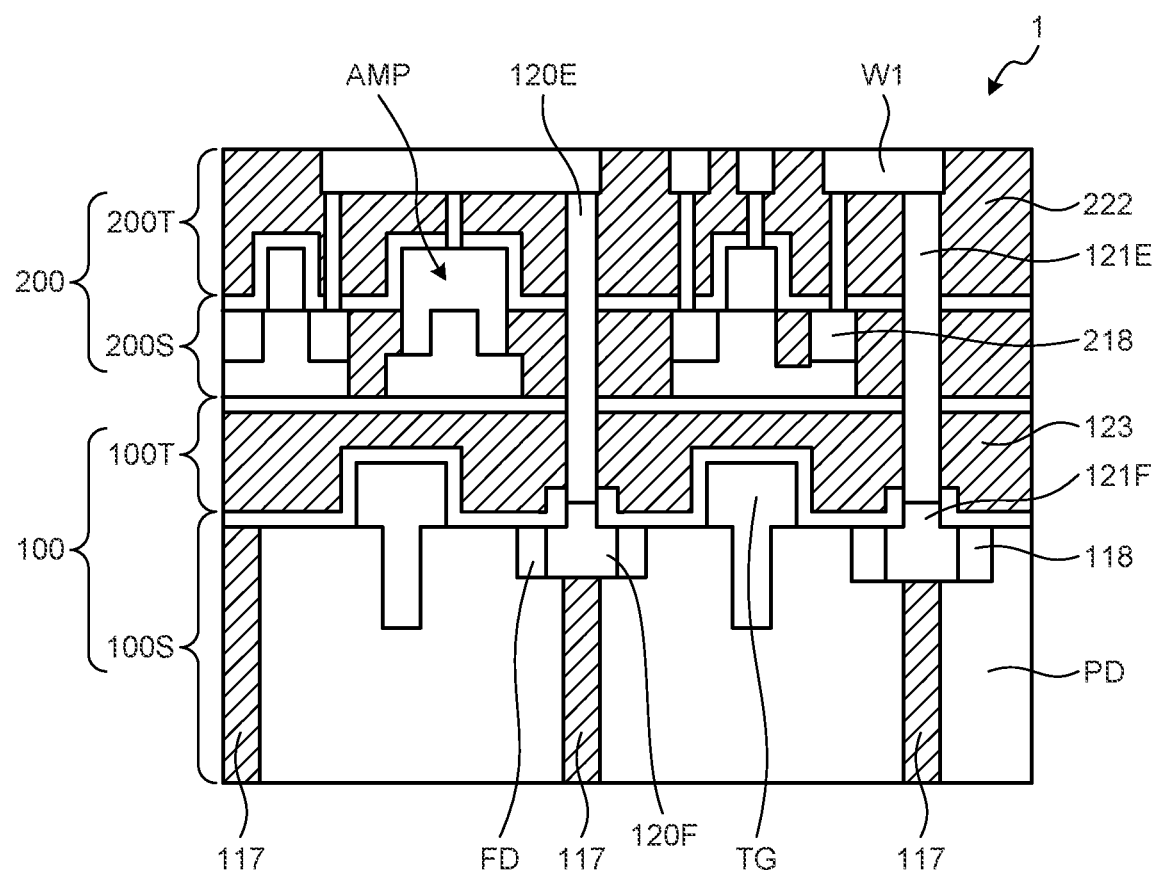
FIG. 57 is a schematic cross-sectional view (part 2) illustrating an example of a main part of a configuration of the imaging device according to the third embodiment of the present disclosure.

Details of the present embodiment will be described with reference to FIGS. 56 and 57. FIGS. 56 and 57 are schematic cross-sectional views illustrating an example of a main part of the configuration of the imaging device 1 according to the present embodiment. For the sake of clarity, FIGS. 56 and 57 illustrate only the main part of the imaging device 1 related to the present embodiment, and omit illustrations of the other parts.

Specifically, as illustrated in FIG. 56, the through-substrate electrode 121E has the distal end portion 121F, and the distal end portion 121F is embedded in the pixel isolation portion (element isolation portion) 117 in the semiconductor layer 100S. Furthermore, in the present embodiment, since the distal end portion 121F is embedded in the pixel isolation portion 117, the side wall of the distal end portion 121F is in contact with the plurality of VSS contact regions (first regions) 118 provided adjacent to the pixel isolation portion 117. In other words, the side wall of the distal end portion 121F is electrically connected to the plurality of VSS contact regions 118 provided in the semiconductor layer 100S. Incidentally, the distal end portion 121F can be formed of a conductive material such as metal or doped polysilicon doped with impurities, for example. In addition, portions of the through-substrate electrode 121E other than the distal end portion 121F can be formed of a conductive material such as various metals (Cu, W, or Al) or doped polysilicon (p-type) doped with impurities.

The present embodiment may be modified as illustrated in FIG. 57. Specifically, while the FIG. 56 is a configuration in which only the through-substrate electrode 121E has the distal end portion 121F, it is allowable in the present modification, as illustrated in FIG. 57, that also the through-substrate electrode 120E may have a distal end portion 120F. The distal end portion 120F is in contact with the FD provided in the semiconductor layer 100S and is electrically connected to the FD. The distal end portion 120F can be formed of a conductive material such as metal or doped polysilicon (n-type) doped with impurities, for example. In this manner, by providing the distal end portion 120F embedded in the semiconductor layer 200S, it is possible to manage without providing a pad portion having a large area for electrically connecting the through-substrate electrode 120E and the FD to each other, making it possible, as a result, to decrease the area of the FD and increase the area of the PD.

In the present embodiment, the configuration is not limited to the case, as illustrated in FIG. 57, where both of the through-substrate electrodes 120E and 121E have the distal end portions 120F and 121F, respectively. Either one of the through-substrate electrodes 120E or 121E may have the distal end portions 120F or 121F.

[Manufacturing Method]

Figure 58:
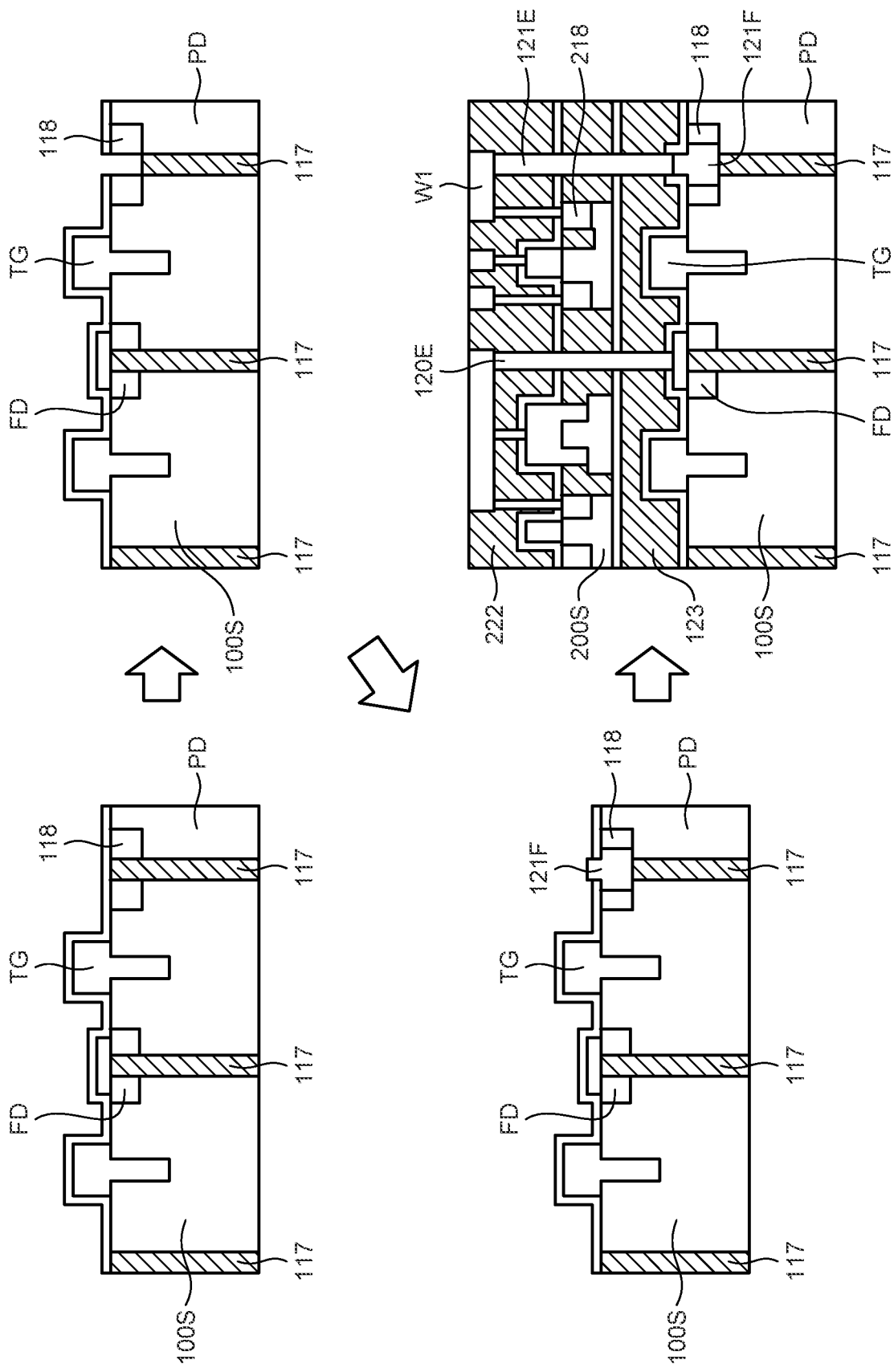
FIG. 58 is a process cross-sectional view illustrating the method of manufacturing the imaging device according to the third embodiment of the present disclosure, corresponding to FIG. 56.
Figure 59:
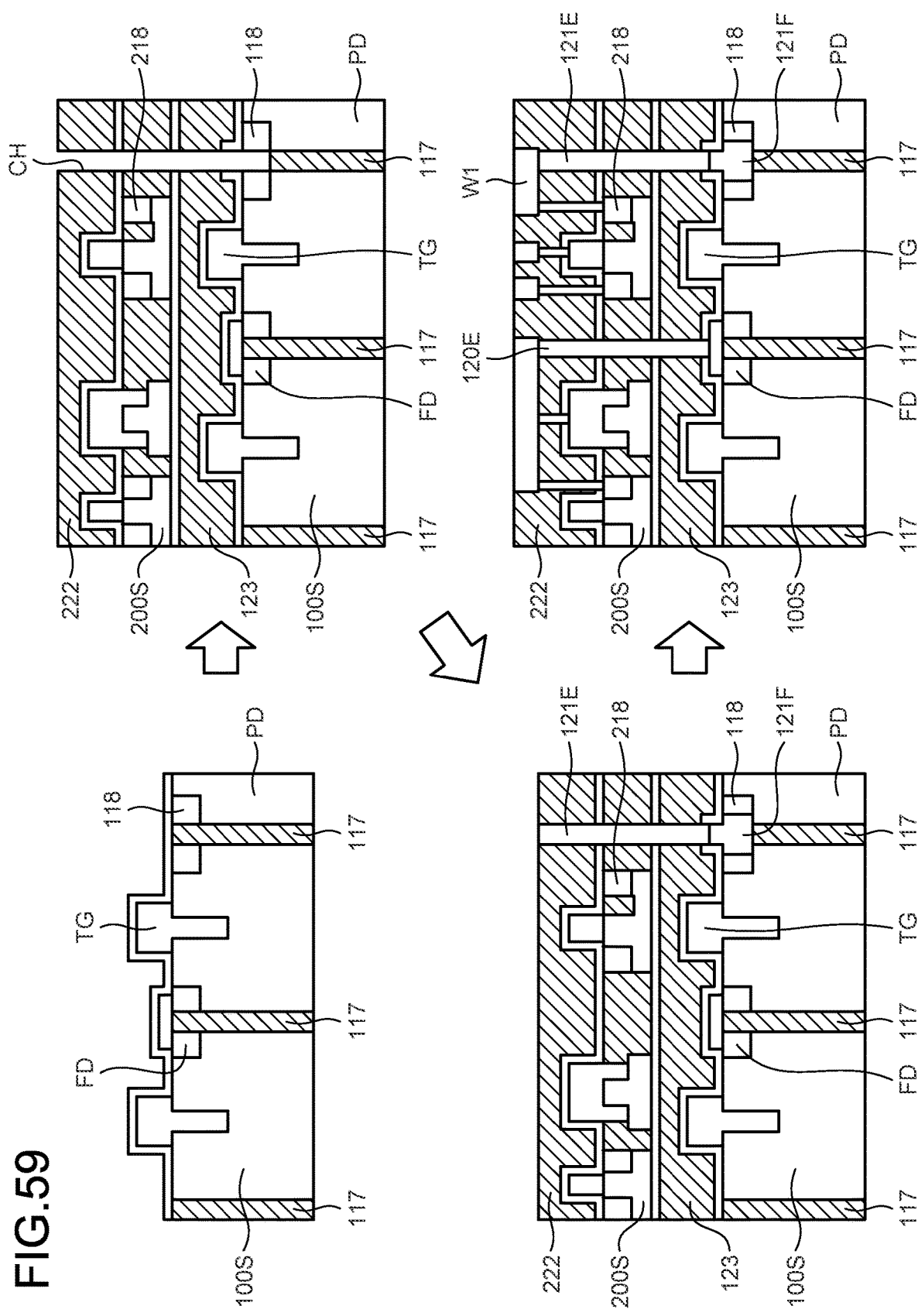
FIG. 59 is a process cross-sectional view illustrating another method of manufacturing the imaging device according to the third embodiment of the present disclosure, corresponding to FIG. 56.

Next, a method of manufacturing the imaging device 1 according to the present embodiment will be described with reference to FIGS. 58 and 59. FIG. 58 is a process cross-sectional view illustrating the method of manufacturing the imaging device 1 according to the present embodiment, corresponding to FIG. 56. FIG. 59 is a process cross-sectional view illustrating another method of manufacturing the imaging device 1 according to the present embodiment, corresponding to FIG. 56. For the sake of clarity, FIGS. 58 and 50 illustrate only the main part of the imaging device 1 related to the present embodiment, and omit illustrations of the other parts.

First, as illustrated in the upper left drawing of FIG. 58, lithography, ion implantation, and the like is used to form the photodiode PD, the floating diffusion FD, the VSS contact region 118, and the like in the semiconductor layer 100S of the first substrate 100. Furthermore, by using lithography, dry etching, or the like, a trench to be the pixel isolation portion 117 is formed in the semiconductor layer 100S, and then an insulating film (for example, SiO) is embedded in the trench that has been formed. Subsequently, a transfer gate TG and the like is formed on the semiconductor layer 100S by methods such as PVD, a CVD method, lithography, dry etching, or the like.

Next, as illustrated in the upper right drawing of FIG. 58, a method such as etching or the like is used to remove an insulating film in the pixel isolation portion 117 (specifically, an insulating film in the upper portion of the pixel isolation portion 117 in the drawing).

Furthermore, as illustrated in the lower left drawing of FIG. 58, a material such as polysilicon, for example, is embedded in the pixel isolation portion 117 where the insulating film has been removed, by using a method of PVD, CVD, or the like. The portion embedded in this manner becomes the distal end portion 121F of the through-substrate electrode 121E. At this time, impurities are put into the embedded polysilicon using ion implantation, or the like, to make a p-type conductivity polysilicon, and then heat treatment is performed to diffuse the doping. This makes it possible, in the present embodiment, to reliably establish the electrical connection between the distal end portion 121F and the VSS contact region 118.

Thereafter, the second substrate 200 is bonded to the first substrate 100 to form portions of the through-substrate electrode 121E other than the distal end portion 121F. For example, the portions of the through-substrate electrode 121E other than the distal end portion 121F can be formed as follows. For example, a method of lithography, dry etching, or the like is used to form a through hole (not illustrated) penetrating the interlayer insulating film 222, the insulating region 212, and the interlayer insulating film 123, and then, a metal film or the like is embedded in the through hole by using PVD, CVD, or the like. Furthermore, by forming the through-substrate electrode 120E, the wiring layer W1, and the like by using PVD, CVD, lithography, dry etching, and the like, it is possible to obtain the configuration as illustrated in the lower right drawing of FIG. 58.

Furthermore, in the present embodiment, the imaging device 1 according to the present embodiment may be formed by using a manufacturing method as illustrated in FIG. 59.

First, similarly to the manufacturing method illustrated in FIG. 58, as illustrated in the upper left drawing of FIG. 59, the photodiode PD, the floating diffusion FD, the VSS contact region 118, and the like are formed in the semiconductor layer 100S of the first substrate 100. Furthermore, a trench (not illustrated) to be the pixel isolation portion 117 is formed in the semiconductor layer 100S, and an insulating film is embedded in the formed trench. Subsequently, a transfer gate TG and the like are formed on the semiconductor layer 100S.

Next, the first substrate 100 and the second substrate 200 are bonded with each other via the interlayer insulating film 123, and a thinning process is applied to the second substrate 200. Furthermore, an element (for example, an amplification transistor AMP or the like), an element isolation region 213, an interlayer insulating film 222, and the like are formed on the second substrate 200. Subsequently, as illustrated in the upper right drawing of FIG. 59, a through hole CH is formed to penetrate through the interlayer insulating film 222, the element isolation region 213, and the interlayer insulating film 123 to reach the upper portion of the pixel isolation portion 117.

Next, as illustrated in the left of the lower drawing of FIG. 59, polysilicon is embedded in the through hole using a method such as PVD, CVD, or the like. The portion embedded in this manner becomes the through-substrate electrode 121E. That is, unlike the manufacturing method illustrated in FIG. 58, the manufacturing method illustrated in FIG. 59 forms the through-substrate electrode 121E integrally in one process, rather than forming in two processes by dividing the through-substrate electrode 121E into the distal end portion 121F and portions other than the distal end portion 121F.

Furthermore, the through-substrate electrode 120E, the wiring layer W1, and the like, are formed so as to obtain a configuration as illustrated in the lower right drawing of FIG. 59.

[Effects]

In the present embodiment, the distal end portion 121F of the through-substrate electrode 121E, which is embedded in the pixel isolation portion 117 of the semiconductor layer 100S, is in contact with the plurality of VSS contact regions 118 provided adjacent to each other with the pixel isolation portion 117 interposed therebetween, so as to be electrically connected to the plurality of VSS contact regions 118. Therefore, in the present embodiment, since the through-substrate electrode 121E is electrically connected to the plurality of VSS contact regions 118 on the side wall of the distal end portion 121F, it is possible to manage without providing the pad portion 121 having a large area to achieve electrical connection to the plurality of VSS contact regions 118. As a result, according to the present embodiment, it is possible to manage without providing the pad portion 121 having a large area, facilitating further miniaturization of the imaging device 1. For example, in the present embodiment, since it is possible to manage without providing the pad portion 121 having a wide area, the size of the photodiode PD and the like can be enlarged, leading to an achievement of an increase in the charge generated in the photodiode PD and improvement of the sensitivity of the imaging device 1. In addition, according to the present embodiment, it is possible to manage without forming a structure having a corner such as the pad portion 121, leading to a suppression of electric field concentration in the through-substrate electrode 121E. As a result, according to the present embodiment, it is possible to suppress failure of the imaging device 1 due to electric field concentration in the through-substrate electrode 121E.

[Modifications]

Figure 60:
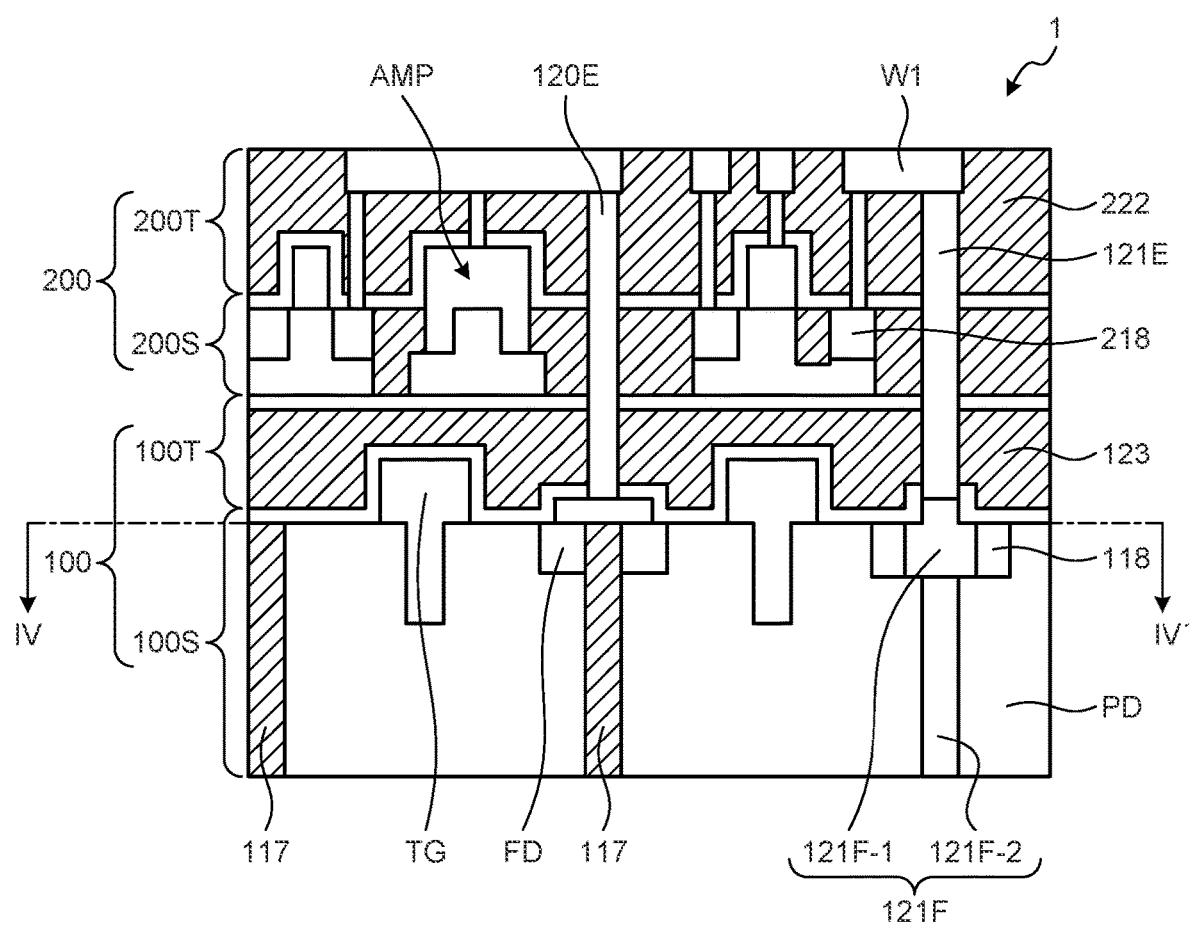
FIG. 60 is a schematic cross-sectional view illustrating an example of a main part of a configuration of an imaging device according to a modification of the third embodiment of the present disclosure.
Figure 61:
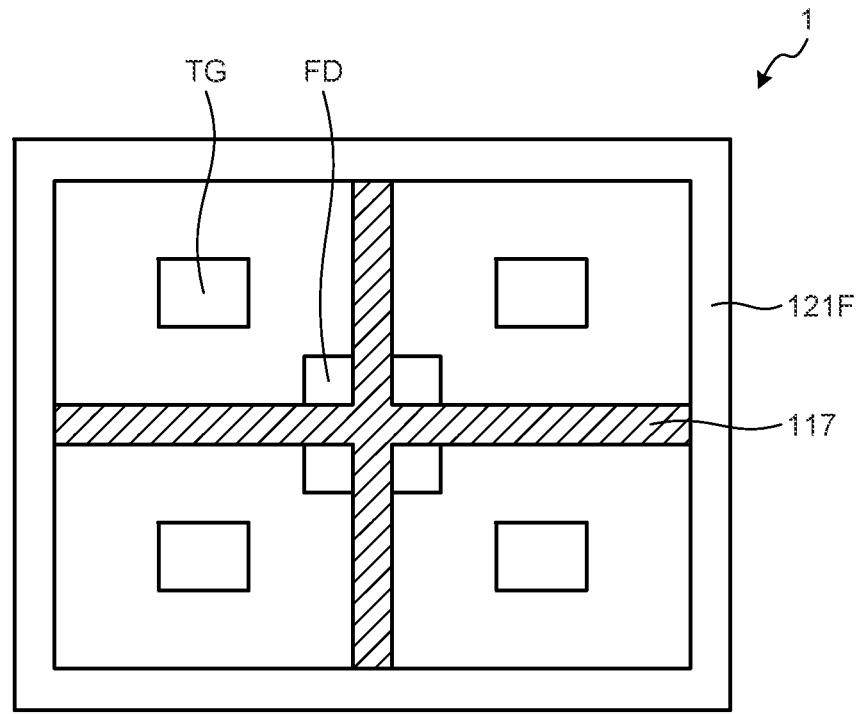
FIG. 61 is a schematic view (part 1) illustrating an example of a planar configuration of a main part of a configuration of the imaging device according to the modification of the third embodiment of the present disclosure.
Figure 62:
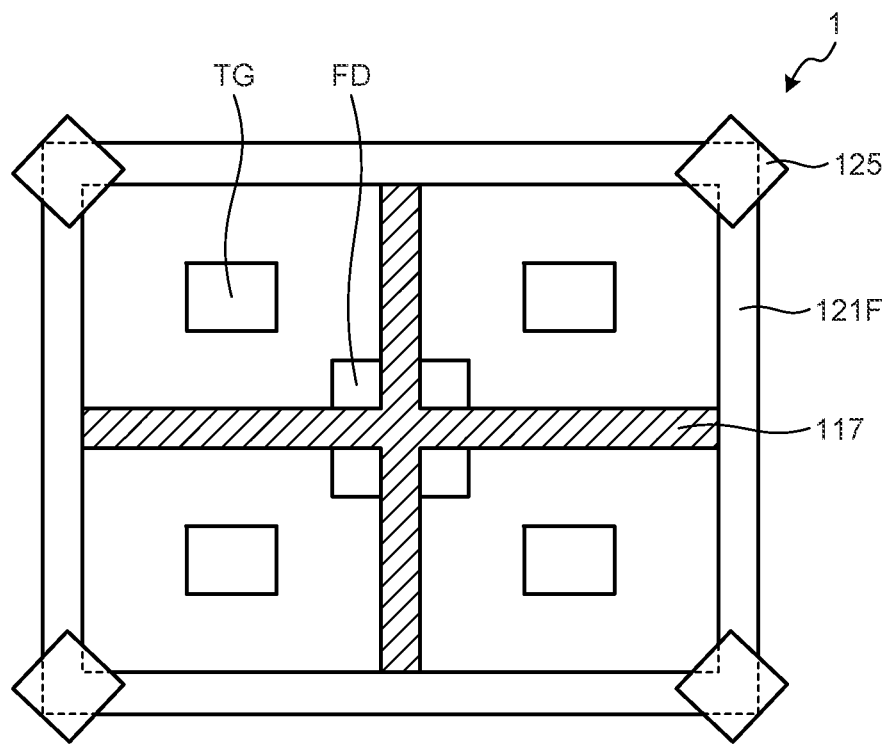
FIG. 62 is a schematic view (part 2) illustrating an example of a planar configuration of a main part of a configuration of the imaging device according to the modification of the third embodiment of the present disclosure.
Figure 63:
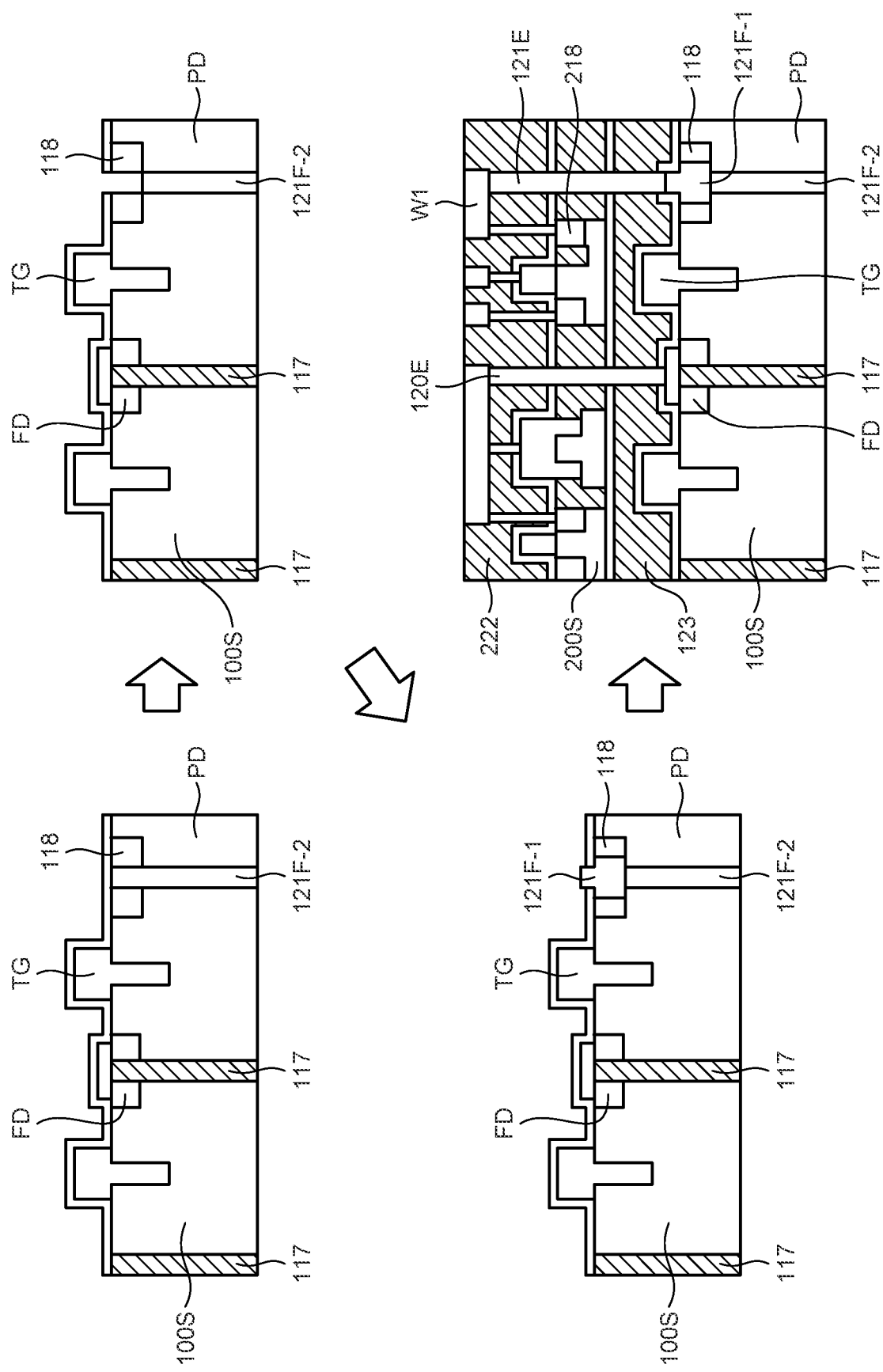
FIG. 63 is a process cross-sectional view illustrating a method of manufacturing the imaging device according to the modification of the third embodiment of the present disclosure, corresponding to FIG. 60.

Due to processing in the manufacturing step, there may be cases, in the imaging device 1, where many defect levels are distributed at an interface near the pixel isolation portion 117, and such distribution might cause generation of unnecessary electrons and might increase an occurrence of white spots in the photodiode PD in the vicinity of the pixel isolation portion 117. In view of this, similarly to the third embodiment, a modification of the present embodiment described below proposes a through-substrate electrode 121E capable of suppressing the occurrence of the white spots while facilitating further miniaturization of the imaging device 1. Hereinafter, the modification of the present embodiment will be described with reference to FIGS. 60 to 63. FIG. 60 is a schematic cross-sectional view illustrating an example of a main part of a configuration of an imaging device 1 according to the modification of the present embodiment. FIGS. 61 and 62 are schematic views illustrating an example of a planar configuration of a main part of the configuration of an imaging device 1 according to the modification of the present embodiment, and specifically, are schematic views illustrating a cross-sectional configuration taken along line IV-IV' illustrated in FIG. 60. FIG. 63 is a process cross-sectional view illustrating the method of manufacturing the imaging device 1 according to the modification of the present embodiment, corresponding to FIG. 60. For the sake of clarity, FIGS. 60 to 63 illustrate only the main part of the imaging device 1 related to the present modification, and omit illustrations of the other parts. Here, only points different from the above-described third embodiment will be described, and description of points common to the third embodiment will be omitted.

Specifically, as illustrated in FIG. 60, similarly to the present embodiment described above, the through-substrate electrode 121E has a distal end portion 121F. Furthermore, the distal end portion 121F includes: a side contact portion 121F-1 electrically connected to the VSS contact region 118; and a penetrating portion 121F-2 penetrating the pixel isolation portion 117. The side contact portion 121F-1 is similar to the distal end portion 121F of the present embodiment described above. Furthermore, the penetrating portion 121F-2 penetrates the pixel isolation portion 117 (semiconductor layer 100S) from a surface of the semiconductor layer 100S facing the semiconductor layer 200S to a surface (incident surface) opposite to the facing surface. Incidentally, the outer periphery of the penetrating portion 121F-2 is covered with an insulating film (not illustrated). Also in the present modification, similarly to the above-described embodiment, the side contact portion 121F-1 can be formed of a conductive material such as metal or doped polysilicon doped with impurities, for example. In addition, the penetrating portion 121F-2 can be formed of a conductive material such as metal.

In the present modification, for example, electrically connecting the through-substrate electrode 121E to the ground will induce an electric field around the through-substrate electrode 121E, making it possible to accumulate holes around the distal end portion 121F of the through-substrate electrode 121E. In the present modification, the accumulated holes can prevent generation of unnecessary electrons, making it possible to suppress the generation of white spots in the photodiode PD close to the pixel isolation portion 117.

Incidentally, the distal end portion 121F may be entirely embedded along the pixel isolation portion 117 as illustrated in FIG. 61. In this case, the width of the distal end portion 121F embedded in the pixel isolation portion 117 in the planar configuration can be approximately 50 nm to 250 nm, for example. Furthermore, as illustrated in FIG. 62, it is allowable to form a contact portion 125 on the distal end portion 121F in the vertical direction of the imaging device 1. For example, the contact portion 125 is provided to achieve more reliable electrical connection between the distal end portion 121F and the portion of the through-substrate electrode 121E located above the distal end portion 121F, that is, on the second substrate 200 side. Specifically, in the manufacturing stage, the distal end portion 121F is formed in the pixel isolation portion 117, and then, a through hole (not illustrated) penetrating the insulating region 212 and the interlayer insulating film 123 is formed in order to achieve connection to the distal end portion 121F. At this time, there might be difficulty in the alignment of the distal end portion 121F and the through hole. Therefore, in order to achieve more reliable electrical connection between the distal end portion 121F and the portion of the through-substrate electrode 121E located on the second substrate 200 side even with an occurrence of misalignment of the through hole, it is allowable to form the contact portion 125 formed of a conductive material, for example.

Next, a method of manufacturing the imaging device 1 according to the present modification will be described with reference to FIG. 63.

First, similarly to the present embodiment, the photodiode PD, the floating diffusion FD, the VSS contact region 118, and the like are formed in the semiconductor layer 100S of the first substrate 100. Subsequently, a plurality of trenches (not illustrated) is formed in the semiconductor layer 100S, and then an insulating film (for example, SiO) is embedded in a part of the plurality of trenches (specifically, the trench to be the pixel isolation portion 117), while doped polysilicon or the like is embedded in the remaining trenches (specifically, the trench for the distal end portion 121F of the through-substrate electrode 121E). In this manner, a configuration as illustrated in the upper left diagram of FIG. 63 can be obtained.

Next, as illustrated in the upper right drawing of FIG. 63, using etching or the like, an upper portion (portion on the second substrate 200 side) of the polysilicon embedded in the remaining trenches (specifically, the trench for the distal end portion 121F of the through-substrate electrode 121E) is removed. For example, the removed portion corresponds to the side contact portion 121F-1 of the distal end portion 121F described above.

Furthermore, as illustrated in the lower left drawing of FIG. 63, using a method such as PVD, CVD method, or the like, doped polysilicon is embedded in the portion where polysilicon has been removed in the remaining trenches (specifically, the trench for the distal end portion 121F of the through-substrate electrode 121E). The portion embedded in this manner becomes the side contact portion 121F-1 of the distal end portion 121F. The subsequent steps are similar to those in the manufacturing method of the present embodiment illustrated in FIG. 58, and thus the description thereof is omitted here.

According to the present modification, similarly to the present embodiment described above, it is possible to manage without providing the pad portion 121 as described above, facilitating further miniaturization of the imaging device 1. Furthermore, in the present modification, the distal end portion 121F of the through-substrate electrode 121E penetrates from the surface of the semiconductor layer 100S facing the semiconductor layer 200S to the surface (incident surface) opposite to the facing surface. In the present modification, by electrically connecting such a through-substrate electrode 121E to the ground, it is possible to strengthen the ground around the photodiode PD, enabling suppression of occurrence of white spots in the photodiode PD close to the pixel isolation portion 117.

12. Fourth Embodiment

Figure 64:
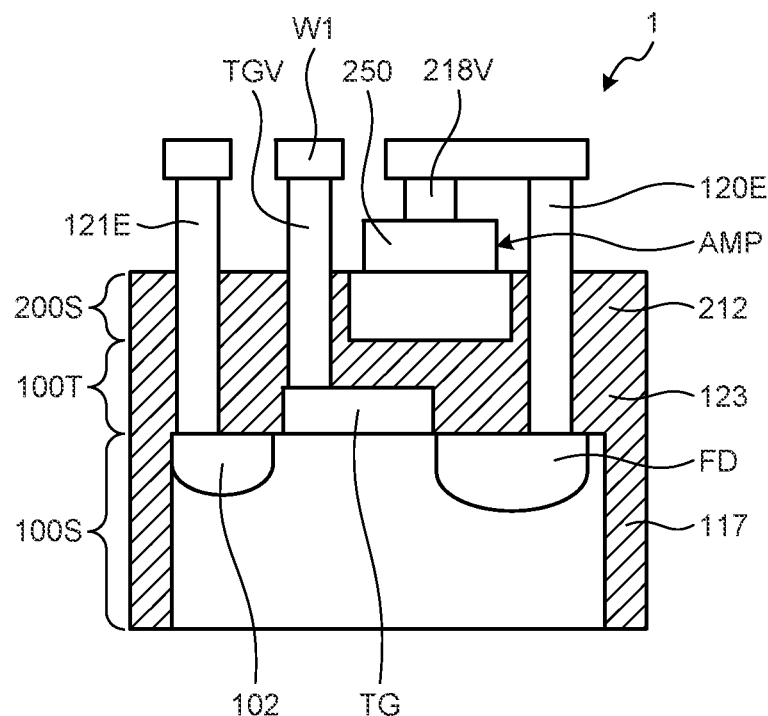
FIG. 64 is a schematic cross-sectional view (part 3) illustrating an example of a main part of the configuration of the imaging device illustrated in FIG. 3.

Now, a fourth embodiment of the present disclosure will be described in detail. The present inventors have continued to earnestly study whether further miniaturization can be achieved for the imaging device 1 according to the first embodiment, and have devised an imaging device 1 according to the fourth embodiment of the present disclosure. Hereinafter, details of achievement of the techniques of the fourth embodiment of the present disclosure devised by the present inventors will be described with reference to FIG. 64. FIG. 64 is a schematic cross-sectional view illustrating an example of a main part of the configuration of the imaging device 1 illustrated in FIG. 3. For the sake of clarity, FIG. 64 illustrates only the main part of the imaging device 1 related to the fourth embodiment, and omit illustrations of the other parts.

As illustrated in FIG. 64, in the imaging device 1, the through-substrate electrodes 120E, 121E, and TGV are provided on the surface of the semiconductor layer 200S opposite to the surface facing the semiconductor layer 100S. Therefore, due to the formation of the through-substrate electrodes 120E, 121E, and TGV on the semiconductor layer 200S in the imaging device 1 illustrated in FIG. 64, there has been a limitation in the area of the region where elements can be flexibly formed on the semiconductor layer 200S. In other words, in the imaging device 1 illustrated in FIG. 64, due to the arrangement of the plurality of through-substrate electrodes 120E, 121E, and TGV on the surface of the semiconductor layer 200S opposite to the surface facing the semiconductor layer 100S, there has been a limitation in the freedom of layout of elements such as transistors on the semiconductor layer 200S. For example, in the imaging device 1 illustrated in FIG. 64, limitation of the area of a gate 250 of the amplification transistor AMP provided on the semiconductor layer 200S has sometimes increased noise of the amplification transistor AMP.

In view of the above-described situation, the present inventors have devised the fourth embodiment of the present disclosure. The imaging device 1 according to the present embodiment devised by the present inventors is configured to provide at least one of contacts 104 or 106 on the surface (incident surface) of the semiconductor layer 100S opposite to the surface facing the semiconductor layer 200S, instead of providing the through-substrate electrodes 121E and TGV. Specifically, the contact (second electrode) 104 is electrically connected to a well region 102 of the semiconductor layer (first semiconductor substrate) 100S. Furthermore, the contact (first electrode) 106 is electrically connected to the gate (gate electrode) TG of the transfer transistor TR. In the present embodiment, by arranging at least one of the contacts 104 or 106 as described above on the incident surface side of the semiconductor layer 100S instead of arranging at least one of the through-substrate electrodes 121E or TGV, it is possible to decrease the number of through-substrate electrodes formed on the surface of the semiconductor layer 200S opposite to the surface facing the semiconductor layer 100S. For example, according to the present embodiment, it is possible to expand the area of the region where the element can be flexibly formed on the semiconductor layer 200S. More specifically, according to the present embodiment, it is possible to expand the area of the gate 250 of the amplification transistor AMP provided on the semiconductor layer 200S, enabling suppression of an increase in the noise of the amplification transistor AMP.

In addition, according to the present embodiment, it is also possible to facilitate performing layout so as to shorten the distance from the floating diffusion FD to the gate 250 of the amplification transistor AMP. As a result, according to the present embodiment, it is possible to avoid deterioration of conversion efficiency due to an increase in parasitic capacitance for the wiring electrically connecting the floating diffusion FD to the gate 250. That is, according to the present embodiment, the reduced limitation on the formation region of the element facilitates further miniaturization of the imaging device 1 and facilitates improvement of the characteristics of elements. Details of the present embodiment will be sequentially described below. In the following description, only points different from the above-described first embodiment will be described, and description of points common to the first embodiment will be omitted.

[Configuration]

Figure 65:
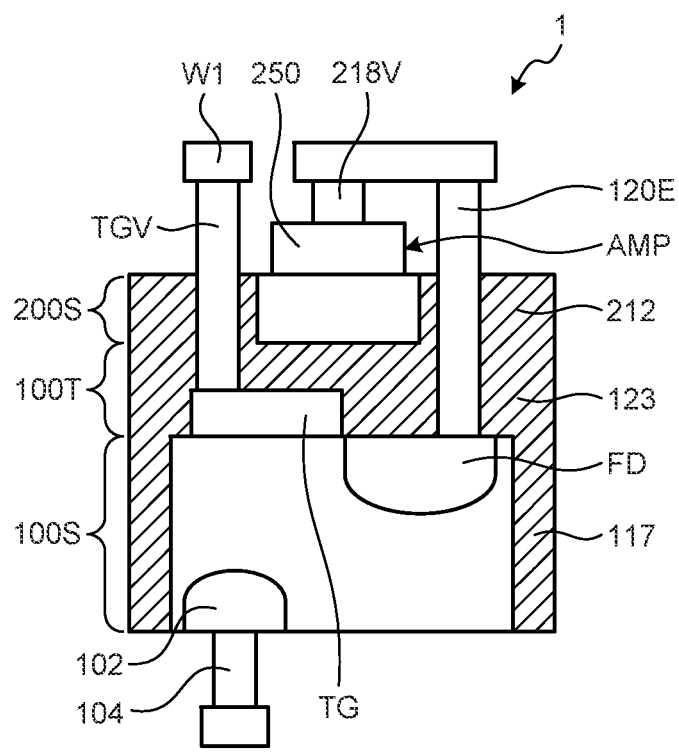
FIG. 65 is a schematic cross-sectional view illustrating an example of a main part of a configuration of an imaging device according to a fourth embodiment of the present disclosure.

First, details of the present embodiment will be described with reference to FIG. 65. FIG. 65 is a schematic cross-sectional view illustrating an example of a main part of the configuration of the imaging device 1 according to the present embodiment. For the sake of clarity, FIG. 65 illustrates only the main part of the imaging device 1 related to the present embodiment, and omit illustrations of the other parts.

Specifically, in the example illustrated in FIG. 65, instead of the through-substrate electrode 121E, the contact 104 electrically connected to the well region 102 of the semiconductor layer 100S is provided on the incident surface side of the semiconductor layer 100S. The contact 104 is preferably provided in the vicinity of the pixel isolation portion 117 so as to prevent blockage of light incident on the incident surface.

In addition, the contact 104 can be formed of a conductive material such as metal, but is preferably formed of a transparent conductive material such as indium tin oxide (ITO) so as to prevent blockage of light incident on the incident surface. For example, examples of the transparent conductive material can include a transparent conductive material capable of transmitting light, such as an indium tin oxide (ITO, crystalline ITO and amorphous ITO) film. However, the present embodiment is not limited to ITO as described above, and other materials may be used. Examples of the transparent conductive material include tin oxide, antimony-tin oxide ($SnO_2$ is doped with Sb as a dopant, and an example of this is ATO), and fluorine-tin oxide ($SnO_2$ is doped with F as a dopant, and an example of this is FTO), as the tin oxide-based material. Examples of the zinc oxide-based material include aluminum-doped zinc oxide (ZnO is doped with Al as a dopant, and an example of this is AZO), gallium-doped zinc oxide (ZnO is doped with Ga as a dopant, and an example of this is GZO), indium-doped zinc oxide (ZnO is doped with In as a dopant, and an example of this is IZO), indium-gallium-doped zinc oxide (ZnO4 is doped with In and Ga as dopants, and an example of this is IGZO), and indium-tin-doped zinc oxide (ZnO is doped with In and Sn as dopants, and an example of this is ITZO). Other examples include indium-doped gallium oxide ($Ga_2O_3$ doped with In, and an example of this is IGO), $CuInO_2$, $MgIn_2O_4$, CuI, $InSbO_4$, ZnMgO, CdO, $ZnSnO_3$, and graphene.

[Manufacturing Method]

Figure 66:
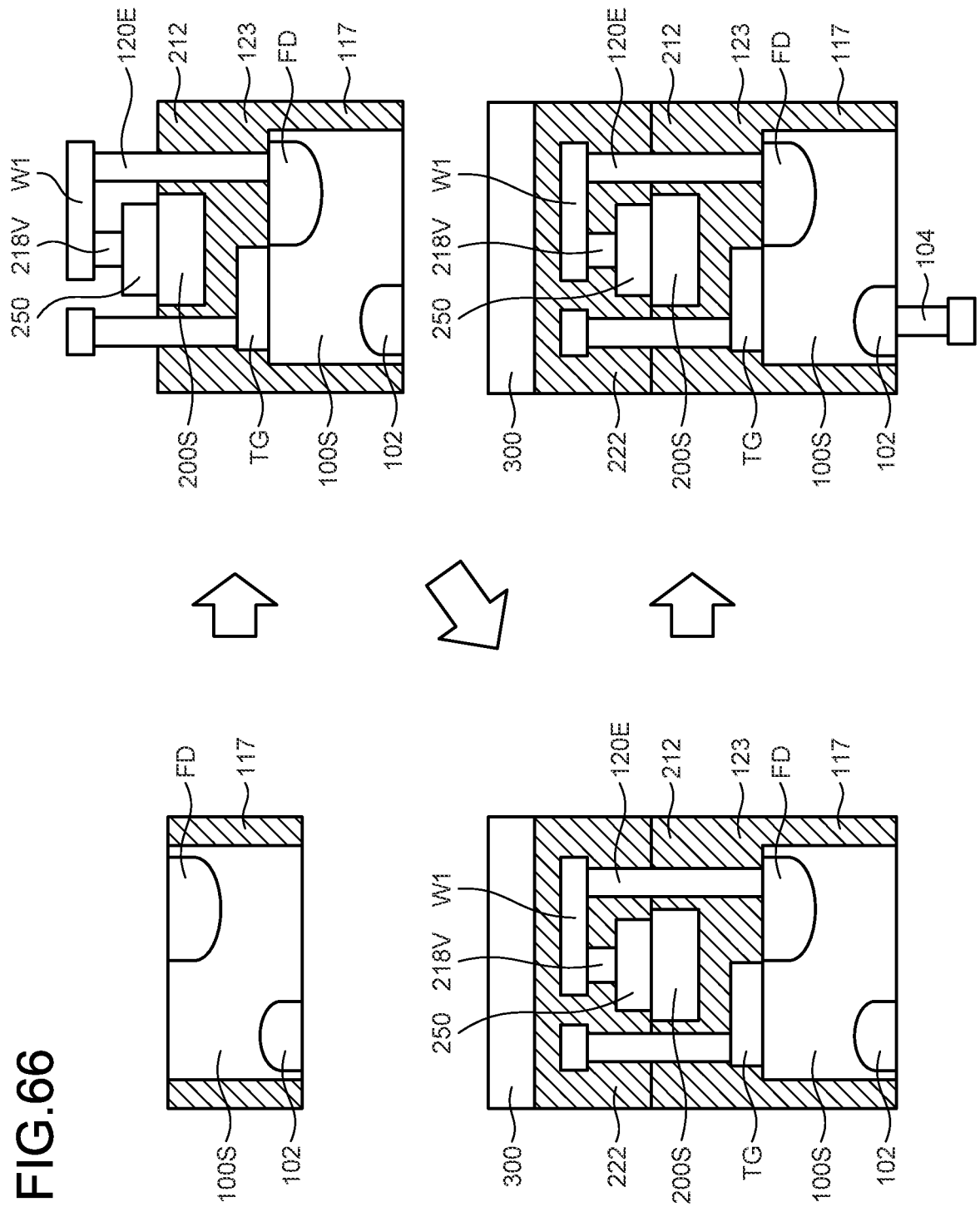
FIG. 66 is a process cross-sectional view illustrating the method of manufacturing the imaging device according to the fourth embodiment of the present disclosure, corresponding to FIG. 65.

Next, a method of manufacturing the imaging device 1 according to the present embodiment will be described with reference to FIG. 66. FIG. 66 is a process cross-sectional view illustrating the method of manufacturing the imaging device 1 according to the fourth embodiment of the present disclosure, corresponding to FIG. 65. For the sake of clarity, FIG. 66 illustrates only the main part of the imaging device 1 related to the present embodiment, and omit illustrations of the other parts.

First, in the present embodiment, as illustrated in the upper left drawing of FIG. 66, the semiconductor layer 100S of the first substrate 100 is processed from the front surface (the surface opposite to the incident surface) side. Specifically, using lithography, ion implantation, and the like, the photodiode PD, the floating diffusion FD, and the like are formed in the semiconductor layer 100S. Furthermore, the pixel isolation portion 117 is formed in the semiconductor layer 100S by a method such as lithography, dry etching, PVD, and a CVD method.

Next, as illustrated in the upper right drawing of FIG. 66, the first substrate 100 and the second substrate 200 are bonded to each other via the interlayer insulating film 123, and then, elements, wiring, and the like are formed on the semiconductor layer 200S of the second substrate 200. At this time, for example, formation of the through-substrate electrode TGV and the like penetrating the semiconductor layer 200S is performed.

Subsequently, as illustrated in the lower left diagram of FIG. 66, the interlayer insulating film 222 is formed on the semiconductor layer 200S by CVD or the like, and the third substrate 300 is further bonded onto the interlayer insulating film 222.

Next, the incident surface side of the semiconductor layer 100S of the first substrate 100 is planarized by CMP or the like to form a through hole in which the contact 104 is formed. Furthermore, as illustrated in the lower right drawing of FIG. 66, polysilicon, metal, or the like is embedded in the through hole using PVD, CVD, or the like. Thereafter, a color filter and a light receiving lens are formed on the incident surface side.

[Effects]

In the present embodiment, instead of the through-substrate electrode 121E, the contact 104 electrically connected to the well region 102 of the semiconductor layer 100S is provided on the incident surface side of the semiconductor layer 100S. Therefore, according to the present embodiment, since the through-substrate electrode 121E is not provided, it is possible to reduce the number of through-substrate electrodes provided on the surface of the semiconductor layer 200S opposite to the surface facing the semiconductor layer 100S. As a result, according to the present embodiment, it is possible to expand the area of the region where the element can be flexibly formed on the semiconductor layer 200S. For example, according to the present embodiment, it is possible to expand the area of the gate 250 of the amplification transistor AMP provided on the semiconductor layer 200S, enabling suppression of an increase in the noise of the amplification transistor AMP.

In addition, according to the present embodiment, it is also possible to facilitate performing layout so as to shorten the distance from the floating diffusion FD to the gate 250 of the amplification transistor AMP. As a result, according to the present embodiment, it is possible to avoid deterioration of conversion efficiency due to an increase in parasitic capacitance for the wiring electrically connecting the floating diffusion FD to the gate 250. That is, according to the present embodiment, the reduced limitation on the formation region of elements facilitates further miniaturization of the imaging device 1 and facilitates improvement of the characteristics of elements.

[First Modification]

Figure 67:
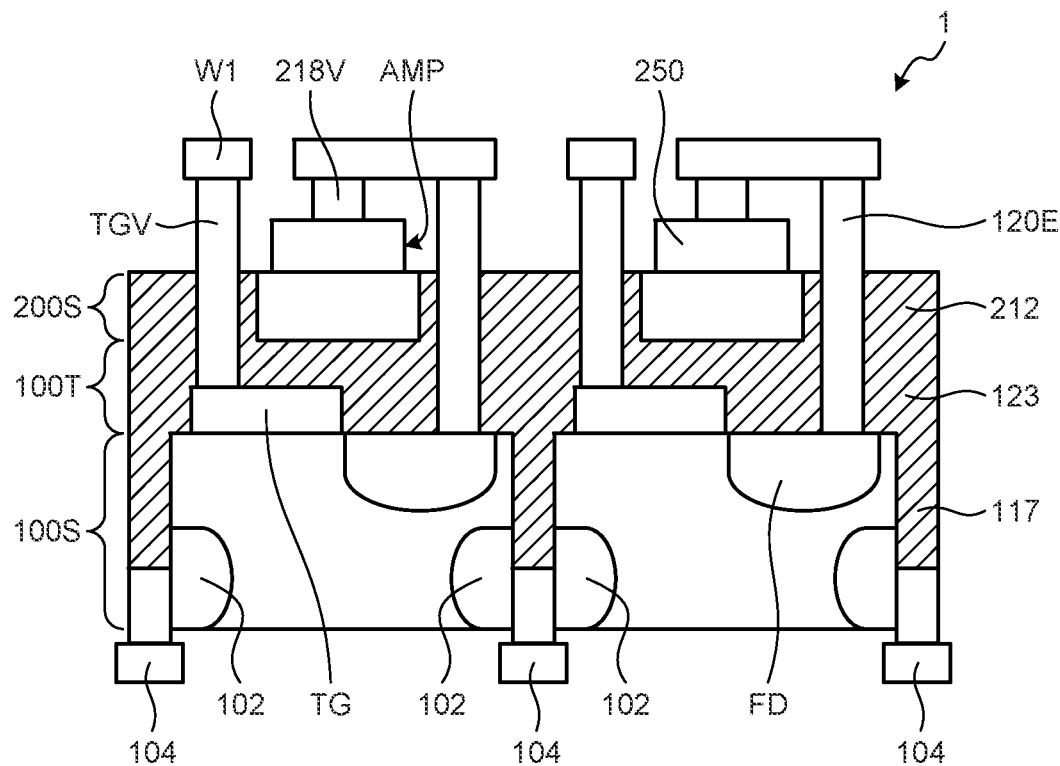
FIG. 67 is a schematic cross-sectional view illustrating an example of a main part of a configuration of an imaging device according to a first modification of the fourth embodiment of the present disclosure.

In the present embodiment, as described above, the contact 104 is preferably provided in the vicinity of the pixel isolation portion 117 so as to prevent blockage of light incident on the incident surface. Accordingly, in the present modification, in order to further prevent blockage of the light incidence, as illustrated in FIG. 67, the contact 104 is provided in the outer peripheral portion of the incident surface, that is, in the pixel isolation portion 117 located in the outer peripheral portion of the incident surface. Hereinafter, a first modification of the present embodiment will be described with reference to FIG. 67. FIG. 67 is a schematic cross-sectional view illustrating an example of a main part of a configuration of an imaging device 1 according to the first modification of the present embodiment. For the sake of clarity, FIG. 67 illustrates only the main part of the imaging device 1 related to the present modification, and omit illustrations of the other parts. Here, only points different from the above-described fourth embodiment will be described, and description of points common to the fourth embodiment will be omitted.

As illustrated in FIG. 67, the contact 104 is provided in the pixel isolation portion 117. Specifically, the contact 104 is provided along the side wall of the semiconductor layer 100S in the pixel isolation portion 117, and is electrically connected to the well region 102 of the semiconductor layer 100S. For example, the contact 104 can be formed of a metal or doped polysilicon doped with impurities, or the like. Furthermore, in a case where the contact 104 is formed of a metal material, the contact 104 may have a function like the light shielding film 117A that shields light from the adjacent pixel 541.

As described above, according to the present modification, by providing the contact 104 along the side wall of the semiconductor layer 100S in the pixel isolation portion 117, it is possible to further prevent blockage of light incidence caused by the contact 104 on the incident surface.

[Second Modification]

Figure 68:
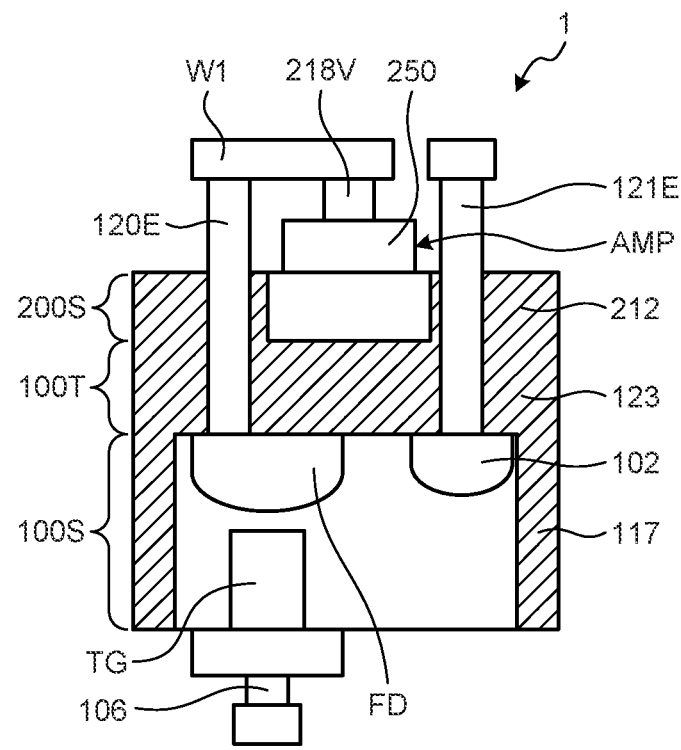
FIG. 68 is a schematic cross-sectional view illustrating an example of a main part of a configuration of an imaging device according to a second modification of the fourth embodiment of the present disclosure.

In the present embodiment, the contact 106 electrically connected to the gate TG of the transfer transistor TR may be provided on the incident surface side of the semiconductor layer 100S. Hereinafter, a second modification of the present embodiment will be described with reference to FIG. 68. FIG. 68 is a schematic cross-sectional view illustrating an example of a main part of a configuration of an imaging device 1 according to the second modification of the present embodiment. For the sake of clarity, FIG. 68 illustrates only the main part of the imaging device 1 related to the present modification, and omit illustrations of the other parts. Here, only points different from the above-described fourth embodiment will be described, and description of points common to the fourth embodiment will be omitted.

Specifically, in the present modification, as illustrated in FIG. 68, the transfer transistor TR is a vertical transistor having a configuration in which the gate (gate electrode) TG of the transfer transistor TR is embedded in the semiconductor layer (first semiconductor substrate) 100S. In other words, in the present modification, the gate TG of the transfer transistor TR is provided so as to be dug into the semiconductor layer 100S. In the present modification, the gate TG is preferably formed deep from the irradiation surface toward the front surface as long as the gate TG is not so deep as to penetrate the thickness of the semiconductor layer 100S. In addition, in the present modification, instead of the through-substrate electrode TGV, the contact 106 electrically connected to the gate TG is provided on the incident surface side of the semiconductor layer 100S. Similarly to the above-described embodiment, the contact 106 is preferably provided on the side wall side of the semiconductor layer 100S, that is, in the vicinity of the pixel isolation portion 117 as much as possible so as not to block the incidence of light on the incident surface.

In the present modification, instead of the through-substrate electrode TGV, the contact 106 electrically connected to the gate TG is provided on the incident surface side of the semiconductor layer 100S. Therefore, according to the present modification, since the through-substrate electrode TGV is not provided, it is possible to reduce the number of through-substrate electrodes provided on the surface of the semiconductor layer 200S opposite to the surface facing the semiconductor layer 100S. As a result, according to the present modification, it is possible to expand the area of the region where the element can be flexibly formed on the semiconductor layer 200S. For example, according to the present modification, it is possible to expand the area of the gate 250 of the amplification transistor AMP provided on the semiconductor layer 200S, enabling suppression of an increase in the noise of the amplification transistor AMP.

In addition, according to the present modification, it is also possible to facilitate performing layout so as to further shorten the distance from the floating diffusion FD to the gate 250 of the amplification transistor AMP. As a result, according to the present modification, it is possible to avoid deterioration of conversion efficiency due to an increase in parasitic capacitance for the wiring electrically connecting the floating diffusion FD to the gate 250. That is, according to the present modification, the reduced limitation on the formation region of elements facilitates further miniaturization of the imaging device 1 and facilitates improvement of the characteristics of the elements.

[Third Modification]

Figure 69:
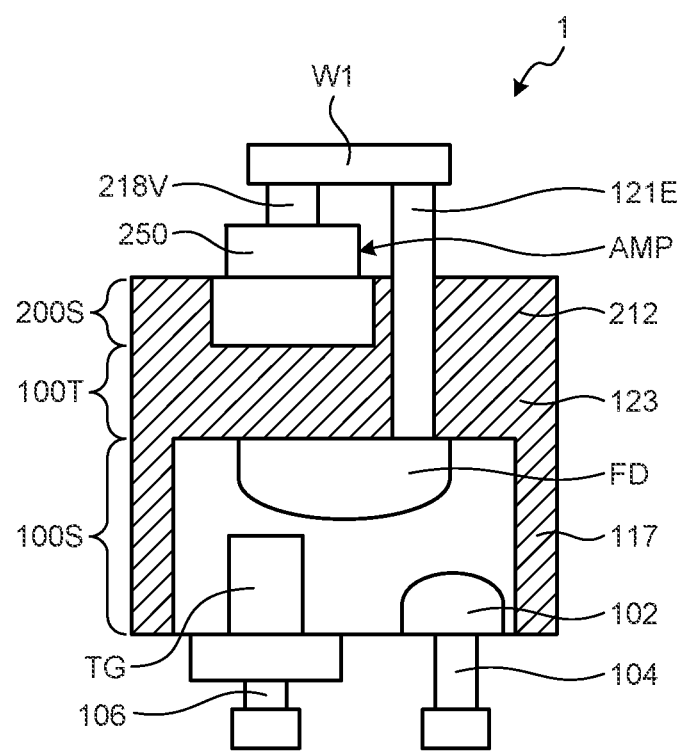
FIG. 69 is a schematic cross-sectional view illustrating an example of a main part of a configuration of an imaging device according to a third modification of the fourth embodiment of the present disclosure.

Furthermore, in the present embodiment, both of the contacts 104 and 106 described above may be provided on the incident surface side of the semiconductor layer 100S. Hereinafter, a third modification of the present embodiment will be described with reference to FIG. 69. FIG. 69 is a schematic cross-sectional view illustrating an example of a main part of a configuration of an imaging device 1 according to the third modification of the present embodiment. For the sake of clarity, FIG. 69 illustrates only the main part of the imaging device 1 related to the present modification, and omit illustrations of the other parts. Here, only points different from the above-described fourth embodiment will be described, and description of points common to the fourth embodiment will be omitted.

Specifically, as illustrated in FIG. 69, in the present modification, instead of the through-substrate electrodes 121E and TGV, both the contacts 104 and 106 are provided on the incident surface side of the semiconductor layer 100S.

In the present modification, by providing both of the contacts 104 and 106, instead of the through-substrate electrodes 121E and TGV, on the incident surface side of the semiconductor layer 100S, it is possible to further decrease the number of through-substrate electrodes provided on the surface of the semiconductor layer 200S opposite to the surface facing the semiconductor layer 100S, similarly to the description above. As a result, according to the present modification, it is possible to further expand the area of the region where the elements can be flexibly formed on the semiconductor layer 200S.

13. Fifth Embodiment

Figure 70:
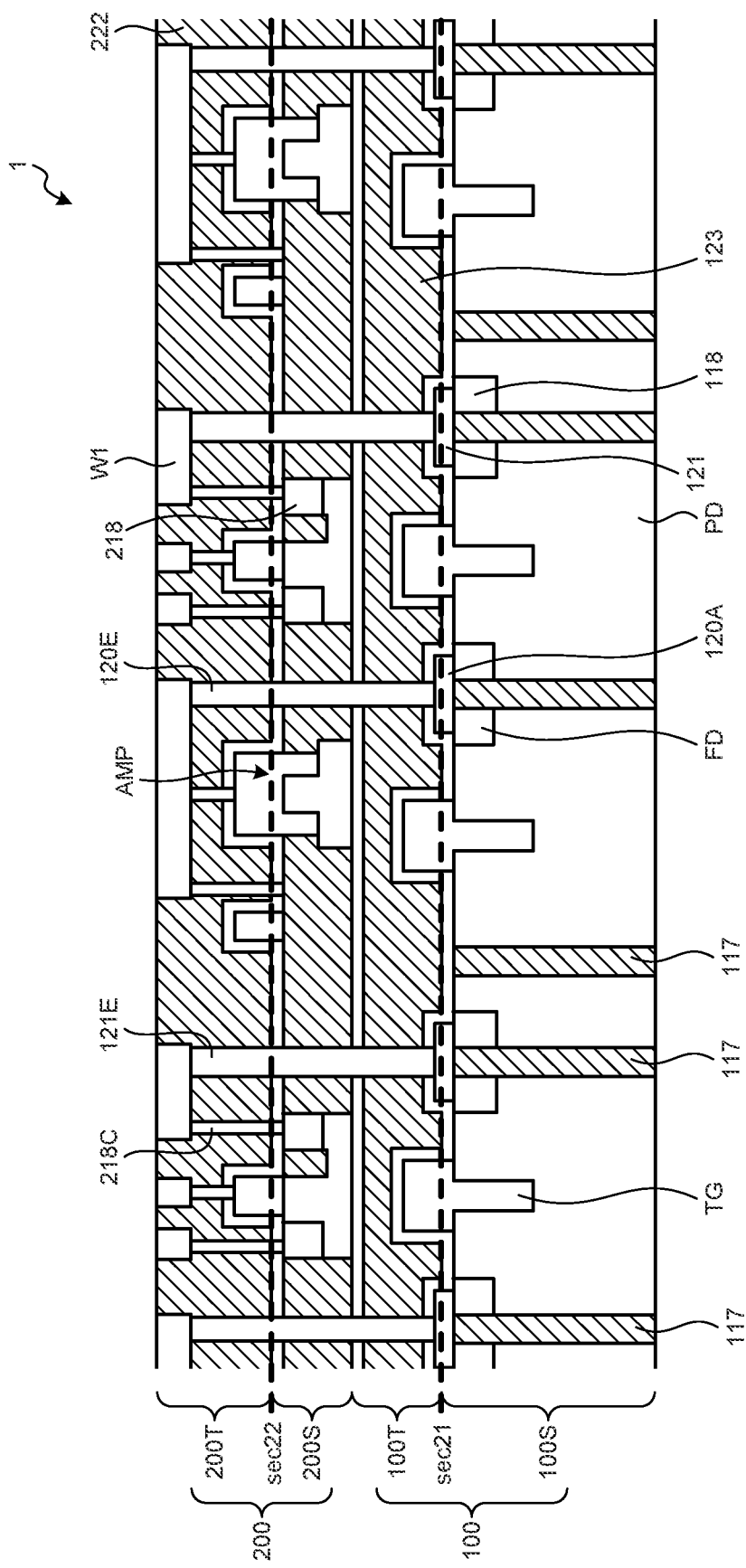
FIG. 70 is a schematic cross-sectional view illustrating an example of a main part of a configuration of an imaging device illustrating a technical background of a fifth embodiment of the present disclosure.
Figure 71:
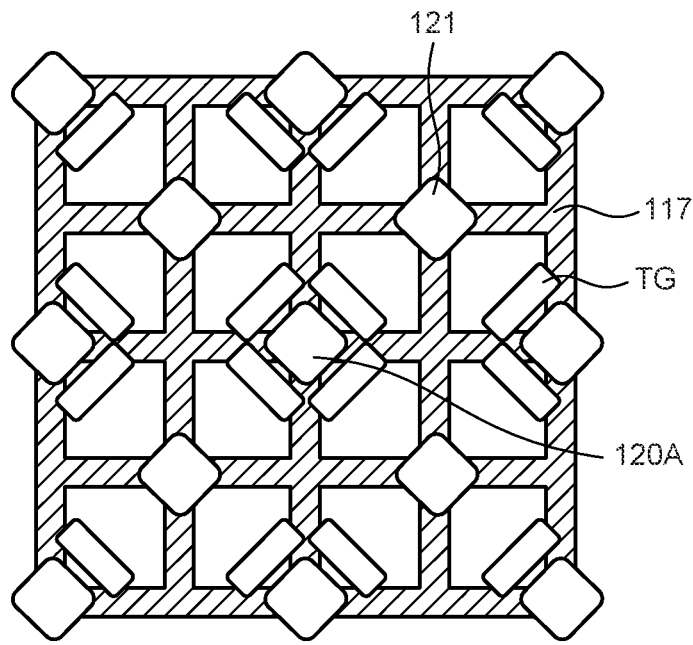
FIG. 71 is a schematic view (part 1) illustrating an example of a main part of a planar configuration of an imaging device illustrating a technical background of the fifth embodiment of the present disclosure.
Figure 72:
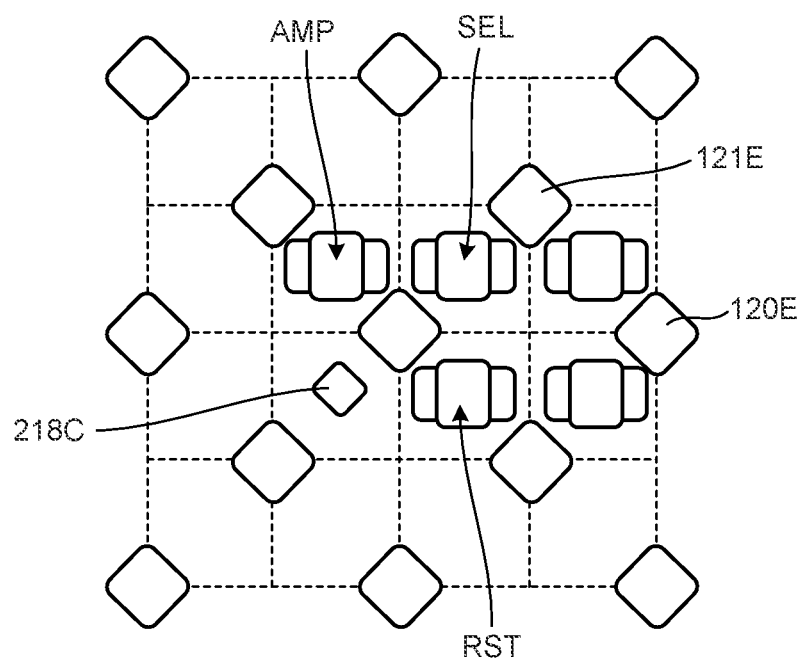
FIG. 72 is a schematic view (part 2) illustrating an example of a main part of a planar configuration of an imaging device illustrating the technical background of the fifth embodiment of the present disclosure.

First, the technical background leading to devised techniques of a fifth embodiment of the present disclosure will be described with reference to FIGS. 70 to 72. FIG. 70 is a schematic cross-sectional view illustrating an example of a main part of a configuration of an imaging device illustrating a technical background of the present embodiment. FIGS. 71 and 72 are schematic views illustrating an example of a main part of a planar configuration of the imaging device for describing a technical background of the fifth embodiment of the present disclosure. Specifically, FIG. 71 illustrates a planar configuration at a position sec21 illustrated in FIG. 70, and FIG. 72 illustrates a planar configuration at a position sec22 illustrated in FIG. 70.

As illustrated in FIGS. 70 to 72, in the imaging device 1, the VSS contact region 118 of the semiconductor layer 100S and the VSS contact region 218 of the semiconductor layer 200S are electrically connected to each other via the through-substrate electrode 121E and the first wiring layer W1 such that the VSS contact region 118 and the VSS contact region 218 have the same potential (for example, a power supply potential, a ground potential, or the like). However, as can be seen from FIG. 72, the presence of the through-substrate electrode 121E limits a region where various transistors (for example, an amplification transistor AMP or the like) can be arranged on the semiconductor layer 200S. That is, the presence of the through-substrate electrode 121E decreases the degree of freedom in arrangement of the transistors, lowering the efficiency in utilization of the planar configuration of the semiconductor layer 200S. This makes it difficult to achieve further miniaturization of the imaging device 1.

Figure 73:
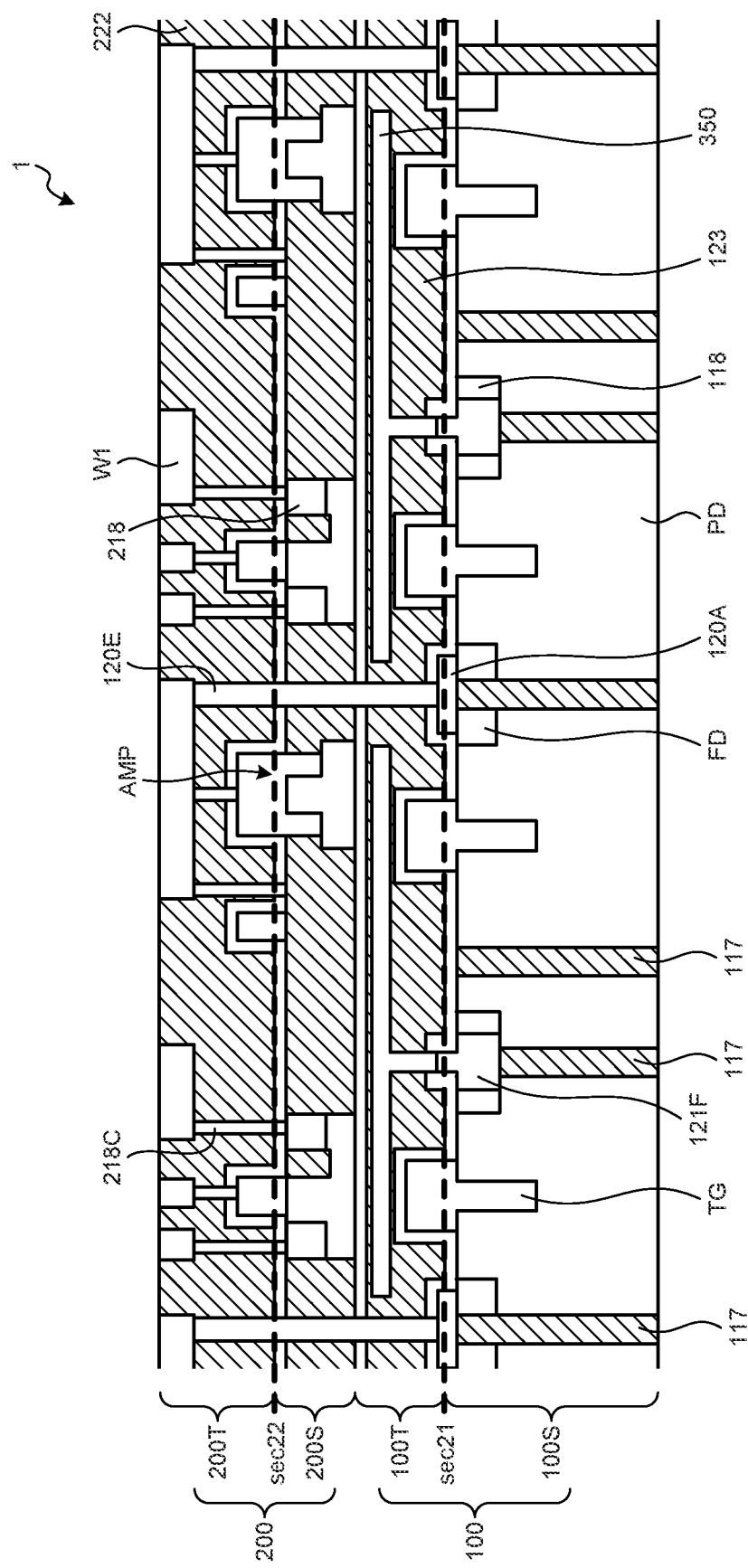
FIG. 73 is a schematic cross-sectional view illustrating an example of a main part of a configuration of the imaging device according to the fifth embodiment of the present disclosure.
Figure 74:
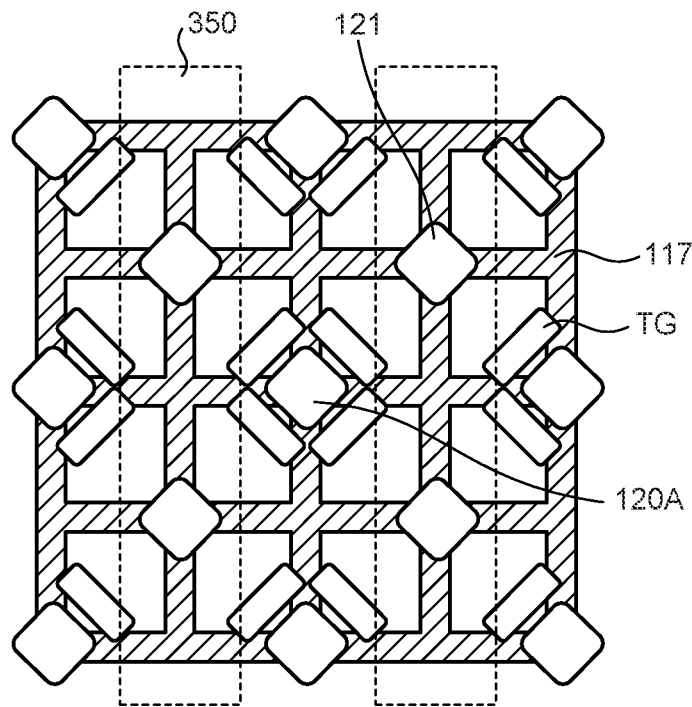
FIG. 74 is a schematic view (part 1) illustrating an example of a planar configuration of a main part of a configuration of the imaging device according to the fifth embodiment of the present disclosure.
Figure 75:
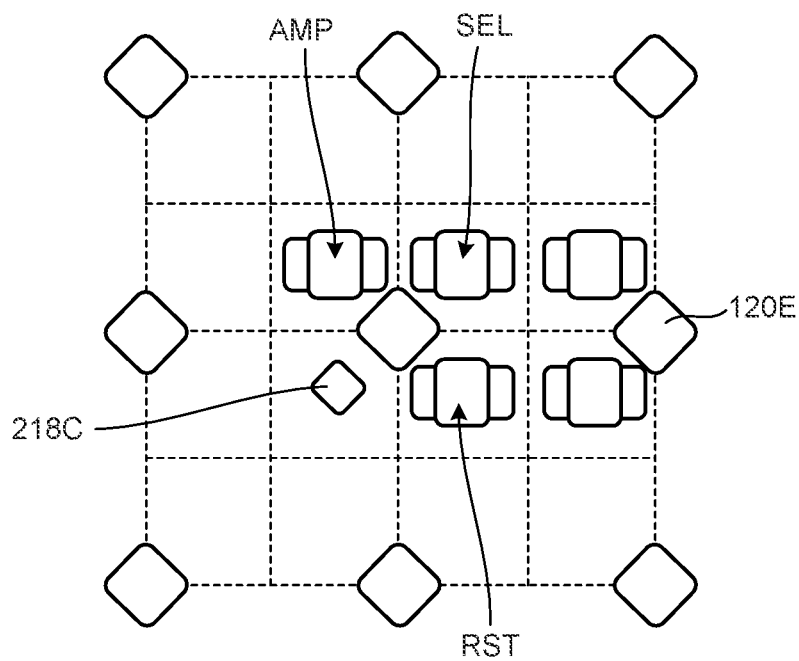
FIG. 75 is a schematic view (part 2) illustrating an example of a planar configuration of a main part of a configuration of the imaging device according to the fifth embodiment of the present disclosure.
Figure 76:
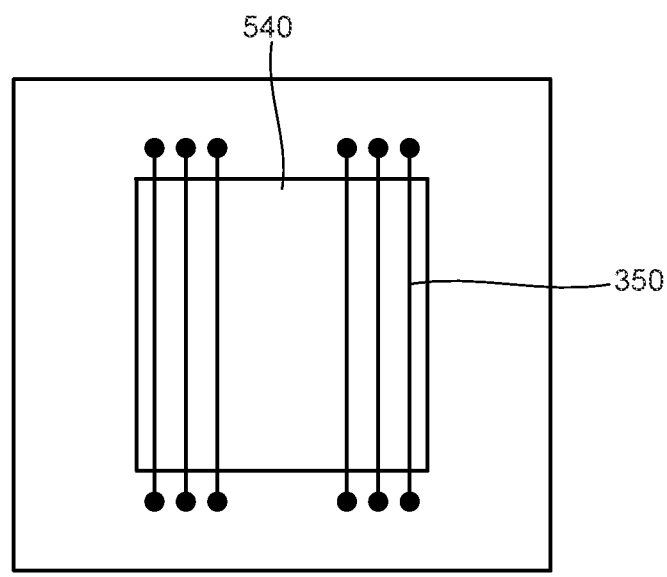
FIG. 76 is a schematic view (part 3) illustrating an example of a planar configuration of a main part of a configuration of the imaging device according to the fifth embodiment of the present disclosure.

In view of this, the present inventors have devised the fifth embodiment of the present disclosure capable of increasing the degree of freedom in arrangement of the transistors and increasing the efficiency in utilization of the planar configuration of the semiconductor layer 200S. Hereinafter, details of the fifth embodiment devised by the present inventors will be described with reference to FIGS. 73 to 76. FIG. 73 is a schematic cross-sectional view illustrating an example of a main part of the configuration of the imaging device according to the present embodiment. FIGS. 74 to 76 are schematic views illustrating an example of a planar configuration of a main part of the configuration of the imaging device according to the present embodiment. Specifically, FIG. 74 illustrates a planar configuration at the position sec21 illustrated in FIG. 73, and FIG. 75 illustrates a planar configuration at the position sec22 illustrated in FIG. 73. FIG. 76 schematically illustrates the pixel array unit 540 according to the present embodiment.

First, as illustrated in FIGS. 73 to 75, the through-substrate electrode 121E is not provided in the present embodiment. In addition, instead of the through-substrate electrode 121E, a wiring line 350 routed from the peripheral portion 540B located on the outer periphery of the pixel array unit 540 is provided in the wiring layer 100T. Furthermore, the wiring line 350 is electrically connected to the VSS contact region 118 via the distal end portion 121F embedded in the semiconductor layer 100S. For example, the wiring line 350 can be formed from a metal film or a polysilicon film doped with a p-type impurity. Furthermore, a bias potential (power supply potential (positive potential or negative potential), ground potential, or the like) is applied to the wiring line 350 from a circuit located in the peripheral portion 540B or the like. That is, in the present embodiment, a bias potential is separately applied to the VSS contact region 118 of the semiconductor layer 100S and the VSS contact region 218 of the semiconductor layer 200S.

As illustrated in FIG. 76, in the present embodiment, the wiring line 350 may extend on the pixel array unit 540 in the column direction V (refer to FIG. 2), and the plurality of wiring lines 350 may be arranged on the pixel array unit 640 so as to be aligned in the row direction H (refer to FIG. 2). Furthermore, in the present embodiment, the number of wiring lines 350 provided in the imaging device 1 is not limited to the number illustrated in FIG. 76, and a plurality of wiring lines can be provided.

Furthermore, in the present embodiment, the wiring line 350 is not limited to a wiring line extending in the column direction V on the pixel array unit 540 as illustrated in FIG. 76, and may be a wiring line extending in the row direction H, for example (refer to FIG. 2).

According to the present embodiment, employment of such a configuration can omit the through-substrate electrode 121E, leading to a higher degree of freedom in arrangement of the transistor, making it possible to enhanced efficiency in utilization of the planar configuration of the semiconductor layer 200S.

Figure 77:
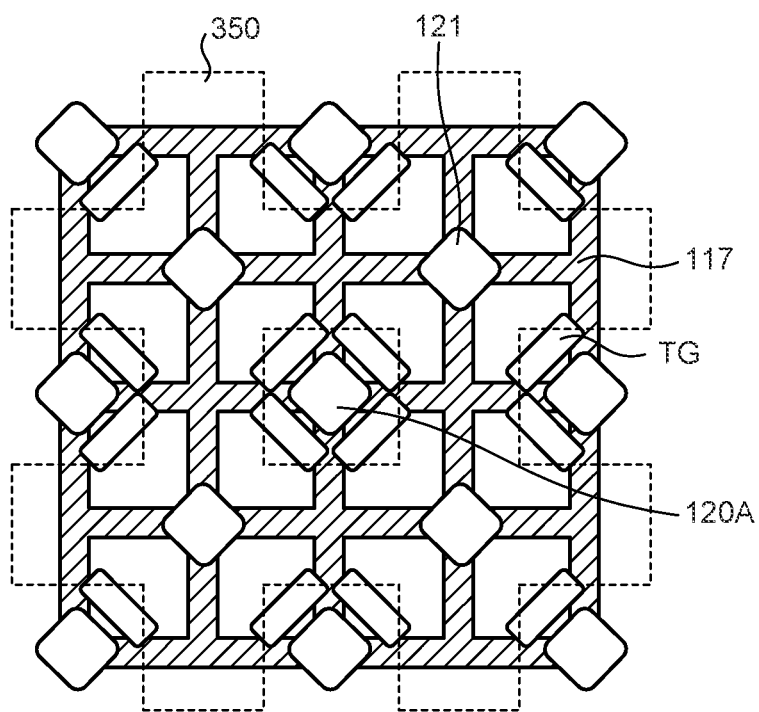
FIG. 77 is a schematic view (part 1) illustrating an example of a planar configuration of a main part of a configuration of an imaging device according to a modification of the fifth embodiment of the present disclosure.
Figure 78:
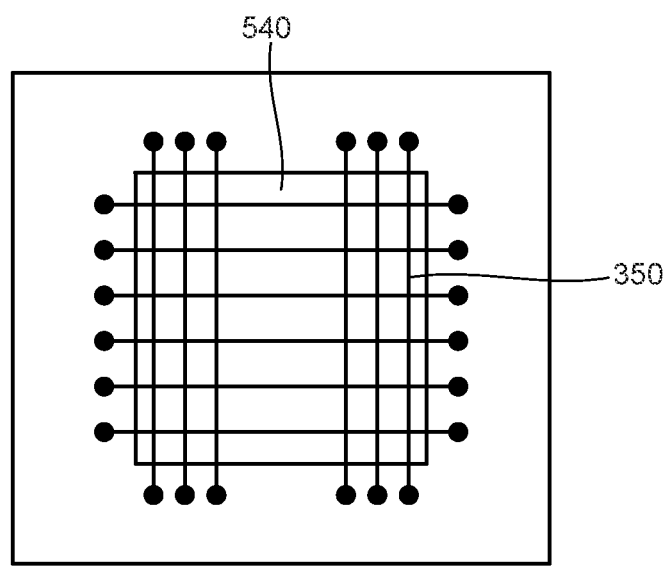
FIG. 78 is a schematic view (part 2) illustrating an example of a planar configuration of a main part of a configuration of the imaging device according to the modification of the fifth embodiment of the present disclosure.

Furthermore, the present embodiment can be modified as follows. Hereinafter, a modification of the present embodiment will be described with reference to FIGS. 77 and 78. FIGS. 77 and 78 are schematic views illustrating an example of a planar configuration of a main part of a configuration of an imaging device according to a modification of the present embodiment. Specifically, FIG. 77 illustrates a planar configuration corresponding to FIG. 74, and FIG. 78 schematically illustrates the pixel array unit 540 according to the present embodiment.

As illustrated in FIGS. 77 and 78, in the present modification, the wiring line 350 may have a grid-like shape formed by combining a plurality of wiring lines extending on the pixel array unit 540 in the column direction V (refer to FIG. 2) and the row direction H (refer to FIG. 2). Furthermore, in the present modification, the number of grids of the wiring line 350 provided in the imaging device 1 is not limited to the number illustrated in FIG. 78, and a plurality of grids can be provided.

In the present modification, by forming the wiring lines 350 in a grid-like shape, it is possible, for example, to further strengthen the ground of the semiconductor layer 100S. Furthermore, in the imaging device 1, light is incident on the imaging device 1 from the lower side of FIG. 73. In this case, due to the grid-like shape of the wiring lines 350, the arrangement of the wiring lines 350 is symmetric in any direction as viewed in the incident direction of the light, leading to uniform light reflection obtained by the wiring lines 350. Therefore, the photodiode PD at any position can uniformly absorb light and generate a signal, making it possible to suppress deterioration of an image.

14. Sixth Embodiment

Figure 79:
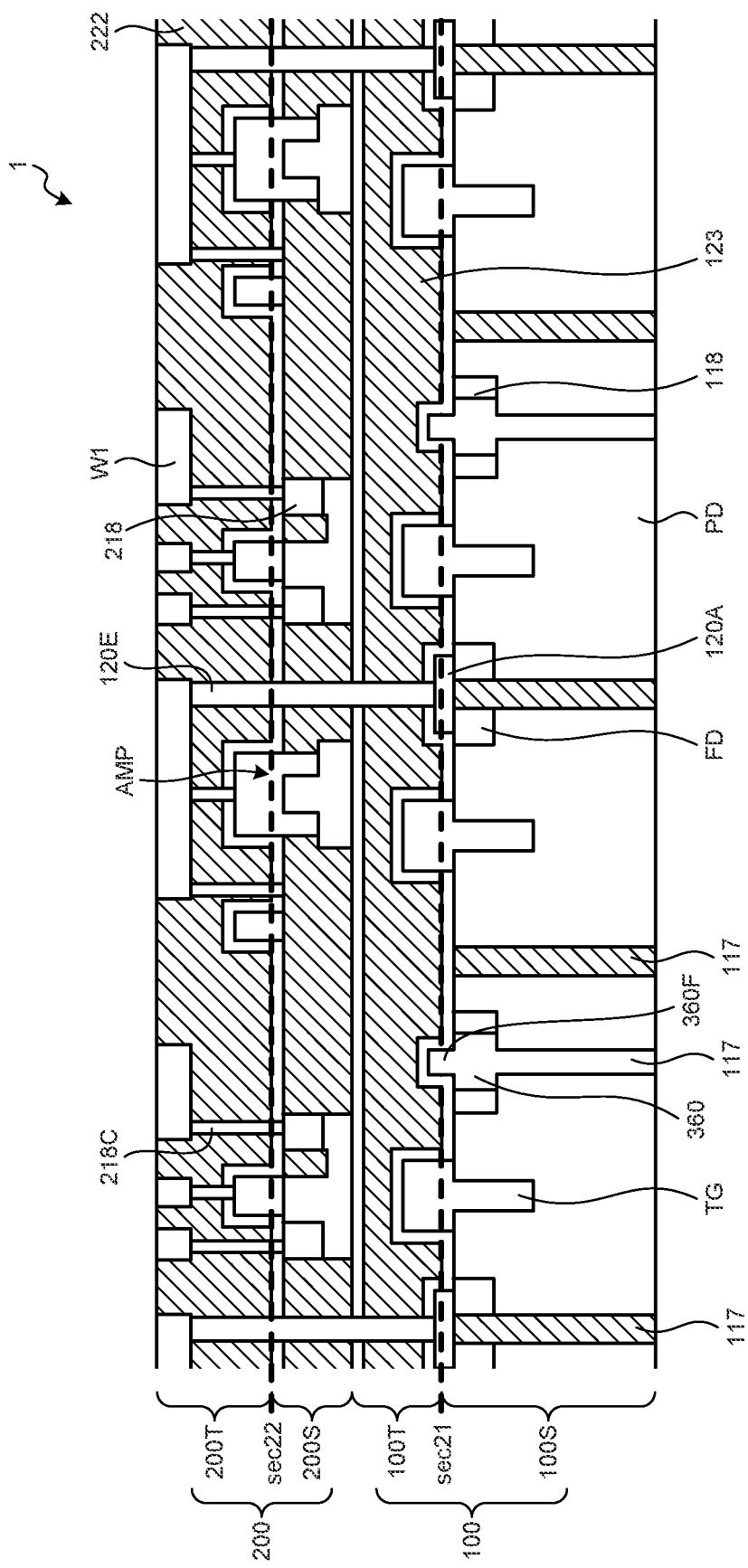
FIG. 79 is a schematic cross-sectional view illustrating an example of a main part of a configuration of an imaging device according to a sixth embodiment of the present disclosure.
Figure 80:
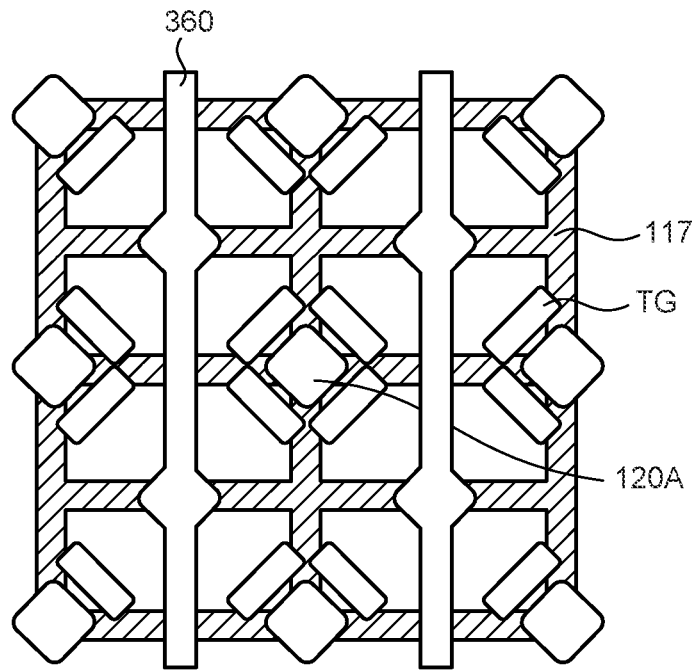
FIG. 80 is a schematic view (part 1) illustrating an example of a planar configuration of a main part of a configuration of the imaging device according to the sixth embodiment of the present disclosure.
Figure 81:
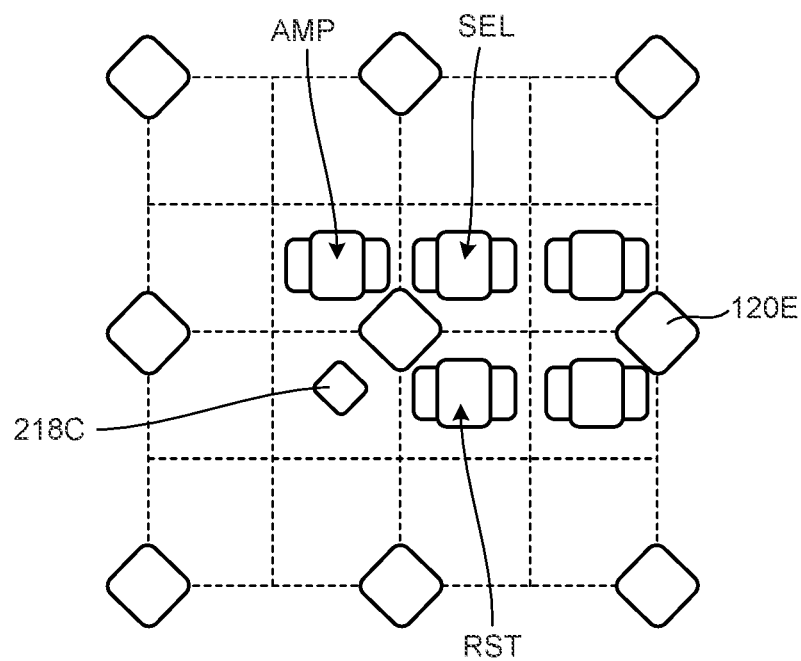
FIG. 81 is a schematic view (part 2) illustrating an example of a planar configuration of a main part of a configuration of the imaging device according to the sixth embodiment of the present disclosure.

In addition, similarly to the fifth embodiment described above, in order to increase the degree of freedom in the arrangement of the transistors and to enhance the efficiency in using the planar configuration of the semiconductor layer 200S, the present inventors have devised a sixth embodiment of the present disclosure. Hereinafter, details of the sixth embodiment devised by the present inventors will be described with reference to FIGS. 79 to 81. FIG. 79 is a schematic cross-sectional view illustrating an example of a main part of the configuration of the imaging device according to the present embodiment. FIGS. 80 and 81 are schematic views illustrating an example of a planar configuration of a main part of the configuration of the imaging device according to the present embodiment. Specifically, FIG. 80 illustrates a planar configuration at the position sec21 illustrated in FIG. 79, and FIG. 81 illustrates a planar configuration at the position sec22 illustrated in FIG. 79.

First, as illustrated in FIGS. 79 to 81, the through-substrate electrode 121E is not provided in the present embodiment. Furthermore, a part of the pixel isolation portion 117 is not present. Instead of the through-substrate electrode 121E and the part of the pixel isolation portion 117, there is provided a through-substrate electrode 360 penetrating the semiconductor layer 100S. For example, the through-substrate electrode 360 can be formed from a metal film or a polysilicon film doped with a p-type impurity. In addition, the through-substrate electrode 360 is electrically connected to a circuit positioned in the peripheral portion 540B located on the outer periphery of the pixel array unit 540, and a bias potential (power supply potential (positive potential or negative potential), ground potential, or the like) is applied from the circuit to the through-substrate electrode 360. Furthermore, the through-substrate electrode 360 is electrically connected to the VSS contact region 118 via a contact portion 360C provided on the wiring layer 100T side front surface of the semiconductor layer 100S. Note that the contact portion 360C can be formed from a metal film or a polysilicon film doped with a p-type impurity, for example. In addition, in the present embodiment, a bias potential is separately applied to the VSS contact region 118 of the semiconductor layer 100S and the VSS contact region 218 of the semiconductor layer 200S.

As illustrated in FIG. 80, similarly to the fifth embodiment illustrated in FIG. 76, the through-substrate electrode 360 in the present embodiment may be provided in a groove extending in the column direction V (refer to FIG. 2) provided in the semiconductor layer 100S of the pixel array unit 540. Furthermore, in the present embodiment, the through-substrate electrodes 360 may be provided in plurality in the semiconductor layer 100S of the pixel array unit 640 so as to be arranged in the row direction H (refer to FIG. 2). In the present embodiment, the number of the through-substrate electrodes 360 provided in the imaging device 1 is not particularly limited.

Furthermore, in the present embodiment, the through-substrate electrode 360 is not limited to being provided to extend in the column direction V on the pixel array unit 540 as illustrated in FIG. 80, and may be provided to extend in the row direction H (refer to FIG. 2), for example.

According to the present embodiment, employment of such a configuration can omit the through-substrate electrode 121E, leading to a higher degree of freedom in arrangement of the transistor, making it possible to enhanced efficiency in utilization of the planar configuration of the semiconductor layer 200S.

Figure 82:
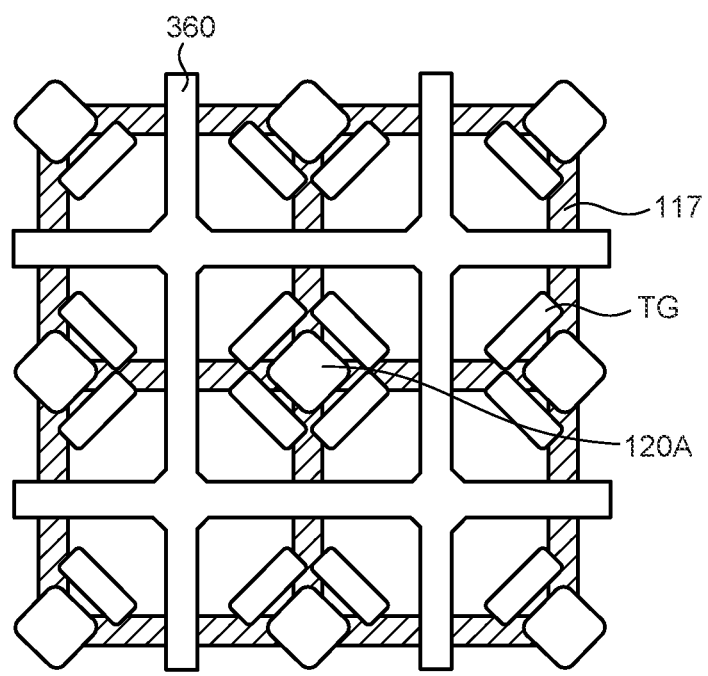
FIG. 82 is a schematic view illustrating an example of a planar configuration of a main part of a configuration of an imaging device according to a first modification of the sixth embodiment of the present disclosure.

Furthermore, the present embodiment can be modified as follows. Hereinafter, a first modification of the present embodiment will be described with reference to FIG. 82. FIG. 82 is a schematic view illustrating an example of a planar configuration of a main part of a configuration of an imaging device according to the first modification of the present embodiment, and specifically illustrates a planar configuration corresponding to FIG. 80.

As illustrated in FIG. 82, in the present modification, the through-substrate electrode 360 may be a grid-like through-substrate electrode embedded in a plurality of grooves extending in the semiconductor layer 100S of the pixel array unit 540 in the column direction V (refer to FIG. 2) and the row direction H (refer to FIG. 2). In the present modification, the number of grids of the through-substrate electrodes 360 provided in the imaging device 1 is not particularly limited.

In the present modification, by forming the through-substrate electrode 360 in a grid-like shape, it is possible to further strengthen the ground of the semiconductor layer 100S. Furthermore, in the imaging device 1, light is incident on the imaging device 1 from the lower side of FIG. 79. In this case, due to the grid-like shape of the through-substrate electrode 360, the arrangement of through-substrate electrode 360 is symmetric in any direction as viewed in the incident direction of the light, leading to uniform light reflection obtained by the through-substrate electrode 360. Therefore, the photodiode PD at any position can uniformly absorb light and generate a signal, making it possible to suppress deterioration of an image.

Figure 83:
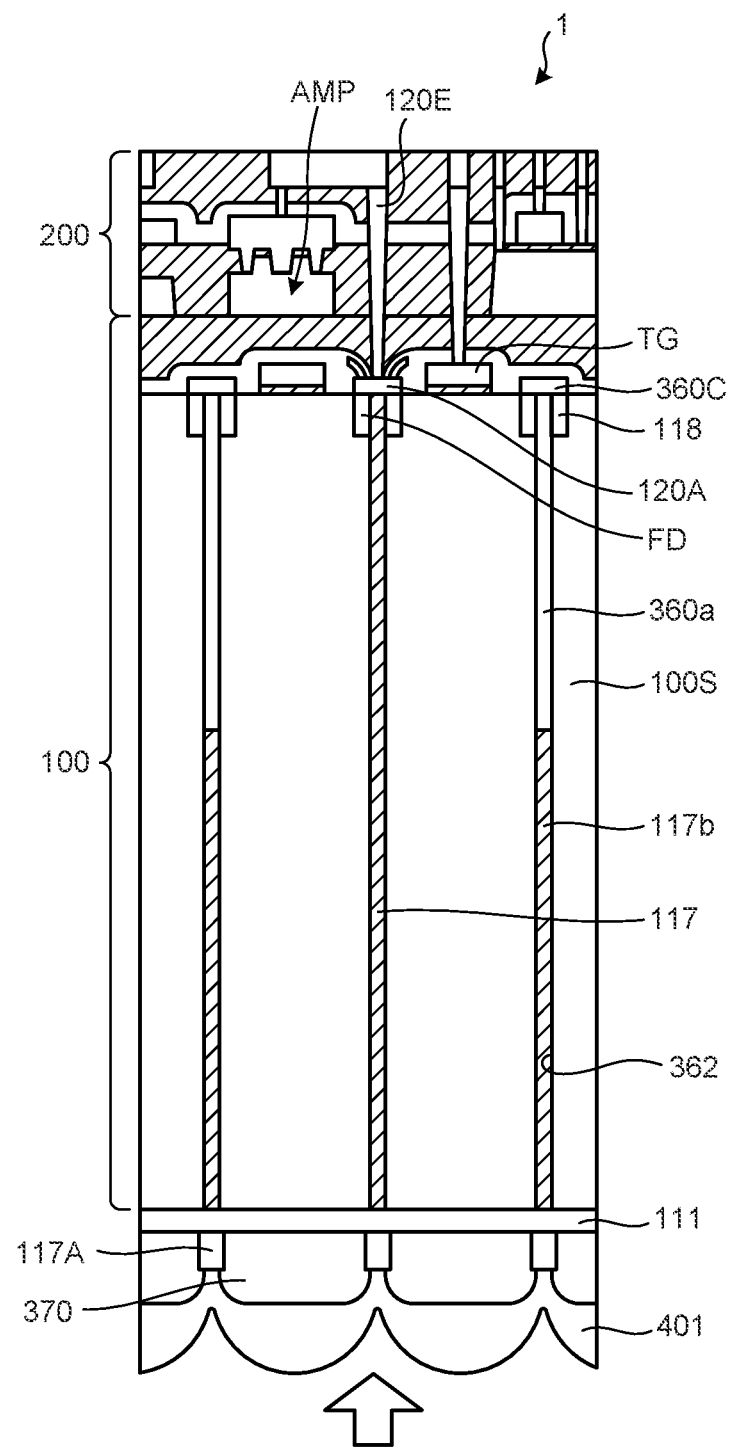
FIG. 83 is a schematic cross-sectional view illustrating an example of a main part of a configuration of an imaging device according to a second modification of the sixth embodiment of the present disclosure.

Furthermore, the present embodiment can be modified as follows. Hereinafter, a first modification of the present embodiment will be described with reference to FIG. 83. FIG. 83 is a schematic cross-sectional view illustrating an example of a main part of a configuration of an imaging device according to the first modification of the present embodiment.

In the present modification, as illustrated in FIG. 83, instead of the through-substrate electrode 360 penetrating the semiconductor layer 100S, an embedded electrode 360a penetrating halfway through the semiconductor layer 100S may be used. In this case, there is provided a pixel isolation portion 117b on the light receiving lens 401 side of a groove 362 in which the embedded electrode 360a is disposed. The embedded electrode 360a can be formed from a metal film or a polysilicon film doped with a p-type impurity, for example. Furthermore, light is incident on the imaging device 1 in a direction indicated by an arrow in FIG. 83, and the pixel isolation portion 117b is preferably formed of a material having less light absorption, for example, silicon oxide or the like. For example, the ratio of the lengths of the embedded electrode 360a and the pixel isolation portion 117b in a film thickness direction of the semiconductor layer 100S is not particularly limited. Still, it is preferable to set that embedded electrode 360a:pixel isolation portion 117b=about 3:7. With this ratio, it is possible to suppress the light absorption by the embedded electrode 360a and improve light collection efficiency to the photodiode PD.

Incidentally, in the present embodiment and the present modification, the through-substrate electrode 360 and the embedded electrode 360a may be formed in the pixel isolation portion 117 located below a pad portion 120A electrically connecting the floating diffusion FD and the through-substrate electrode 120E. In this case, the distal end portion of the through-substrate electrode 360 and the embedded electrode 360a on the wiring layer 100T side is preferably covered with an insulating film so as not to be electrically connected to the pad portion 120A or the floating diffusion FD. In such a case, when the embedded electrode 360a has been formed, the pixel isolation portion 117b is provided on the light receiving lens 401 side of the embedded electrode 360a.

15. Application Examples

Figure 84:
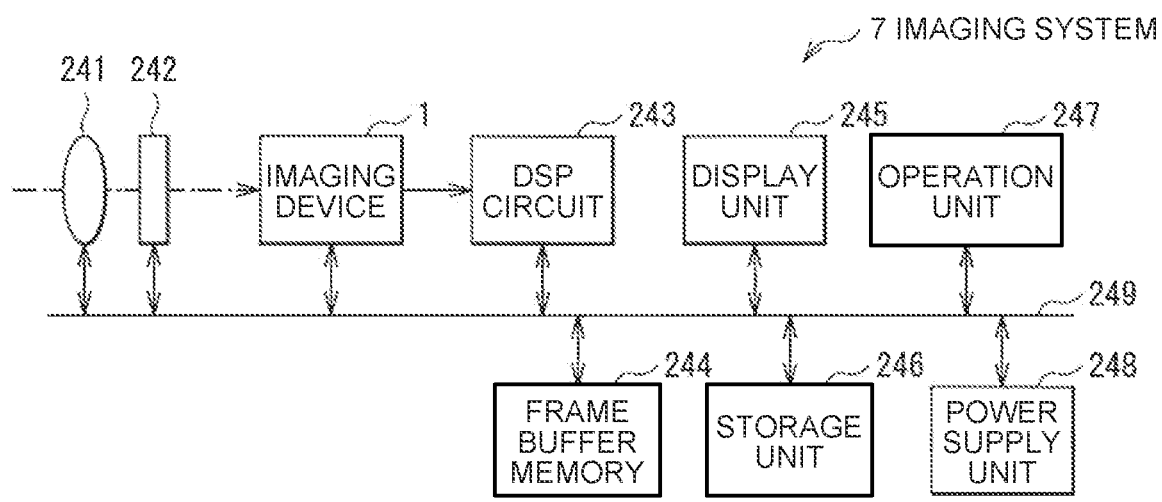
FIG. 84 is a diagram illustrating an example of a schematic configuration of an imaging system including the imaging device according to the embodiments and their modifications.

FIG. 84 is a diagram illustrating an example of a schematic configuration of an imaging system 7 including the imaging device 1 according to the embodiments and their modifications.

The imaging system 7 is an electronic device exemplified by an imaging device such as a digital still camera or a video camera, or a portable terminal device such as a smartphone or a tablet terminal. The imaging system 7 includes, for example, the imaging device 1, a DSP circuit 243, frame buffer memory 244, a display unit 245, a storage unit 246, an operation unit 247, and a power supply unit 248 according to the above-described embodiments and their modifications. In the imaging system 7, the imaging device 1, the DSP circuit 243, the frame buffer memory 244, the display unit 245, the storage unit 246, the operation unit 247, and the power supply unit 248 according to the above-described embodiments and their modifications are connected to each other via a bus line 249.

The imaging device 1 according to the above-described embodiments and their modifications outputs image data corresponding to incident light. The DSP circuit 243 is a signal processing circuit that processes a signal (image data) output from the imaging device 1 according to the above-described embodiments and their modifications. The frame buffer memory 244 temporarily holds, in units of frames, the image data processed by the DSP circuit 243. The display unit 245 includes, for example, a panel type display device such as a liquid crystal panel or an organic Electro Luminescence (EL) panel, and displays a moving image or a still image captured by the imaging device 1 according to the above embodiments and their modifications. The storage unit 246 records image data of a moving image or a still image captured by the imaging device 1 according to the above-described embodiments and their modifications in a recording medium such as a semiconductor memory device or a hard disk. The operation unit 247 issues operation commands for various functions of the imaging system 7 in accordance with an operation by the user. The power supply unit 248 appropriately supplies various types of power as operation power of the imaging device 1, the DSP circuit 243, the frame buffer memory 244, the display unit 245, the storage unit 246, and the operation unit 247 according to the above-described embodiments and their modifications to these supply targets.

Next, an imaging procedure in the imaging system 7 will be described.

Figure 85:
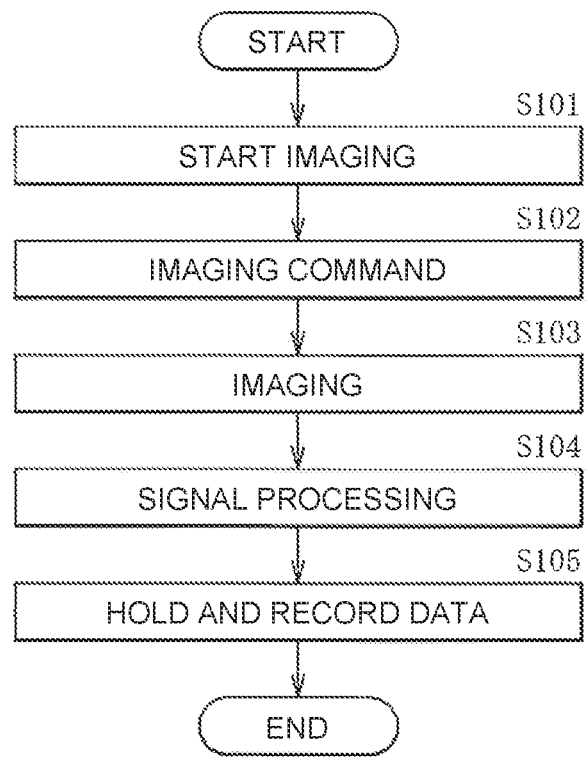
FIG. 85 is a diagram illustrating an example of an imaging procedure of the imaging system illustrated in FIG. 84.

FIG. 85 illustrates an example of a flowchart of an imaging operation in the imaging system 7. A user gives an instruction on start of imaging by operating the operation unit 247 (Step S101). In response to this, the operation unit 247 transmits an imaging command to the imaging device 1 (Step S102). Having received the imaging command, the imaging device 1 (specifically, a system control circuit 36) executes imaging by a predetermined imaging method (Step S103).

The imaging device 1 outputs image data obtained by the imaging to the DSP circuit 243. Here, the image data represents data for all the pixels of the pixel signal generated based on the charge temporarily held in the floating diffusion FD. The DSP circuit 243 performs predetermined signal processing (for example, noise reduction processing) based on the image data input from the imaging device 1 (Step S104). The DSP circuit 243 causes the frame buffer memory 244 to hold the image data that has undergone the predetermined signal processing, and then, the frame buffer memory 244 causes the storage unit 246 to store the image data (Step S105). In this manner, imaging in the imaging system 7 is performed.

In the present application example, the imaging device 1 according to the above-described embodiments and their modifications is applied to the imaging system 7. Accordingly, downsizing or high definition of the imaging device 1 can be achieved, making it possible to provide the downsized or high definition imaging system 7.

16. Examples of Applications to Products

Examples of Applications to Products 1

The technology according to the present disclosure (the present technology) is applicable to various products. The technology according to the present disclosure may be applied to devices mounted on any time of moving objects such as automobiles, electric vehicles, hybrid electric vehicles, motorcycles, bicycles, personal mobility, airplanes, drones, ships, and robots.

Figure 86:
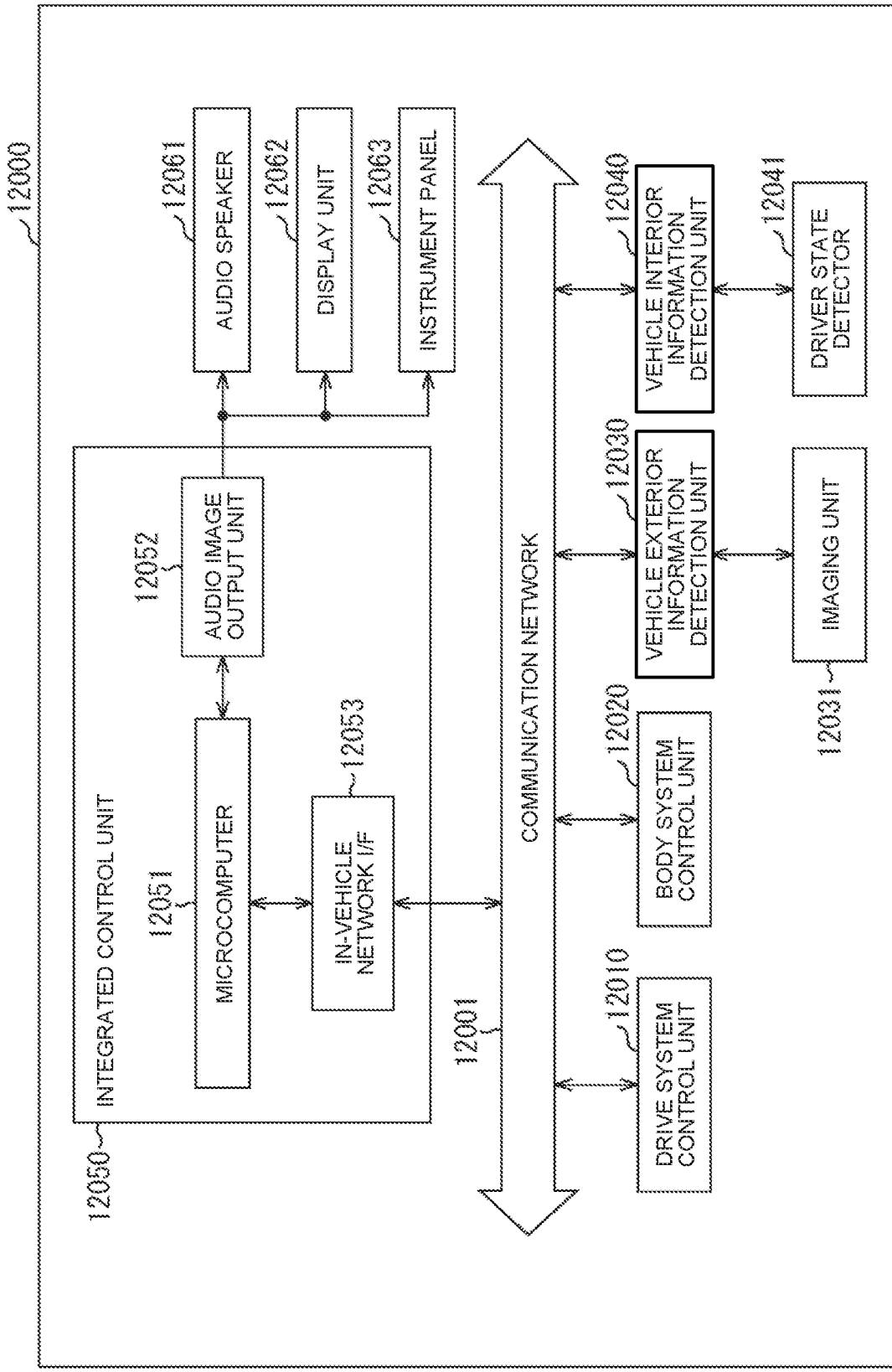
FIG. 86 is a block diagram illustrating an example of a schematic configuration of a vehicle control system.

FIG. 86 is a block diagram illustrating a schematic configuration example of a vehicle control system, which is an example of a moving body control system to which the technique according to the present disclosure is applicable.

A vehicle control system 12000 includes a plurality of electronic control units connected via a communication network 12001. In the example illustrated in FIG. 86, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, an audio image output unit 12052, and an in-vehicle network interface (I/F) 12053 are illustrated.

The drive system control unit 12010 controls the operation of the device related to the drive system of the vehicle in accordance with various programs. For example, the drive system control unit 12010 functions as a control device of a driving force generation device that generates a driving force of a vehicle such as an internal combustion engine or a driving motor, a driving force transmission mechanism that transmits a driving force to the wheels, a steering mechanism that adjusts steering angle of the vehicle, a braking device that generates a braking force of the vehicle, or the like.

The body system control unit 12020 controls the operation of various devices mounted on the vehicle body in accordance with various programs. For example, the body system control unit 12020 functions as a control device for a keyless entry system, a smart key system, a power window device, or various lamps such as a head lamp, a back lamp, a brake lamp, a turn signal lamp, or a fog lamp. In this case, the body system control unit 12020 can receive input of radio waves transmitted from a portable device that substitutes for the key or signals from various switches. The body system control unit 12020 receives the input of these radio waves or signals and controls the door lock device, the power window device, the lamp, and the like, of the vehicle.

The vehicle exterior information detection unit 12030 detects information outside the vehicle equipped with the vehicle control system 12000. For example, an imaging unit 12031 is connected to the vehicle exterior information detection unit 12030. The vehicle exterior information detection unit 12030 causes the imaging unit 12031 to capture an image of the exterior of the vehicle and receives the captured image. The vehicle exterior information detection unit 12030 may perform an object detection process or a distance detection process of people, vehicles, obstacles, signs, or characters on the road surface based on the received image.

The imaging unit 12031 is an optical sensor that receives light and outputs an electrical signal corresponding to the amount of received light. The imaging unit 12031 can output the electric signal as an image and also as distance measurement information. Furthermore, the light received by the imaging unit 12031 may be visible light or invisible light such as infrared light.

The vehicle interior information detection unit 12040 detects vehicle interior information. The vehicle interior information detection unit 12040 is connected to a driver state detector 12041 that detects the state of the driver, for example. The driver state detector 12041 may include a camera that images the driver, for example. The vehicle interior information detection unit 12040 may calculate the degree of fatigue or degree of concentration of the driver or may determine whether the driver is dozing off based on the detection information input from the driver state detector 12041.

The microcomputer 12051 can calculate a control target value of the driving force generation device, the steering mechanism, or the braking device based on vehicle external/internal information obtained by the vehicle exterior information detection unit 12030 or the vehicle interior information detection unit 12040, and can output a control command to the drive system control unit 12010. For example, the microcomputer 12051 can perform cooperative control for the purpose of achieving a function of an advanced driver assistance system (ADAS) including collision avoidance or impact mitigation of vehicles, follow-up running based on an inter-vehicle distance, cruise control, vehicle collision warning, vehicle lane departure warning, or the like.

Furthermore, it is allowable such that the microcomputer 12051 controls the driving force generation device, the steering mechanism, the braking device, or the like, based on the information regarding the surroundings of the vehicle obtained by the vehicle exterior information detection unit 12030 or the vehicle interior information detection unit 12040, thereby performing cooperative control for the purpose of autonomous driving or the like, in which the vehicle performs autonomous traveling without depending on the operation of the driver.

Furthermore, the microcomputer 12051 can output a control command to the body system control unit 12020 based on the vehicle exterior information acquired by the vehicle exterior information detection unit 12030. For example, the microcomputer 12051 can control the head lamp in accordance with the position of the preceding vehicle or the oncoming vehicle sensed by the vehicle exterior information detection unit 12030, and thereby can perform cooperative control aiming at antiglare such as switching the high beam to low beam.

The audio image output unit 12052 transmits an output signal in the form of at least one of audio or image to an output device capable of visually or audibly notifying the occupant of the vehicle or the outside of the vehicle of information. In the example of FIG. 63, an audio speaker 12061, a display unit 12062, and an instrument panel 12063 are illustrated as exemplary output devices. The display unit 12062 may include, for example, at least one of an onboard display and a head-up display.

Figure 87:
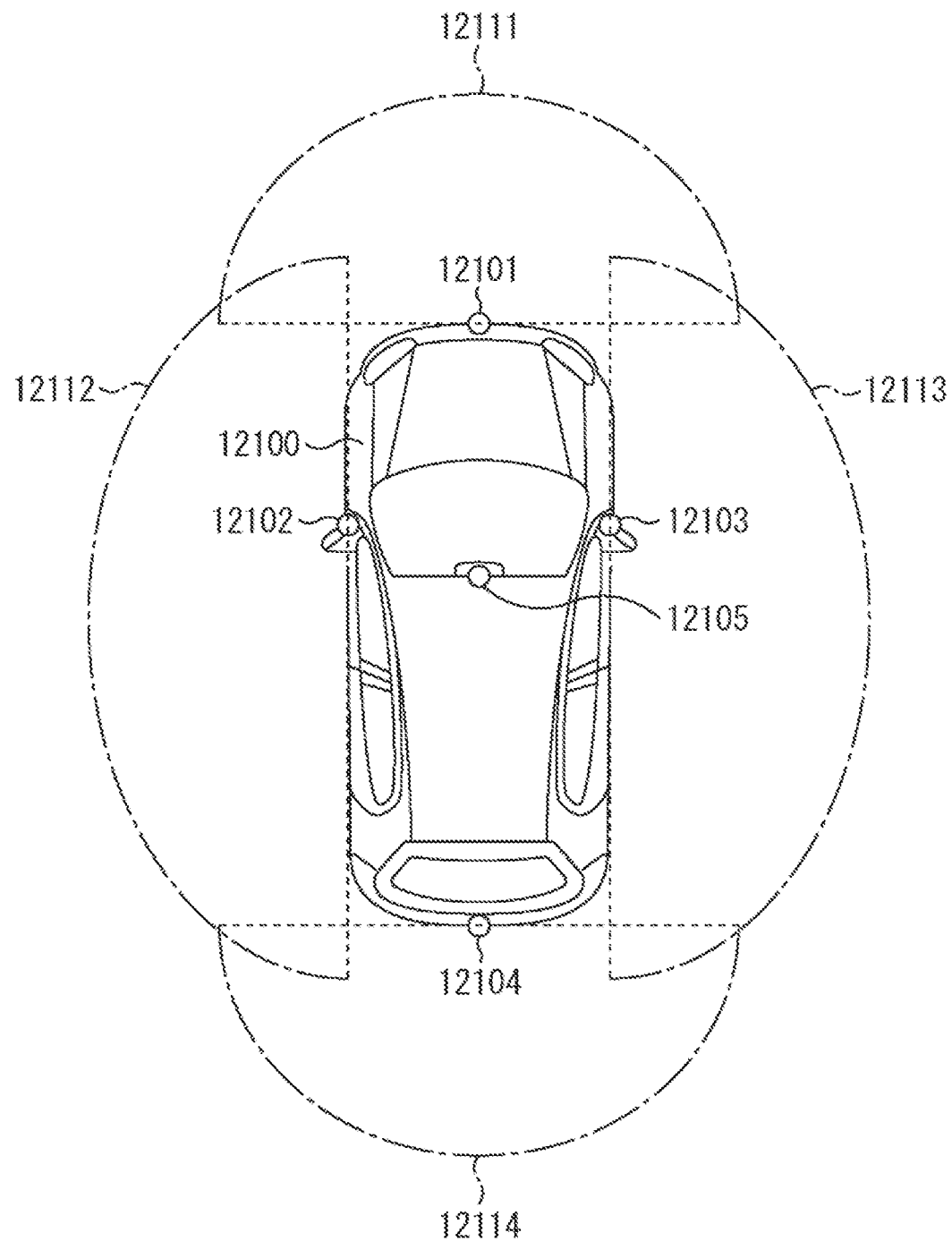
FIG. 87 is a diagram illustrating an example of installation positions of a vehicle exterior information detector and an imaging unit.

FIG. 87 is a diagram illustrating an example of an installation position of the imaging unit 12031.

In FIG. 87, a vehicle 12100 has imaging units 12101, 12102, 12103, 12104, and 12105 as the imaging units 12031.

For example, the imaging units 12101, 12102, 12103, 12104, and 12105 are installed at positions on a vehicle 12100, including a front nose, a side mirror, a rear bumper, a back door, an upper portion of the windshield in a vehicle interior, or the like. The imaging unit 12101 provided on the front nose and the imaging unit 12105 provided on the upper portion of the windshield in the vehicle interior mainly acquire an image in front of the vehicle 12100. The imaging units 12102 and 12103 provided in the side mirrors mainly acquire images of the side of the vehicle 12100. The imaging unit 12104 provided on the rear bumper or the back door mainly acquires an image behind the vehicle 12100. The images in front acquired by the imaging units 12101 and 12105 are mainly used for detecting a preceding vehicle or a pedestrian, an obstacle, a traffic light, a traffic sign, a lane, or the like.

Note that FIG. 87 illustrates an example of the imaging range of the imaging units 12101 to 12104. An imaging range 12111 indicates an imaging range of the imaging unit 12101 provided on the front nose, imaging ranges 12112 and 12113 indicate imaging ranges of the imaging units 12102 and 12103 provided on the side mirrors, respectively, and an imaging range 12114 indicates an imaging range of the imaging unit 12104 provided on the rear bumper or the back door. For example, by superimposing pieces of image data captured by the imaging units 12101 to 12104, it is possible to obtain a bird's-eye view image of the vehicle 12100 as viewed from above.

At least one of the imaging units 12101 to 12104 may have a function of acquiring distance information. For example, at least one of the imaging units 12101 to 12104 may be a stereo camera including a plurality of imaging elements, or an imaging element including pixels for phase difference detection.

For example, the microcomputer 12051 can calculate a distance to each of three-dimensional objects in the imaging ranges 12111 to 12114 and a temporal change (relative speed with respect to the vehicle 12100) of the distance based on the distance information obtained from the imaging units 12101 to 12104, and thereby can extract a three-dimensional object traveling at a predetermined speed (for example, 0 km/h or more) in substantially the same direction as the vehicle 12100 being the closest three-dimensional object on the traveling path of the vehicle 12100, as a preceding vehicle. Furthermore, the microcomputer 12051 can set an inter-vehicle distance to be ensured in front of the preceding vehicle in advance, and can perform automatic brake control (including follow-up stop control), automatic acceleration control (including follow-up start control), or the like. In this manner, it is possible to perform cooperative control for the purpose of autonomous driving or the like, in which the vehicle autonomously travels without depending on the operation of the driver.

For example, based on the distance information obtained from the imaging units 12101 to 12104, the microcomputer 12051 can extract three-dimensional object data regarding the three-dimensional object with classification into three-dimensional objects, such as a two-wheeled vehicle, a regular vehicle, a large vehicle, a pedestrian, and other three-dimensional objects such as a utility pole, and can use the data for automatic avoidance of obstacles. For example, the microcomputer 12051 distinguishes obstacles around the vehicle 12100 into obstacles having high visibility to the driver of the vehicle 12100 and obstacles having low visibility to the driver. Subsequently, the microcomputer 12051 determines a collision risk indicating the risk of collision with each of obstacles. When the collision risk is a set value or more and there is a possibility of collision, the microcomputer 12051 can output an alarm to the driver via the audio speaker 12061 and the display unit 12062, and can perform forced deceleration and avoidance steering via the drive system control unit 12010, thereby achieving driving assistance for collision avoidance.

At least one of the imaging units 12101 to 12104 may be an infrared camera that detects infrared rays. For example, the microcomputer 12051 can recognize a pedestrian by determining whether a pedestrian is present in the captured images of the imaging units 12101 to 12104. Such pedestrian recognition is performed, for example, by a procedure of extracting feature points in a captured image of the imaging units 12101 to 12104 as an infrared camera, and by a procedure of performing pattern matching processing on a series of feature points indicating the contour of the object to discriminate whether or not it is a pedestrian. When the microcomputer 12051 determines that a pedestrian is present in the captured images of the imaging units 12101 to 12104 and recognizes a pedestrian, the audio image output unit 12052 causes the display unit 12062 to perform superimposing display of a rectangular contour line for emphasis to the recognized pedestrian. Furthermore, the audio image output unit 12052 may cause the display unit 12062 to display an icon indicating a pedestrian or the like at a desired position.

Hereinabove, an example of the moving body control system to which the technology according to the present disclosure is applicable has been described. The technique according to the present disclosure can be suitably applied to, for example, the imaging unit 12031 among the configurations described above. Specifically, the imaging device 1 according to the above-described embodiments and their modifications is applicable to the imaging unit 12031. By applying the technology according to the present disclosure to the imaging unit 12031, it is possible to obtain a high-definition photographic image with little noise, leading to achievement of high-accuracy control using the photographic image in the moving body control system.

Examples of Applications to Products 2

Figure 88:
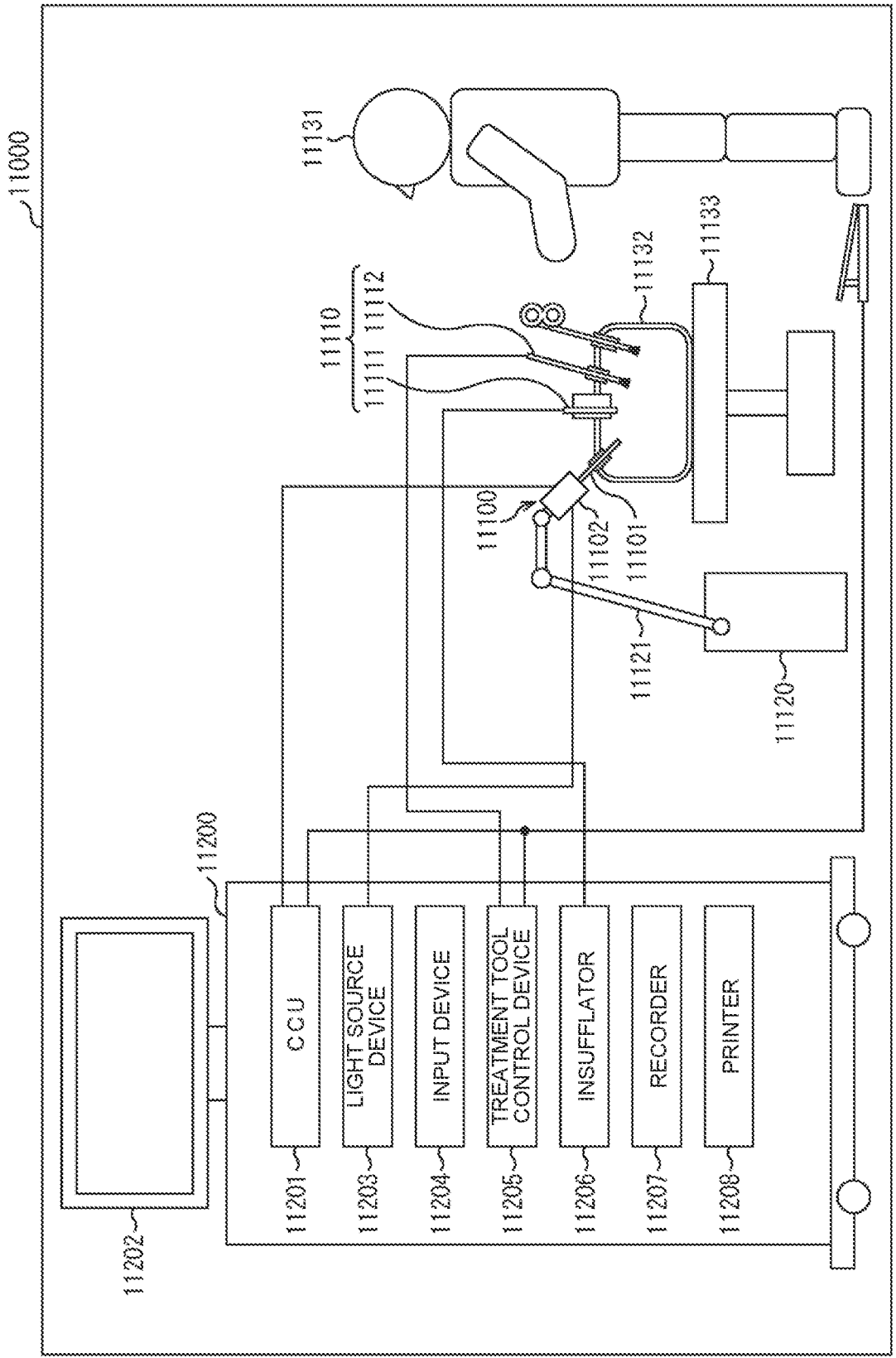
FIG. 88 is a diagram illustrating an example of a schematic configuration of an endoscopic surgery system.

FIG. 88 is a view illustrating an example of a schematic configuration of an endoscopic surgery system to which the technique (the present technology) according to the present disclosure is applicable.

FIG. 88 illustrates a scene in which a surgeon (doctor) 11131 is performing surgery on a patient 11132 on a patient bed 11133 using an endoscopic surgery system 11000. As illustrated, the endoscopic surgery system 11000 includes an endoscope 11100, other surgical tools 11110 such as an insufflation tube 11111 and an energy treatment tool 11112, a support arm device 11120 that supports the endoscope 11100, and a cart 11200 equipped with various devices for endoscopic surgery.

The endoscope 11100 includes: a lens barrel 11101, a region of a predetermined length from a distal end of which is to be inserted into the body cavity of the patient 11132; and a camera head 11102 connected to a proximal end of the lens barrel 11101. The example in the figure illustrates the endoscope 11100 as a rigid endoscope having the lens barrel 11101 of a rigid type. However, the endoscope 11100 can be a flexible endoscope having a flexible lens barrel.

The distal end of the lens barrel 11101 has an opening to which an objective lens is fitted. The endoscope 11100 is connected to a light source device 11203. The light generated by the light source device 11203 is guided to the distal end of the lens barrel by a light guide extending inside the lens barrel 11101, and the guided light will be emitted toward an observation target in the body cavity of the patient 11132 through the objective lens. The endoscope 11100 may be a forward viewing endoscope, a forward-oblique viewing endoscope, or a side-viewing endoscope.

An optical system and an imaging element are provided inside the camera head 11102. Reflected light (observation light) from the observation target is focused on the imaging element by the optical system. The observation light is photoelectrically converted by the imaging element so as to generate an electric signal corresponding to the observation light, that is, an image signal corresponding to the observation image. The image signal is transmitted as RAW data to a camera control unit (CCU) 11201.

The CCU 11201 is formed with a central processing unit (CPU), a graphics processing unit (GPU), or the like, and integrally controls operations of the endoscope 11100 and a display device 11202. Furthermore, the CCU 11201 receives an image signal from the camera head 11102, and performs various image processing on the image signal for displaying an image based on the image signal, such as developing processing (demosaicing).

Under the control of the CCU 11201, the display device 11202 displays an image based on the image signal that has undergone image processing by the CCU 11201.

The light source device 11203 includes a light source such as Light Emitting Diode (LED), for example, and supplies the irradiation light for imaging the surgical site or the like to the endoscope 11100.

An input device 11204 is an input interface to the endoscopic surgery system 11000. The user can input various types of information and input instructions to the endoscopic surgery system 11000 via the input device 11204. For example, the user inputs an instruction to change the imaging conditions (type of irradiation light, magnification, focal length, and the like) by the endoscope 11100.

A treatment tool control device 11205 controls the drive of the energy treatment tool 11112 for ablation or dissection of tissue, sealing of blood vessels, or the like. In order to inflate the body cavity of the patient 11132 to ensure a view field for the endoscope 11100 and to ensure a working space of the surgeon, an insufflator 11206 pumps gas into the body cavity through an insufflation tube 11111. A recorder 11207 is a device capable of recording various types of information associated with the surgery. A printer 11208 is a device capable of printing various types of information associated with surgery in various forms such as text, images, and graphs.

The light source device 11203 that supplies the endoscope 11100 with irradiation light when imaging a surgical site can be constituted with, for example, an LED, a laser light source, or a white light source with a combination of these. In a case where the white light source is constituted with the combination of the RGB laser light sources, it is possible to control the output intensity and the output timing of individual colors (individual wavelengths) with high accuracy.

Accordingly, it is possible to perform white balance adjustment of the captured image on the light source device 11203. Furthermore, in this case, by emitting the laser light from each of the RGB laser light sources to an observation target on the time division basis and by controlling the drive of the imaging element of the camera head 11102 in synchronization with the light emission timing, it is also possible to capture the image corresponding to each of RGB colors on the time-division basis. According to this method, a color image can be obtained without providing a color filter on the imaging element.

Furthermore, the drive of the light source device 11203 may be controlled so as to change the intensity of the output light at predetermined time intervals. With the control of the drive of the imaging element of the camera head 11102 in synchronization with the timing of the change of the intensity of the light so as to obtain images on the time division basis and combine the images, it is possible to generate an image with high dynamic range without so called blackout shadows or blown out highlights (overexposure).

Furthermore, the light source device 11203 may be configured to be able to supply light in a predetermined wavelength band corresponding to special light observation. The special light observation is used to perform narrowband light observation (narrow band imaging). The narrowband light observation uses the wavelength dependency of the light absorption in the body tissue and emits light in a narrower band compared with the irradiation light (that is, white light) at normal observation, thereby imaging a predetermined tissue such as a blood vessel of the mucosal surface layer with high contrast. Alternatively, the special light observation may include fluorescence observation to obtain an image by fluorescence generated by emission of excitation light. Fluorescence observation can be performed to observe fluorescence emitted from a body tissue to which excitation light is applied (autofluorescence observation), and can be performed with topical administration of reagent such as indocyanine green (ICG) to the body tissue, and together with this, excitation light corresponding to the fluorescence wavelength of the reagent is emitted to the body tissue to obtain a fluorescent image, or the like. The light source device 11203 can be configured to be able to supply narrow band light and/or excitation light corresponding to such special light observation.

Figure 89:
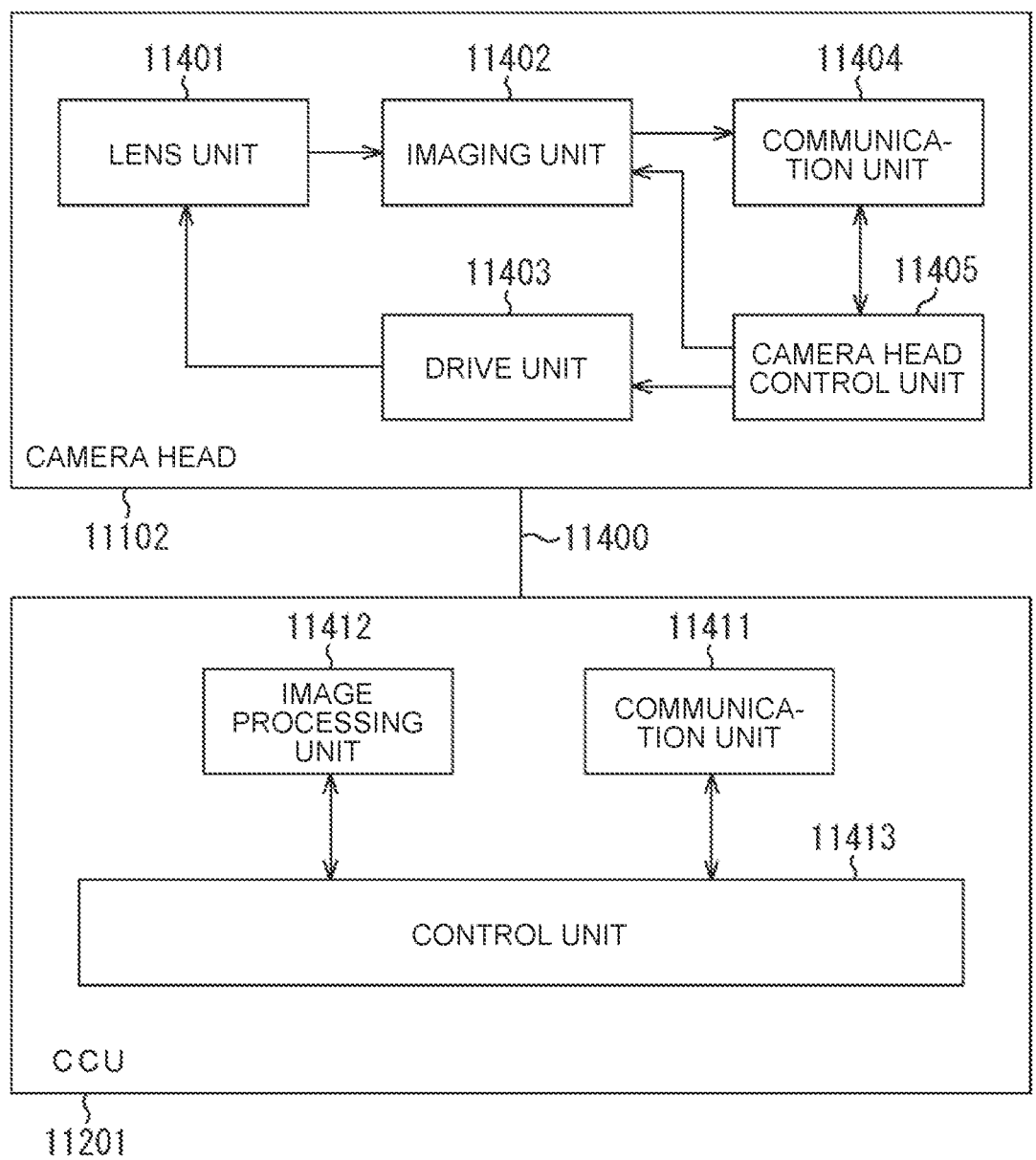
FIG. 89 is a block diagram illustrating an example of a functional configuration of a camera head and a CCU.

FIG. 89 is a block diagram illustrating an example of the functional configuration of the camera head 11102 and the CCU 11201 illustrated in FIG. 88.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected to each other by a transmission cable 11400.

The lens unit 11401 is an optical system provided at a connection portion with the lens barrel 11101. The observation light captured from the distal end of the lens barrel 11101 is guided to the camera head 11102 so as to be incident on the lens unit 11401. The lens unit 11401 is formed by a combination of a plurality of lenses including a zoom lens and a focus lens.

The imaging unit 11402 is constituted with an imaging element. The number of imaging elements forming the imaging unit 11402 may be one (single-plate type) or in plural (multi-plate type). When the imaging unit 11402 is a multi-plate type, for example, each of imaging elements may generate an image signal corresponding to one color of RGB, and a color image may be obtained by combining these individual color image signals. Alternatively, the imaging unit 11402 may include a pair of imaging elements for acquiring image signals individually for the right eye and the left eye corresponding to three-dimensional (3D) display. The 3D display enables a surgeon 11131 to grasp the depth of the living tissue more accurately in the surgical site. When the imaging unit 11402 is a multi-plate type, a plurality of the lens unit 11401 may be provided corresponding to each of the imaging elements.

Furthermore, the imaging unit 11402 does not necessarily have to be provided on the camera head 11102. For example, the imaging unit 11402 may be provided inside the lens barrel 11101 immediately behind the objective lens.

The drive unit 11403 includes an actuator, and moves the zoom lens and the focus lens of the lens unit 11401 by a predetermined distance along the optical axis under the control of the camera head control unit 11405. With this operation, the magnification and focus of the image captured by the imaging unit 11402 can be appropriately adjusted.

The communication unit 11404 includes a communication device for transmitting and receiving various types of information to and from the CCU 11201. The communication unit 11404 transmits the image signal obtained from the imaging unit 11402 as RAW data to the CCU 11201 via the transmission cable 11400.

Furthermore, the communication unit 11404 receives a control signal for controlling the drive of the camera head 11102 from the CCU 11201 and supplies the control signal to the camera head control unit 11405. The control signal includes information associated with imaging conditions, such as information designating a frame rate of a captured image, information designating an exposure value at the time of imaging, and/or information designating the magnification and focal point of the captured image.

Note that the imaging conditions such as the frame rate, the exposure value, the magnification, and the focus may be appropriately designated by the user, or may be automatically set by the control unit 11413 of the CCU 11201 based on the acquired image signal. In the latter case, an Auto Exposure (AE) function, an Auto Focus (AF) function, and an Auto White Balance (AWB) function are to be installed in the endoscope 11100.

The camera head control unit 11405 controls the drive of the camera head 11102 based on the control signal from the CCU 11201 received via the communication unit 11404.

The communication unit 11411 includes a communication device for transmitting and receiving various types of information to and from the camera head 11102. The communication unit 11411 receives an image signal transmitted from the camera head 11102 via the transmission cable 11400.

Furthermore, the communication unit 11411 transmits a control signal for controlling the drive of the camera head 11102 to the camera head 11102. The image signal and the control signal can be transmitted by electric communication, optical communication, or the like.

The image processing unit 11412 performs various image processing on the image signal which is the RAW data transmitted from the camera head 11102.

The control unit 11413 performs various controls related to the imaging of the surgical site or the like by the endoscope 11100 and related to the display of the captured image obtained by the imaging of the surgical site or the like. For example, the control unit 11413 generates a control signal for controlling the drive of the camera head 11102.

Furthermore, the control unit 11413 controls the display device 11202 to display the captured image including an image of a surgical site or the like based on the image signal that has undergone image processing by the image processing unit 11412. At this time, the control unit 11413 may recognize various objects in the captured image by using various image recognition techniques. For example, the control unit 11413 detects the shape, color, or the like of an edge of an object included in the captured image, making it possible to recognize a surgical tool such as forceps, a specific living body site, bleeding, a mist at the time of using the energy treatment tool 11112, or the like. When displaying the captured image on the display device 11202, the control unit 11413 may superimpose and display various surgical operation support information on the image of the surgical site by using the recognition result. By displaying the surgery support information in a superimposed manner so as to be presented to the surgeon 11131, it is possible to reduce the burden on the surgeon 11131 and enable the surgeon 11131 to proceed with the operation with higher reliability.

The transmission cable 11400 that connects the camera head 11102 and the CCU 11201 is an electric signal cable that supports electric signal communication, an optical fiber that supports optical communication, or a composite cable thereof.

Here, while an illustrated example in which wired communication is performed using the transmission cable 11400, the communication between the camera head 11102 and the CCU 11201 may be performed wirelessly.

An example of the endoscopic surgery system to which the technique according to the present disclosure can be applied has been described above. The technique according to the present disclosure can be appropriately applied to the imaging unit 11402 provided in the camera head 11102 of the endoscope 11100 among the configurations described above. Application of the technology according to the present disclosure to the imaging unit 11402, can achieve downsizing and high definition of the imaging unit 11402, making it possible to provide the endoscope 11100 having achieved downsizing or high definition.

Although the present disclosure has been described with reference to the exemplary embodiments, their modifications, application examples, and examples of application to various products, the present disclosure is not limited to the exemplary embodiments and the like, and various modifications can be made. Note that the effects described in the present specification are merely examples. The effects of the present disclosure are not limited to the effects described herein. The present disclosure may have effects other than those described herein.

Furthermore, for example, the present disclosure can have the following configurations.

Although the present disclosure has been described with reference to the embodiments, their modifications, application examples, and examples of application to various products, the present disclosure is not limited to the embodiments and the like, and various modifications can be made. Note that the effects described in the present specification are merely examples. The effects of the present disclosure are not limited to the effects described herein. The present disclosure may have effects other than those described herein.

17. Summary

As described above, according to the embodiments and their modification of the present disclosure, it is possible to provide the imaging device 1 having a three-layer structure that does not hinder miniaturization of an area per pixel with a chip size equivalent to the current size.

Note that, in the embodiment and the modification of the present disclosure described above, the conductivity type of each semiconductor region described above may be reversed, and for example, the present embodiment and the modification can be applied to an imaging device using holes as signal charges.

Furthermore, in the embodiment of the present disclosure described above, the semiconductor substrate does not necessarily have to be a silicon substrate, and may be another substrate (for example, a silicon on insulator (SOI) substrate, a SiGe substrate, or the like). The semiconductor substrate may have a semiconductor structure or the like formed on such various substrates.

Furthermore, the imaging device 1 according to the embodiment and the modification of the present disclosure is not limited to an imaging device that captures an image as an image as a result of detection of distribution of the amount of incident light of visible light. For example, the present embodiment and the modification can be applied to a solid-state imaging element that captures a distribution of incident amounts of infrared rays, X-rays, particles, or the like as an image, or a solid-state imaging element (physical quantity distribution detector) that detects a distribution of other physical quantities such as pressure and capacitance and thereby forms an image, such as a fingerprint detection sensor.

In the embodiments and modifications of the present disclosure, examples of a method of forming individual layers, films, elements, and the like described above include a physical vapor deposition (PVD) method, a CVD method, and the like. Examples of the PVD method include a vacuum vapor deposition method using resistance heating or high frequency heating, an electron beam (EB) vapor deposition method, various sputtering methods (magnetron sputtering method, an RF-DC coupled bias sputtering method, an electron cyclotron resonance (ECR) sputtering method, a facing target sputtering method, a high frequency sputtering method, and the like), an ion plating method, a laser ablation method, and a molecular beam epitaxy (MBE) method, a laser transfer method, and the like. Examples of the CVD method include a plasma CVD method, a thermal CVD method, an MOCVD method, and an optical CVD method. Furthermore, other methods include an electrolytic plating method, an electroless plating method, and a spin coating method; immersion method; casting method; micro-contact printing; drop cast method; various printing methods such as a screen printing method, an inkjet printing method, an offset printing method, a gravure printing method, and a flexographic printing method; a stamping method; a spray method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendering coater method. Examples of a patterning method of individual layers include: chemical etching such as shadow mask, laser transfer, and photolithography; and physical etching using ultraviolet rays, laser, and the like. In addition, examples of the planarization technique include a CMP method, a laser planarization method, and a reflow method. That is, the imaging device 1 according to the embodiments and their modifications of the present disclosure can be easily and inexpensively manufactured using an existing semiconductor device manufacturing process.

Furthermore, individual steps in the manufacturing method according to the embodiments and their modifications of the present disclosure described above do not necessarily have to be processed in the described order. For example, the individual steps may be processed in an appropriately changed order. Furthermore, the method used in individual steps does not necessarily have to be performed with the described method, and may be performed by other methods.

18. Supplementary Notes

The preferred embodiments of the present disclosure have been described in detail above with reference to the accompanying drawings. However, the technical scope of the present disclosure is not limited to such examples. It will be apparent to those skilled in the art of the present disclosure that various modifications and alterations can be conceived within the scope of the technical idea described in the claims and naturally fall within the technical scope of the present disclosure.

Furthermore, the effects described in the present specification are merely illustrative or exemplary and are not limited. That is, the technique according to the present disclosure can exhibit other effects that are apparent to those skilled in the art from the description of the present specification in addition to or instead of the above effects.

Note that the present technology can also have the following configurations.

(1) An imaging device comprising:
   a first semiconductor substrate provided with a photoelectric conversion element, floating diffusion that temporarily holds a charge output from the photoelectric conversion element, and a transfer transistor that transfers the charge output from the photoelectric conversion element to the floating diffusion;
   a second semiconductor substrate provided on the first semiconductor substrate via a first interlayer insulating film and provided with a readout circuit unit that reads out the charge held in the floating diffusion and outputs a pixel signal; and
   a through-substrate electrode that penetrates the second semiconductor substrate and the first interlayer insulating film from a surface of the second semiconductor substrate opposite to a surface facing the first semiconductor substrate, the through-substrate electrode extending to the first semiconductor substrate so as to electrically connect the first semiconductor substrate and the second semiconductor substrate to each other,
   wherein a side surface of the through-substrate electrode is in contact with the second semiconductor substrate.

(2) The imaging device according to (1),
   wherein the through-substrate electrode penetrates a second region in the second semiconductor substrate and the first interlayer insulating film from a surface in the second region of the second semiconductor substrate opposite to a surface facing the first semiconductor substrate, the through-substrate electrode extending to a surface in a first region of the first semiconductor substrate facing the second semiconductor substrate.

(3) The imaging device according to (1),
   wherein the through-substrate electrode penetrates a second region in the second semiconductor substrate and the first interlayer insulating film from a surface in the second region of the second semiconductor substrate opposite to a surface facing the first semiconductor substrate, the through-substrate electrode extending to a first contact provided on a surface in a first region of the first semiconductor substrate facing the second semiconductor substrate.

(4) The imaging device according to (3),
   wherein the first semiconductor substrate includes a plurality of the first regions, and
   the first contact is provided across the plurality of first regions and electrically connects the plurality of first regions to each other.

(5) The imaging device according to any one of (2) to (4),
   wherein the first region and the second region have an identical conductivity type.

(6) An imaging device comprising:
   a first semiconductor substrate provided with a photoelectric conversion element, floating diffusion that temporarily holds a charge output from the photoelectric conversion element, and a transfer transistor that transfers the charge output from the photoelectric conversion element to the floating diffusion;
   a second semiconductor substrate provided on the first semiconductor substrate via a first interlayer insulating film and provided with a readout circuit unit that reads out the charge held in the floating diffusion and outputs a pixel signal; and
   a through-substrate electrode that penetrates the first interlayer insulating film and electrically connects the first semiconductor substrate and the second semiconductor substrate to each other,
   wherein a distal end portion of the through-substrate electrode is embedded in the first semiconductor substrate.

(7) The imaging device according to (6),
   wherein a side wall of the distal end portion of the through-substrate electrode is in contact with a first region in the first semiconductor substrate.

(8) The imaging device according to (7),
   wherein a plurality of the first regions is provided in the first semiconductor substrate, and
   the side wall of the distal end portion of the through-substrate electrode is in contact with the plurality of first regions.

(9) The imaging device according to any one of (6) to (8),
   wherein the first semiconductor substrate is provided with an element isolation portion that partitions pixels including the photoelectric conversion element and the floating diffusion, and
   the distal end portion is embedded in the element isolation portion.

(10) The imaging device according to (9), wherein the distal end portion penetrates the first semiconductor substrate from a surface of the first semiconductor substrate facing the second semiconductor substrate to a surface of the first semiconductor substrate opposite to the facing surface.

(11) An imaging device comprising:
   a first semiconductor substrate provided with a photoelectric conversion element, floating diffusion that temporarily holds a charge output from the photoelectric conversion element, and a transfer transistor that transfers the charge output from the photoelectric conversion element to the floating diffusion;
   a second semiconductor substrate provided on the first semiconductor substrate via a first interlayer insulating film and provided with a readout circuit unit that reads out the charge held in the floating diffusion and outputs a pixel signal;

a first electrode electrically connected to a gate electrode of the transfer transistor; and a second electrode electrically connected to a semiconductor layer in the first semiconductor substrate, wherein at least one of the first and second electrodes is provided on a surface of the first semiconductor substrate opposite to a surface facing the second semiconductor substrate.

(12) The imaging device according to (11), wherein the surface of the first semiconductor substrate opposite to the surface facing the second semiconductor substrate is an incident surface of light to the photoelectric conversion element.

(13) The imaging device according to (12), wherein the first electrode is provided on the incident surface side, and the transfer transistor is a vertical transistor having a configuration in which the gate electrode of the transfer transistor is embedded in the first semiconductor substrate.

(14) The imaging device according to (12), wherein the second electrode is provided on the incident surface side, and the second electrode is formed of a transparent conductive film.

(15) The imaging device according to (12), wherein the first semiconductor substrate includes an element isolation portion that partitions pixels including the photoelectric conversion element, the floating diffusion, and the transfer transistor, the element isolation portion being provided around the incident surface, and the second electrode is provided in the element isolation portion on the incident surface side.

(16) The imaging device according to (15), wherein the second electrode is provided along a side wall of a semiconductor layer in the first semiconductor substrate.

(17) The imaging device according to any one of (1) to (16), further comprising a third semiconductor substrate including a logic circuit that processes the pixel signal, the third semiconductor substrate being located on an opposite side of a surface of the second semiconductor substrate facing the first semiconductor substrate.

(18) The imaging device according to (17), further comprising:

a second interlayer insulating film provided on a surface of the second semiconductor substrate opposite to the surface facing the first semiconductor substrate;

a first metal pad formed of a copper material and provided on a surface of the second interlayer insulating film opposite to the surface facing the second semiconductor substrate;

a third interlayer insulating film provided on a surface of the third semiconductor substrate facing the second semiconductor substrate; and a second metal pad formed of a copper material and provided on a surface of the third interlayer insulating film facing the second semiconductor substrate, wherein the first metal pad and the second metal pad are bonded to each other.

REFERENCE SIGNS LIST 1, 1B IMAGING DEVICE
7 IMAGING SYSTEM
10 FIRST SUBSTRATE PORTION (BOTTOM SUBSTRATE)
10a, 11a, 221a FRONT SURFACE
11, 3010 SEMICONDUCTOR SUBSTRATE
15, 117B, 215, 217, 225, 3040 INSULATING FILM
16, 223, 2130 ELEMENT ISOLATION LAYER
17 IMPURITY DIFFUSION LAYER
20 SECOND SUBSTRATE PORTION
30 THIRD SUBSTRATE PORTION
51, 53, 119, 123, 222 INTERLAYER INSULATING FILM
100, 200, 300 SUBSTRATE
100S, 200S, 300S SEMICONDUCTOR LAYER
100T, 200T, 300T WIRING LAYER
102, 211 WELL REGION
104, 106 CONTACT
111 INSULATING FILM
112 FIXED CHARGE FILM
113, 116 PINNING REGION
114 n-TYPE SEMICONDUCTOR REGION
115 p-WELL LAYER
117, 117b PIXEL ISOLATION PORTION
117A LIGHT SHIELDING FILM
118, 218 VSS CONTACT REGION
120, 120A, 121, 220 PAD PORTION
120C, 121C CONNECTION VIA
120E, 121E, 360, TGV, TGV1, TGV2, TGV3, TGV4 THROUGH-SUBSTRATE ELECTRODE
120F, 121F DISTAL END PORTION
121F-1 SIDE CONTACT PORTION
121F-2 PENETRATING PORTION
122, 221 PASSIVATION FILM
124 BONDING FILM
125, 201, 202, 203, 204, 218C, 301, 302, 303, 304, 360C CONTACT PORTION
210 PIXEL CIRCUIT
211b, 221b BACK SURFACE
212 INSULATING REGION
213 ELEMENT ISOLATION REGION
218V CONNECTION PORTION
227, 305 PAD ELECTRODE
243 DSP CIRCUIT
244 FRAME BUFFER MEMORY
245 DISPLAY UNIT
246 STORAGE UNIT
247 OPERATION UNIT
248 POWER SUPPLY UNIT
249 BUS LINE
250 GATE
350, FDGL, L1 to L10, L30, RSTL, SELL, TRG1, TRG2, TRG3, TRG4 WIRING LINE
360a EMBEDDED ELECTRODE
362 GROOVE
370 COLOR FILTER
401 LIGHT RECEIVING LENS
510A INPUT UNIT
510B OUTPUT UNIT
511 INPUT TERMINAL
512 INPUT CIRCUIT UNIT
513 INPUT AMPLITUDE CHANGING UNIT
514 INPUT DATA CONVERSION CIRCUIT UNIT
515 OUTPUT DATA CONVERSION CIRCUIT UNIT
516 OUTPUT AMPLITUDE CHANGING UNIT
517 OUTPUT CIRCUIT UNIT
518 OUTPUT TERMINAL
520 ROW DRIVE UNIT
530 TIMING CONTROL UNIT

539 PIXEL SHARING UNIT
540 PIXEL ARRAY UNIT
540B PERIPHERAL PORTION
541, 541A, 541B, 541C, 541D PIXEL
542 ROW DRIVE SIGNAL LINE
543 VERTICAL SIGNAL LINE
544 POWER SUPPLY LINE
550 COLUMN SIGNAL PROCESSING UNIT
560 IMAGE SIGNAL PROCESSING UNIT
1100, 1020 COMMON PAD ELECTRODE
2100 LOWER SUBSTRATE (MIDDLE SUBSTRATE)
2110 FIRST SEMICONDUCTOR SUBSTRATE
2200 UPPER SUBSTRATE (TOP SUBSTRATE)
2210 SECOND SEMICONDUCTOR SUBSTRATES
AG, RG, AND SG GATE ELECTRODE
AMP AMPLIFICATION TRANSISTOR
CH THROUGH HOLE
FD, FD1, FD2, FD3, FD4 FLOATING DIFFUSION
FDG FD CONVERSION GAIN SWITCHING TRANSISTOR
H1, H2 CONNECTION HOLE
L LIGHT
PD, PD1, PD2, PD3, PD4 PHOTODIODE
PU PIXEL UNIT
RST RESET TRANSISTOR
SEL SELECTION TRANSISTOR
TA, TB EXTERNAL TERMINAL
TG, TG1, TG2, TG3, TG4 TRANSFER GATE
TGa VERTICAL PORTION
TGb HORIZONTAL PORTION
TR TRANSFER TRANSISTOR
VSS, VDD POWER SUPPLY LINE
W1, W2, W3, W4 WIRING LAYER
WE WELL LAYER
sec1, sec2, sec3, sec21, sec22 POSITIONS

What is claimed is:

1. An imaging device, comprising:
a first semiconductor substrate provided with a photoelectric conversion element, a floating diffusion that temporarily holds a charge output from the photoelectric conversion element, and a transfer transistor that transfers the charge output from the photoelectric conversion element to the floating diffusion;
a second semiconductor substrate provided on the first semiconductor substrate via a first interlayer insulating film and provided with a readout circuit unit that reads out the charge held in the floating diffusion and outputs a pixel signal; and
a through-substrate electrode that penetrates the second semiconductor substrate and the first interlayer insulating film from a surface of the second semiconductor substrate opposite to a surface facing the first semiconductor substrate, the through-substrate electrode extending to the first semiconductor substrate so as to electrically connect the first semiconductor substrate and the second semiconductor substrate to each other; and
an element isolation portion,
wherein a side surface of the through-substrate electrode is in contact with the second semiconductor substrate, and
wherein the through-substrate electrode is aligned with the element isolation portion in an end-to-end vertical alignment in a cross-sectional view.

2. The imaging device according to claim 1, wherein the through-substrate electrode penetrates a second region in the second semiconductor substrate and the first interlayer insulating film from a surface in the second region of the second semiconductor substrate opposite to a surface facing the first semiconductor substrate, the through-substrate electrode extending to a surface in a first region of the first semiconductor substrate facing the second semiconductor substrate.

3. The imaging device according to claim 1, wherein the through-substrate electrode penetrates a second region in the second semiconductor substrate and the first interlayer insulating film from a surface in the second region of the second semiconductor substrate opposite to a surface facing the first semiconductor substrate, the through-substrate electrode extending to a first contact provided on a surface in a first region of the first semiconductor substrate facing the second semiconductor substrate.

4. The imaging device according to claim 3, wherein the first semiconductor substrate includes a plurality of the first regions, and the first contact is provided across the plurality of first regions and electrically connects the plurality of first regions to each other.

5. The imaging device according to claim 2, wherein the first region and the second region have an identical conductivity type.

6. An imaging device, comprising:
a first semiconductor substrate provided with a photoelectric conversion element, a floating diffusion that temporarily holds a charge output from the photoelectric conversion element, and a transfer transistor that transfers the charge output from the photoelectric conversion element to the floating diffusion;
a second semiconductor substrate provided on the first semiconductor substrate via a first interlayer insulating film and provided with a readout circuit unit that reads out the charge held in the floating diffusion and outputs a pixel signal;
a through-substrate electrode that penetrates the first interlayer insulating film and electrically connects the first semiconductor substrate and the second semiconductor substrate to each other; and
an element isolation portion,
wherein a distal end portion of the through-substrate electrode is embedded in the first semiconductor substrate, and
wherein the through-substrate electrode is aligned with the element isolation portion in an end-to-end vertical alignment in a cross-sectional view.

7. The imaging device according to claim 6, wherein a side wall of the distal end portion of the through-substrate electrode is in contact with a first region in the first semiconductor substrate.

8. The imaging device according to claim 7, wherein a plurality of the first regions is provided in the first semiconductor substrate, and the side wall of the distal end portion of the through-substrate electrode is in contact with the plurality of first regions.

9. The imaging device according to claim 6, wherein the element isolation portion partitions pixels including the photoelectric conversion element and the floating diffusion, and the distal end portion of the through-substrate electrode is embedded in the element isolation portion.

10. The imaging device according to claim 9, wherein the distal end portion of the through-substrate electrode penetrates the first semiconductor substrate from a surface of the first semiconductor substrate facing the second semiconductor substrate to a surface of the first semiconductor substrate opposite to the facing surface.

11. The imaging device according to claim 1, further comprising a third semiconductor substrate including a logic circuit that processes the pixel signal, the third semiconductor substrate being located on an opposite side of a surface of the second semiconductor substrate facing the first semiconductor substrate.

12. The imaging device according to claim 11, further comprising:
a second interlayer insulating film provided on a surface of the second semiconductor substrate opposite to the surface facing the first semiconductor substrate;
a first metal pad formed of a copper material and provided on a surface of the second interlayer insulating film opposite to the surface facing the second semiconductor substrate;
a third interlayer insulating film provided on a surface of the third semiconductor substrate facing the second semiconductor substrate; and
a second metal pad formed of a copper material and provided on a surface of the third interlayer insulating film facing the second semiconductor substrate,
wherein the first metal pad and the second metal pad are bonded to each other.

13. The imaging device according to claim 1, wherein the through-substrate electrode has a tapered shape with a constant inclination.

14. The imaging device according to claim 1, wherein the through-substrate electrode has a constant thickness.

* * * * *